(12) United States Patent
Kawashima et al.

(10) Patent No.: US 8,995,170 B2
(45) Date of Patent: Mar. 31, 2015

(54) NON-VOLATILE MEMORY DEVICE

(71) Applicant: Panasonic Corporation, Osaka (JP)

(72) Inventors: Yoshio Kawashima, Osaka (JP); Yukio Hayakawa, Kyoto (JP); Takumi Mikawa, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/122,708

(22) PCT Filed: Mar. 27, 2013

(86) PCT No.: PCT/JP2013/002082
§ 371 (c)(1),
(2) Date: Nov. 27, 2013

(87) PCT Pub. No.: WO2013/145736
PCT Pub. Date: Oct. 3, 2013

(65) Prior Publication Data
US 2014/0098595 A1    Apr. 10, 2014

(30) Foreign Application Priority Data

Mar. 29, 2012 (JP) ................. 2012-078285

(51) Int. Cl.
*G11C 7/00* (2006.01)
*H01L 45/00* (2006.01)
(Continued)

(52) U.S. Cl.
CPC .............. *H01L 45/12* (2013.01); *H01L 27/101* (2013.01); *G11C 13/0002* (2013.01); *G11C 13/004* (2013.01); *G11C 13/0069* (2013.01); *G11C 13/0007* (2013.01); *G11C 13/003* (2013.01); *G11C 2013/0054* (2013.01);
(Continued)

(58) Field of Classification Search
CPC ....................... G11C 13/0069; G11C 11/161
USPC .................................................. 365/148, 158
See application file for complete search history.

(56) References Cited

U.S. PATENT DOCUMENTS 4,479,200 A    10/1984    Sato et al.
6,034,882 A    3/2000    Johnson et al.
(Continued)

FOREIGN PATENT DOCUMENTS

JP    58-118087    7/1983
JP    06-208350    7/1994
(Continued)

OTHER PUBLICATIONS

International Search Report issued Apr. 23, 2013 in International (PCT) Application No. PCT/JP2013/002082.

*Primary Examiner* — Michael Tran
(74) *Attorney, Agent, or Firm* — Wenderoth, Lind & Ponack, L.L.P.

(57) ABSTRACT

A non-volatile memory device includes: a memory cell array including a plurality of memory cells each including a first variable resistance element and a first current steering element and a parameter generation circuit including a reference cell including a second variable resistance element and a second current steering element having the same current density-voltage characteristic as that of the first current steering element, wherein a conductive shorting layer for causing short-circuiting between the electrodes is formed on the side surfaces of the second variable resistance element.

19 Claims, 83 Drawing Sheets

(51) Int. Cl.
  *H01L 27/10* (2006.01)
  *G11C 13/00* (2006.01)
  *H01L 27/24* (2006.01)

(52) U.S. Cl.
  CPC ............ *H01L 45/08* (2013.01); *H01L 45/1233* (2013.01); *H01L 45/146* (2013.01); *H01L 45/1675* (2013.01); *H01L 27/2409* (2013.01); *H01L 27/2463* (2013.01)
  USPC .......................................... 365/148; 365/158

(56) References Cited

U.S. PATENT DOCUMENTS

| | | | |
|---|---|---|---|
| 6,753,561 | B1 | 6/2004 | Rinerson et al. |
| 8,213,209 | B2 | 7/2012 | Tsuda et al. |
| 8,227,788 | B2 * | 7/2012 | Mikawa et al. .................. 257/4 |
| 8,300,444 | B2 | 10/2012 | Nagashima et al. |
| 8,477,525 | B2 | 7/2013 | Ito |
| 2009/0321711 | A1 | 12/2009 | Takagi et al. |
| 2010/0013512 | A1 * | 1/2010 | Hargan et al. .................. 324/765 |
| 2010/0226164 | A1 | 9/2010 | Nagashima et al. |
| 2011/0019494 | A1 | 1/2011 | Tsuda et al. |
| 2011/0044088 | A1 * | 2/2011 | Muraoka et al. .............. 365/148 |
| 2011/0228587 | A1 | 9/2011 | Ito |
| 2011/0233511 | A1 * | 9/2011 | Kawashima et al. ............. 257/4 |
| 2012/0081946 | A1 * | 4/2012 | Kawabata et al. ............. 365/148 |
| 2012/0205608 | A1 * | 8/2012 | Yamauchi et al. ................. 257/4 |
| 2012/0292586 | A1 * | 11/2012 | Yamauchi et al. ................. 257/4 |
| 2014/0077149 | A1 * | 3/2014 | Chen et al. ........................ 257/5 |

FOREIGN PATENT DOCUMENTS

| | | |
|---|---|---|
| JP | 2002-530850 | 9/2002 |
| JP | 2009-099199 | 5/2009 |
| JP | 2010-049776 | 3/2010 |
| JP | 2011-029329 | 2/2011 |
| JP | 2011-198407 | 10/2011 |
| WO | 00/30118 | 5/2000 |
| WO | 2008/047530 | 4/2008 |
| WO | 2009/057212 | 5/2009 |

* cited by examiner

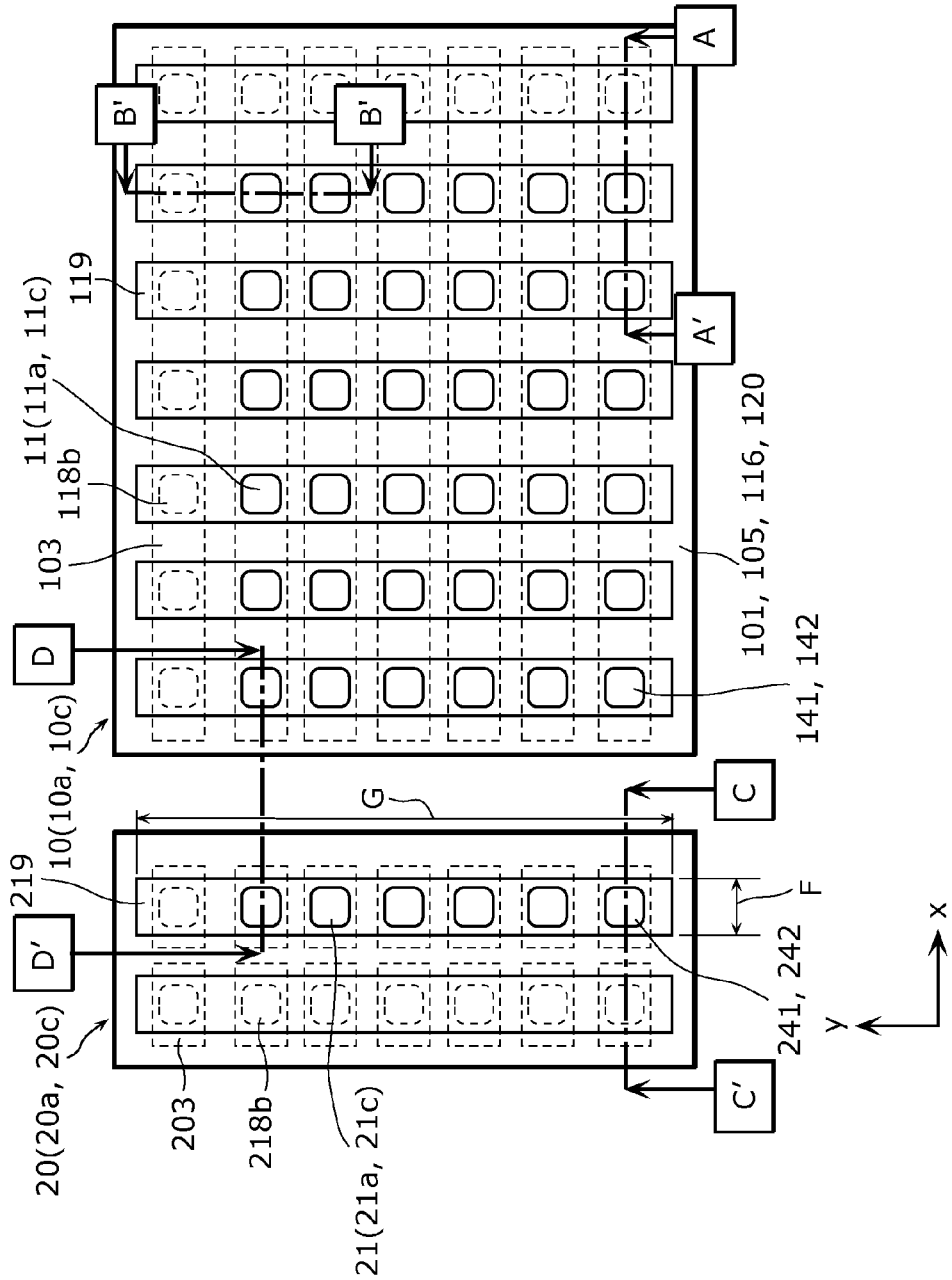

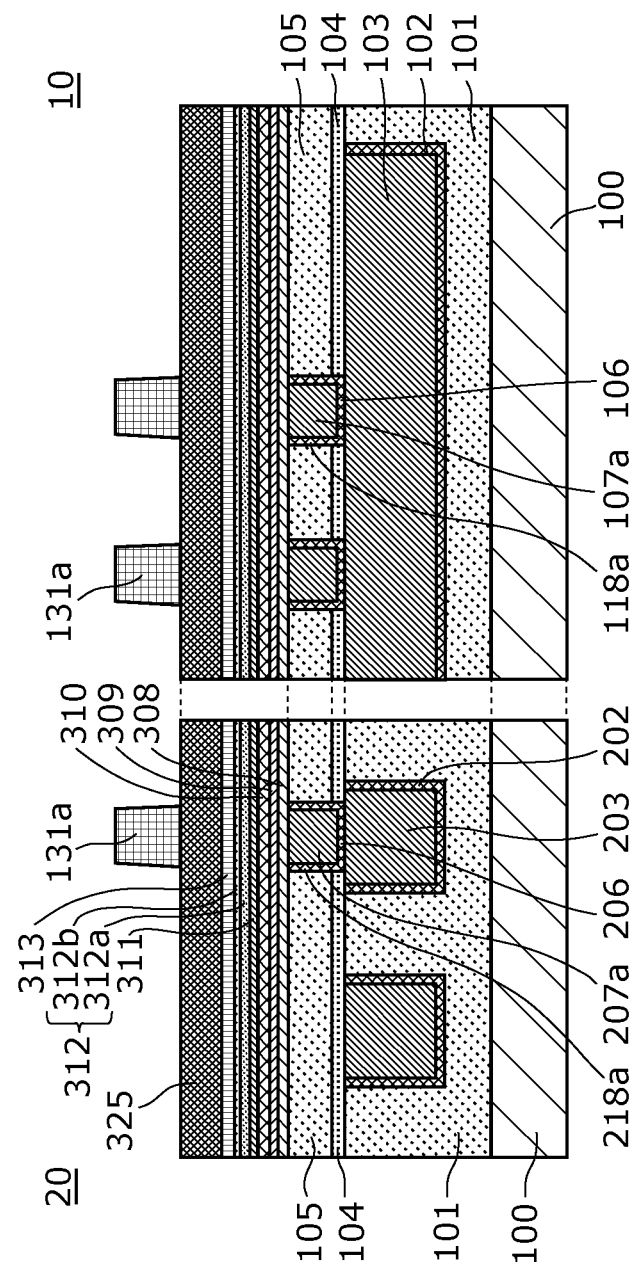

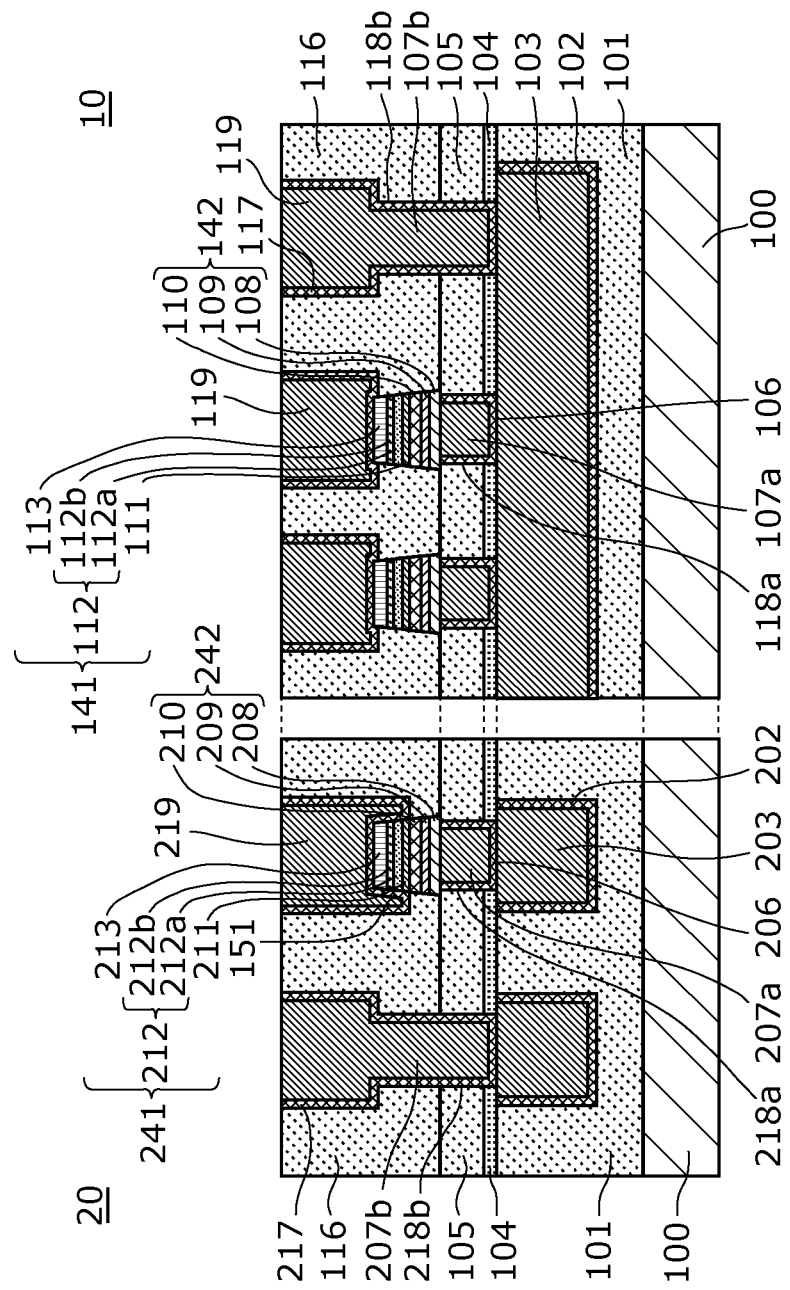

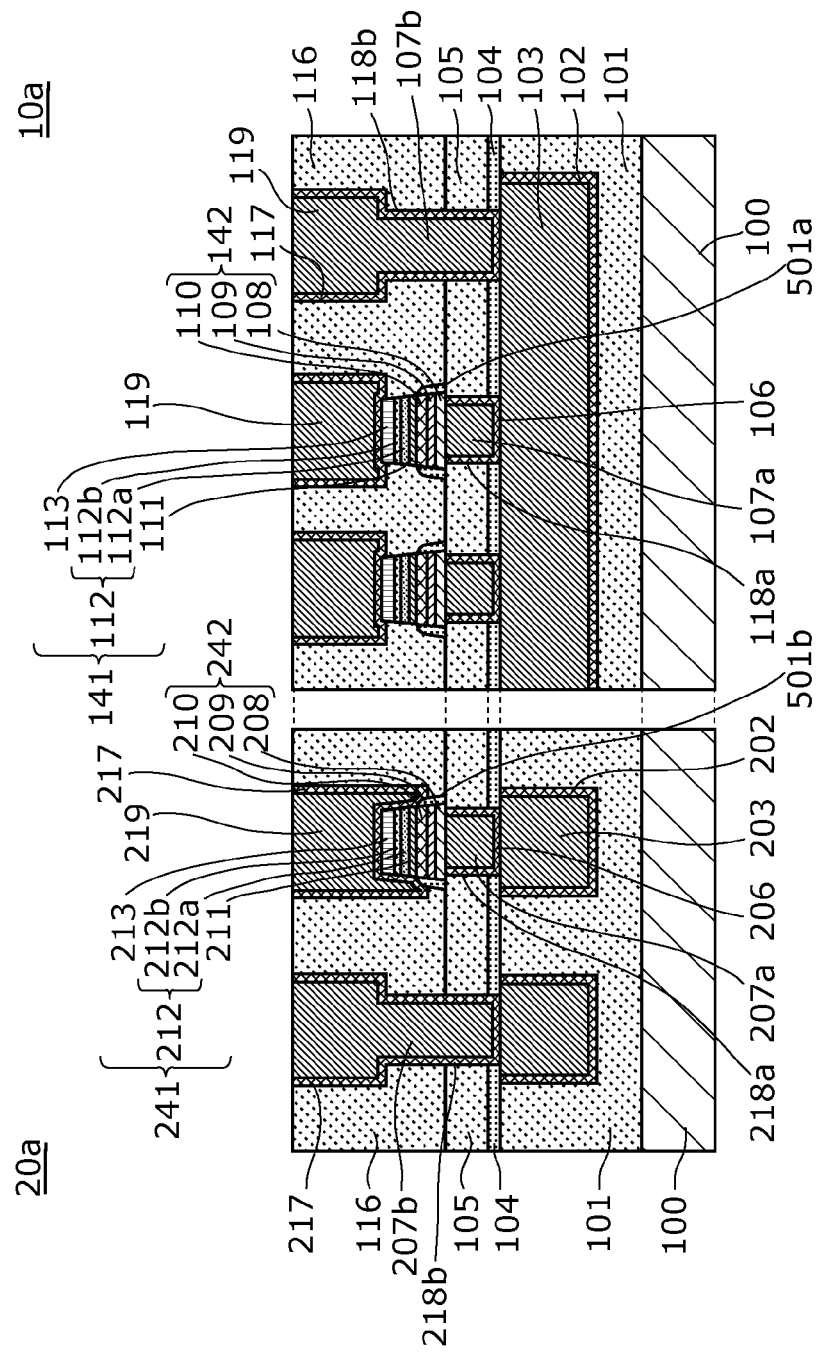

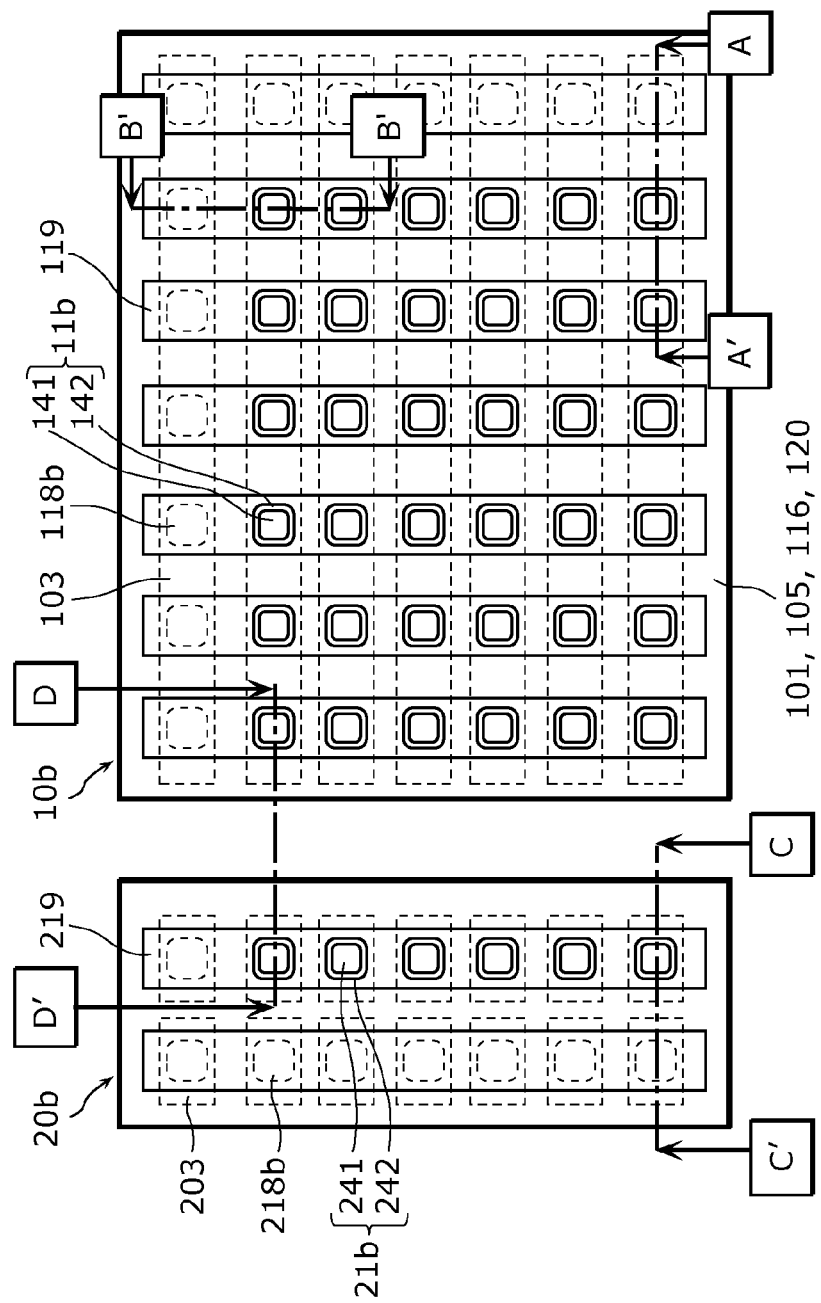

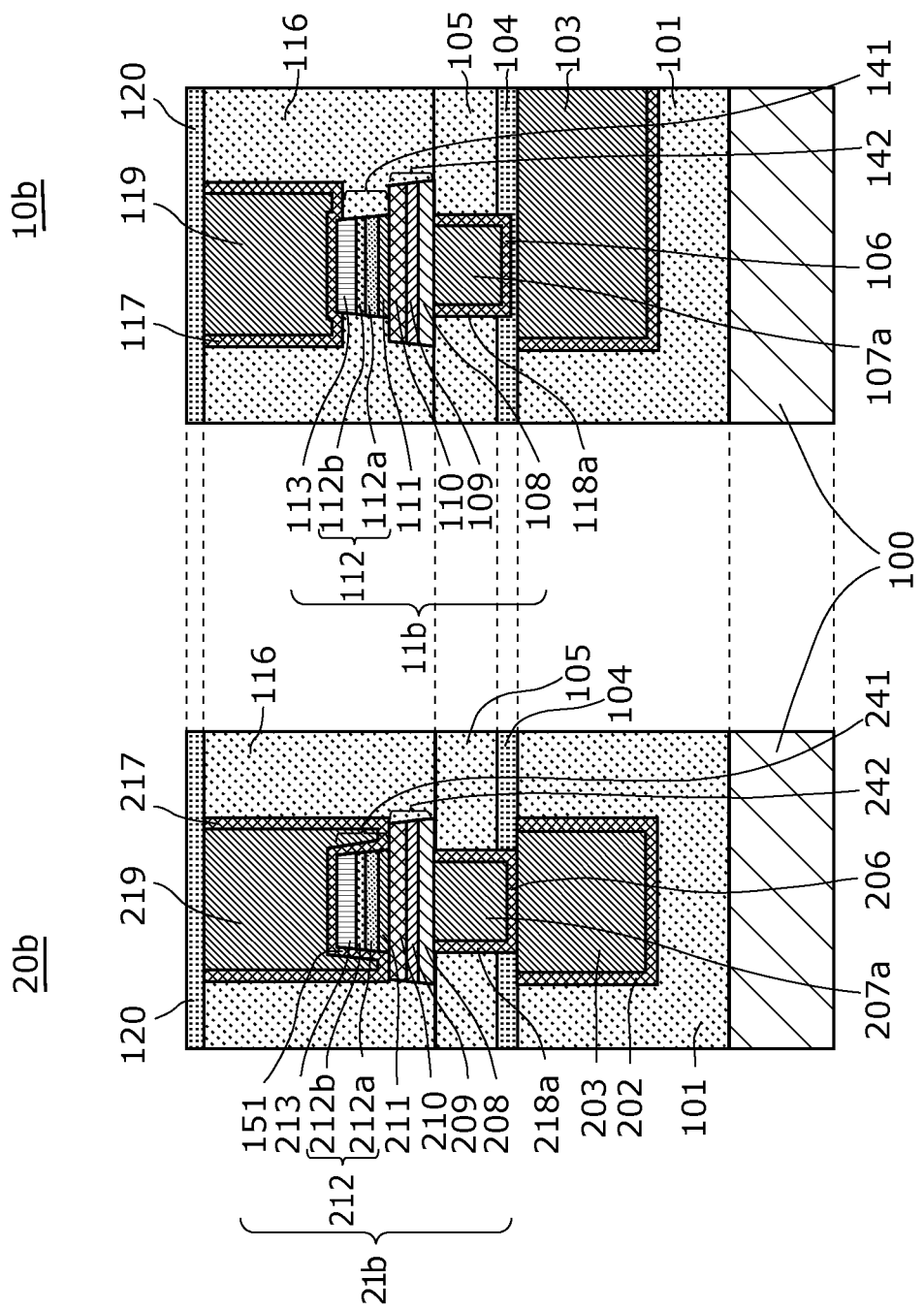

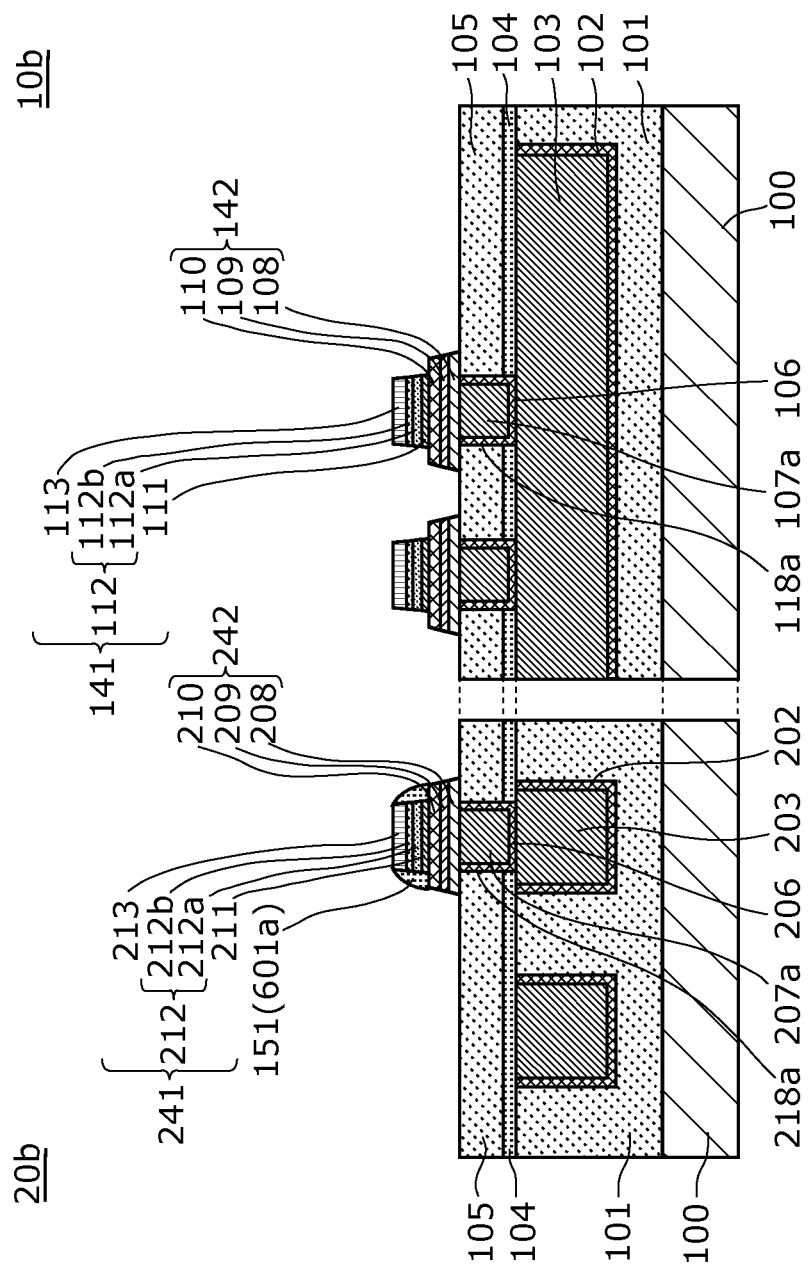

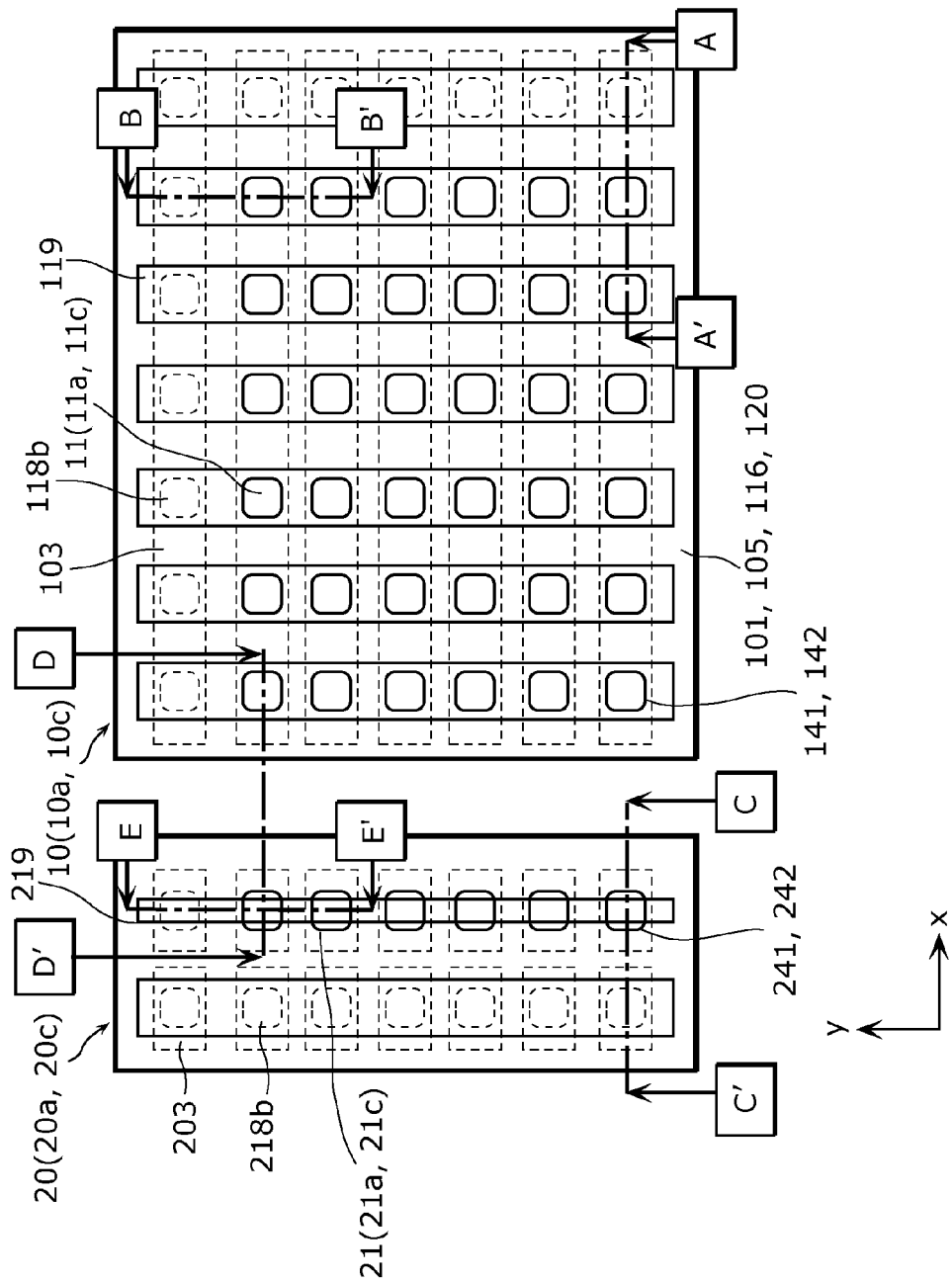

NON-VOLATILE MEMORY DEVICE

TECHNICAL FIELD

The present invention relates to a variable-resistance non-volatile memory device and a method for manufacturing the same.

BACKGROUND ART

Recently, with advancement in digital techniques used in electric devices, non-volatile memory devices having a large capacity have been actively developed for storage of data such as music, images, and other information.

As one next-generation non-volatile memory device, a non-volatile memory device (called ReRAM) has been focused on which includes a variable resistance memory device (variable resistance element) having a resistance value variable with application of an electric pulse and holds the state. The variable resistance non-volatile memory device has an advantage of being able to be consistent with conventional normal semiconductor processes and to be further refined.

For example, Patent Literature 1 discloses a structure in which a variable resistance element and a diode are arranged in series in a perpendicular direction, a variable resistance film is formed to be a variable resistance element in a contact hole, and the diode is formed above the contact hole, for allowing the diode to have an effective area larger than the effective area of the variable resistance element.

Patent Literature 2 discloses a cross-point structure as a structure for realizing high integration of non-volatile memory devices. The non-volatile memory device having a cross-point structure disclosed in Patent Literature 2 includes a memory cell array including a plurality of memory devices each having a variable resistance element. The memory devices are arranged in via holes in a cross-point area in which a plurality of first lines and a plurality of second lines are arranged orthogonal to each other. In addition, in each memory device, elements each having a non-linear current-voltage characteristic (non-linear elements or current steering elements) are arranged in series. These elements having the non-linear current-voltage characteristic selectively activate given ones of the memory devices in the memory cell array. More specifically, for example, use of diodes of a metal-insulator-metal (MIM) type as current steering elements allows the memory devices to perform bi-directional current steering.

CITATION LIST

Patent Literature

[PTL 1]
PCT International Publication No. 2008/047530
[PTL 2]
U.S. Pat. No. 6,753,561, Specification

SUMMARY OF INVENTION

Technical Problem

However, in the conventional non-volatile memory device having a cross-point structure including memory devices (memory cells) in each of which a variable resistance element and a non-linear current steering element are connected in series, current steering elements may have different non-linear current steering characteristics on a surface above a wafer substrate (a substrate on which a plurality of non-volatile memory devices are formed). In this case, the current steering elements in the chips (each of which is a substrate on which a single non-volatile memory device is formed) formed by separating the wafer substrate have different non-linear current steering characteristics, and thus a voltage to be applied to each of variable resistance elements is not an optimum voltage. As a result, fluctuations in signal read or write operations can potentially occur, or an erroneous signal read or write operation can potentially occur.

The present invention was made with an aim to provide a non-volatile memory device capable of suppressing error operations and fluctuations.

Solution to Problem

In order to achieve the object, an non-volatile memory device according to an aspect of the present invention includes: a substrate; a memory cell array including: a plurality of first lines arranged in parallel to each other above the substrate; a plurality of second lines arranged in parallel to each other crossing the plurality of first lines three-dimensionally; and a plurality of memory cells each including a first variable resistance element and a first current steering element and placed at a corresponding one of cross-points of the first lines and the second lines; and a parameter generation circuit including: a third line placed above the substrate; a fourth line placed above the third line; and a current steering characteristic reference cell placed between and connected to the third line and the fourth line and including a second variable resistance element and a second current steering element having a same current density-voltage characteristic as a current density-voltage characteristic of the first current steering element, wherein the second variable resistance element includes: a lower electrode layer; a variable resistance layer formed above the lower electrode layer; and an upper electrode layer formed above the variable resistance layer, and in the current steering characteristic reference cell, the second variable resistance element has a side surface with a conductive shorting layer for short-circuiting the upper electrode layer and the lower electrode layer.

Advantageous Effects of Invention

According to the present invention, it is possible to provide a non-volatile memory device capable of suppressing error operations and fluctuations.

BRIEF DESCRIPTION OF DRAWINGS

FIG. 2 is a plan view of an exemplary structure of a part of the non-volatile memory device according to Embodiment 1 of the present invention.

FIG. 5C is a cross-sectional view for explaining the method for manufacturing the non-volatile memory device according to Embodiment 1 of the present invention.

FIG. 5H is a cross-sectional view for explaining the method for manufacturing the non-volatile memory device according to Embodiment 1 of the present invention.

FIG. 16E is a cross-sectional view for explaining the method for manufacturing the non-volatile memory device according to Embodiment 2 of the present invention.

FIG. 20 is a plan view of an exemplary structure of a part of a non-volatile memory device according to Embodiment 3 of the present invention.

FIG. 22 is a cross-sectional view of the exemplary structure of the non-volatile memory device according to Embodiment 3 of the present invention.

FIG. 26E is a cross-sectional view for explaining the method for manufacturing the non-volatile memory device according to Variation 1 of Embodiment 3 of the present invention.

FIG. 30 is a plan view of an exemplary structure of a part of the non-volatile memory device according to a variation of any of Embodiments 1 to 4 of the present invention.

DESCRIPTION OF EMBODIMENTS

Figure 1:
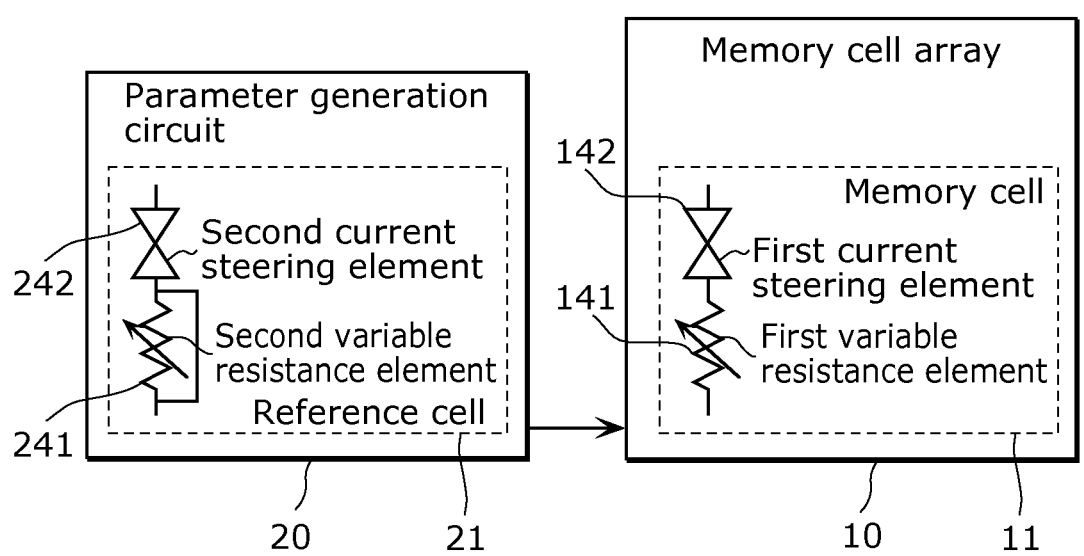
FIG. 1 is a block diagram showing a part of a structure of a non-volatile memory device according to Embodiment 1 of the present invention.

Hereinafter, a non-volatile memory device and a method for manufacturing the same according to this embodiment are described with reference to the drawings. It is to be noted that the same reference signs are assigned to substantially the same structural elements, operations, effects and the like in the drawings, and the same descriptions may be skipped. In addition, the drawings schematically show the structural elements for better understanding. Thus, the shapes and the like are not exactly correct, and the numbers of respective kinds of structural elements etc. are also exemplary numbers for simplicity. In addition, the numerical values, materials, structural elements, the arrangement and connection of the structural elements, steps, the processing order of the steps etc. shown in the following exemplary embodiments are mere examples, and therefore do not limit the scope of present invention. Among the structural elements in the embodiments below, the structural elements not recited in the independent claims defining the most generic concept of the present invention are described as non-essential structural elements.

An non-volatile memory device according to an aspect of the present invention includes: a substrate; a memory cell array including: a plurality of first lines arranged in parallel to each other above the substrate; a plurality of second lines arranged in parallel to each other crossing the plurality of first lines three-dimensionally; and a plurality of memory cells each including a first variable resistance element and a first current steering element and placed at a corresponding one of cross-points of the first lines and the second lines; and a parameter generation circuit including: a third line placed above the substrate; a fourth line placed above the third line; and a current steering characteristic reference cell placed between and connected to the third line and the fourth line and including a second variable resistance element and a second current steering element having a same current density-voltage characteristic as a current density-voltage characteristic of the first current steering element, wherein the second variable resistance element includes: a lower electrode layer; a variable resistance layer formed above the lower electrode layer; and an upper electrode layer formed above the variable resistance layer, and in the current steering characteristic reference cell, the second variable resistance element has a side surface with a conductive shorting layer for short-circuiting the upper electrode layer and the lower electrode layer.

In this way, since the first current steering element and the second current steering element have the same current steering characteristic, and the upper electrode layer and the lower electrode layer of the second variable resistance element are electrically shorted, it is possible to determine the current steering characteristic of the first current steering element formed in the memory cell by detecting the current steering characteristic of the second current steering element without being affected by a resistance value even in the case where the variable resistance layer of the second variable resistance element is in a high resistance state.

Furthermore, it is possible to determine the current steering characteristic for each non-volatile memory device by means of the non-volatile memory device including the parameter generation circuit. For example, even when the current steering element characteristic fluctuates above the wafer substrate, it is possible to detect the current steering characteristic for each chip. For this reason, for example, it is possible to change the voltages to be applied to the memory cells based on the parameter of the current steering characteristic obtained by the parameter generation circuit and apply the optimum voltages for operating the memory cells, and to thereby reduce error operations and fluctuations.

In addition, in the embodiment, the second current steering element may be an element for determining a non-linear current steering characteristic of the first current steering element.

In this way, even when the non-linear current steering characteristic of the first current steering element changes (for example, a change is made in property due to an ambient temperature, a repetitive operation, etc), it is possible to determine (estimate) the non-linear current steering characteristic of the first current steering element after the change by detecting the non-linear current steering characteristic of the second current steering element, and to thereby determine the change in the property of the first current steering element.

In addition, in an embodiment, the non-volatile memory device may further include: a control circuit; a write circuit which applies, to one or more predetermined memory cells among the plurality of memory cells, a voltage for writing information to the one or more predetermined memory cells; and a read circuit which applies, to one or more predetermined memory cells among the plurality of memory cells, a voltage for reading the information from the one or more predetermined memory cells, wherein the parameter generation circuit may obtain a parameter indicating a non-linear current steering characteristic of the second current steering element, and output a parameter signal corresponding to the parameter to the control circuit, the control circuit may generate a control signal for controlling the write circuit and the read circuit based on the parameter signal, and output the control signal to at least one of the write circuit and the read circuit, and the at least one of the write circuit and the read circuit may determine the voltage to be applied to the one or more predetermined memory cells based on the control signal.

In this way, it is possible to apply the optimum voltages for operating the memory cells. This makes it possible to realize a stable variable resistance operation (in other words, data writing), and further to detect stably the written data without erroneous recognition.

In addition, in an embodiment, the second current steering element may be larger in the size of the current steering layer than the first current steering element when seen from the direction perpendicular to the upper surface of the substrate.

In this way, it is possible to detect accurately the non-linear current steering characteristic of the second current steering element. For example, even when the second current steering element has a damaged area (for example, an area suffering from plasma damage) around its side surfaces, it is possible to reduce the influence of the damaged area onto the non-linear current steering characteristic by increasing the area of the second current steering element. As a result, it is possible to detect accurately the change in the current steering layer of the first current steering element (for example, the change made in the property due to an ambient temperature, a repetitive operation, etc.), and to reduce an error in a current steering characteristic to be detected in the second current steering element.

In addition, in an embodiment, the first current steering element may include: a lower electrode layer; a current steering layer formed above the lower electrode layer of the first current steering element; and an upper electrode layer formed above the current steering layer of the first current steering element, the second current steering element may include: a lower electrode layer; a current steering layer formed above the lower electrode layer of the second current steering element; and an upper electrode layer formed above the current steering layer of the second current steering element, the lower electrode layer of the first current steering element and the lower electrode layer of the second current steering element may have a same composition, the current steering layer of the first current steering element and the current steering layer of the second current steering element may have a same composition and a same film thickness, and the upper electrode layer of the first current steering element and the upper electrode layer of the second current steering element may have a same composition.

In addition, the current steering layer of the first current steering layer and the current steering layer of the second current steering layer may be formed in a single process.

In this way, the first current steering element and the second current steering element can be configured to have the same current steering characteristic and change in the non-linear current steering characteristic (for example, due to an ambient temperature, a repetitive operation, etc.).

In addition, in an embodiment, the first variable resistance element may include: a lower electrode layer; a variable resistance layer formed above the lower electrode layer of the first variable resistance element; and an upper electrode layer formed above the variable resistance layer of the first variable resistance element, the lower electrode layer of the first variable resistance element and the lower electrode layer of the second variable resistance element may have a same composition, the variable resistance layer of the first variable resistance element and the variable resistance layer of the second variable resistance element may have a same composition and a same film thickness, and the upper electrode layer of the first variable resistance element and the upper electrode layer of the second variable resistance element may have a same composition.

In addition, the variable resistance layer of the first variable resistance element and the variable resistance layer of the second variable resistance element may be formed in a single process.

In this case, the current steering characteristic reference cell and the memory cell can be configured to have the same variable resistance element. Thus, it is possible to easily realize the non-volatile memory device including the parameter generation circuit.

In addition, in an embodiment, in each of the memory cells: the first current steering element and the first variable resistance element may be connected in series; and the first variable resistance element may be placed above the first current steering element, and in the current steering characteristic reference cell: the second variable resistance element and the second current steering element may be connected in series; and the second variable resistance element may be placed above the second current steering element.

In this way, the first variable resistance element and the first current steering element are formed continuously, which makes it possible to realize the memory cell which can operate stably without having parasitic capacitance in the connection part between the first variable resistance element and the first current steering element. In addition, the second variable resistance element and the second current steering element are formed continuously, which makes it possible to realize the current steering characteristic reference cell which can operate stably without having parasitic capacitance in the connection part between the second variable resistance element and the second current steering element.

Furthermore, it is possible to form the first variable resistance element after forming the first current steering element, and to thus form the first variable resistance element without influence of the process of forming the first current steering element. Likewise, it is possible to form the second variable resistance element after forming the second current steering element, and to thus form the second variable resistance element without influence of the process of forming the second current steering element. For this reason, it is possible to form the first variable resistance element and the second variable resistance element each having a stable characteristic. For example, even when a high temperature (at or exceeding a room temperature) is applied when depositing, above the substrate, the layers (the lower electrode layer, the current steering layer, and the upper electrode layer) to be the first current steering element and the layers (the lower electrode layer, the current steering layer, and the upper electrode layer) to be the second current steering element, the high temperature is not applied to the first variable resistance element and the second variable resistance element. For this reason, it is possible to realize the first variable resistance element and the second variable resistance element which operate stably with reduced process thermal budgets.

In addition, in an embodiment, the second current steering element may include: a lower electrode layer; a current steering layer formed above the lower electrode layer of the second current steering element; and an upper electrode layer formed above the current steering layer of the second current steering element, and the conductive shorting layer may be in contact with at least one of the lower electrode layer of the second variable resistance element and the upper electrode layer of the second current steering element.

In addition, the parameter generation circuit may have a plurality of the current steering characteristic reference cells sharing the conductive shorting layer.

In addition, the conductive shorting layer may be a part of the fourth line.

In addition, the fourth line may have a bottom surface positioned deeper than an upper surface of the lower electrode layer of the second variable resistance element.

In this way, it is possible to form the conductive shorting layer having a low resistance value by utilizing the part of the fourth line having a low resistance value as the conductive shorting layer. For this reason, it is possible to reduce an error in a current steering characteristic to be detected in the second current steering element.

In addition, in an embodiment, the parameter generation circuit may include a plurality of the current steering characteristic reference cells, and each of the current steering characteristic reference cells may include the conductive shorting layer.

In addition, the conductive shorting layer may be a part of a contact plug of the current steering characteristic reference cell positioned between the fourth line and the upper electrode layer of the second variable resistance element.

In addition, the first variable resistance element may include: an lower electrode layer; a variable resistance layer formed above the lower electrode layer of the first variable resistance element; and an upper electrode layer formed above the variable resistance layer of the first variable resistance element. The first current steering element may include: a lower electrode layer; a current steering layer formed above the lower electrode layer of the first current steering element; and an upper electrode layer formed above the current steering element of the first current steering element. The memory cell may have a contact plug placed between the second line and the upper electrode layer of the first variable resistance layer. The contact plug of the memory cell may be positioned such that the entire outline thereof is inward of the outline of the variable resistance layer of the first variable resistance element when seen from the direction perpendicular to the upper surface of the substrate, without being in contact with the lower electrode layer of the first variable resistance element and the upper electrode layer of the first current steering element.

In addition, the centers of the contact plug of the current steering characteristic reference cell and the variable resistance layer of the second variable resistance element may be different when seen from a direction perpendicular to an upper surface of the substrate.

In addition, at least part of the outline of the conductive shorting layer may be outward of the outline of the variable resistance layer of the second variable resistance element when seen from the direction perpendicular to the upper surface of the substrate.

In addition, the entire outline of the conductive shorting layer may be outward of the outline of the variable resistance layer of the second variable resistance element when seen from the direction perpendicular to the upper surface of the substrate.

In this way, it is possible to form, as the conductive shorting layer, the side surface in contact with the second variable resistance element of the contact plug connecting the fourth line and the second variable resistance element, and utilize, as the conductive shorting layer, the part of the contact flag having the low resistance value, and to thereby to form the conductive shorting layer having the low resistance value. For this reason, it is possible to reduce an error in a current steering characteristic to be detected in the second current steering element.

In addition, in an embodiment, the first variable resistance element may include: a lower electrode layer; a variable resistance layer formed above the lower electrode layer of the first variable resistance element; and an upper electrode layer formed above the variable resistance layer of the first variable resistance element, and the lower electrode layer of the first variable resistance element and the upper electrode layer of the first variable resistance element may be electrically connected via the variable resistance layer.

In addition, the first current steering element may include a lower electrode layer, a current steering layer formed above the lower electrode layer of the first current steering element, and an upper electrode layer formed above the current steering layer of the first current steering element. The second line does not need to be in contact with the lower electrode layer of the first variable resistance element and the upper electrode layer of the first current steering element.

In addition, the first current steering element may include a lower electrode layer, a current steering layer formed above the lower electrode layer of the first current steering element, and an upper electrode layer formed above the current steering layer of the first current steering element. The memory cell may have a contact plug disposed between the second line and the upper electrode layer of the first variable resistance layer. The contact plug of the memory cell does not need to be in contact with the lower electrode layer of the first variable resistance element and the upper electrode layer of the first current steering element.

In addition, the entire outline of the contact plug of the memory cell may be inward of the outline of the variable resistance layer of the first variable resistance element when seen from the direction perpendicular to the upper surface of the substrate.

In addition, the first variable resistance element may have a side surface covered by a dielectric side wall.

In this way, it is possible to reduce short-circuiting in the variable resistance element of the memory cell.

In addition, in an embodiment, each of the first current steering element and the second current steering element may have a side surface covered by a dielectric side wall.

In this way, the side surfaces of the first current steering element and the second current steering element are protected. Accordingly, an etching process margin in the process of forming the fourth line increases, which makes it possible to realize the memory cell and the current steering characteristic reference cell which can operate stably.

In addition, the first variable resistance element may have a side surface covered by a dielectric side wall.

In this way, the side surfaces of the first variable resistance element are protected. Accordingly, an etching process margin in the process of forming the second line and the fourth line increases, which makes it possible to realize the memory cell and the current steering characteristic reference cell which can operate stably. In addition, the second line and the fourth line can be formed in the same process, and thus it is possible to reduce cost.

In addition, in an embodiment, the conductive shorting layer may be a conductive side wall.

In addition, the current steering layer of the second current steering element may be larger in the variable resistance layer of the second variable resistance element when seen from the direction perpendicular to the upper surface of the substrate, and the current steering layer of the first current steering element may be larger than the variable resistance layer of the first variable resistance element.

In addition, the side surface of the first variable resistance element does not need to be covered by a conductive side wall.

In this way, it is possible to increase an allowable current for the first current steering element, and to thus realize the memory cell which operates stably.

In addition, in an embodiment, in each of the memory cells: the first current steering element and the first variable resistance element may be connected in series; and the first current steering element may be placed above the first variable resistance element, and in the current steering characteristic reference cell: the second current steering element and the second variable resistance element may be connected in series; and the second current steering element may be placed above the second variable resistance element.

In addition, the conductive shorting layer may be a conductive side wall.

In addition, the side surface of the second variable resistance element may be covered by a conductive side wall, and the side surface of the first variable resistance element does not need to be covered by a conductive side wall.

In this way, the first current steering element and the first variable resistance element are formed continuously. Thus, it is possible to realize the memory cell which can operate stably without having parasitic resistance at the connection part between the first current steering element and the first variable resistance element. In this way, the second current steering element and the second variable resistance element are formed continuously. Thus, it is possible to realize the current steering characteristic reference cell which can operate stably without having parasitic resistance at the connection part between the second current steering element and the second variable resistance element.

Furthermore, since it is possible to form the first current steering element after forming the first variable resistance element, it is possible to form the first current steering element without influence of the process of forming the first variable resistance element. Likewise, since it is possible to form the second current steering element after forming the second variable resistance element, it is possible to form the second current steering element without influence of the process of forming the second variable resistance element. For this reason, it is possible to form the first current steering element and the second current steering element each having a stable characteristic. For example, even when a high temperature (at or exceeding a room temperature) is applied when depositing, above the substrate, the layers (the lower electrode layer, the variable resistance layer, and the upper electrode layer) to be the first variable resistance element and the layers (the lower electrode layer, the variable resistance layer, and the upper electrode layer) to be the second variable resistance element, the high temperature is not applied to the first current steering element and the second current steering element. For this reason, it is possible to realize the first current steering element and the second current steering element which operate stably with reduced process thermal budgets.

A non-volatile memory device manufacturing method according to an embodiment of the present invention includes: forming (i) a first current steering element and a first variable resistance element which are included in a memory cell and (ii) a second current steering element and a second variable resistance element which are included in a current steering characteristic reference cell for monitoring a current steering characteristic of the first current steering element. The forming is to form the second variable resistance layer including a lower electrode layer, a variable resistance layer above the lower electrode layer, and an upper electrode layer above the variable resistance layer, and to form conductive shorting layers for short-circuiting the upper electrode layer and the lower electrode layer, on the side surfaces of the second variable resistance element.

In this way, since the first current steering element and the second current steering element have the same current steering characteristic, and the upper electrode layer and the lower electrode layer of the second variable resistance element are electrically shorted, it is possible to determine the current steering characteristic of the first current steering element formed in the memory cell by detecting the current steering characteristic of the second current steering element without detecting a resistance value thereof even when the variable resistance layer of the second variable resistance element is in a high resistance state.

Furthermore, by forming the parameter generation circuits in the respective chips, it is possible to detect current steering characteristics of the respective chips even when current steering characteristics fluctuate above the wafer substrate. For this reason, for example, it is possible to change the voltages to be applied to the memory cells based on the parameters of the current steering characteristics obtained by the parameter generation circuit and apply the optimum voltages for operating the memory cells, and to thereby reduce error operations and fluctuations.

In addition, the forming may include forming: a first conductive layer above the substrate; a current steering layer on the first conductive layer; a second conductive layer on the current steering layer; a third conductive layer on the second conductive layer; a variable resistance layer on the third conductive layer; a fourth conductive layer on the variable resistance layer; an upper electrode layer of the first variable resistance element and an upper electrode layer of the second variable resistance element by patterning the fourth conductive layer; a variable resistance layer of the first variable resistance element and a variable resistance layer of the second variable resistance element by patterning the variable resistance layer; a lower electrode layer of the first variable resistance element and a lower electrode layer of the second variable resistance element by patterning the third conductive layer; an upper electrode layer of the first current steering element and an upper electrode layer of the second current steering element by patterning the second conductive layer; a current steering layer of the first current steering element and a current steering layer of the second current steering element by patterning the current steering element; a lower electrode layer of the first current steering element and a lower electrode layer of the second current steering element by patterning the first conductive layer; and a conductive shorting layer.

In this way, the first current steering element of the memory cell and the second current steering element of the current steering characteristic reference cell include the same electrode layers and the same current steering layers, and thus have the same current steering characteristic. For this reason, by detecting the current steering characteristic of the second current steering element makes it possible to determine the current steering characteristic of the first current steering element formed in the memory cell.

Furthermore, it is possible to manufacture such a non-volatile memory device according to semiconductor manufacturing processes using conventional CMOS manufacturing processes. Accordingly, there is no need to perform a unique and special semiconductor manufacturing process in each of the processes of forming the variable resistance element and the current steering element. Therefore, it is possible to realize the manufacturing method highly compatible with increasingly finer semiconductor manufacturing processes.

In an embodiment, the forming of a conductive shorting layer may be forming a line to be connected to an upper electrode layer of the second variable resistance element, so as to utilize a part of the line as the conductive shorting layer.

In this way, it is possible to form the fourth line and the conductive shorting layer at the same time, and to thereby reduce the number of manufacturing processes.

In an embodiment, the forming of a conductive shorting layer may be forming the line and also a contact plug of a current steering characteristic reference cell for connecting the line and an upper electrode layer of the second variable resistance element, so as to utilize, as the conductive shorting layer, a part of a contact plug of the current steering characteristic reference cell.

In addition, in the forming of the conductive shorting layer, the conductive shorting layer may be formed such that the centers of the contact plug of the current steering characteristic reference cell and the variable resistance layer of the second variable resistance element are different when seen from the direction perpendicular to the upper surface of the substrate.

In this way, it is possible to form the contact plug and the conductive shorting layer at the same time, and to thereby reduce the number of manufacturing processes.

In an embodiment, the forming of a conductive shorting layer may be forming the conductive shorting layer such that at least a part of the outline of the conductive shorting layer is positioned outward of the outline of the variable resistance layer of the second variable resistance element when seen from the direction perpendicular to the upper surface of the substrate.

In this way, the contact plugs and the second variable resistance element have a larger superposition area, which makes it possible to manufacture the current steering characteristic reference cell capable of operating stably with a superposition margin.

In an embodiment, the forming of an element may include forming a dielectric side wall at each of side surfaces of the first current steering element and the second current steering element before forming the conductive shorting layer.

In this way, etching process margin increases in the forming of a fourth line which can be utilized as the conductive shorting layer. Thus, it is possible to manufacture the second current steering element stably.

In an embodiment, the forming of a dielectric side wall may be forming a dielectric side wall at each of side surfaces of the first variable resistance element.

In this way, it is possible to form the second line and the conductive shorting layer at the same time, and form the contact plug and the conductive shorting layer which are connected to the memory cell via the second line at the same time. Furthermore, the etching margin increases in the forming of the fourth line and the second line. Thus, it is possible to manufacture the current steering characteristic reference cell and the memory cell stably.

In an embodiment, the forming of an element may be forming the first current steering element, the first variable resistance element, the second current steering element, and the second variable resistance element, such that, when seen from the direction perpendicular to the upper surface of the substrate, the variable resistance layer of the first variable resistance element is smaller in area than the current steering layer of the first current steering element and the variable resistance layer of the second variable resistance element is smaller in area than the current steering layer of the second current steering element.

In this way, it is possible to form the second current steering element larger than the second variable resistance element and the first current steering element larger than the first variable resistance layer, and thus to increase an allowable current of the first current steering element. Therefore, it is possible to manufacture the memory cell which operates stably.

In an embodiment, the forming of a conductive shorting layer may be forming conductive side walls which cover side surfaces of the upper electrode layer, variable resistance layer, and lower electrode layer of the second variable resistance element, and utilizing the conductive side walls resulting from the conductive shorting layer.

In this way, it is possible to form, at the same time, the current steering element in the memory cell and the current steering element in the current steering characteristic reference cell both of which are larger than the variable resistance element, and thus to increase an allowable current for the current steering element. Thus, it is possible to manufacture the memory cell which operates stably. In addition, it is possible to form the fourth line and the second line at the same time, and to thereby reduce the number of manufacturing processes.

In an embodiment, the forming of an element may include forming: a third conductive layer above the substrate; a variable resistance layer above the third conductive layer; a fourth conductive layer above the variable resistance layer; a first conductive layer above the fourth conductive layer; a current steering layer above the first conductive layer; a second conductive layer above the current steering layer; an upper electrode layer of the first variable resistance element and an upper electrode layer of the second variable resistance element by patterning the second conductive layer; a current steering layer of the first current steering element and a current steering layer of the second current steering element by patterning the current steering layer; a lower electrode layer of the first current steering element and a lower electrode layer of the second current steering element by patterning the first conductive layer; an upper electrode layer of the first variable resistance element and an upper electrode layer of the second variable resistance element by patterning the fourth conductive layer; a variable resistance layer of the first variable resistance element and a variable resistance layer of the second variable resistance element by patterning the variable resistance layer; a lower electrode layer of the first variable resistance element and a lower electrode layer of the second variable resistance element by patterning the third conductive layer; and the conductive shorting layer.

In addition, the forming of a conductive shorting layer may be forming conductive side walls which cover side surfaces of the upper electrode layer, the variable resistance layer, and the lower electrode layer of the second variable resistance element, and utilizing the conductive side walls resulting from the conductive shorting layer.

In this way, the first current steering element and the second current steering element include the same electrode layers and the same current steering layers, and thus have the same current steering characteristic. For this reason, by detecting the current steering characteristic of the second current steering element makes it possible to determine the current steering characteristic of the first current steering element formed in the memory cell.

Furthermore, even when a high temperature (at or exceeding a room temperature) is applied when depositing, above the substrate, the layers (the lower electrode layer, the variable resistance layer, and the upper electrode layer) of the first variable resistance element, the high temperature is not applied to the first current steering element. For this reason, it is possible to form the first current steering element with reduced process thermal budgets, resulting in increase in the flexibility in selecting materials for the lower electrode, the current steering layer, and the upper electrode of the first current steering element.

Furthermore, it is possible to manufacture such a nonvolatile memory device according to semiconductor manufacturing processes using conventional CMOS manufacturing processes. Accordingly, there is no need to perform a unique and special semiconductor manufacturing process in each of the processes of forming the variable resistance element and the current steering element. Therefore, it is possible to realize the manufacturing method highly compatible with increasingly finer semiconductor manufacturing processes.

The first current steering element and the second current steering element have substantially the same form. The first current steering element and the second current steering element may show the same current density-voltage characteristic. Here, in the case of "the same current density-voltage characteristic", the second current control element has substantially the same characteristic as that of the first current steering element, within a fluctuation range of 10%. Examples of the characteristics include a threshold voltage, an off-current density, and on-current density, and do not include a parasitic resistance component.

In addition, "the same composition" and "the same film thickness" mean a composition and a film thickness which make it possible to substantially equalize the same current density-voltage characteristic of the first current steering element and the second current steering element. In other words, "substantially the same composition" is a composition indicating an equivalent current density-voltage characteristic in the case of an approximately same film thickness, and "substantially the same film thickness" is a film thickness indicating an equivalent voltage characteristic in the case of a same composition.

Embodiment 1

Descriptions are given of an exemplary structure of a non-volatile memory device according to Embodiment 1 of the present invention and a method for manufacturing the same.

FIG. 1 is a block diagram showing a part of the structure of the non-volatile memory device according to this embodiment.

This non-volatile memory device includes: a memory cell array 10, a parameter generation circuit 20 electrically connected to the memory cell array 10. It is to be noted that the non-volatile memory device may further include, for example, an amplifier which connects the memory cell array 10 and the current steering element parameter generation circuit 20.

The memory cell array 10 includes: a plurality of bit lines and a plurality of word lines which three-dimensionally cross each other; and a plurality of memory cells which are arranged at cross-points of the plurality of bit lines and the plurality of word lines and in each of which a first variable resistance element and a first current steering element are connected in series. Each memory cell has an end connected to a corresponding one of the bit lines and an end connected to a corresponding one of the word lines. The memory cell array 10 further includes: a bit line selection circuit, a word line selection circuit, a write driver circuit which applies, to one or more predetermined memory cells among the plurality of memory cells, a voltage for writing information thereto; a read driver circuit which applies, to the one or more predetermined memory cells, a voltage for reading information from the one or more predetermined memory cells; a power source circuit, and a control circuit which controls these circuits. The parameter generation circuit 20 includes a plurality of current steering characteristic reference cells (hereinafter simply referred to as reference cells) including a second variable resistance element having a conductive shorting layer at a side surface (a side surface part) and a second current steering element as an element for determining a non-linear current steering characteristic of the first current steering element. In other words, in the parameter generation circuit 20, the upper electrode layer and the lower electrode layer of the second variable resistance element are electrically shorted, and the parameter generation circuit 20 generates the value of a parameter indicating a non-linear current steering characteristic of the second current steering element without the variable resistance layer being interposed therebetween, that is, without being affected by the value of a resistance in the resistance layer. The non-linear current steering characteristic in the first current steering element of the memory cell 11 is determined based on the value of the parameter. More specifically, the parameter generation circuit 20 measures the non-linear current steering characteristic of the second current steering element, extracts (obtains) the parameter indicating the non-linear current steering characteristic such as a threshold value voltage (VF) of the second current steering element, and supplies (outputs) the parameter value (a parameter signal corresponding to the obtained parameter) to the control circuit of the memory cell array 10. The control circuit for the memory cell array 10 calculates an application voltage required for a read operation or a write operation from the given parameter value, and outputs the control signal to the power source circuit, and the write driver circuit or the read circuit, etc. In other words, the control circuit generates a control signal which controls the write driver circuit and the read circuit based on the parameter signal, and outputs the control signal to at least one of the write driver circuit and the read circuit. The power source circuit, and the write driver circuit or the read circuit etc. outputs an appropriate application voltage according to the input control signal. In other words, at least one of the power source circuit, and the write driver circuit or the read circuit determines the voltage to be applied to the one or more predetermined memory cells based on the control signal.

Figure 3A:
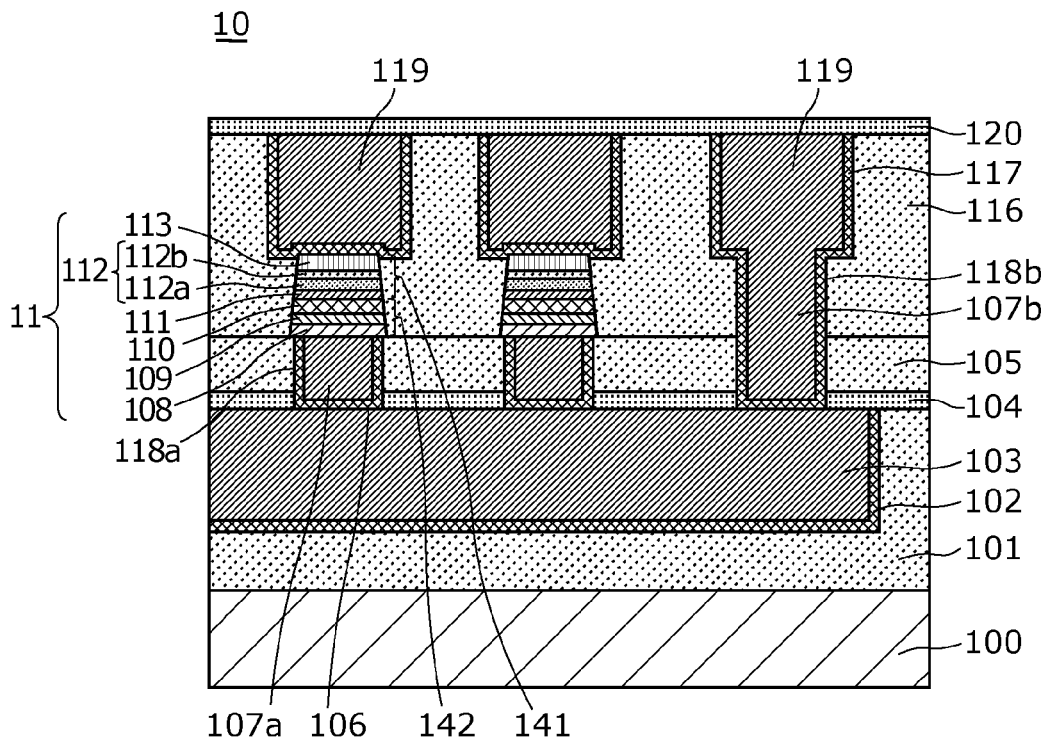
FIG. 3A is a cross-sectional view of an exemplary structure of a memory cell array according to Embodiment 1 of the present invention.
Figure 3B:
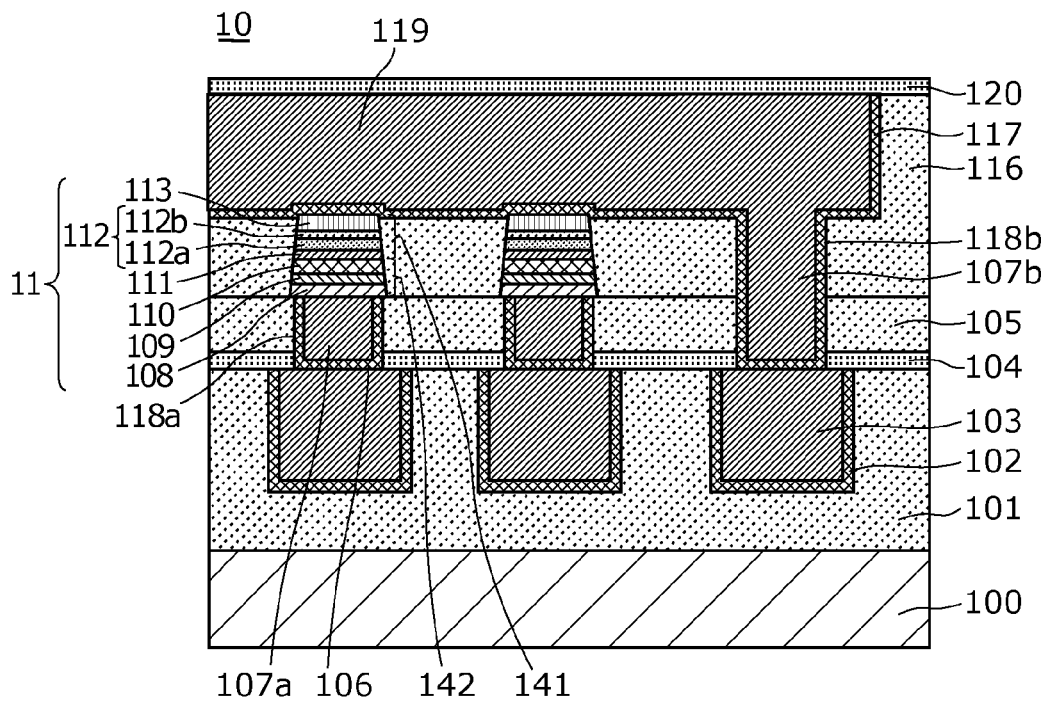
FIG. 3B is a cross-sectional view of an exemplary structure of a memory cell array according to Embodiment 1 of the present invention.
Figure 3C:
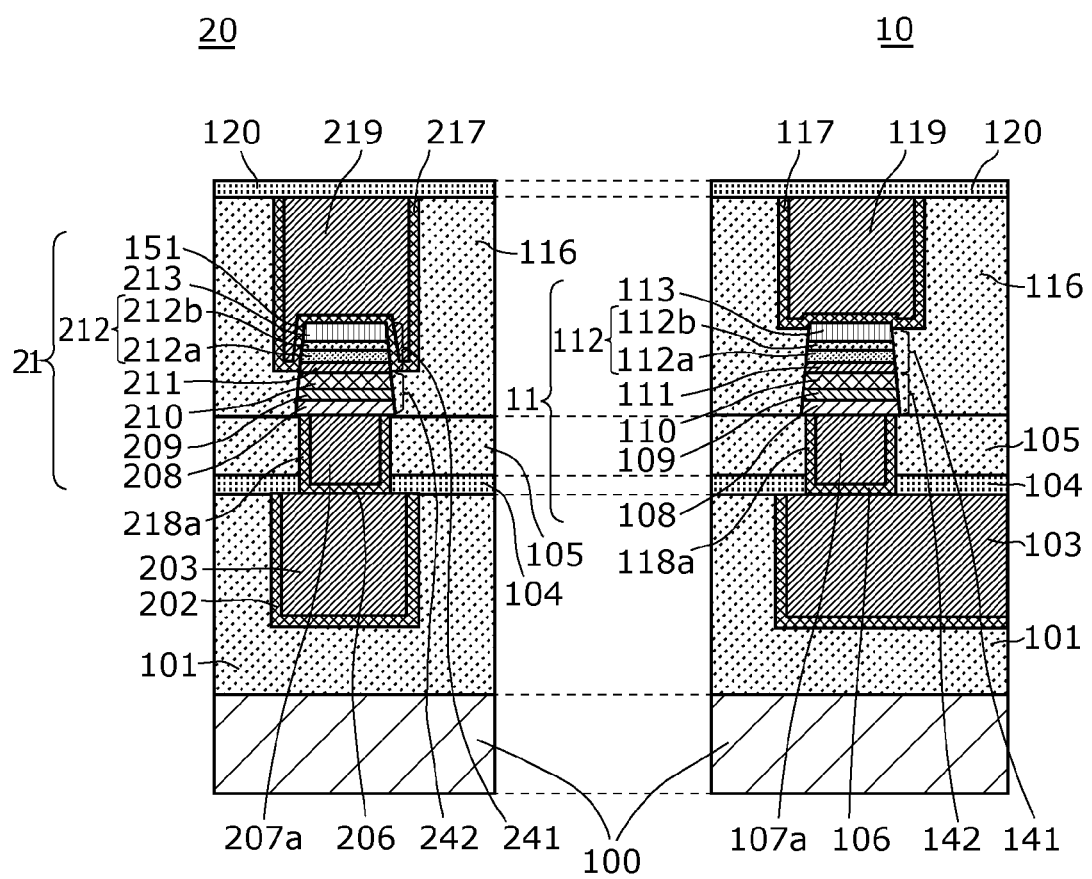
FIG. 3C is a cross-sectional view of an exemplary structure of the non-volatile memory device according to Embodiment 1 of the present invention.

FIG. 2 is a plan view showing a part of the structure of the non-volatile memory device according to this embodiment. Each of FIG. 3A and FIG. 3B is a cross-sectional view of an exemplary structure of the memory cell array 10 according to this embodiment. FIG. 3C is a cross-sectional view of an exemplary structure of the non-volatile memory device according to this embodiment. FIG. 3A is a cross-sectional view of the cross section along the alternate long and short dash line shown in the A-A' in FIG. 2 when seen from the arrow direction. FIG. 3B is a cross-sectional view of the cross section along the alternate long and short dash line shown in the B-B' in FIG. 2 when seen from the arrow direction. FIG. 3C is a cross-sectional view of the cross section along the alternate long and short dash line shown in the D-D' in FIG. 2 when seen from the arrow direction.

The non-volatile memory device according to this embodiment includes a substrate 100, a memory cell array 10, and a parameter generation circuit 20. The memory cell array 10 includes: a substrate 100; a first interlayer dielectric 101 formed above the substrate 100; a second interlayer dielectric 105; a third interlayer dielectric 116; a plurality of first lines 103 arranged in stripes parallel to each other above the substrate 100 between the substrate 100 and the second interlayer dielectric 105; a plurality of second lines 119 arranged in stripes parallel to each other in the second interlayer dielectric 105 such that the plurality of second lines 119 in stripes three-dimensionally cross the plurality of first lines 103; and a plurality of memory cells 11 which are arranged in the third interlayer dielectric 116 formed at the cross-points of the first lines 103 and the second lines 119 and each of which includes a variable resistance element 141 and a first current steering element 142. The parameter generation circuit 20 includes third lines 203 (formed in the layer in which the first lines 103 are formed) placed above the substrate 100 between the substrate 100 and the second interlayer dielectric 105, and fourth lines 219 (formed in the layer in which the second lines 119 are formed) placed above the third lines 203 (above the second interlayer dielectric 105). The parameter generation circuit 20 further includes a reference cell 21 formed in the third interlayer dielectric 116 formed between and connected to the third lines 203 and the fourth lines 219, and including a second variable resistance element 241 and a second current steering element 242. Here, the second current steering element 242 includes the same current density-voltage characteristic as that of the first current steering element 142. The second variable resistance element 241 includes: a fourth lower electrode layer 211; a second variable resistance layer 212 formed above the fourth lower electrode layer 211; and a fourth upper electrode layer 213 formed above the second variable resistance layer 212. In the current steering characteristic reference cell 21, the second variable resistance element 241 includes, at its side surface, a conductive shorting layer 151 which short-circuits the fourth upper electrode layer 213 and the fourth lower electrode layer 211. The second current steering element 242 is connected to the third lines 203 and the fourth lines 219 without the second variable resistance layer 212 being interposed therebetween.

The first current steering element 142 includes: a first lower electrode layer 108, a first current steering layer 109 formed above the first lower electrode layer 108; and a first upper electrode layer 110 formed above the first current steering layer 109. The second current steering element 242 includes: a second lower electrode layer 208, a second current steering layer 209 formed above the second lower electrode layer 208; and a second upper electrode layer 210 formed above the second current steering layer 209. The first lower electrode layer 108 and the second lower electrode layer 208 have substantially the same composition, the first current steering layer 109 and the second current steering layer 209 have substantially the same composition and film thickness, and the first upper electrode layer 110 and the second upper electrode layer 210 have substantially the same composition.

The first current steering layer 109 and the second current steering layer 209 are formed in the same process.

In the memory cell 11, a stack structure is formed which includes the first current steering element 142 and the first variable resistance element 141 are connected in series, and the first variable resistance element 141 is formed above the first current steering element 142. In the reference cell 21, a stack structure is formed which includes the second current steering element 242 and the second variable resistance element 241 are connected in series, and the second variable resistance element 241 is formed above the second current steering element 242.

The first variable resistance element 141 includes: a third lower electrode layer 111 formed above the first upper electrode layer 110, a first variable resistance layer 112 formed to be a stack of a first oxide layer 112a including a first metal oxide of an oxygen deficiency type formed above the third lower electrode layer 111 and a second oxide layer 112b including a second metal oxide having a small oxygen deficiency and a high resistance value compared to the first metal oxide, and a third upper electrode layer 113 formed above the first variable resistance layer 112. The third lower electrode layer 111 and the fourth lower electrode layer 211 have substantially the same composition, the first variable resistance layer 112 and the second variable resistance layer 212 have substantially the same composition and film thickness, and the third upper electrode layer 113 and the fourth upper electrode layer 213 have substantially the same composition.

The first variable resistance layer 112 and the second variable resistance layer 212 are formed in the same process.

The third upper electrode layer 113 and the fourth upper electrode layer 213 is made of a noble metal including iridium, platinum, or palladium.

For example, the first metal oxide includes one of a tantalum oxide $TaO_x$ ($0<x<2.5$), a hafnium oxide $HfO_x$ ($0<x<2.0$), and a zirconium oxide $ZrO_x$ ($0<x<2.0$) etc. which are of an oxygen deficiency type. Here, a material of an oxygen deficiency type is a material having a stoichiometric composition, refers to a metal oxide having a less oxygen content atomic percentage than a metal oxide exhibiting an insulation property, and is normally shows characteristics of semiconductors. As another example, the second metal oxide includes one of a tantalum oxide $TaO_y$ ($x<y$), a hafnium oxide $HfO_y$ ($x<y$), and a zirconium oxide $ZrO_y$ ($x<y$) etc. The second metal oxide is typically a metal oxide having an extremely high resistance or an insulation property. In other words, the second metal oxide may have an oxygen deficiency of 0 (stoichiometric composition) or a negative value (oxygen-excessive type).

The conductive shorting layer 151 is in contact with the fourth upper electrode layer 213 and the fourth lower electrode layer 211.

The parameter generation circuit 20 includes a plurality of reference cells 21, and each of the reference cells 21 includes a conductive shorting layer 151.

The conductive shorting layer 151 is formed as parts of the fourth line 219 and a third barrier metal layer 217 (the parts positioned at the both sides including the parts in contact with the side surfaces of the second variable resistance element 241, in other words, the side surfaces of the fourth upper electrode layer 213 and the fourth lower electrode layer 211).

Here, the third barrier metal layer 117 may be replaced with the second line 119 without formation of the third barrier metal layer 117 in the wiring groove, and the third barrier metal layer 217 may be replaced with the fourth line 219 without formation of the third barrier metal layer 217 in the wiring groove. In each of FIG. 1 to FIG. 5I showing this embodiment, the third barrier metal layer 117 in the wiring groove is a part of the second lines 119, and the third barrier metal layer 217 in the wiring groove is a part of the fourth lines 219. In this case, the conductive shorting layer 151 is formed as parts of the fourth lines 219 (the parts positioned at the both sides including the parts in contact with the side surfaces of the second variable resistance element 241, in other words, the side surfaces of the fourth upper electrode layer 213 and the fourth electrode layer 211).

The bottom surfaces of the fourth lines 219 are positioned deeper than the upper surface of the fourth lower electrode layer 211.

The second lines 119 are not in contact with the third lower electrode layer 111 and the first upper electrode layer 110.

The third lower electrode layer 111 and the third upper electrode layer 113 are not short-circuited.

Hereinafter, an exemplary non-volatile memory device according to this embodiment is described in detail.

The memory cell array 10 shown in FIG. 2 includes: a plurality of first lines 103, a plurality of second lines 119, and a plurality of memory cells 11 each including a first variable resistance element 141 and a first current steering element 142.

The plurality of first lines 103 are formed above the substrate 100 on which transistors etc. are formed. The plurality of first lines 103 are formed in stripes parallel to each other. The plurality of second lines 119 are formed in stripes parallel to each other. It is to be noted that the first lines 103 and the second lines 119 are arranged orthogonal to each other in the descriptions below, but these lines do not always need to be arranged orthogonal to each other as long as they are arranged to cross each other. In addition, at the respective cross-points at which the plurality of first lines 103 and the plurality of second lines 119 cross each other, memory cells 11 are formed each of which includes the first variable resistance element 141 and the first current steering element 142.

A specific structure of the memory cell array 10 is described below.

As shown in each of FIGS. 3A, 3B, and 3C, the memory cell array 10 is formed above the substrate 100 and includes: a first interlayer dielectric 101, a first barrier metal layer 102, the first lines 103, a first liner layer 104, a second interlayer dielectric 105, a second barrier metal layer 106, plugs 107a and 107b, the variable resistance element 141, the first current steering element 142, a third interlayer dielectric 116, a third barrier metal layer 117, contact holes 118a and 118b, the second lines 119, and a second liner layer 120.

The first barrier metal layer 102 is formed within a wiring groove formed to embed the first lines 103 to the first interlayer dielectric 101. This first barrier metal layer 102 is formed, for example, by sequentially depositing a tantalum nitride having a thickness from 5 nm to 40 nm and a tantalum having a thickness from 5 nm to 40 nm.

The first lines 103 are formed in the first interlayer dielectric 101, and include, for example, copper or the like. More specifically, each first line 103 is formed such that the wiring groove is fully filled with the first line 103 and the first barrier metal layer 102 above the first barrier metal layer 102 formed in the wiring groove of the first interlayer dielectric 101.

The first liner layer 104 is formed above the first interlayer dielectric 101 including the first line 103. This first liner layer 104 includes, for example, a silicon nitride having a thickness from 30 nm to 200 nm.

The second interlayer dielectric 105 is formed above the first liner layer 104, and includes, for example, a silicon oxide having a thickness from 100 nm to 500 nm.

Here, the first liner layer 104 and the second interlayer dielectric 105 include the contact holes 118a and 118b.

The second barrier metal layer 106 is formed in the first liner layer 104 and the second interlayer dielectric layer 105, specifically in the contact hole 118a formed in the first liner layer 104 and the second interlayer dielectric 105. The second barrier metal layer 106 is formed by, for example, sequentially depositing a tantalum nitride having a thickness from 5 nm to 40 nm and a tantalum having a thickness from 5 nm to 40 nm.

The plug 107a is formed in the contact hole 118a in the first liner layer 104 and the second interlayer dielectric 105, and is electrically connected to the first line 103. More specifically, the plug 107a is formed above the second barrier metal layer 106 in the contact hole 118a formed in the first liner layer 104 and the second interlayer dielectric 105, and is electrically connected to the first line 103. This plug 107a is formed, for example, to have a diameter from 50 nm to 200 nm.

The plug 107b is formed in the contact hole 118b in the first liner layer 104 and the second interlayer dielectric 105, and is electrically connected to the first line 103. More specifically, the plug 107b is formed above the third barrier metal layer 117 in the contact hole 118b formed in the first liner layer 104 and the second interlayer dielectric 105, and is electrically connected to the first line 103. This plug 107b is formed, for example, to have a diameter from 50 nm to 200 nm.

The first current steering element 142 is an MIM diode or a Metal Semiconductor Metal (MSM) diode or the like, formed above the second interlayer dielectric 105, and is connected to the plug 107a electrically and physically. This first current steering element 142 includes a first lower electrode layer 108, a first current steering layer 109, and a first upper electrode layer 110.

The first lower electrode layer 108 is formed above the substrate 100 (specifically, above the second interlayer dielectric 105), and includes a tantalum nitride or the like. The first current steering layer 109 is formed above the first lower electrode layer 108, and includes a silicon nitride of a nitrogen-deficiency type or the like. The first upper electrode layer 110 is formed above the first current steering layer 109, and includes a tantalum nitride or the like.

Here, the silicon nitride of a nitrogen-deficiency type is a nitride having a composition in which the component z of the nitride N when the silicon nitride is presented as $SiN_z$ ($0<z$) is less than the amount which realizes a stoichometrically stable state (a stoichometric composition). Here, the silicon nitride includes stoichometrically stable $Si_3N_4$, and thus the silicon nitride is of a nitrogen-deficiency type when $0<z<1.33$ is satisfied. Accordingly, when the nitrogen-deficient silicon nitride is used for the first current steering layer 109 and the tantalum nitride is used as an electrode material for the first lower electrode layer 108 and the first upper electrode layer 110, on condition that $0<z\leq0.85$ is satisfied, $SiN_z$ shows semiconductor characteristics, and it is possible to configure an MSM diode capable of turning on and off a voltage or current which is sufficient for realizing variable resistance.

The tantalum nitride has a work function of 4.6 eV which is sufficiently higher than an electron affinity of 3.8 eV of silicon, a Schottky barrier is formed at an interface between the first lower electrode layer 108 and the first current steering layer 109 and an interface between the first current steering layer 109 and the first upper electrode layer 110. In addition, a metal such as tantalum having a high melting point and a nitride thereof has an excellent heat resistance, and shows stable characteristics even when a current having a large current density is applied. For the reasons stated above, the electrode material used for the first current steering element 142 as the MSM diode may be tantalum, a tantalum nitride, titanium, a titanium nitride, tungsten, a tungsten nitride, or the like.

The first current steering element 142 is formed as described above.

The first variable resistance element 141 is formed to be connected in series to the first current steering element 142 and above the first current steering element 142. This first current steering element 141 includes a third lower electrode layer 111, a first variable resistance layer 112, and a third upper electrode layer 113.

The third lower electrode layer 111 is formed above the first upper electrode layer 110. The first variable resistance layer 112 is formed above the third lower electrode layer 111, and the third upper electrode layer 113 is formed above the first variable resistance layer 112. This first variable resistance layer 112 is interposed between the third lower electrode layer 111 and the third upper electrode layer 113, and has a resistance value which is reversibly variable based on an electric signal given between the third lower electrode layer 111 and the third upper electrode layer 113. For example, the first variable resistance layer 112 is a layer in which a change between a high resistance state and a low resistance state is made according to the polarity of a voltage given between the third lower electrode layer 111 and the third upper electrode layer 113. The first variable resistance layer 112 is formed by stacking at least two layers of a first oxide layer 112a (high oxygen-deficient layer, lower resistance layer) connected to the third lower electrode layer 111 and a second oxide layer 112b (low oxygen-deficient layer, higher resistance layer) connected to the third upper electrode layer 113.

The first oxide layer 112a includes a first metal oxide of an oxygen deficiency type, and the second oxide layer 112b includes a second metal oxide having an oxygen deficiency smaller than that of the first metal oxide. The second oxide layer 112b of the variable resistance element includes microlocal areas formed therein and having an oxygen deficiency which reversibly variable depending on application of an electric pulse. It is considered that these local areas include filament including oxygen vacant sites.

An "oxygen deficiency" is a rate of deficient oxygen with respect to the amount of oxygen of an oxide in a stoichiometric composition of a metal oxide (the stoichiometric composition is the one having the highest resistance value when a plurality of stoichiometric compositions are present in the metal oxide). The metal oxide having the stoichiometric composition is stable and has a high resistance value compared to the other metal oxides having the other compositions.

In an exemplary case where the metal is tantalum (Ta), the stoichiometric composition of the oxide as defined above is $Ta_2O_5$, and $TaO_{2.5}$ can be presented. The oxygen deficiency of $TaO_{2.5}$ is 0%, and the oxygen deficiency of $TaO_{1.5}$ is 40% according to the expression: oxygen deficiency=$(2.5-1.5)/2.5$. In addition, an oxygen-excessive metal oxide has a negative-value oxygen deficiency. In this DESCRIPTION, it is assumed that an oxygen deficiency may have a positive value or a negative value unless otherwise specified.

The oxide having a small oxygen deficiency is closer to an oxide having a stoichiometric composition and thus has a high resistance value, and the oxide having a large oxygen deficiency is closer to a metal included in the oxide and thus has a low resistance value An "oxygen content atomic percentage" is a rate of oxygen atoms in the total number of atoms. For example, the oxygen atomic percentage of Ta2O5 is 71.4 atm % obtained from the rate (O/(Ta+O) of the oxygen atoms in the total number of atoms). Accordingly, the oxygen-deficient tantalum oxide has an oxygen atomic percentage having a value larger than 0 and smaller than 71.4 atm %. For example, when a metal included in a first metal oxide and a metal included in a second metal oxide is of a same kind, the oxygen atomic percentage has a correspondence with the oxygen deficiency. In other words, when the second metal oxide has an oxygen atomic percentage larger than the oxygen atomic percentage of the first metal oxide, the second metal oxide has an oxygen deficiency smaller than the oxygen deficiency of the first metal oxide.

As a metal included in the first variable resistance layer 112, it is possible to use a transition metal or aluminium (Al). The transition metal used here is tantalum (Ta), titanium (Ti), hafnium (Hf), zirconium (Zr), niobium (Nb), tungsten (W), nickel (Ni), or the like. A transition metal can take a plurality of oxygen states, and thus it is possible to realize different resistance states due to oxidation reduction reaction.

Here is an exemplary case where a tantalum oxide is used for the first variable resistance layer 112. When the first metal oxide which becomes the first oxide layer 112a has a composition of TaOx and x is from 0.8 to 1.9, and when the second metal oxide which becomes the second oxide layer 112b has a composition of TaOy and y has a value larger than x, it is possible to change the resistance value of the first variable resistance layer 112 stably and quickly. In this case, the second oxide layer 112b made of the second metal oxide may have a film thickness from 3 nm to 4 nm.

Here is an exemplary case where a hafnium oxide is used for the first variable resistance layer 112. When the first metal oxide which becomes the first oxide layer 112a has a composition of HfOx and x is from 0.9 to 1.6, and when the second metal oxide which becomes the second oxide layer 112b has a composition of HfOy and y has a value larger than x, it is possible to change the resistance value of the first variable resistance layer 112 stably and quickly. In this case, the second oxide layer 112b made of the second metal oxide may have a film thickness from 3 nm to 4 nm.

Here is an exemplary case where a zirconium oxide is used for the first variable resistance layer 112. When the first metal oxide which becomes the first oxide layer 112a has a composition of ZrOx and x is from 0.9 to 1.4, and when the second metal oxide which becomes the second oxide layer 112b has a composition of ZrOy and y has a value larger than x, it is possible to change the resistance value of the first variable resistance layer 112 stably and quickly. In this case, the second oxide layer 112b made of the second metal oxide may have a film thickness from 1 nm to 5 nm.

Here, different metals may be used as the first metal included in the first metal oxide and the second metal included in the second metal oxide. In this case, the second metal oxide may have a small oxygen deficiency, in other words, a high resistance value compared to the first metal oxide. With this structure, a voltage applied between the third lower electrode 111 and the third upper electrode 113 during resistance change is largely distributed to the second metal oxide, which facilitates oxidation reduction reaction in the second metal oxide.

In addition, when using different materials as the first metal included in the first metal oxide and the second metal included in the second metal, the second metal oxide may have a small standard electrode potential smaller than a standard electrode potential of the first metal. A larger standard electrode material presents a higher oxygen resistance property. In this way, oxidation reduction reaction is facilitated in the second metal oxide having a comparatively small standard electrode potential. It is to be considered that a resistance change phenomenon is a change in a resistance value (oxygen deficiency) made by a change in a filament (an electricity conduction path) made due to oxidation reduction reaction in micro-local areas formed in the highly resistant second metal oxide.

For example, it is possible to realize stable resistance change operations using an oxygen-deficient tantalum oxide (TaOx) as the first metal oxide and using a titanium oxide (TiO2) as the second metal oxide. Titanium (having a standard electrode potential of −1.63 eV) is lower in standard electrode potential than tantalum (having a standard electrode potential of −0.6 eV). In this way, it is possible to facilitate oxidation reduction reaction in the second metal oxide using, as the second metal oxide, the metal oxide having the standard electrode potential lower than the standard electrode potential of the first metal oxide. As another combination, it is possible to use aluminum oxide (Al2O3) as the second metal oxide which becomes the high resistance layer. For example, it is also good to use an oxygen-deficient tantalum oxide (TaOx) as the first metal oxide, and use an aluminum oxide (Al2O3) as the second metal oxide.

It is considered that the resistance change phenomenon in the variable resistance layer in the stack structure is a change in a resistance value in any of cases of a resistance change to a high resistance state or a resistance change to a low resistance state made by a change, due to oxidation reduction reaction, made in a filament (an electricity conduction path) in micro-local areas formed in the highly resistant second oxide layer 112b.

In other words, when a voltage which is positive with respect to the third lower electrode layer 111 is applied to the third upper electrode layer 113 connected to the second oxide layer 112b, oxygen ions in the first variable resistance layer 112 are drawn to the side of the second oxide layer 112b. In this way, oxidation reaction occurs in the micro-local areas formed in the second oxide layer 112b, with a decrease in the oxygen deficiency. As a result, the filament in the local areas is less active, which increases a resistance value therein.

On the other hand, when a voltage which is negative with respect to the third lower electrode layer 111 is applied to the third upper electrode layer 113 connected to the second oxide layer 112b, oxygen ions in the second oxide layer 112b are pushed to the side of the first metal oxide layer. In this way, oxidation reduction reaction occurs in the micro-local areas formed in the second oxide layer 112b, with an increase in the oxygen deficiency. As a result, the filament in the local areas is more active, which decreases a resistance value therein.

The third upper electrode layer 113 connected to the second oxide layer 112b having the smaller oxygen deficiency includes a material having a standard reference potential higher than a metal such as platinum (Pt), iridium (Ir), and palladium (Pd) included in the metal included in the second metal oxide and a material included in the first electrode. In addition, the third lower electrode layer 111 connected to the first oxide layer 112a having the higher oxygen deficiency may include a material having a standard reference potential further lower than the metal included in the first metal oxide such as tungsten (W), nickel (Ni), tantalum (Ta), titanium (Ti), aluminium (Al), a tantalum nitride (TaN), and a titanium titanium (TiN). A larger standard electrode material presents a higher oxygen resistance property.

In other words, relationships that Vr2<V2 and V1<V2 may be satisfied when V2 denotes the standard electrode potential of the third upper electrode layer 113, Vr2 denotes the standard electrode potential of the metal included in the second metal oxide, Vr1 denotes the standard electrode potential of the metal included in the first metal oxide, and V1 denotes the standard electrode potential of the third lower electrode layer 111. Furthermore, relationships that V2>Vr2 and Vr1≥V1 may also be satisfied.

With the above structure, oxidation reduction reaction selectively occurs in the second metal oxide in the proximity of the interface between the third upper electrode layer 113 and the second oxide layer 112b, which can achieve stable variable resistance phenomena.

Irrespective of which one of the materials is to be used to form the second oxide layer 112b, an initial break may be required to stably change the state of the variable resistance element at the time immediately after the manufacturing. Such an initial break is normally performed once to form a low-resistance part (filament) in the second oxide layer 112b when the second oxide layer 112b immediately after the manufacturing has a resistance value larger than the value in the high resistance state in the case of a change into the low resistance state. When the second oxide layer 112b has a large thickness, an initial break requires a high voltage. In other words, with a thickness larger than the above thickness, the second oxide layer 112b may break the first current steering element 142 such as a diode connected to the first variable resistance element 141 in series. On the other hand, irrespective of which one of the materials is to be used to form the second oxide layer 112b, it is possible to perform an initial break with a low voltage by designing the second oxide layer 112b having a further smaller oxygen deficiency and to thereby facilitate application of voltage in the proximity of the interface between the second oxide layer 112b and the electrode. In other words, with the second oxide layer 112b having the smaller oxygen deficiency, it is possible to facilitate resistance changes due to oxidation and reduction, and to thereby obtain excellent memory cell characteristics for enabling such an initial breakdown with a low voltage.

In this way, the first variable resistance element 141 is formed.

The third interlayer dielectric 116 is formed above the second interlayer dielectric 105 to cover the first current steering element 141 and the first current steering element 142. In addition, contact holes 118b are formed in the first liner layer 104, the second interlayer dielectric 105, and the third interlayer dielectric 116, and a wiring groove is formed in the third interlayer dielectric 116. In addition, a plug 107b is embedded in each contact hole 118b, and a second line 119 is embedded in the wiring groove.

The third barrier layer 117 is formed in the contact hole 118b and the wiring groove. The third barrier metal layer 117 is formed by, for example, sequentially depositing a tantalum nitride having a thickness from 5 nm to 40 nm and a tantalum having a thickness from 5 nm to 40 nm.

The second line 119 is formed in the wiring groove in the third interlayer dielectric 116, and is connected to the upper part of the first variable resistance element 141 which is the third upper electrode layer 113 included in the first variable resistance element 141. In addition, the second line 119 is connected not only to the plug 107b in the contact hole 118b but also to the first line 103 for wiring the neighborhood of the memory cell array 10.

The memory cell array 10 is configured as described above.

Figure 4:
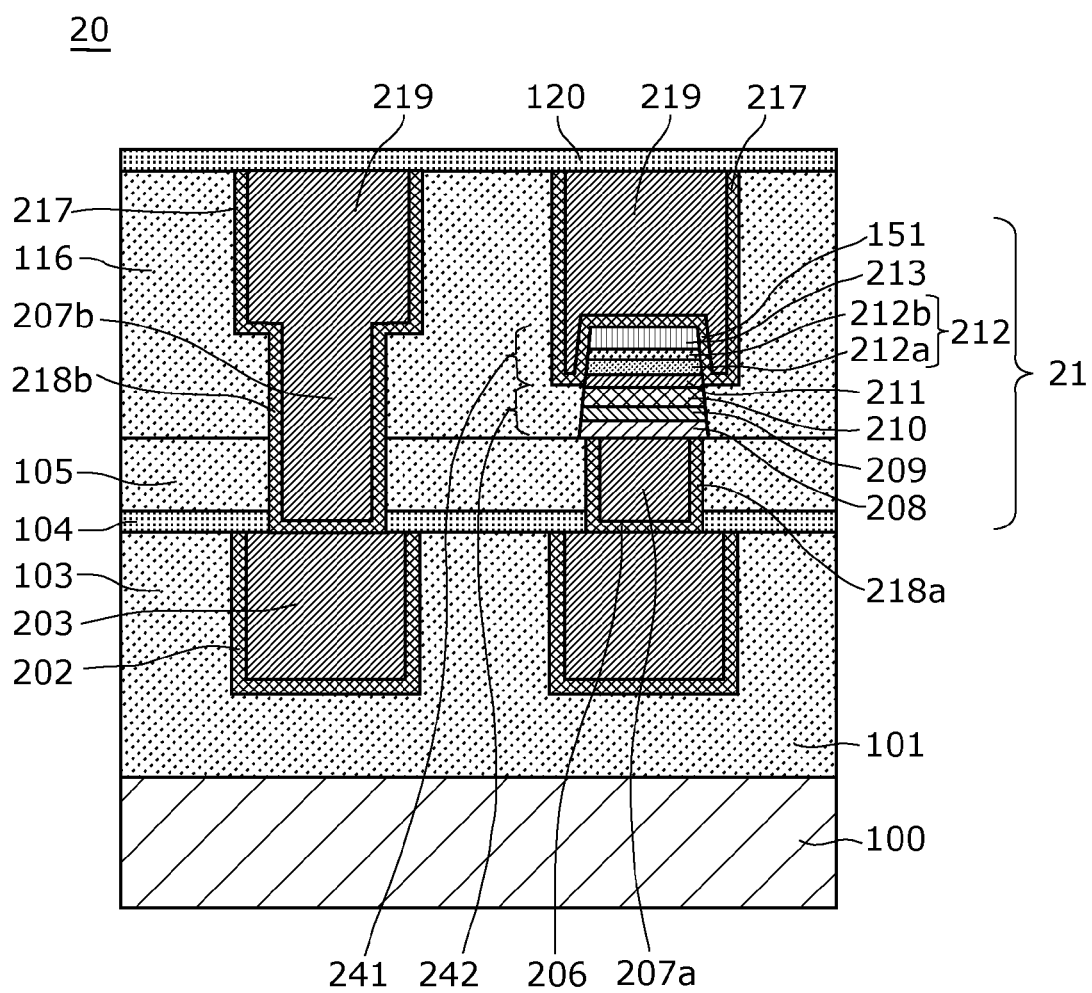
FIG. 4 is a cross-sectional view of an exemplary structure of a parameter generation circuit according to Embodiment 1 of the present invention.

FIG. 4 is a cross-sectional diagram showing an exemplary structure of the parameter generation circuit 20 according to this embodiment. FIG. 4 is a cross-sectional view when the cross section along an alternate long and short dash line between C-C' in FIG. 2 is seen in the direction shown by the arrows.

This parameter generation circuit 20 is configured by integrating a plurality of reference cells 21 to have a plurality of third lines 203, a plurality of fourth lines 219, a plurality of second current steering elements 242, and a plurality of variable resistance elements 241.

The plurality of third lines 203 are formed above the substrate 100 on which transistors etc. are formed. The plurality of third lines 203 are formed in stripes parallel to each other. The plurality of fourth lines 219 are formed in stripes parallel to each other. At the cross-points of the third lines 203 and the fourth lines 219, reference cells 21 are formed. Each of the reference cells 21 includes a second variable resistance element 241 and a second current steering element 242 connected in series. The second variable resistance element 241 has, as each of the side surfaces thereof, a conductive shorting layer 151. The third lines 203 and the fourth lines 219 are connected to the reference cells 21, a sense amplifier, a power source, etc.

Hereinafter, elements of the current steering element parameter generation circuit 20 are explained in detail.

As shown in each of FIG. 3C and FIG. 4, the parameter generation circuit 20 is formed above the substrate 100, and includes: a first interlayer dielectric 101, a first barrier metal layer 202, third lines 203, a first liner layer 104, a second interlayer dielectric 105, a second barrier metal layer 206, plugs 207a and 207b, a second variable resistance element 241, a conductive shorting layer 151 on a side surface of the second variable resistance element 241, a second current steering element 242, a third interlayer dielectric 116, a third barrier metal layer 217, contact holes 218a and 218b, fourth lines 219, and a second liner layer 120.

The first barrier metal layer 202 is formed within a wiring groove formed to embed the third lines 203 to the first interlayer dielectric 101. This first barrier metal layer 202 is formed, for example, by sequentially depositing a tantalum nitride having a thickness from 5 nm to 40 nm and a tantalum having a thickness from 5 nm to 40 nm.

The third lines 203 are formed in the first interlayer dielectric 101, and includes, for example, copper or the like. More specifically, each third line 203 is formed such that the wiring groove is fully filled with the third line 203 and the first barrier metal layer 202 above the first barrier metal layer 202 formed in the wiring groove of the first interlayer dielectric 101.

The first liner layer 104 is formed above the first interlayer dielectric 101 including the third line 203. Each of the first liner layer 104 and the second interlayer dielectric 105 has a contact hole 218a.

The second barrier metal layer 206 is formed in the first liner layer 104 and the second interlayer dielectric layer 105, specifically in the contact hole 218a formed in the first liner layer 104 and the second interlayer dielectric 105. The second barrier metal layer 206 is formed by, for example, sequentially depositing a tantalum nitride having a thickness from 5 nm to 40 nm and a tantalum having a thickness from 5 nm to 40 nm.

The plug 207a is formed in the contact hole 218a in the first liner layer 104 and the second interlayer dielectric 105, and is electrically connected to the third line 203. More specifically, the plug 207a is formed above the second barrier metal layer 206 in the contact hole 218a formed in the first liner layer 104 and the second interlayer dielectric 105, and is electrically connected to the third line 203. This plug 207a is formed, for example, to have a diameter from 50 nm to 200 nm.

The plug 207b is formed in the contact hole 218b in the first liner layer 104 and the second interlayer dielectric 105, and is electrically connected to the third line 203. More specifically, the plug 207b is formed above the third barrier metal layer 217 in the contact hole 218b formed in the first liner layer 104 and the second interlayer dielectric 105, and is electrically connected to the third line 203. This plug 207b is formed, for example, to have a diameter from 50 nm to 200 nm.

The second current steering element 242 is an MSM diode or the like formed above the second interlayer dielectric 105, and is connected to the plug 207a electrically and physically. This second current steering element 242 includes a second lower electrode layer 208, a second current steering layer 209, and a second upper electrode layer 210.

The second lower electrode layer 208 is formed above the substrate 100 (specifically, above the second interlayer dielectric 105), and includes a tantalum nitride or the like. The second current steering layer 209 is formed above the second lower electrode layer 208, and includes a silicon nitride of a nitrogen-deficiency type or the like. The second upper electrode layer 210 is formed above the second current steering layer 209, and includes a tantalum nitride or the like.

Likewise the first variable resistance element 141 included in the memory cell 11, the second variable resistance element 241 included in the reference cell 21 is formed above the second current steering element 242 so as to be connected in series to the second current steering element 242. This second variable resistance element 241 includes a fourth lower electrode layer 211, a second variable resistance layer 212, and a fourth upper electrode layer 213.

The second variable resistance layer 212 in a metal oxide layer formed above the fourth lower electrode layer 211. The second variable resistance layer 212 has a stack of a low oxygen-deficient layer (second oxide layer 212b, high resistance layer) and a high oxygen-deficient layer (first oxide layer 212a, low resistance layer).

The fourth lower electrode layer 211 is formed above the second upper electrode layer 210. The fourth upper electrode layer 213 is formed above the second variable resistance layer 212.

It is to be noted that the second variable resistance element 241 is the same in the form as the variable resistance element 141. In other words, the fourth lower electrode layer 211, the second variable resistance layer 212, and the fourth upper electrode layer 213 are the same in the forms, materials, compositions, and film thicknesses as the third lower electrode layer 111, the first variable resistance layer 112, and the third upper electrode layer 113, respectively.

The third interlayer dielectric 116 is formed above the second interlayer dielectric 105 to cover the second current steering element 242. In addition, contact holes 218b are formed in the first liner layer 104, the second interlayer dielectric 105, and the third interlayer dielectric 116, and a wiring groove is formed in the third interlayer dielectric 116. In addition, a plug 207b is embedded in each contact hole 218b, and a fourth line 219 is embedded in the wiring groove.

The third barrier layers 217 are formed in the contact holes 218b and the wiring grooves. The third barrier metal layers 217 are formed by, for example, sequentially depositing a tantalum nitride having a thickness from 5 nm to 40 nm and a tantalum having a thickness from 5 nm to 40 nm.

The conductive shorting layer 151 is formed, as a part of the fourth lines 219, in the wiring groove of the third interlayer dielectric 116 to cover the second variable resistance element 241 of the reference cell 21, and to be connected to the lower part of the second variable resistance element 241, that is, to the forth lower electrode layer 211 of the second variable resistance element 241. In other words, the conductive shorting layer 151 is in contact with the side surfaces (both ends) of the fourth lower electrode layer 211, the second variable resistance layer 212, and the fourth upper electrode layer 213 which are included in the second variable resistance element 241. Accordingly, the fourth lines 219 and the second current steering element 242 are electrically connected without the second variable resistance layer 212 being interposed therebetween. Typically, in order to cause such fourth lines 219 to function as a conductive shorting layer 151, the conductive shorting layer 151 is formed across a plurality of reference cells 21. In other words, the plurality of reference cells 21 also serve as the conductive shorting layer 151. In this case, when the shape of the conductive shorting layer 151 is seen from the direction perpendicular to the upper surface (principal surface) of the substrate 100 (in other words, when the shape of the conductive shorting layer 151 is projected onto the substrate 100 from the direction perpendicular to the upper surface of the substrate 100), the x-direction and y-direction widths of the conductive shorting layer 151 shown in FIG. 2 correspond to the line widths (F in FIG. 2) and lengths (G in FIG. 2) of the fourth lines 219. In this case, the x-direction maximum width of the conductive shorting layer 151 is larger than the y-direction maximum width of the same.

The fourth lines 219 are connected not only to the plug 207b in the contact hole 218b but also to the third line 203.

The reference cells 21 has a structure substantially with a conductive shorting layer 151 at each of side surfaces of the second variable resistance element 241, in addition to the structure of the memory cell 11 shown in each of FIGS. 3A and 3B. In other words, the reference cell 21 is configured to be capable of detecting a characteristic of the second current steering element 242 without electrical influence of the resistance value of the second variable resistance layer 212.

The memory cell array 10 includes memory cells 11 each including a first variable resistance element 141 and a first current steering element 142. On the other hand, the parameter generation circuit 20 includes reference cells 21 each including a second current steering element 242 having the same structure as the first current steering element 142, a second variable resistance element 241 having the same structure as the first variable resistance element 141, and a conductive shorting layer 151 formed at side surfaces of the second variable resistance element 241.

The second current steering element 242 included in the reference cell 21 and the first current steering element 142 included in the memory cell 11 are formed in the same process. Thus, each of the second current steering element 242 is formed to have the same form (in terms of material, film thickness, composition, thermal history, etc.) as those of the corresponding one of the layers of the first current steering element 142. It is to be noted that when the second current steering element 242 and the first current steering element 142 are formed in different processes, a step is generated below one of the elements. In addition, they are arranged in a horizontal direction parallel to a main surface of the substrate 100 at the same height from the substrate 100.

More specifically, the second lower electrode layer 208 having the same material and film thickness as those of the first lower electrode layer 108 of the first current steering element 142 is formed in the layer in which the first lower electrode layer 108 is formed, the second current steering layer 209 having the same material and film thickness as those of the first current steering layer 109 of the first current steering element 142 is formed in the layer in which the first current steering layer 109 is formed, and the second upper electrode layer 210 having the same material and film thickness as those of the first upper electrode layer 110 of the first current steering element 142 is formed in the layer in which the first upper electrode layer 110 is formed. In this way, the first current steering element 142 and the second current steering element 242 have the same current steering characteristic. For this reason, by detecting the current steering characteristic of the second current steering element 242 of the reference cell 21, it is possible to obtain the current steering characteristic of the first current steering element 142 of the cell 11.

For example, in the case of using a tantalum oxide as a metal oxide, in the memory cell 11, a first variable resistance layer 112 includes a second oxide layer 112b (TaOy) (2.1≤y≤2.5) which is a layer having a high oxygen content atomic percentage in a range from 67.7 atm % to 71.4 atm %. Accordingly, the first variable resistance element 141 has 10 MΩ as an initial resistance value (which is a resistance value in the case where the first variable resistance element 141 is in a super high resistance state). Thus, it is difficult to directly detect current steering characteristic of the first current steering element 142 using normal memory cells 11. However, it is possible to easily determine the current steering characteristic of the first current steering element 142 by providing the parameter generation circuit 20 with the reference cell 21 having a characteristic equivalent to that of the first current steering element 142 and invalidating the second variable resistance element 241 using the conductive shorting layer 151.

As described above, in the non-volatile memory device according to this embodiment, the parameter generation circuit 20 includes the second current steering element 242 having the current density-voltage characteristic equivalent to that of the first current steering element 142 of the memory cell 11. Although the second variable resistance element 241 has the same form as the first variable resistance element 141, the conductive shorting layer 151 short-circuits the fourth upper electrode layer 213 of the second variable resistance element 241 and the fourth lower electrode layer 213. Thus, even when the second variable resistance element 241 includes the high-resistant second variable resistance layer 212, it is possible to detect the non-linear current steering characteristic of the second current steering element 242 without the electrically high resistant second variable resistance layer 212 being interposed therebetween, and to thereby determine the non-linear current steering characteristic of the first current steering element 142. For this reason, without the need to directly detect the non-linear current steering characteristic of the first current steering element 142, it is possible to determine the non-linear current steering characteristic of the first current steering element 142 by detecting the non-linear current steering characteristic of the second current steering element 242. Accordingly, when the parameter generation circuit 20 generates a voltage to be applied to the memory cell 11, for example, it is possible to detect the current steering characteristic of the second current steering element 242, and output it to the control circuit of the memory array 10 for compensation for the optimum write voltage. Thus, it is possible to realize the non-volatile memory device which is stable with less error operations and fluctuations.

For example, the parameter generation circuit 20 is formed to include a reference cell 21, a sense circuit, an electric power circuit, a control circuit, etc. The parameter generation circuit 20 detects a forward direction threshold value voltage Vf, an ON current, and an OFF current of the second current control element 242, and outputs them to the control circuit of the memory cell array 10. Based on the detection result, the control circuit of the memory cell array 10 generates an offset voltage using the internal voltage generation circuit of the memory cell array 10, optimizes a write voltage, a read voltage, an initial break voltage etc. to the memory cell 11, and applies them to the memory cell 11. This optimization of voltages to be applied may be performed at the time when the non-volatile memory device is tested before shipment, or performed periodically at the time of operations after shipment, or performed before and after shipment. With periodical optimization, it is possible to adapt to aging of the non-volatile memory device. In addition, the parameter generation circuit 20 includes a plurality of reference cells and is capable of increasing the optimization accuracy by generating an offset voltage using the average of results of detection by the plurality of reference cells 21.

Here, it is also good to evaluate each of the reference cells using external test circuits, for example, by connecting a corresponding one of the fourth lines 219 and a corresponding one of the third lines 203 to the external terminals and connecting the external terminals to a test circuit outside the non-volatile memory device.

Next, a description is given of a method for manufacturing the aforementioned non-volatile memory device, specifically, an exemplary method for forming a memory cell array 10 and a parameter generation circuit 20.

Figure 5A:
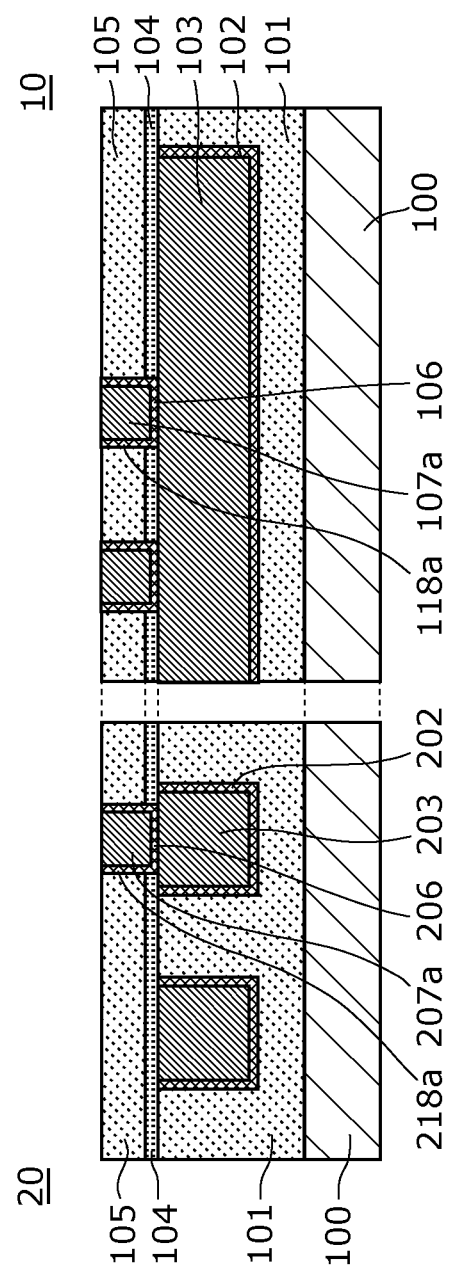
FIG. 5A is a cross-sectional view for explaining the method for manufacturing the non-volatile memory device according to Embodiment 1 of the present invention.
Figure 5B:
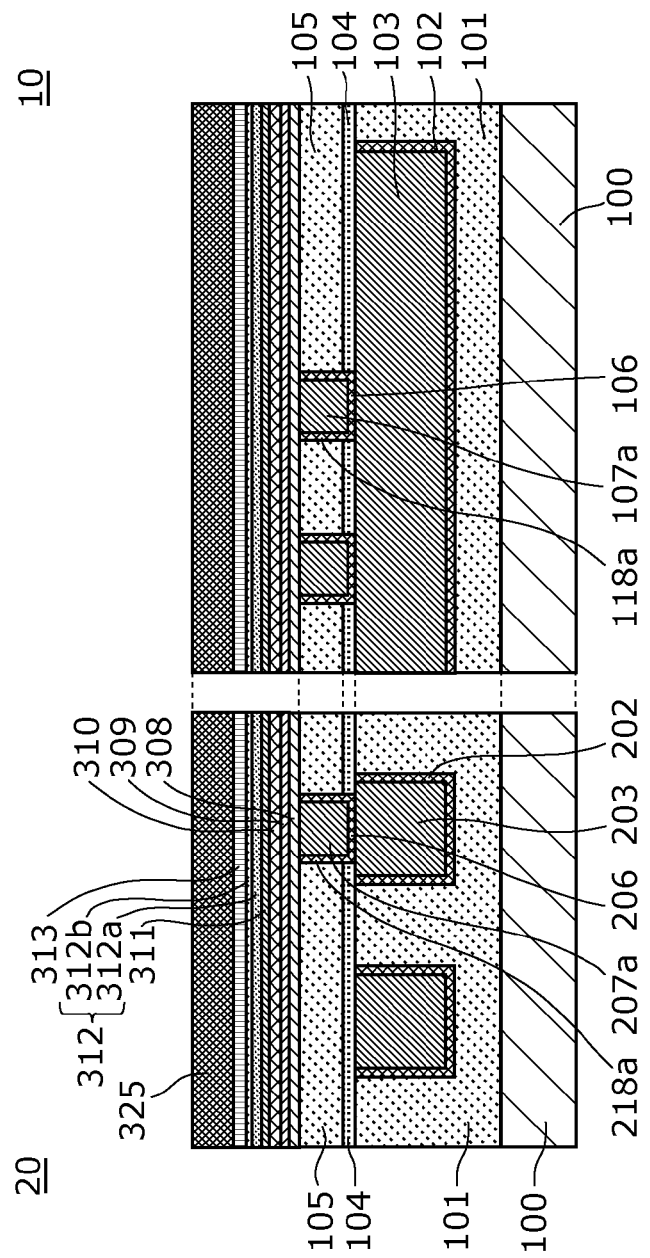
FIG. 5B is a cross-sectional view for explaining the method for manufacturing the non-volatile memory device according to Embodiment 1 of the present invention.
Figure 5D:
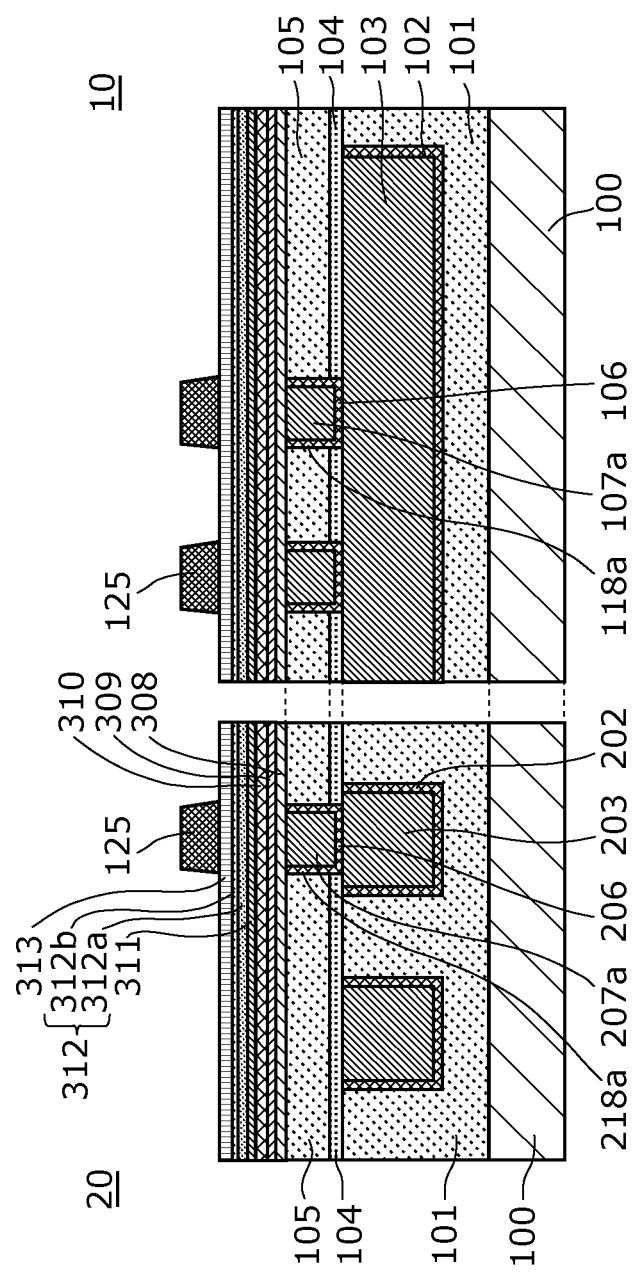
FIG. 5D is a cross-sectional view for explaining the method for manufacturing the non-volatile memory device according to Embodiment 1 of the present invention.
Figure 5E:
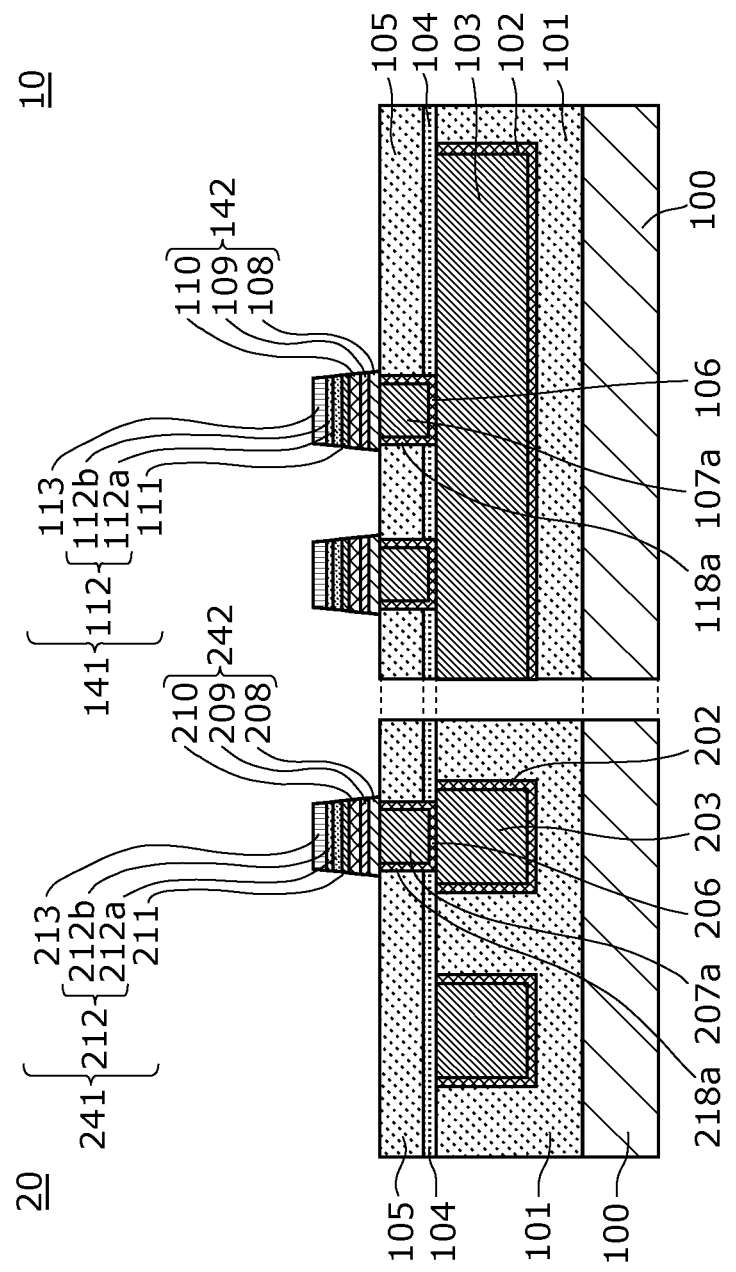
FIG. 5E is a cross-sectional view for explaining the method for manufacturing the non-volatile memory device according to Embodiment 1 of the present invention.
Figure 5F:
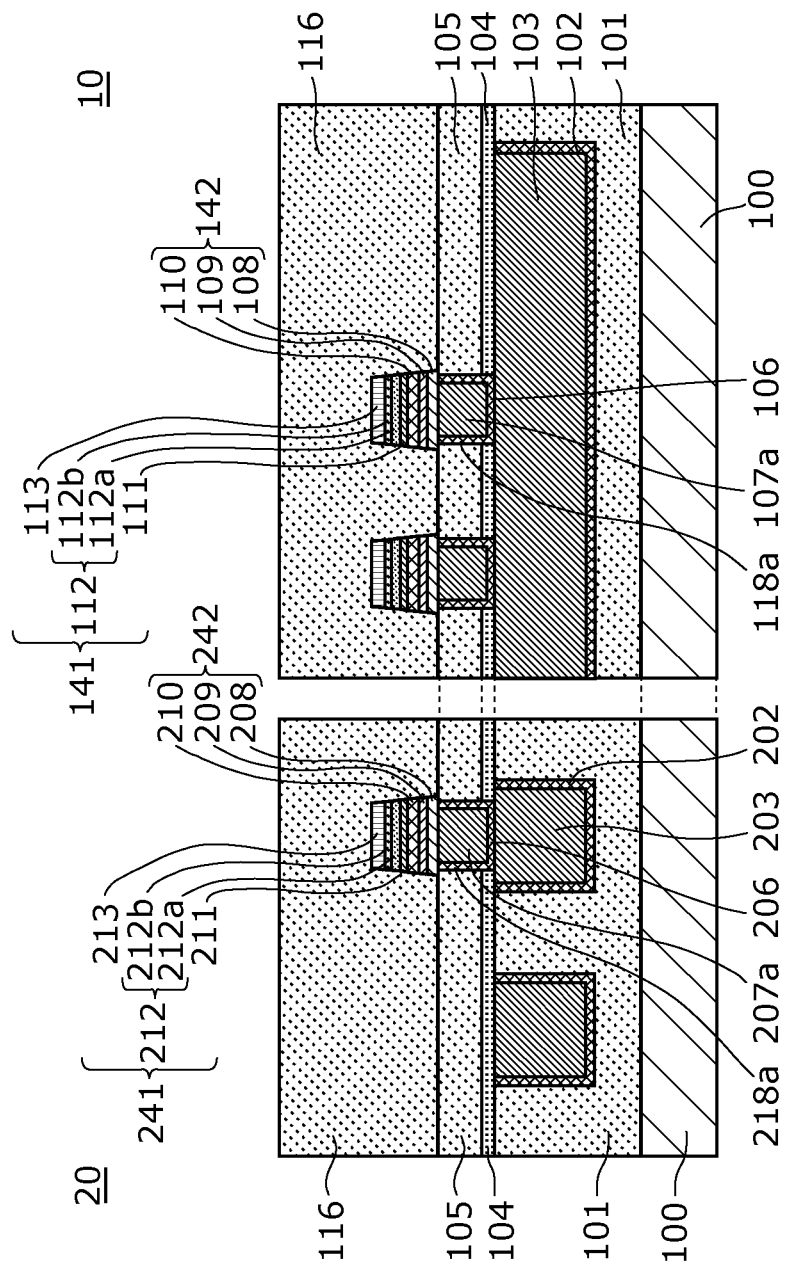
FIG. 5F is a cross-sectional view for explaining the method for manufacturing the non-volatile memory device according to Embodiment 1 of the present invention.
Figure 5G:
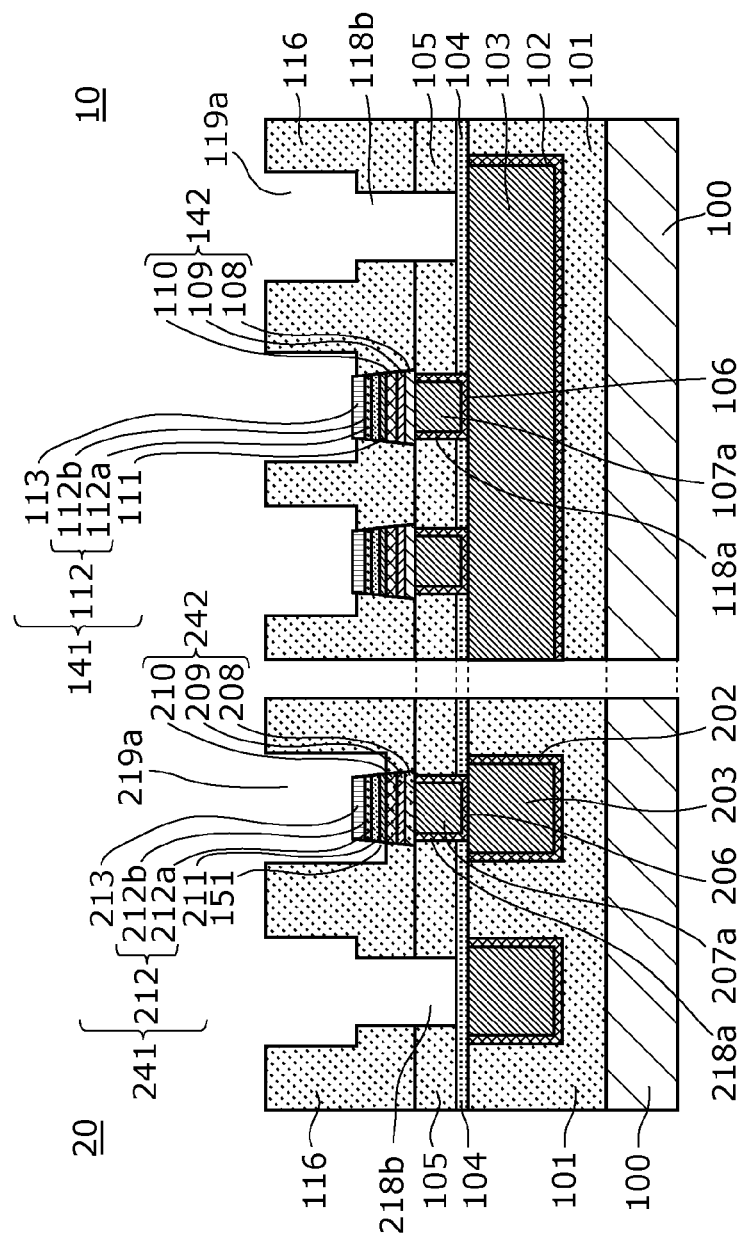
FIG. 5G is a cross-sectional view for explaining the method for manufacturing the non-volatile memory device according to Embodiment 1 of the present invention.
Figure 5I:
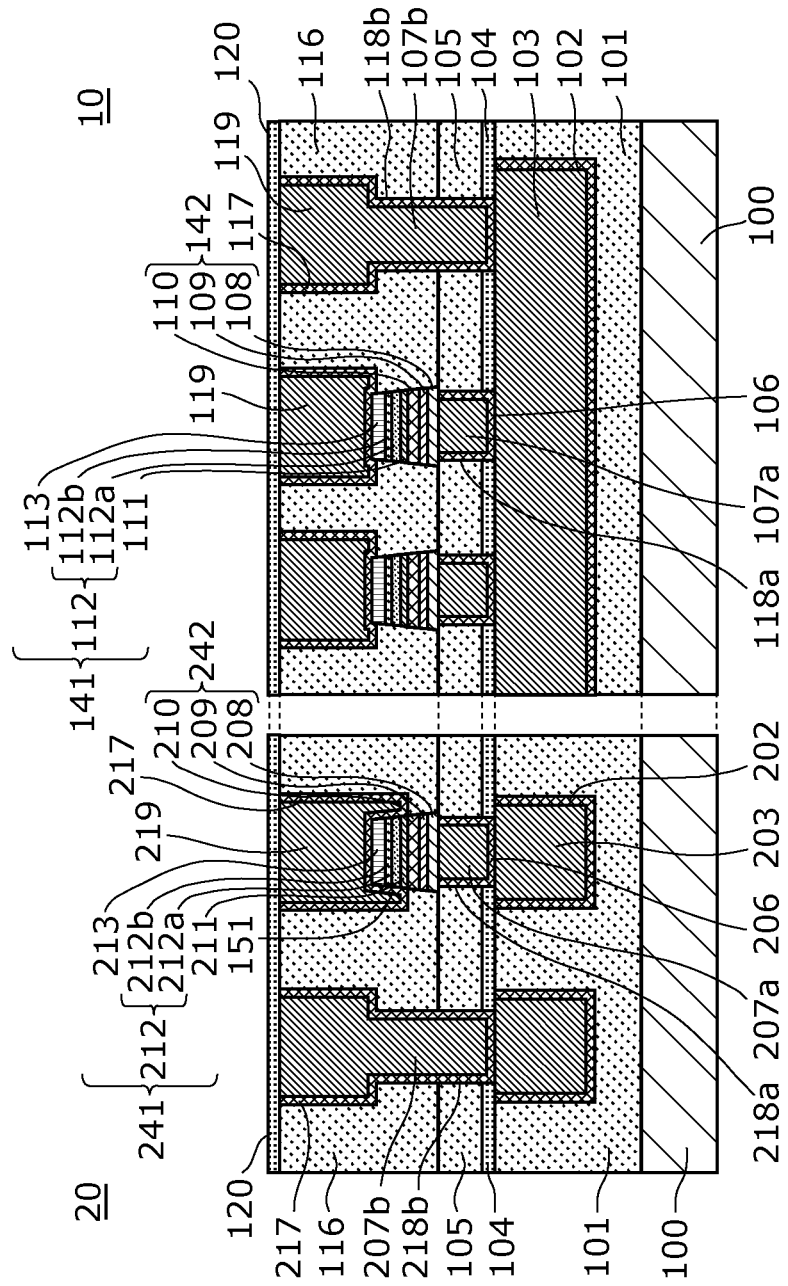
FIG. 5I is a cross-sectional view for explaining the method for manufacturing the non-volatile memory device according to Embodiment 1 of the present invention.

Each of FIGS. 5A and 5I is a cross-sectional view for explaining the exemplary method for forming the memory cell array 10 (memory cells 11 and a wiring part thereof) and the parameter generation circuit 20 (a reference cell 21 and a wiring part thereof) according to this embodiment. Typically, a large number of memory cells 11 and reference cells 21 are formed above the substrate 100. For simplification, in each of FIGS. 5 and 5I, two memory cells 11 are formed, and one reference cell 21 is formed. In addition, for easy understanding, the structure is partly magnified. The attached drawings for explaining the embodiments other than this embodiment may be also simplified.

A non-volatile memory device manufacturing method according to this embodiment includes forming: a memory cell array 10 including a plurality of memory cells 11 each having a stack structure in which a first current steering element 142 and a first variable resistance element 141 are connected in series; and a parameter generation circuit 20 including a reference cell 21 which is for determining (monitoring) a current steering characteristic of the first current steering element 142 and includes a second current steering element 242 and a second variable resistance element 241. The parameter generation circuit 20 is electrically connected to the memory cell array 10 to operate the memory cells 11. In the process of forming the element, the variable resistance element 241 is formed which includes a fourth lower electrode layer 211, a second variable resistance layer 212 formed above the fourth lower electrode layer 211, and a fourth upper electrode layer 213 formed above the second variable resistance layer 212, and then a conductive shorting layer 151 for short-circuiting the fourth upper electrode layer 213 and the fourth lower electrode layer 211 is formed at each of side surfaces of the second variable resistance element 241.

The first current steering element 142 and the first variable resistance element 141 are formed using the same mask, the second current steering element 242 and the second variable resistance element 241 are formed using the same mask, and the second current steering element 242 and the first current steering element 142 are formed at the same time.

The forming process includes forming: a first conductive layer 308 above the substrate 100; a current steering layer 309 on the first conductive layer 308; a second conductive layer 310 on the current steering layer 309; a third conductive layer 311 on the second conductive layer 310; a variable resistance layer 312 on the third conductive layer 311; a fourth conductive layer 313 on the variable resistance layer 312; a third upper electrode layer 113 and a fourth upper electrode layer 213 by patterning the fourth conductive layer 313; a first variable resistance layer 112 and a second variable resistance layer 212 by patterning the variable resistance layer 312; a third lower electrode layer 111 and a fourth lower electrode layer 211 by patterning the third conductive layer 311; a first upper electrode layer 110 and a second upper electrode layer 210 by patterning the second conductive layer 310; a first current steering layer 109 and a second current steering layer 209 by patterning the current steering element 309; a first lower electrode layer 108 and a second lower electrode layer 208 by patterning the first conductive layer 308; and a conductive shorting layer 151.

The process of forming the element includes: forming a first variable resistance element 141 and a second variable resistance element 241 by patterning a fourth conductive layer 313, a variable resistance layer 312, and a third conductive layer 311 and then patterning, for separation, a second conductive layer 310, a current steering layer 309, and a first conductive layer 308 so as to form, at the same time, a first current steering element 142 below the first variable resistance element 141 included in the memory cell 11 and a second current steering element 242 formed below the second variable resistance element 241 included in the reference cell 21; and forming second lines 119 electrically connected to the memory cells 11 and the fourth lines 219 electrically connected to the reference cell 21. In the processes for forming the respective elements by patterning, the conductive shorting layer 151 is formed at each of side surfaces of the second variable resistance element 241 included in the reference cell 21 using the same hard mask layer 125 in the patterning for forming the first variable resistance element 141 in the memory cell 11 and the patterning for forming the first current steering element 142 and using the same hard mask layer 125 in the patterning for forming the second variable resistance element 241 included in the reference cell 21 and the patterning for forming the second current steering element 242.

The process for forming the second lines 119 and the fourth lines 219 includes: forming a third interlayer dielectric 116 to cover the memory cells 11 and the reference cell 21; forming a wiring groove 119a for forming a wiring pattern of second lines 119 in the third interlayer dielectric 116; forming a wiring groove 219a for forming a wiring pattern of fourth lines 219 in the third interlayer dielectric 116; and forming a wiring pattern of second lines 119 and a wiring pattern of fourth lines 219 by embedding a conductor in the wiring groove 119a and the wiring groove 219a. In the forming of the wiring groove 219a, at least parts of the side surfaces of the second variable resistance element 241 included in the reference cell 21 are exposed.

The variable resistance layer 312 includes a metal oxide. The metal oxide includes at least two layers which are a low oxygen-deficient layer and a high oxygen-deficient layer. The element forming process includes: forming a first oxide layer 312a including an oxygen deficient first metal oxide above the third conductive layer 311, and then forming a second oxide layer 312b including a second metal oxide having a smaller oxygen deficiency and a resistance value higher than those of the first metal oxide above the first oxide layer 312a.

In the process for forming the conductive shorting layer 151, the fourth lines 219 connected to the fourth upper electrode layer 213 are formed so that parts of the fourth lines 219 become the conductive shorting layer 151.

An exemplary method for manufacturing the non-volatile memory device according to this embodiment is described in detail below.

First, as shown in FIG. 5A, a first line 103 and a third line 203 are formed above a semiconductor substrate 100 on which transistors are formed in advance, and plugs 107a and 207a are formed above the first line 103 and the third line 203 so as to be connected to the first line 103 and the third line 203.

More specifically, a first interlayer dielectric 101 including a silicon oxide is formed above the substrate 100, using a plasma CVD or the like. Next, a wiring groove for embedding the first line 103 and the third line 203 in the first interlayer dielectric 101 is formed using photolithography and dry etching. Next, the following are deposited in the wiring groove: first barrier metal layers 102 and 202 including a tantalum nitride (from 5 nm to 40 nm) and tantalum (from 5 nm to 40 nm) and copper (from 50 nm to 300 nm) as a material for wiring. Next, by further depositing copper as a seed using an electroplating method or the like, the wiring groove is filled with the copper as the material for wiring and the first barrier metal layers 102 and 202. Next, by removing unnecessary part of copper on the surface among the deposited copper and unnecessary parts of the first barrier metal layers 102 and 202 using a CMP method, the first line 103 and the third line 203 are formed to have a flat surface which is flush with the surface of the first interlayer dielectric 101. Next, a first liner layer 104 is formed to cover the first interlayer dielectric 101, the first line 103, and the third line 203 by depositing a silicon nitride approximately from 30 nm to 200 nm above the first interlayer dielectric 101, the first line 103, and the third line 203 using a plasma CVD or the like. Next, a second interlayer dielectric 105 is further deposited above the first liner layer 104. Here, as necessary, steps on the surface are reduced using a CMP method. Next, a contact hole 118a in which the plug 107a to be connected to the first line 103 is formed at a predetermined position above the first line 103 using photolithography and dry etching. Likewise, a contact hole 218a in which the plug 207a to be connected to the third line 203 is formed at a predetermined position above the third line 203. Next, second barrier metal layers 106 and 206 including a tantalum nitride layer (having a thickness from 5 nm to 40 nm) and a tantalum layer (having a thickness from 5 nm to 40 nm) and a copper layer (having a thickness from 50 nm to 300 nm) are deposited above the second interlayer dielectric 105 including the contact holes 118a and 218a, using a sputtering method or the like. Next, by further depositing copper as a seed using an electroplating method or the like, the entirety of the contact holes 118a and 218a are filled with the second barrier metal layers 106 and 206 and the copper. Next, the plugs 107a and 207a are formed to have a flat surface which is flush with the surface of the second interlayer dielectric 105 by removing unnecessary part of copper on the surface and unnecessary part of the second barrier metal layers 106 and 206 using a CMP method.

Next, as shown in FIG. 5B, the following are sequentially deposited above the second interlayer dielectric 105 including the plugs 107a and 207a using a sputtering method or the like: a first conductive layer 308 (having a thickness of 20 nm) including a tantalum nitride; a current steering layer 309 (having a thickness of 20 nm) including a nitrogen-deficient silicon nitride; and a second conductive electrode layer 310

(having a thickness of 30 nm) including a tantalum nitride. Next, the following are sequentially deposited above the second conductive layer 310 using a sputtering method or the like: a third conductive layer 311 (having a thickness of 30 nm) including a tantalum nitride; a first oxide layer 312a, a second oxide layer 312b, and a fourth conductive layer 313 (having a thickness of 80 nm) including iridium. Next, as a hard mask for use in dry etching, the following is deposited using a sputtering method or the like: a hard mask layer 325 (having a thickness of 100 nm) which is a conductive layer and includes one of a titanium nitride and a titanium-aluminium nitride (for example, a titanium-aluminium nitride.

Here, the first oxide layer 312a and the second oxide layer 312b are formed by depositing TaOx (0<x<2.5) by 50 nm as a high oxygen-deficient layer (the first oxide layer 312a), and above this high oxygen-deficient layer (first oxide layer 312a), depositing TaOy (x<y) by 5 nm as a low oxygen-deficient layer (the second oxide layer 312b) having an oxygen deficiency smaller than TaOx. At this time, the first oxide layer 312a and the second oxide layer 312b may be formed by depositing TaOx by 50 nm and performing oxidation on the upper surface of TaOx by plasma oxidization in an oxygen air, and depositing TaOy (x<y) of the low oxygen-deficient layer (the second oxide layer 312b) having an oxygen content atomic percentage larger than TaOx by 5 nm above the TaOx of the high oxygen-deficient layer (first oxide layer 312a). Here, the oxidation method is not limited to such plasma oxidation. For example, it is also good to perform a process for providing a surface oxidation effect such as a heat treatment in oxygen air. In addition, the deposited amount of TaOx of the high oxygen-deficient layer (first oxide layer 312a) is not limited to 50 nm. For example, it is also good that TaOx of the high oxygen-deficient layer (first oxide layer 312a) is deposited by 45 nm, and TaOy (x<y) of the low oxygen-deficient layer (the second oxide layer 312b) is deposited by 5 nm instead of performing such an oxidation process. In addition, it is also good to deposit a low oxygen-deficient titanium oxide by 5 nm instead of TaOy of the low oxygen-deficient layer (the second oxide layer 312b).

Next, as shown in FIG. 5C, a first resist mask pattern 131a for forming the first variable resistance element 141 and the second variable resistance element 241 is formed above a hard mask layer 325 using photolithography.

Next, as shown in FIG. 5D, the hard mask layer 125 is patterned using a first resist mask pattern 131a to form a hard mask layer 325. Next, the first resist mask pattern 131a is removed by performing an ashing process.

Next, as shown in FIG. 5E, the fourth conductive layer 313, the first oxide layer 312a, the second oxide layer 312b, and the third conductive layer 311 are patterned using the hard mask layer 125 to form (i) a third upper electrode layer 113, a first variable resistance layer 112, and a third lower electrode layer 111 of the first variable resistance layer 141, and (ii) a fourth upper electrode layer 213, a second variable resistance layer 212, and a fourth lower electrode layer 211 of the second variable resistance element 241. Furthermore, the first upper electrode layer 110 of the first current steering element 142, the first current steering layer 109, and the first lower electrode layer 108 are formed, by patterning the second conductive layer 310, the current steering layer 309, and the first conductive layer 308 using the hard mask layer 125. At the same time, the second upper electrode layer 210, the second current steering layer 209, and the second lower electrode layer 208 of the second current steering element 242 are formed, by patterning the second conductive layer 310, the current steering layer 309, and the first conductive layer 308 using the hard mask layer 125. Next, the hard mask layer 125 is removed by etching or the like. Here, there is no need to always remove the hard mask layer 125, and it may be maintained as necessary. In this way, it is possible to form the second current steering element 242 having the same current steering characteristic as that of the first current steering element 142 included in each memory cell 11, in the layer in which the first current steering element 142 is formed.

Next, as shown in FIGS. 5F and 5G, a third interlayer dielectric 116 is formed to cover the first variable resistance element 141, the second variable resistance element 241, the first current steering element 142, and the second current steering element 242. Next, wiring grooves 119a and 219a and contact holes 218a and 118b are formed in the third interlayer dielectric 116. The wiring grooves 119a and 219a are used to form (i) a second line 119 to be connected to the third upper electrode layer 113 of the first variable resistance element 141 and (ii) a fourth line 219 to be connected to a side surface of the second variable resistance element 241 included in the reference cell 21.

More specifically, as shown in FIG. 5F, the third interlayer dielectric 116 for embedding the second line 119 and the fourth line 219 are deposited to cover the first variable resistance element 141, the second variable resistance element 241, the first current steering element 142, and the second current steering element 242. Next, as shown in FIG. 5G, the wiring grooves 119a and 219a for forming the second line 119 and the fourth line 219 are formed in the third interlayer dielectric 116 by photolithography and dry etching. The wiring grooves 119a and 219a are used to form (i) a second line 119 to be connected to the third upper electrode layer 113 of the first variable resistance element 141 and (ii) a fourth line 219 to be connected to a side surface of the second variable resistance element 241 included in the reference cell 21. At this time, in the dry etching process for forming the wiring groove 219a, the following layers are exposed: the fourth upper electrode layer 213, the second variable resistance layer 212, and the fourth lower electrode layer 211 which are included in the second variable resistance element 241 of the reference cell 21. At the same time, the contact holes 118b and 218b for forming plugs 107b and 207b which are connected to the first line 103 and the third line 203 are formed, by photolithography and dry etching, at predetermined positions without the first variable resistance element 141, the second variable resistance element 241, the first current steering element 142, and the second current steering element 242.

As a general example, the contact holes 118b and 218b for plugs 107b and 207b as drawing contacts are formed first by first photolithography and dry etching, and the wiring grooves 119a and 219a for the second line 119 and the fourth line 219 are formed by second photolithography and dry etching. However, there is no inconvenience to form the wiring grooves 119a and 219a first.

Next, as shown in FIG. 5H, (i) third barrier metal layers 117 and 217 including a tantalum nitride (5 nm to 40 nm) and tantalum (5 nm to 40 nm) and (ii) copper (50 nm to 300 nm) as a material for wiring are deposited, using a sputtering method or the like, in the contact holes 118b and 218b and the wiring grooves 119a and 219a. Conditions used here are the same as those in the process for embedding the first line 103 and the third line 203 as shown in FIG. 5A. Next, by further depositing copper as a seed using an electroplating method or the like, the contact holes 118b and 218b and the wiring grooves 119a and 219a are fully filled with the copper as the material for wiring and the third barrier metal layers 117 and 217. Next, by removing unnecessary part of the copper on the surface and unnecessary parts of the third barrier metal layers 117 and 217 using a CMP method, the second line 119 and the fourth line 219 are formed to have a flat surface which is flush with the surface of the third interlayer dielectric 116. In this way, the third barrier metal layer 217, the copper as the wiring material, and the conductive shorting layer 151 having a low resistance value are formed at the side surfaces of the fourth upper electrode layer 213, the second variable resistance layer 212, and the fourth lower electrode layer 211 included in the second variable resistance element 241 which is the reference cell 21 exposed in the formation of the wiring groove 219*a* shown in FIG. 5G. In this way, it is possible to form the reference cell 21 for detecting the current steering characteristic of the second current steering element 242 even when the second variable resistance layer 212 are in a high resistance state.

Next, as shown in FIG. 5I, a second liner layer 120 is formed by depositing a silicon nitride layer by 30 nm to 200 nm, as a specific example, by 50 nm, using a plasma CVD or the like above the second line 119, the fourth line 219, and the third interlayer dielectric 116, so as to cover the second line 119 and the fourth line 219.

In this way, according to the non-volatile memory device manufacturing method in this embodiment, the first current steering element 142 and the second current steering element 242 of the memory cell 11 are formed in the same electrode layer and current steering layer, and thus have the same current steering characteristic that is the same voltage-current density relationship. For this reason, by detecting the current steering characteristic of the second current steering element 242, it is possible to determine the current steering characteristic of the first current steering element 142 of the memory cell 11, and to thereby manufacture the non-volatile memory device which operates stably with reduced numbers of error operations and fluctuations.

In addition, using the method for manufacturing the non-volatile memory device according to this embodiment, it is possible to manufacture the non-volatile memory device in a semiconductor manufacturing process using a conventional CMOS manufacturing process or the like. Accordingly, there is no need to perform a unique and special semiconductor manufacturing process in each of the processes of forming the variable resistance element and the current steering element. Therefore, it is possible to realize the manufacturing method highly compatible with increasingly finer semiconductor manufacturing processes. As a result, it is possible to realize the stable manufacturing method which facilitates refinement.

In addition, using the method for manufacturing the non-volatile memory device according to this embodiment, it is possible to sequentially form layers of the variable resistance element and the current steering element. Therefore, it is possible to reduce in-process damage of the variable resistance element and the current steering element, and to thereby reduce a difference in characteristic.

In addition, it is possible to form the fourth lines and the conductive shorting layer 151 at the same time, and to thereby reduce the number of manufacturing processes.

It is to be noted that the first current steering element 142 and the second current steering element 242 do not always need to have the same size, and the second current steering element 242 may be larger than the other.

More specifically, when seen from the direction perpendicular to the upper surface of the substrate 100, the size of an area of the second current steering layer 209 including the second current steering element 242 and in contact with the second upper electrode layer 210 and the size of an area of the second current steering layer 209 in contact with the second lower electrode layer 208 may be larger than the size of an area of the first current steering layer 109 including the first current steering element 142 and in contact with the first upper electrode layer 110 and the size of an area of the first current steering layer 109 in contact with the first lower electrode layer 108.

In this way, it is possible to realize the second current steering element 242 less susceptible to plasma damage resulting from application to the side surfaces, in addition to the effects of this embodiment. By reducing the influence of such plasma damage, it is possible to accurately detect a non-linear current steering characteristic, and to accurately detect change (for example, characteristic change depending on an ambient temperature, characteristic deterioration due to repetitive operations), and to thereby reduce an error in a current steering characteristic to be detected in the second current steering element 242. In other words, even when etching damage is caused at the side surfaces of the second current steering element 242, it is possible to increase the area which (i) includes the interface between the second upper electrode layer 210 and the second current steering layer 209 and the interface between the second lower electrode layer 208 and the second current steering layer 209 and (ii) is less affected by the etching damage, and to thereby detect a stable current steering characteristic.

At this time, the first current steering element 142 of each of the memory cells 11 and the second current steering element 242 of the reference cell 21 are formed to have the same electrode layer and current steering layer, and thus have the s voltage to current density relationship. In this way, since the designed sizes of the first current steering element 142 and the second current steering element 242 are clear even when the areas thereof are different, it is possible to adjust, depending on the areas etc., the current value to be detected, detect the current steering characteristic of the second current steering element 242, and to thereby determine the current steering characteristic of the first current steering element 142.

A specific manufacturing method conceivable in each of the processes shown in FIGS. 5C and 5D is to make larger the first resist mask pattern 131*a* for patterning the hard mask layer 125 for patterning the second variable resistance element 241 and the second current steering element 242 which are included in the reference cell 21 than the first resist mask pattern 131*a* for patterning the hard mask layer 125 for patterning the first variable resistance element 141 and the first current steering element 142 which are included in the memory cell 11. By using the different-size first resist mask patterns 131*a* for forming the respective elements, different-size hard mask layers 125 are respectively formed in the memory cell array 10 and the parameter generation circuit 20 in the process shown in FIG. 5D. In the process shown in FIG. 5E, the first current steering element 142 and the second current steering element 242 which are different in size are formed, and the second current steering element 242 formed using the larger first resist mask pattern 131*a* has the larger area.

In addition, the memory cell array 10 is formed in the single layer to have the structure including: the plurality of first lines 103 arranged in stripes parallel to each other; the plurality of second lines 119 formed in the third interlayer dielectric 116 so as to be arranged in stripes parallel to each other crossing the first lines 103; and the plurality of memory cells 11 (i) which are formed in the third interlayer dielectric 116 in which the first lines 103 and the second lines 119 cross each other and (ii) each of which includes the first variable resistance element 141 and the first current steering element 142. Instead of the non-limiting structure, a multi-layered non-volatile memory device may be formed to have a stack of repetitive layers of memory cell arrays 10 above a substrate 100. At this time, the parameter generation circuit 20 does not always need to be formed in each of the layers of the memory cell arrays 10, and it is only necessary that the parameter generation circuit 20 is formed in at least one of the layers of the memory cell arrays 10. In this way, the parameter generation circuit 20 can detect at least changes in a non-linear current steering characteristic made due to an ambient temperature, and can function as a control circuit capable of performing adjustment depending on temperatures.

Variation 1 of Embodiment 1

Next, Variation 1 of Embodiment 1 of the present invention is described.

Figure 6:
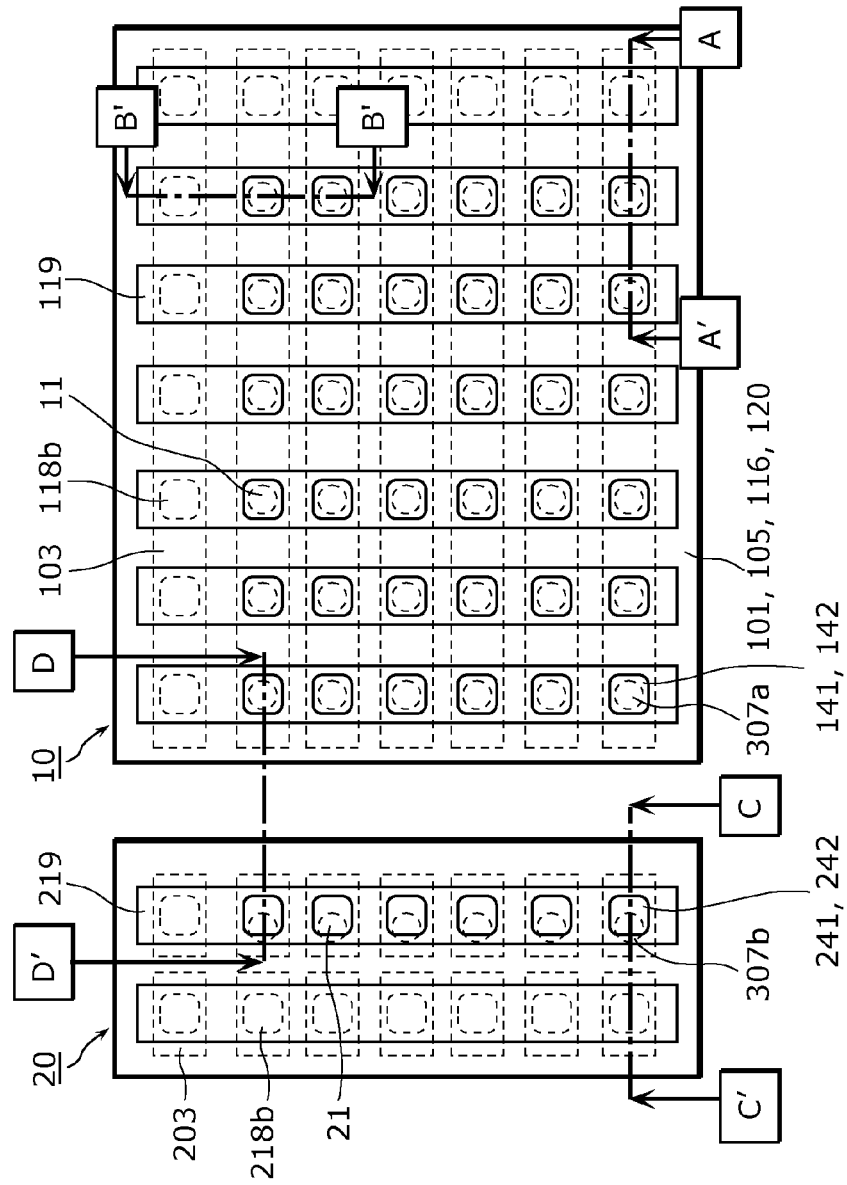
FIG. 6 is a plan view of an exemplary structure of a part of a non-volatile memory device according to Variation 1 of Embodiment 1 of the present invention.
Figure 7:
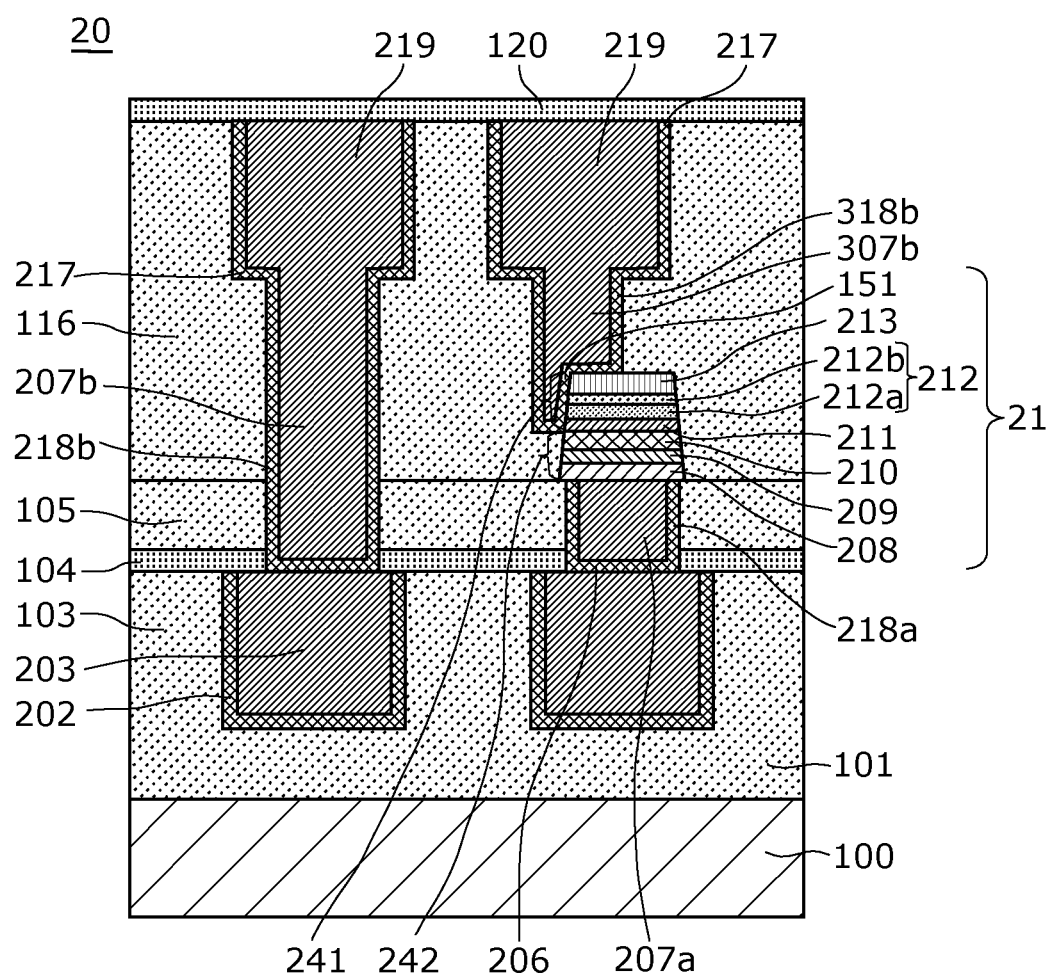
FIG. 7 is a cross-sectional view of an exemplary structure of a parameter generation circuit according to Variation 1 of Embodiment 1 of the present invention.
Figure 8:
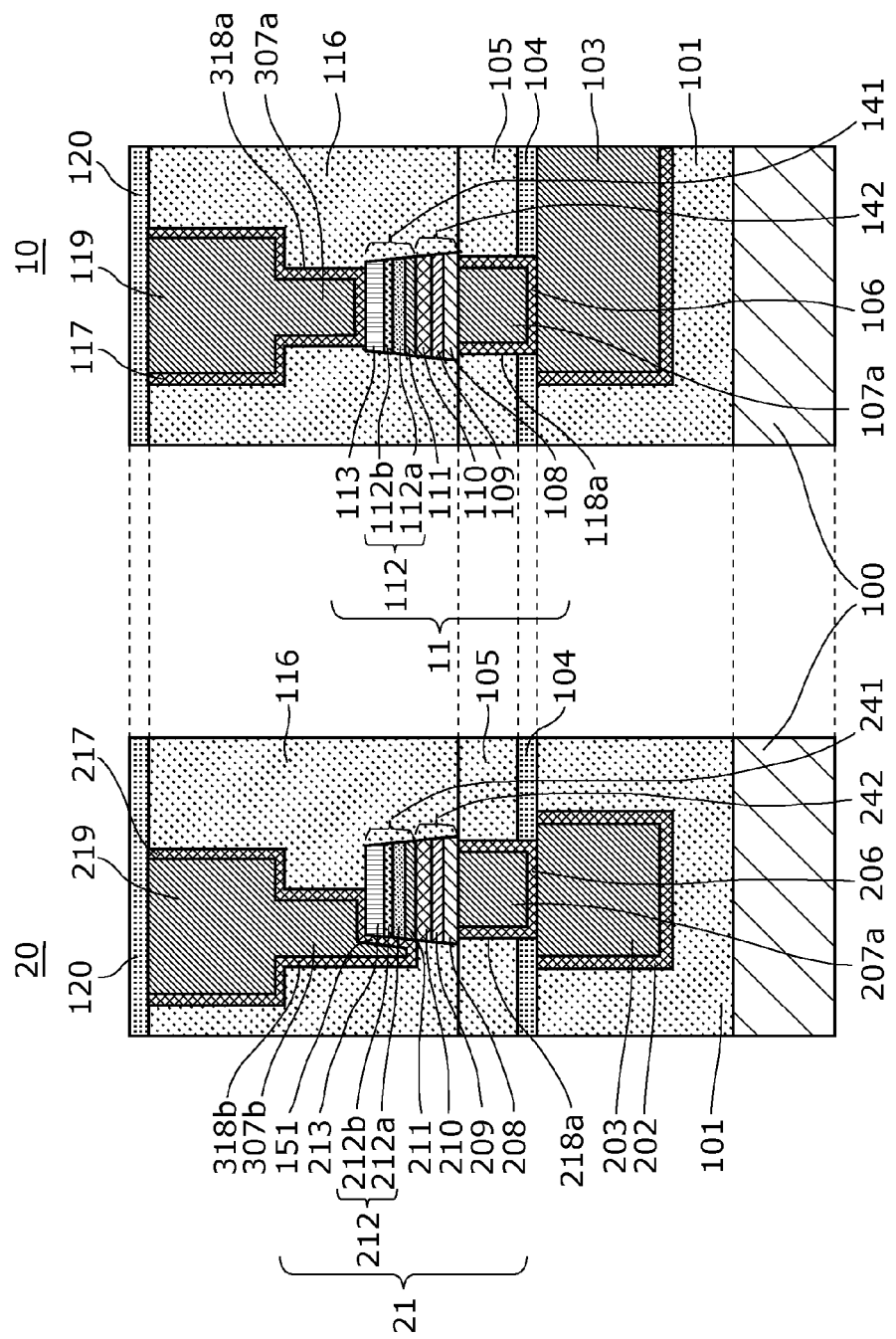
FIG. 8 is a plan view of an exemplary structure of a part of the non-volatile memory device according to Variation 1 of Embodiment 1 of the present invention.

FIG. 6 is a plan view of an exemplary structure of a part of the non-volatile memory device according to this variation. FIG. 7 is a cross-sectional diagram showing an exemplary structure of the parameter generation circuit 20 according to this variation. FIG. 8 is a cross-sectional view of an exemplary structure of the non-volatile memory device according to this variation. FIG. 7 is a cross-sectional view of the cross section along the alternate long and short dash line shown in the C-C' in FIG. 6 when seen from the arrow direction. FIG. 8 is a cross-sectional view of the cross section along the alternate long and short dash line shown in the D-D' in FIG. 6 when seen from the arrow direction.

The non-volatile memory device in this variation is different from the non-volatile memory device according to Embodiment 1 in that a conductive shorting layer 151 of the parameter generation circuit 20 is formed on parts of a plug (contact plug) 307b of a reference cell 21 and a third barrier metal layer 217 arranged between fourth lines 219 and a fourth upper electrode layer 213 (the parts are on side surfaces of the second variable resistance element 241, in other words, sides including portions in contact with side surfaces of the fourth upper electrode layer 213 and the fourth lower electrode layer 211). More specifically, the reference cell 21 shown in FIG. 7 is different from the reference cell 21 shown in each of FIGS. 3C and 4 in that the conductive shorting layer 151 formed on side surfaces of the second variable resistance element 241 is parts of the plug 307b and the third barrier metal layer 217 which electrically connect the fourth lines 219 and the reference cell 21.

The third barrier metal layer 117 may be replaced with a plug 307a without formation of a third barrier metal layer 117 in the contact hole 318a, and the third barrier metal layer 217 may be replaced with a plug 307b without formation of a third barrier metal layer 217 in the contact hole 318a. In the explanation in each of FIG. 6 to FIG. 9C in this variation, the third barrier metal layer 117 in the contact hole 318a is the part of the plug 307a, and the third barrier metal layer 217 in the contact hole 318b is the part of the plug 307b. In this case, the conductive shorting layer 151 is formed as the parts of the plug 307b (the parts positioned at the sides of the second variable resistance element 241, in other words, the parts positioned at sides including the parts in contact with the side surfaces of the fourth upper electrode layer 213 and the fourth electrode layer 211).

Hereinafter, differences from Embodiment 1 are mainly described.

The plug 307a of the memory cell 11 is placed between the second lines 119 and the third upper electrode layer 113, and is not in contact with the third lower electrode layer 111 and the first upper electrode layer 110. When seen from the direction perpendicular to the upper surface of the substrate 100, the entire outline of the plug 307a of the memory cell 11 is positioned inward from the outline of the first variable resistance layer 112. On the other hand, when seen from the direction perpendicular to the upper surface of the substrate 100, a part of the outline of the plug 307b serving as the conductive shorting layer 151 in the reference cell 21 is positioned outward from the outline of the second variable resistance layer 212, and the other part is positioned inward from the outline of the second variable resistance layer 212.

When seen from the direction perpendicular to the upper surface of the substrate 100, the area of the bottom surface of the plug 307a of the memory cell 11 is smaller than the area of the first variable resistance layer 112.

The plugs 307a and 307b are different from each other in the positions of contact with the first variable resistance element 141 (the third upper electrode layer 113) and the second variable resistance element 241 (the fourth upper electrode layer 213).

When seen from the direction perpendicular to the upper surface of the substrate 100, the centers of the conductive shorting layer 151 and the second variable resistance layer 212 of the second variable resistance element 241 in the reference cell 21 are different from each other.

The conductive shorting layer 151 has a shape such as a circular shape in which an x-direction maximum width and a y-direction maximum width are the same when seen from the direction perpendicular to the upper surface of the substrate 100.

When the lower part of the plug 307b is caused to function as the conductive shorting layer 151, the conductive shorting layer 151 is typically provided for each reference cell 21.

The second current steering element 242 includes a second lower electrode layer 208, a second current steering layer 209, and a second upper electrode layer 210. The reference cell 21 in FIGS. 3C and 4 and the reference cell 21 in FIG. 7 have the same second current steering element 242.

As described above, the non-volatile memory device according to this variation provides advantageous effects similar to those in Embodiment 1.

In addition, the non-volatile memory device according to this variation includes the plug 307b connecting the fourth lines 219 and the reference cell 21 and serving as the conductive shorting layer 151. Thus, it is possible to realize the conductive shorting layer 151 having a low resistance value. For this reason, it is possible to reduce an error in a current steering characteristic to be detected in the second current steering element 242. As a result, it is possible to apply a voltage optimum for causing the memory cells 11 to operate in different non-volatile memory devices, and to thereby reduce error operations in the non-volatile memory devices and a difference in current steering characteristic.

Next, a method for manufacturing a non-volatile memory device according to this variation is described.

Figure 9A:
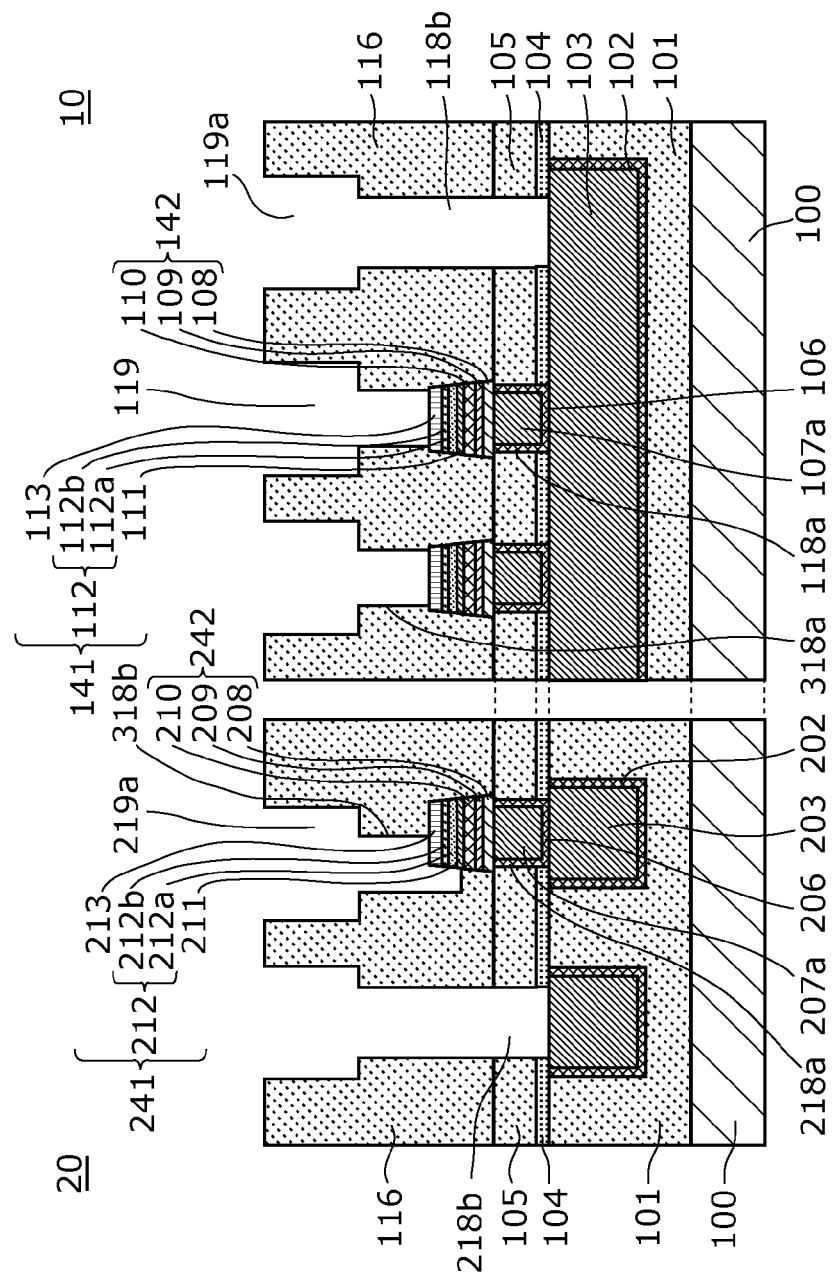
FIG. 9A is a cross-sectional view for explaining the method for manufacturing the non-volatile memory device according to Variation 1 of Embodiment 1 of the present invention.
Figure 9B:
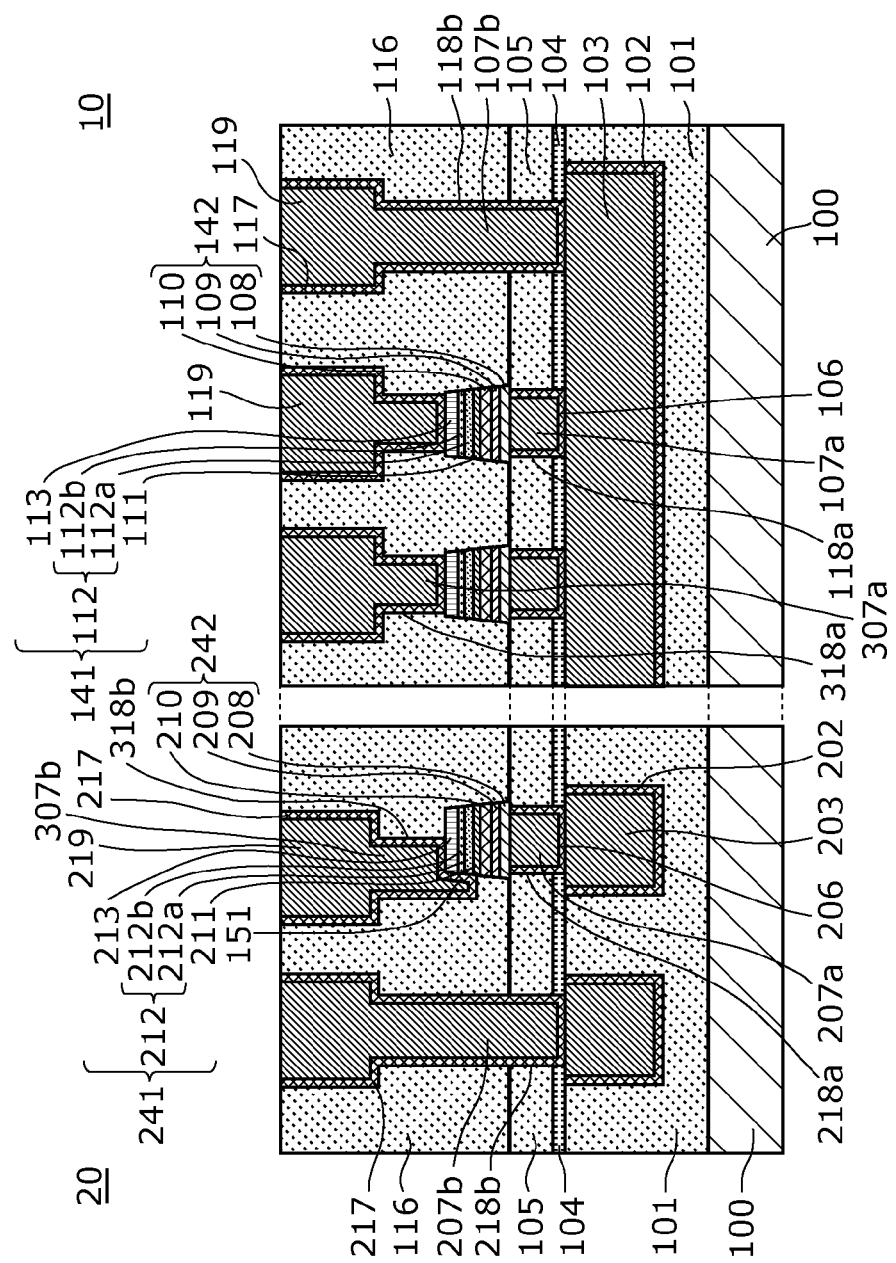
FIG. 9B is a cross-sectional view for explaining the method for manufacturing the non-volatile memory device according to Variation 1 of Embodiment 1 of the present invention.
Figure 9C:
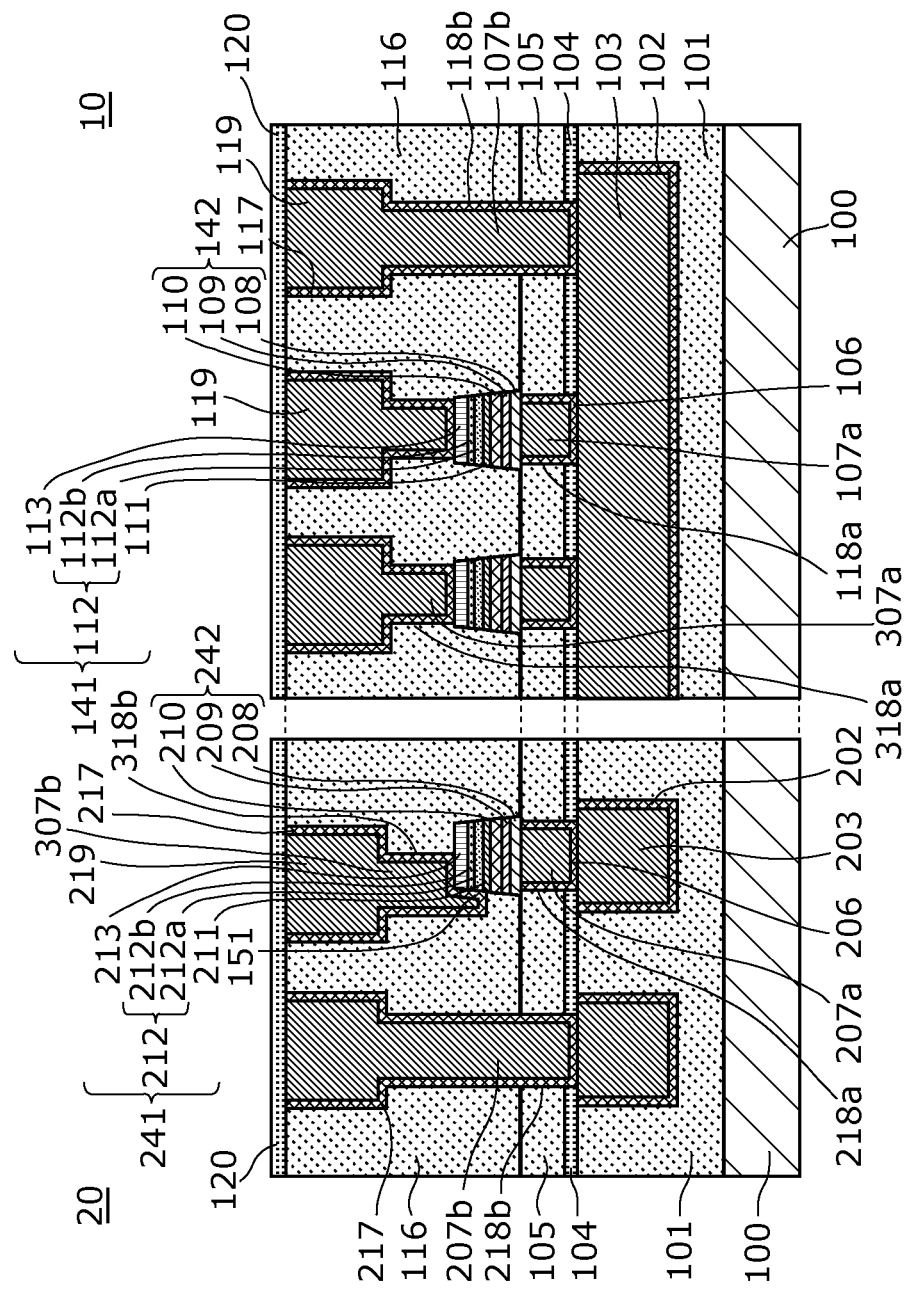
FIG. 9C is a cross-sectional view for explaining the method for manufacturing the non-volatile memory device according to Variation 1 of Embodiment 1 of the present invention.

Each of FIG. 9A to 9C is a cross-sectional view for explaining an exemplary method for forming a memory cell array 10 and a parameter generation circuit 20 according to this variation.

A non-volatile memory device manufacturing method according to this variation is different in the processes shown in FIGS. 5G and 5H, from the non-volatile memory device manufacturing method shown in FIGS. 5A to 5I. In other words, the non-volatile memory device manufacturing method according to this variation is different from the non-volatile memory device manufacturing method according to Embodiment 1 in the point of forming fourth lines 219 and a plug 307b of the reference cell 21 which connects the fourth lines 219 and a fourth upper electrode layer 213 in a process for forming a conductive shorting layer 151 to use, as the conductive shorting layer 151, parts of the plug 307 of the reference cell 21 (the parts are in contact with the fourth upper electrode layer 213 and the fourth lower electrode layer 211).

Hereinafter, differences from the non-volatile memory device according to Embodiment 1 are mainly described.

After the processes shown in FIGS. 5A to 5F referred to in Embodiment 1, as shown in FIG. 9A, the following are formed: a contact hole 318a for forming a plug 307a for connection to the third upper electrode layer 113 of the first variable resistance element 141; a contact hole 318b for forming a plug 307b for connection to the side surfaces of the second variable resistance element 241 included in the reference cell 21; wiring grooves 119a and 219a for forming second lines 119 and fourth lines 219; and contact holes 218a and 118b. In a dry etching process for forming the contact hole 318b, the following are partly (at side surfaces) exposed: the fourth upper electrode layer 213, the second variable resistance layer 212, and the fourth lower electrode layer 211 which are included in the second variable resistance element 241 in the reference cell 21. In a succeeding process shown in FIG. 9B, in the contact hole 318b in which side surfaces of the second variable resistance element 241 are exposed, a conductor is embedded to form the plug 307b.

More specifically, as shown in FIG. 9A, the third interlayer dielectric 116 for embedding the second lines 119 and the fourth lines 219 is deposited to cover the first variable resistance element 141, the second variable resistance element 241, the first current steering element 142, and the second current steering element 242. Subsequently, through photolithography and dry etching, the following are formed in the third interlayer dielectric 116: a plug 307a for connection to the third upper electrode layer 113 in the first variable resistance element 141; and contact holes 318a and 318b for embedding a plug 307b for connection to side surfaces of the second variable resistance element 241 included in the reference cell 21. At this time, in a dry etching process for forming the contact hole 318b, the following are partly exposed: the fourth upper electrode layer 213, the second variable resistance layer 212, and the fourth lower electrode layer 211 which are included in the second variable resistance element 241 in the reference cell 21. When the contact holes 318a and 318b are formed, wiring grooves 119a and 218a for embedding the second lines 119 and the fourth lines 219 are formed through photolithography and dry etching. Furthermore, the contact holes 118b and 218b for forming plugs 107b and 207b which are connected to the first lines 103 and the third lines 203 are formed at predetermined positions without the first variable resistance element 141, the second variable resistance element 241, the first current steering element 142, and the second current steering element 242.

Next, as shown in FIG. 9B, a conductive shorting layer 151 is formed such that the centers of the plug 307b of the reference cell 21 and the second variable resistance layer 212 are different when seen from the direction perpendicular to the upper surface of the substrate 100. In other words, the conductive shorting layer 151 is formed such that at least part of the outline of the conductive shorting layer 151 is positioned outward from the outline of the second variable resistance layer 212 when seen from the direction perpendicular to the upper surface of the substrate 100. More specifically, (i) third barrier metal layers 117 and 217 including a tantalum nitride (5 nm to 40 nm) and tantalum (5 nm to 40 nm) and (ii) copper (50 nm to 300 nm) for a material for wiring are deposited, using a sputtering method or the like, in the contact holes 118b and 218b, the contact holes 318a and 318b, and the wiring grooves 119a and 219a. Here, conditions used here are the same as those in the process for embedding the first line 103 and the third line 203 as shown in FIG. 5A. Next, by further depositing copper as a seed using an electroplating method or the like, the contact holes 118b and 218b, the contact holes 318a and 318b, and the wiring grooves 119a and 219a are fully filled with the copper as the material for wiring and the third barrier metal layers 117 and 217. Next, by removing unnecessary part of the copper on the surface and unnecessary parts of the third barrier metal layers 117 and 217 using a CMP method, the second line 119 and the fourth line 219 are formed to have a flat surface which is flush with the surface of the third interlayer dielectric 116. In this way, the side surfaces of the fourth upper electrode layer 213, the second variable resistance layer 212, and the fourth lower electrode layer 211 included in the second variable resistance element 241 in the reference cell 21 are exposed through the formation of the contact hole 318a as shown in FIG. 9A, and the third barrier metal layer 217 and the copper as the wiring material are formed on the side surfaces to form the conductive shorting layer 151 having a low resistance value. With the conductive shorting layer 151, it is possible to form the reference cell 21 for detecting the current steering characteristic of the second current steering element 242 even when the second variable resistance layer 212 is in a high resistance state.

Next, as shown in FIG. 9C, a second liner layer 120 is formed by depositing a silicon nitride layer by 30 nm to 200 nm, as a specific example, by 50 nm, using a plasma CVD or the like above the second line 119, the fourth line 219, and the third interlayer dielectric 116, so as to cover the second line 119 and the fourth line 219.

As described above, the non-volatile memory device according to this variation provides advantageous effects similar to those in Embodiment 1.

In addition, according to the non-volatile memory device manufacturing method in this variation, it is possible to form the plug 307b and the conductive shorting layer 151 at the same time, and to reduce the number of manufacturing processes.

Variation 2 of Embodiment 1

Next, Variation 1 of Embodiment 2 of the present invention is described.

Figure 10:
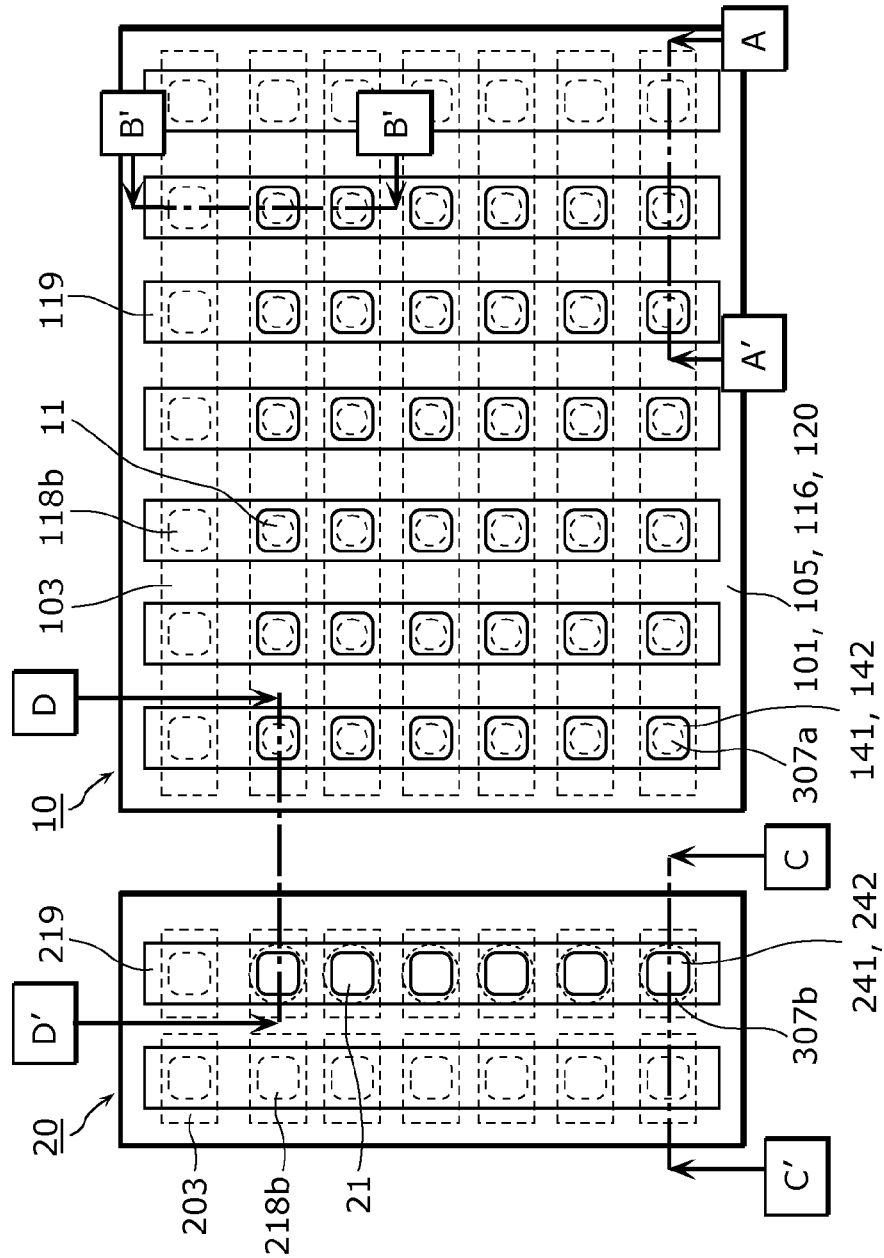
FIG. 10 is a plan view of an exemplary structure of a part of a non-volatile memory device according to Variation 2 of Embodiment 1 of the present invention.
Figure 11:
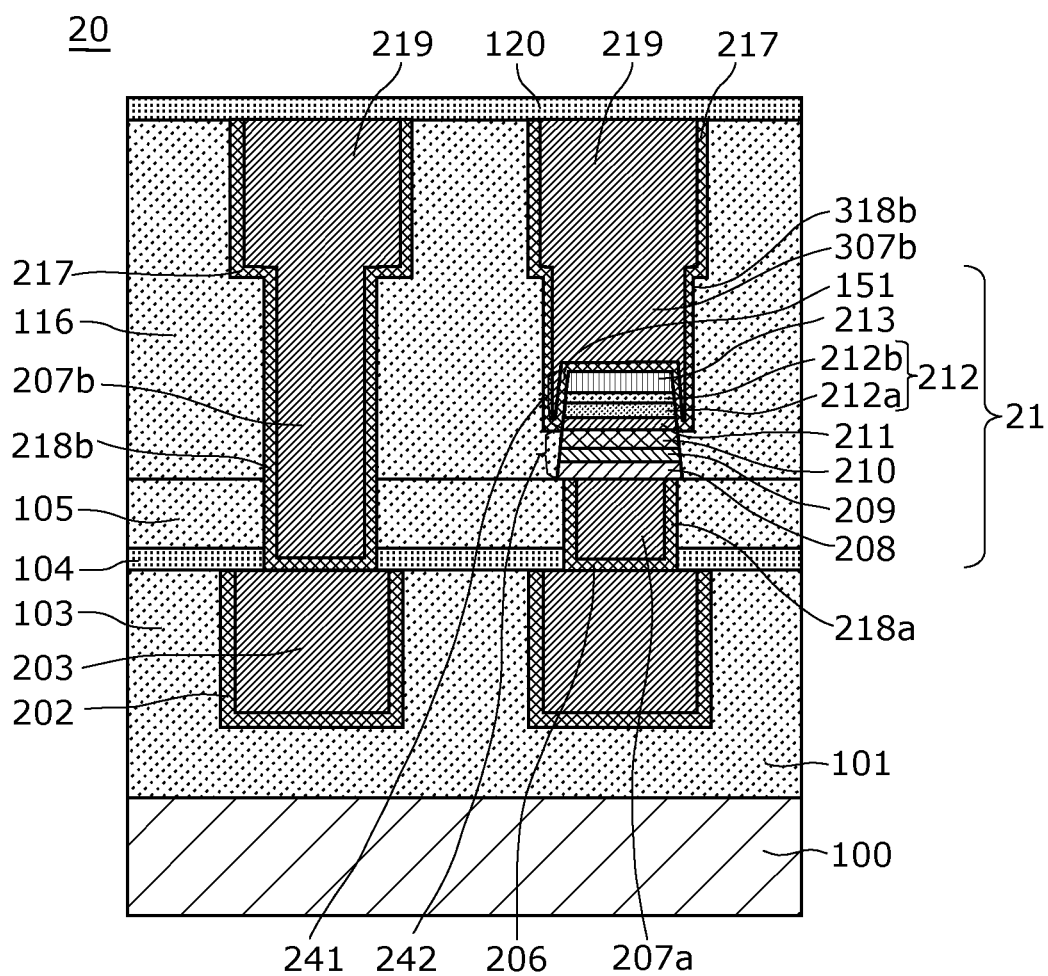
FIG. 11 is a cross-sectional view of an exemplary structure of a parameter generation circuit according to Variation 2 of Embodiment 1 of the present invention.
Figure 12:
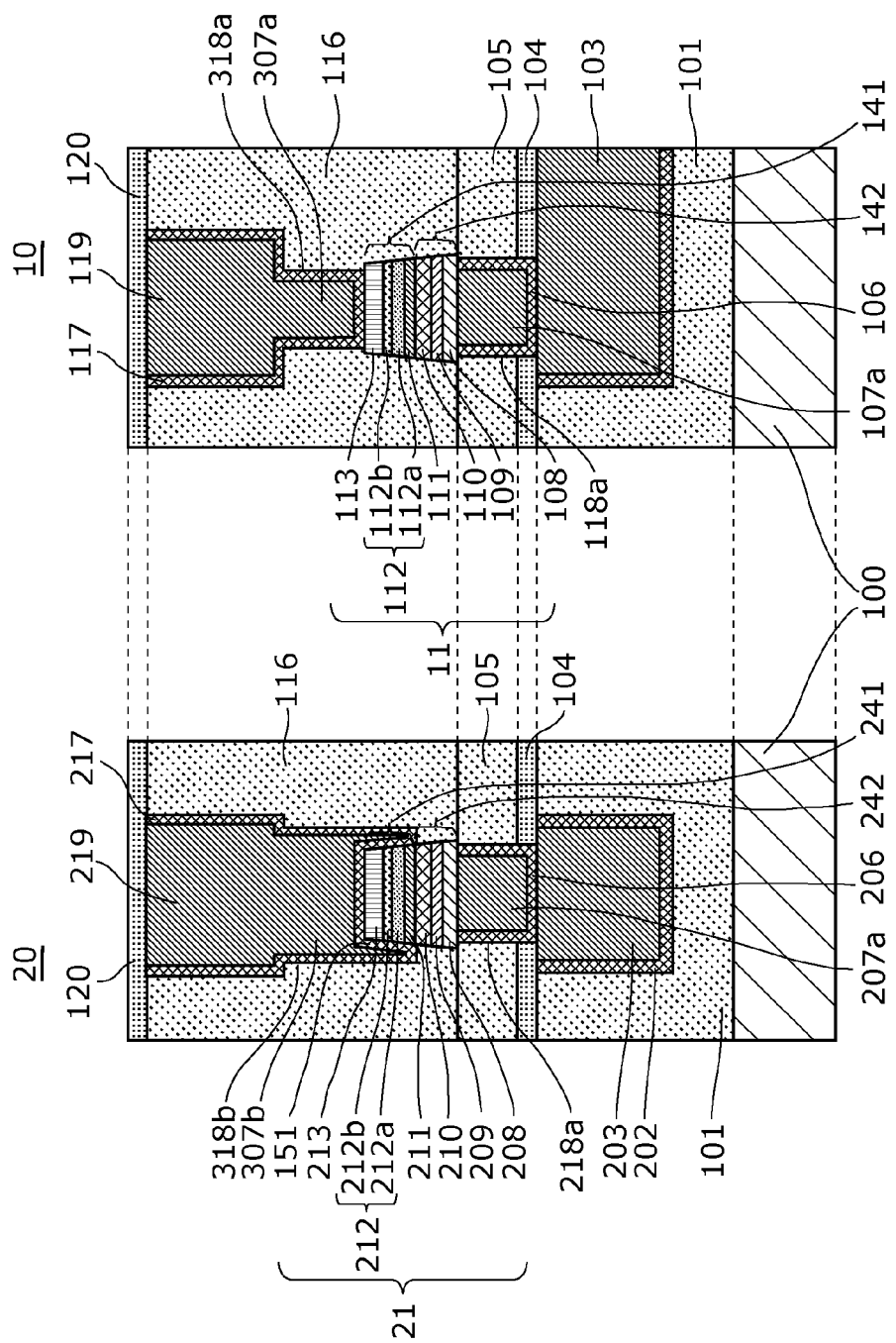
FIG. 12 is a plan view of an exemplary structure of a part of the non-volatile memory device according to Variation 2 of Embodiment 1 of the present invention.

FIG. 10 is a plan view of an exemplary structure of a part of the non-volatile memory device according to this variation. FIG. 11 is a cross-sectional view of an exemplary structure of the parameter generation circuit 20 according to this variation. FIG. 12 is a cross-sectional view of an exemplary structure of the non-volatile memory device according to this variation. FIG. 11 is a cross-sectional view of the cross section along the alternate long and short dash line shown in the C-C in FIG. 10 when seen from the arrow direction. FIG. 12 is a cross-sectional view of the cross section along the alternate long and short dash line shown in the D-D' in FIG. 10 when seen from the arrow direction.

Hereinafter, for convenience in explanation, Variation 2 is described focusing on differences from the non-volatile memory device according to Variation 1 of Embodiment 1. In other words, the same descriptions of FIGS. 10 to 12 in this variation as those of FIGS. 6 to 8 in Variation 1 are not repeated.

The non-volatile memory device according to this embodiment is different from the device in Variation 1 in that the entire outline of a plug 307b serving as a conductive shorting layer 151 in the reference cell 21 is positioned outward from the outline of the second variable resistance layer 212 when seen from the direction perpendicular to the upper surface of the substrate 100.

The area of the bottom surface (the area of the conductive shorting layer 151) of the plug 307b in the reference cell 21 is larger than the area of the bottom surface of a plug 307a in a memory cell 11, and is larger than the area of the second variable resistance layer 212. When seen from the direction perpendicular to the upper surface of the substrate 100, the area size of the bottom surface of the plug 307a of the memory cell 11 is smaller than the area size of the first variable resistance layer 112.

The bottom surfaces of the plug 307a and 307b are approximately the same in shape when seen from the direction perpendicular to the upper surface of the substrate 100, but are different in sizes and positions in contact with the first variable resistance element 141 (the third upper electrode layer 113) and the second variable resistance element 241 (the fourth upper electrode layer 213).

When seen from the direction perpendicular to the upper surface of the substrate 100, the centers of the conductive shorting layer 151 and the second variable resistance layer 212 of the second variable resistance element 241 in the reference cell 21 are different from each other.

The conductive shorting layer 151 has a shape such as a circular shape in which an x-direction maximum width and a y-direction maximum width are the same and encloses the second variable resistance element 241 when seen from the direction perpendicular to the upper surface of the substrate 100.

As described above, the non-volatile memory device according to this variation provides advantageous effects similar to those in Embodiment 1 and Variation 1.

Furthermore, the non-volatile memory device according to this variation includes the conductive shorting layer 151 on the entire side surfaces of the second variable resistance element 241. Thus, it is possible to reduce a resistance value in the conductive shorting layer 151 and to further reduce an error in a current steering characteristic to be detected in the second current steering element 242.

Next, a non-volatile memory device manufacturing method according to this variation is described focusing on differences from the non-volatile memory device in Variation 1, and the same descriptions may be omitted. In other words, the same descriptions of FIGS. 13A to 13C in this variation as those of FIGS. 9A to 9C in Variation 1 are not repeated.

Figure 13A:
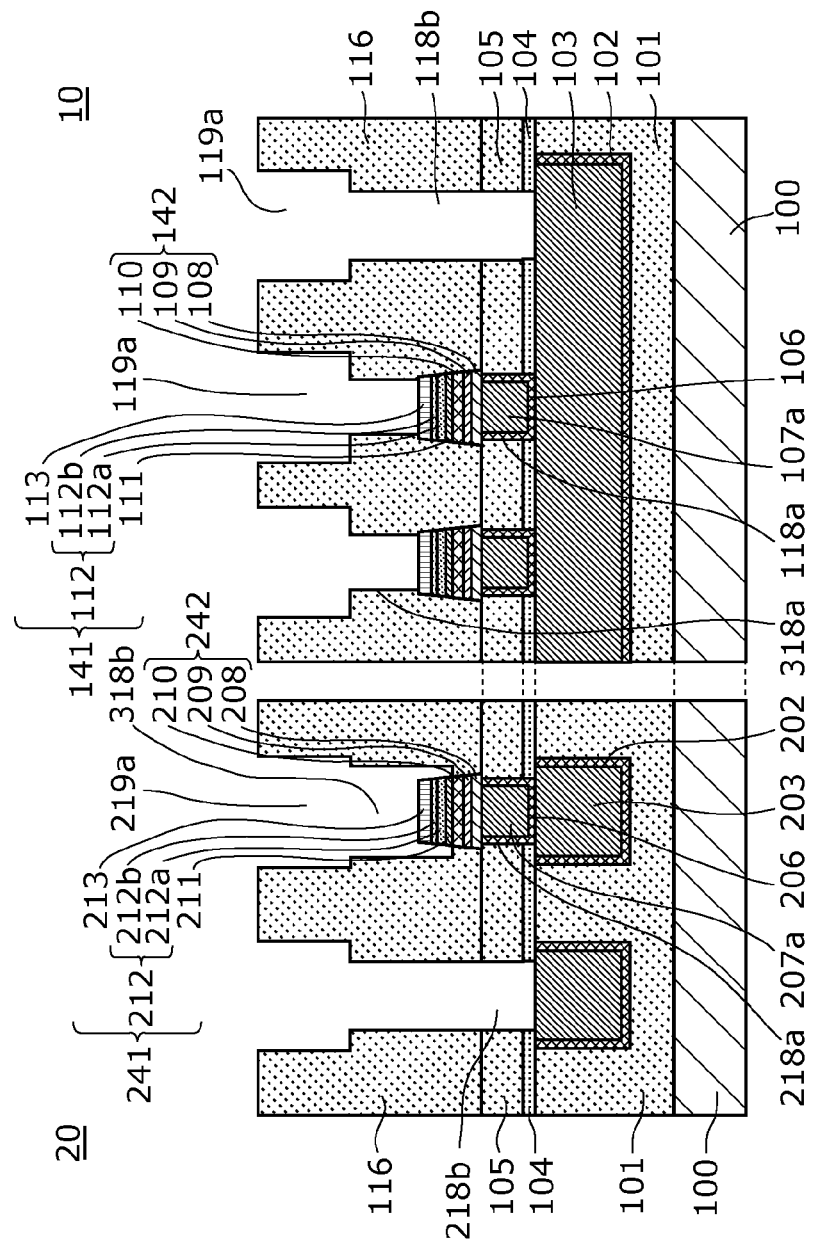
FIG. 13A is a cross-sectional view for explaining the method for manufacturing the non-volatile memory device according to Variation 2 of Embodiment 1 of the present invention.
Figure 13B:
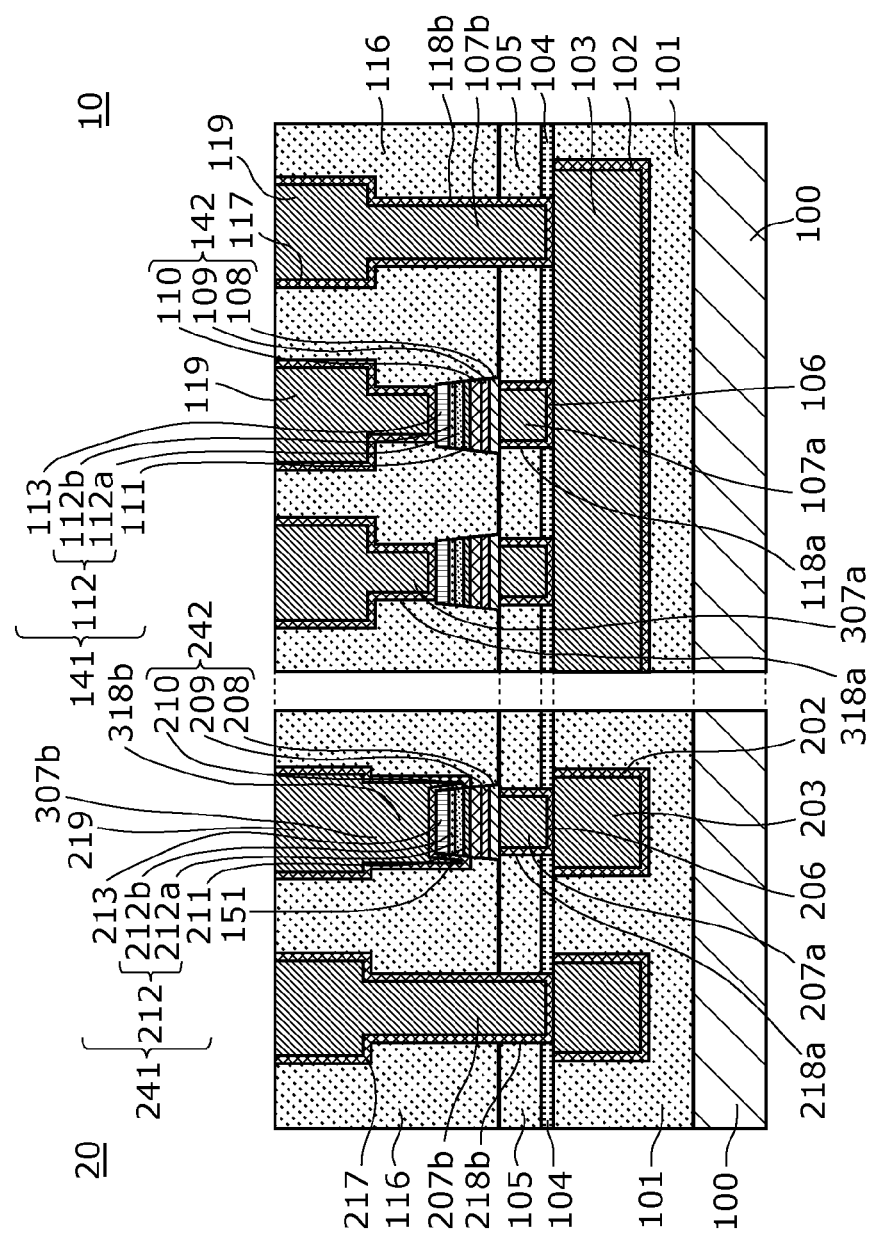
FIG. 13B is a cross-sectional view for explaining the method for manufacturing the non-volatile memory device according to Variation 2 of Embodiment 1 of the present invention.
Figure 13C:
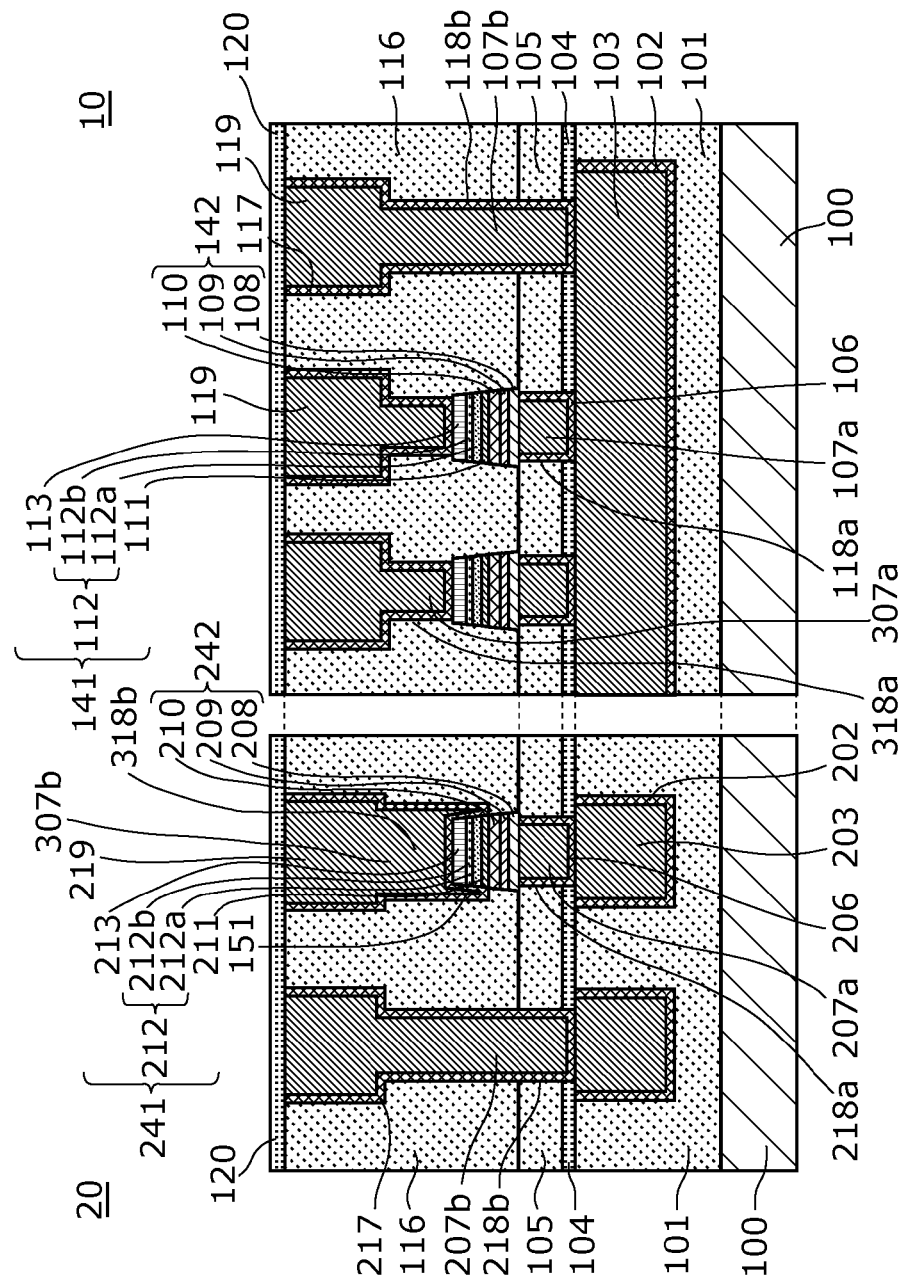
FIG. 13C is a cross-sectional view for explaining the method for manufacturing the non-volatile memory device according to Variation 2 of Embodiment 1 of the present invention.

Each of FIG. 13A to 13C is a cross section for explaining an exemplary method for forming the memory cell array 10 and the parameter generation circuit 20 according to this variation.

A non-volatile memory device manufacturing method according to this variation is different in the processes shown in FIGS. 5G and 5H, from the non-volatile memory device manufacturing method shown in FIGS. 5A to 5I. In addition, the process shown in FIG. 9A is particularly different from the manufacturing method shown in Variation 1.

After the processes shown in FIGS. 5A to 5F referred to in Embodiment 1, as shown in FIG. 13A, the following are formed: a contact hole 318a for forming a plug 307a for connection to the third upper electrode layer 113 of the first variable resistance element 141; a contact hole 318b for forming a plug 307b for connection to the side surfaces of the second variable resistance element 241 included in the reference cell 21 and larger than the second variable resistance element 241; wiring grooves 119a and 219a for forming second lines 119 and fourth lines 219; and contact holes 218a and 118b. Here, the entire upper part of the second variable resistance element 241 in the reference cell 21 is exposed in a dry etching process for forming the contact hole 318b. The entire upper surface of the second variable resistance element 241 means at least part of (i) the entire upper and side surfaces of the fourth upper electrode layer 213, (ii) the entire side surfaces of the second variable resistance layer 212, and (iii) the side surfaces of the fourth lower electrode layer 211. In a succeeding process shown in FIG. 13B, in the contact hole 318b in which the entire upper surface of the second variable resistance element 241 is exposed, a conductor is embedded to form the plug 307b. When seen from the direction perpendicular to the upper surface of the substrate 100, the contact hole 318b is larger than the second variable resistance element 241.

More specifically, after the deposition of the third interlayer dielectric 116, the following are formed in the third interlayer dielectric 116 through photolithography and dry etching: a plug 307a for connection to the third upper electrode layer 113 in the first variable resistance element 141; and contact holes 318a and 318b for embedding a plug 307b for connection to the entire upper surface of the second variable resistance element 241 included in the reference cell 21. At this time, the entire upper surface of the second variable resistance element 241 in the reference cell 21 is exposed in a dry etching process for forming the contact hole 318b.

Next, as shown in FIG. 13B, the conductive shorting layer 151 is formed such that the entire conductive shorting layer 151 is positioned outward from the outline of the second variable resistance layer 212 when seen from the direction perpendicular to the upper surface of the substrate 100. Subsequently, as shown in FIG. 13C, the second liner layer 120 is formed.

As described above, the non-volatile memory device manufacturing method according to this variation provides advantageous effects similar to those in Embodiment 1 or Variation 1.

Furthermore, according to the non-volatile memory device manufacturing method in this variation, the conductive shorting layer 151 is formed to cover the entire surface of the second variable resistance element 241 in the reference cell 21. Thus, it is possible to manufacture the reference cell 21 capable of operating stably with a process margin.

Embodiment 2

Descriptions are given of an exemplary structure of a non-volatile memory device according to Embodiment 2 of the present invention and a method for manufacturing the same. Hereinafter, differences from Embodiment 1 are mainly described.

Figure 14:
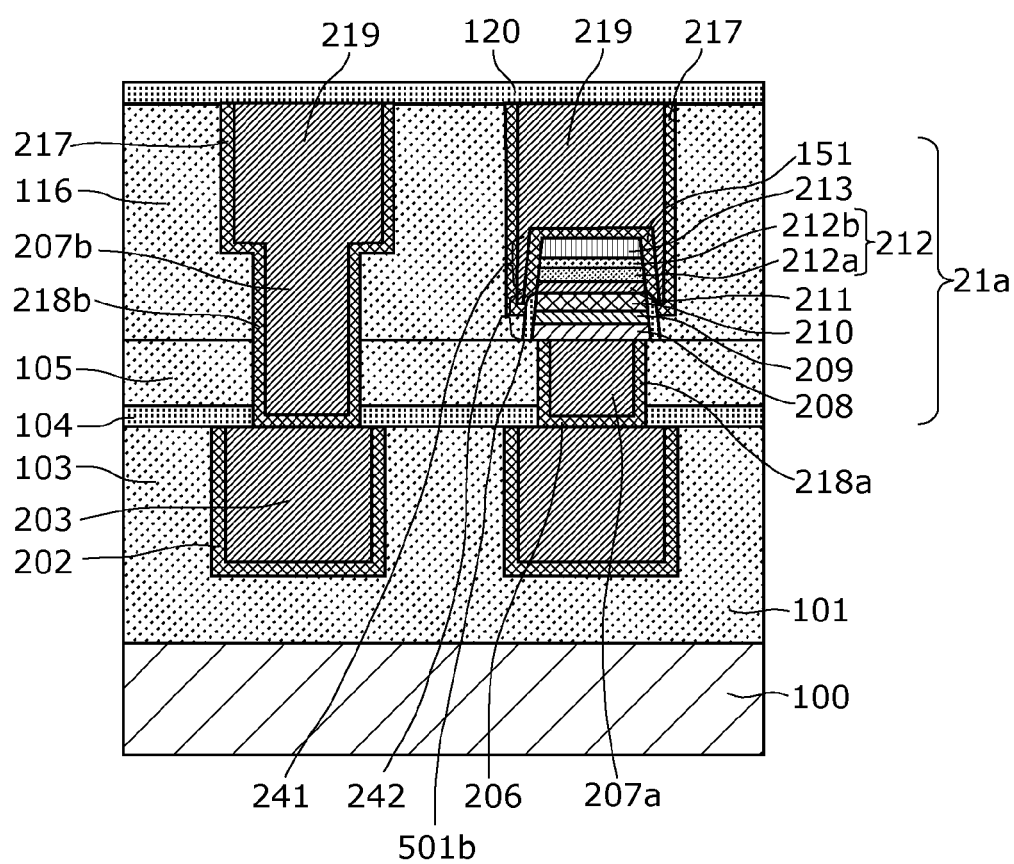
FIG. 14 is a cross-sectional view of an exemplary structure of a parameter generation circuit according to Embodiment 2 of the present invention.
Figure 15:
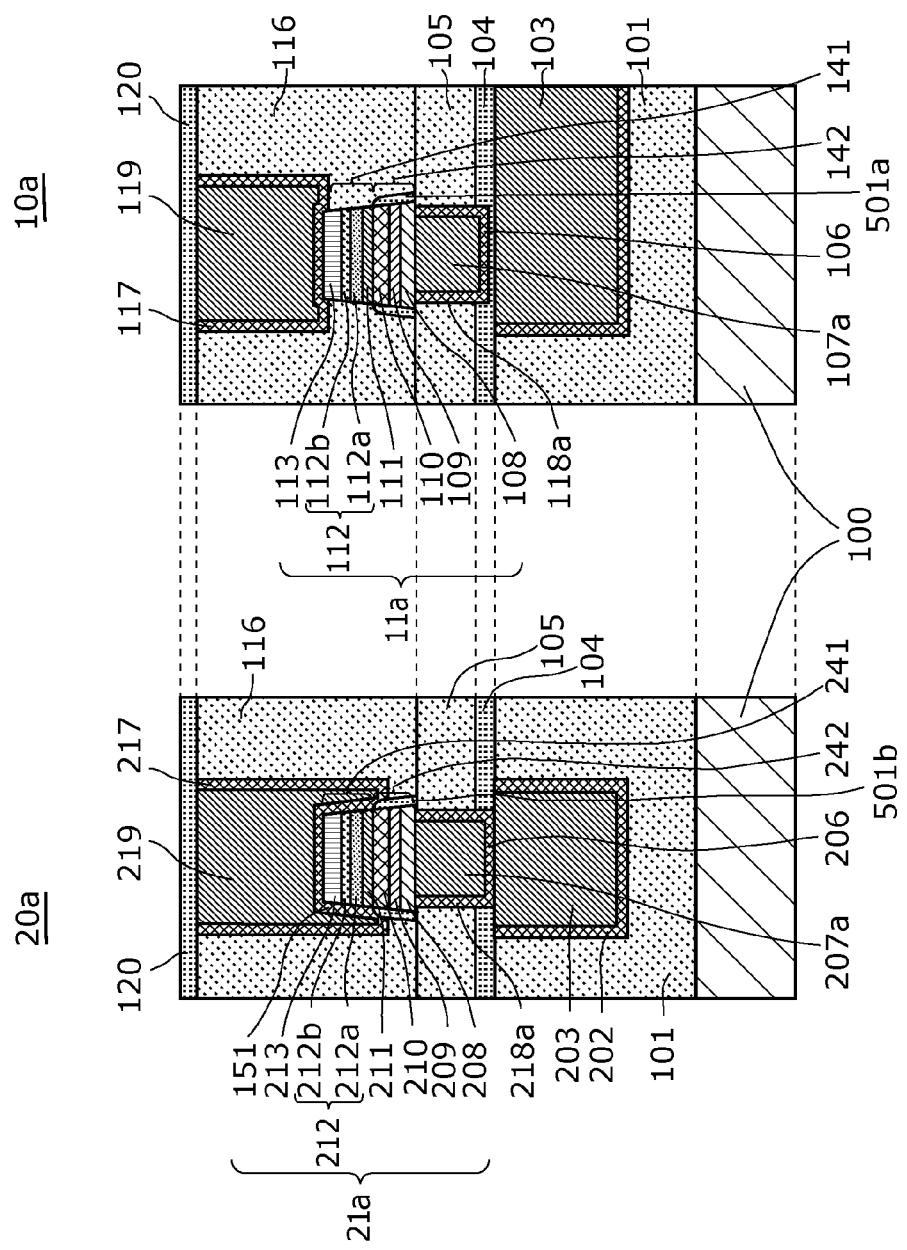
FIG. 15 is a cross-sectional view of the exemplary structure of a non-volatile memory device according to Embodiment 2 of the present invention.

FIG. 14 is a cross-sectional view of an exemplary structure of the parameter generation circuit 20a according to this embodiment. FIG. 15 is a cross-sectional view of an exemplary structure of the non-volatile memory device according to this embodiment. The plan view of the non-volatile memory device according to this embodiment is the same as in FIG. 2. FIG. 14 is a cross-sectional view of the cross section along the alternate long and short dash line shown in the C-C' in FIG. 2 when seen from the arrow direction. FIG. 15 is a cross-sectional view of the cross section along the alternate long and short dash line shown in the D-D' in FIG. 15 when seen from the arrow direction.

The non-volatile memory device according to this embodiment is different from the non-volatile memory device in Embodiment 1 in that a current steering element 142 and a second current steering element 242 have side surfaces covered by dielectric side walls 501a and 501b.

Here, the third barrier metal layer 117 may be replaced with a second line 119 without formation of the third barrier metal layer 117 in a wiring groove, and the third barrier metal layer 217 may be replaced with a fourth line 219 without formation of the third barrier metal layer 217 in a wiring groove. In each of FIG. 14 to FIG. 19H showing this embodiment, the third barrier metal layer 117 in the wiring groove is a part of the second lines 119, and the third barrier metal layer 217 in the wiring groove is a part of the fourth lines 219. In this case, a conductive shorting layer 151 is formed as parts of the fourth line 219 (the parts positioned at the both sides including the parts in contact with the side surfaces of a second variable resistance element 241, in other words, the side surfaces of a fourth upper electrode layer 213 and a fourth electrode layer 211).

Hereinafter, an exemplary non-volatile memory device according to this embodiment is described in detail below.

A memory cell 11a and a reference cell 21a shown in FIG. 14 and FIG. 15 respectively have structures each including a dielectric side wall 501b on the side surfaces of a second current steering element 242 or a dielectric side wall 501a on the side surfaces of a first current steering element 142, in addition to a corresponding one of the memory cell 11 and the reference cell 21 shown in FIG. 3C and FIG. 4. In other words, the memory cell 11a and the reference cell 21a have the same structures as the structures of the memory cell 11 and the reference cell 21 in Embodiment 1, except in the points that the dielectric side walls 501b and 501a are formed on the side surfaces of the second current steering element 242 in the reference cell 21a and the first current steering element 142 in the memory cell 11a.

As described above, the non-volatile memory device according to this embodiment provides advantageous effects similar to those provided by the non-volatile memory device in this embodiment.

Furthermore, since the non-volatile memory device according to this embodiment includes the dielectric side walls 501a and 501b on the side surfaces of the first current steering element 142 and the second current steering element 242, it is possible to realize the memory cell 11a and the reference cell 21a capable of operating stably with a process margin.

Next, a description is given of a method for manufacturing the aforementioned non-volatile memory device, specifically, an exemplary method for forming a memory cell array 10a and a parameter generation circuit 20a.

Each of FIG. 16A to 16F is a cross-sectional view for explaining an exemplary method for forming the memory cell array 10a and the parameter generation circuit 20a according to this embodiment.

The manufacturing method according to this embodiment is different from the non-volatile memory device manufacturing method in FIG. 5A to FIG. 5I, at and after the process in FIG. 5F. In other words, the non-volatile memory device manufacturing method in this embodiment is different from the non-volatile memory device manufacturing method in Embodiment 1 in the point of having an element forming process for forming dielectric side walls 501a and 501b on side surfaces of the first current steering element 142 and the second current steering element 242 before a process for forming a conductive shorting layer 151. In other words, the non-volatile memory device manufacturing method in this embodiment is different from the non-volatile memory device manufacturing method in Embodiment 1 in the point of having the process for forming the dielectric side walls 501a and 501b on the side surfaces of the first current steering element 142 and the second current steering element 242, after the processes for forming by patterning the respective elements (the first variable resistance element 141, the second variable resistance element 241, the first current steering element 142, and the second current steering element 242).

Hereinafter, an exemplary method for manufacturing the non-volatile memory device according to this embodiment is described in detail below.

Figure 16A:
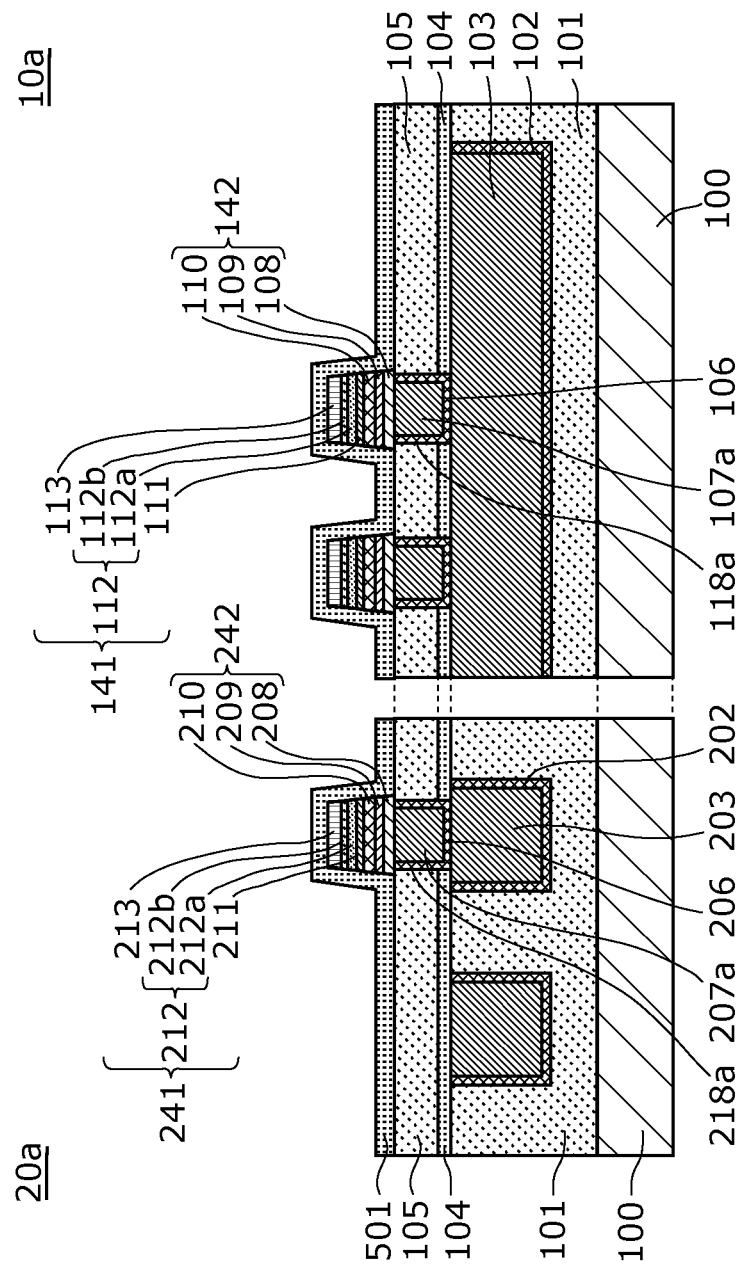
FIG. 16A is a cross-sectional view for explaining the method for manufacturing the non-volatile memory device according to Embodiment 2 of the present invention.

First, after the processes shown in FIG. 5A to 5E described in Embodiment 1, as shown in FIG. 16A, a silicon nitride dielectric 501 (having a film thickness of 170 nm) is deposited on the second interlayer dielectric 105 using a plasma CVD, to cover the first variable resistance element 141, the second variable resistance element 241, the first current steering element 142, the second current steering element 242, and the second interlayer dielectric 105.

Figure 16B:
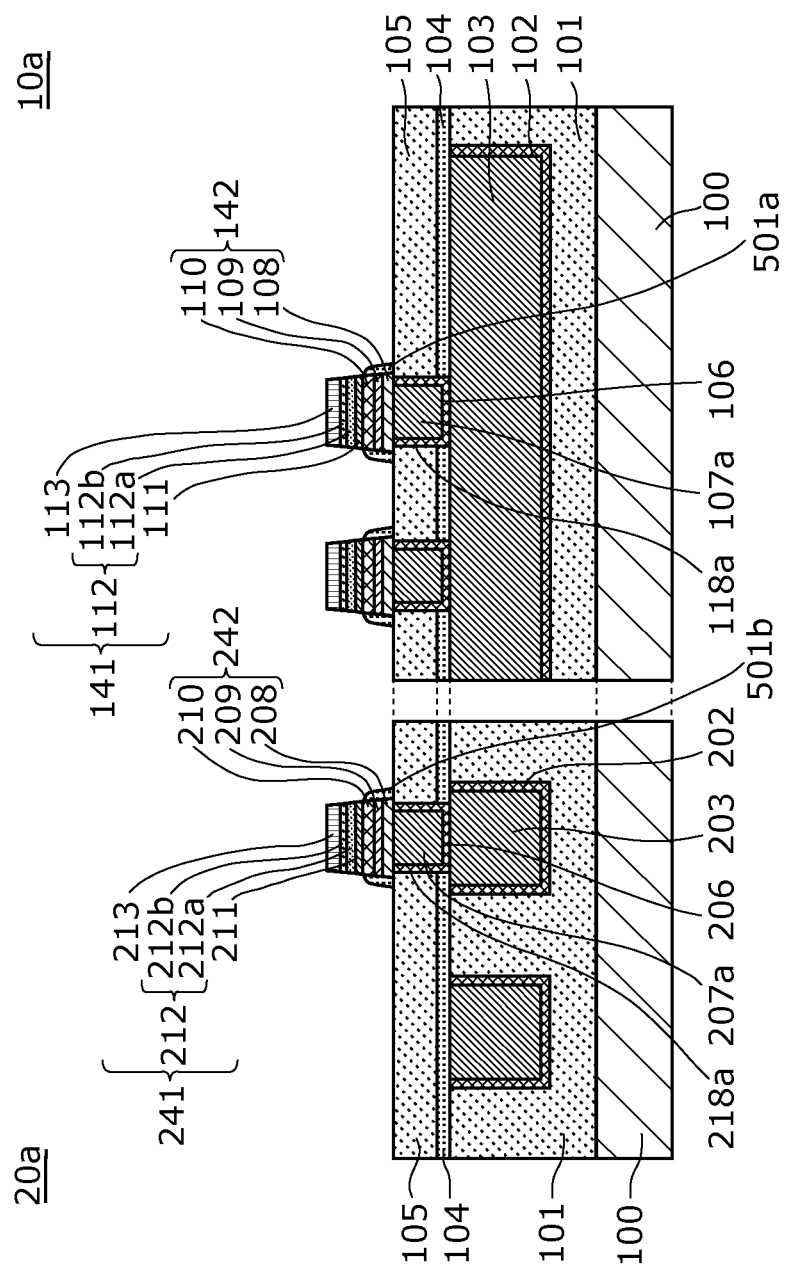
FIG. 16B is a cross-sectional view for explaining the method for manufacturing the non-volatile memory device according to Embodiment 2 of the present invention.

Next, as shown in FIG. 16B, the deposited dielectric 501 is removed by performing etch back (anisotropic etching) on the dielectric 501 from the upper surfaces of the third upper electrode layer 113 and the fourth upper electrode layer 213, the upper surface of the second interlayer dielectric 105, and the side surfaces of the first variable resistance element 141 and the second variable resistance element 241. In this way, by performing etch back, it is possible to form the dielectric side wall 501a on the side surfaces of the first current steering element 142 and the dielectric side wall 501b on the side surfaces of the second current steering element 242.

An exemplary method for etching the dielectric 501 is a method for using responsive ion etching (RIE). In the case of using such responsive ion etching, in general, etching rate is overwhelmingly faster in an ion injection direction (a perpendicular direction) than in another direction (a perpendicular direction). For this reason, by performing etching back using such responsive ion etching, it is possible to maintain the dielectric 501 only on the side surfaces (side walls) of the first current steering element 142 and the second current steering element 242, and to easily form the dielectric side walls 501a and 501b (having a film thickness of 150 nm).

Figure 16C:
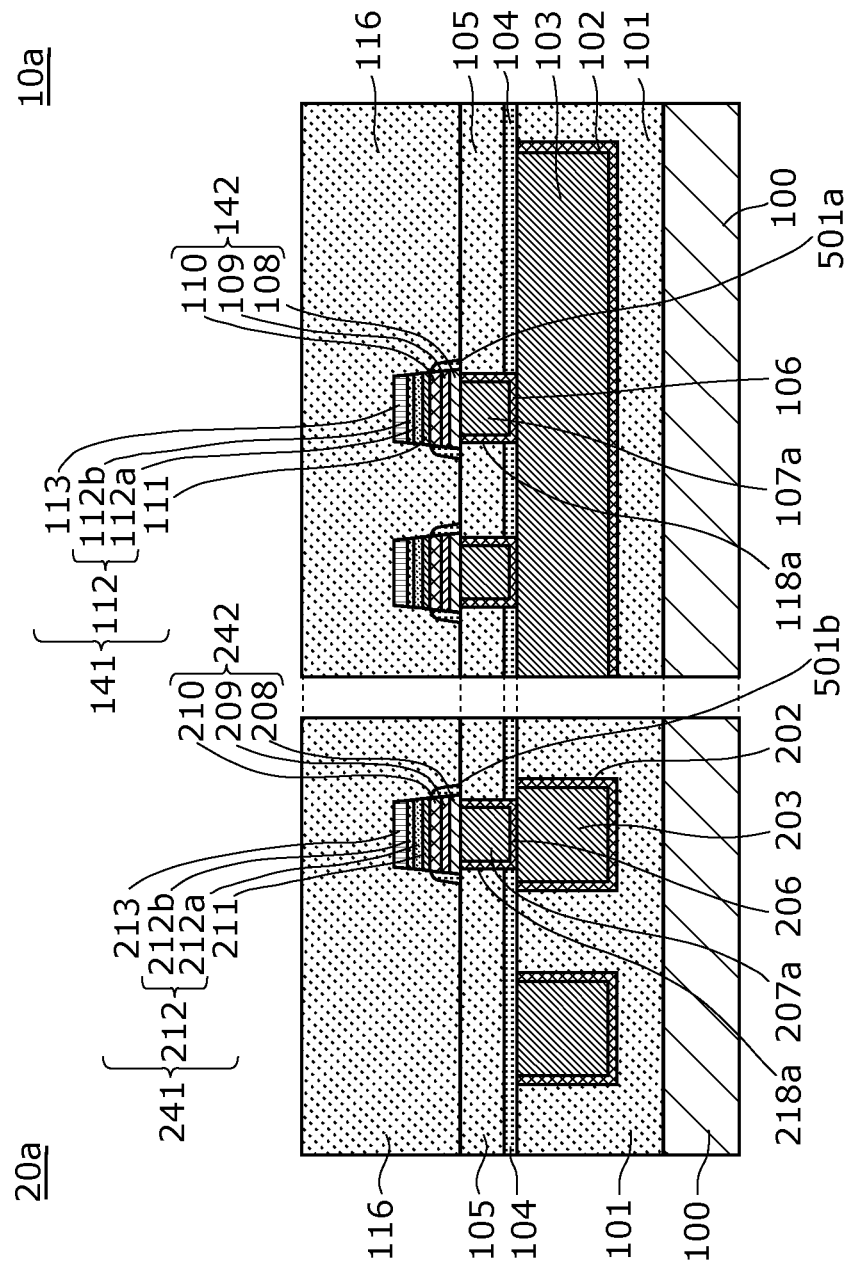
FIG. 16C is a cross-sectional view for explaining the method for manufacturing the non-volatile memory device according to Embodiment 2 of the present invention.
Figure 16D:
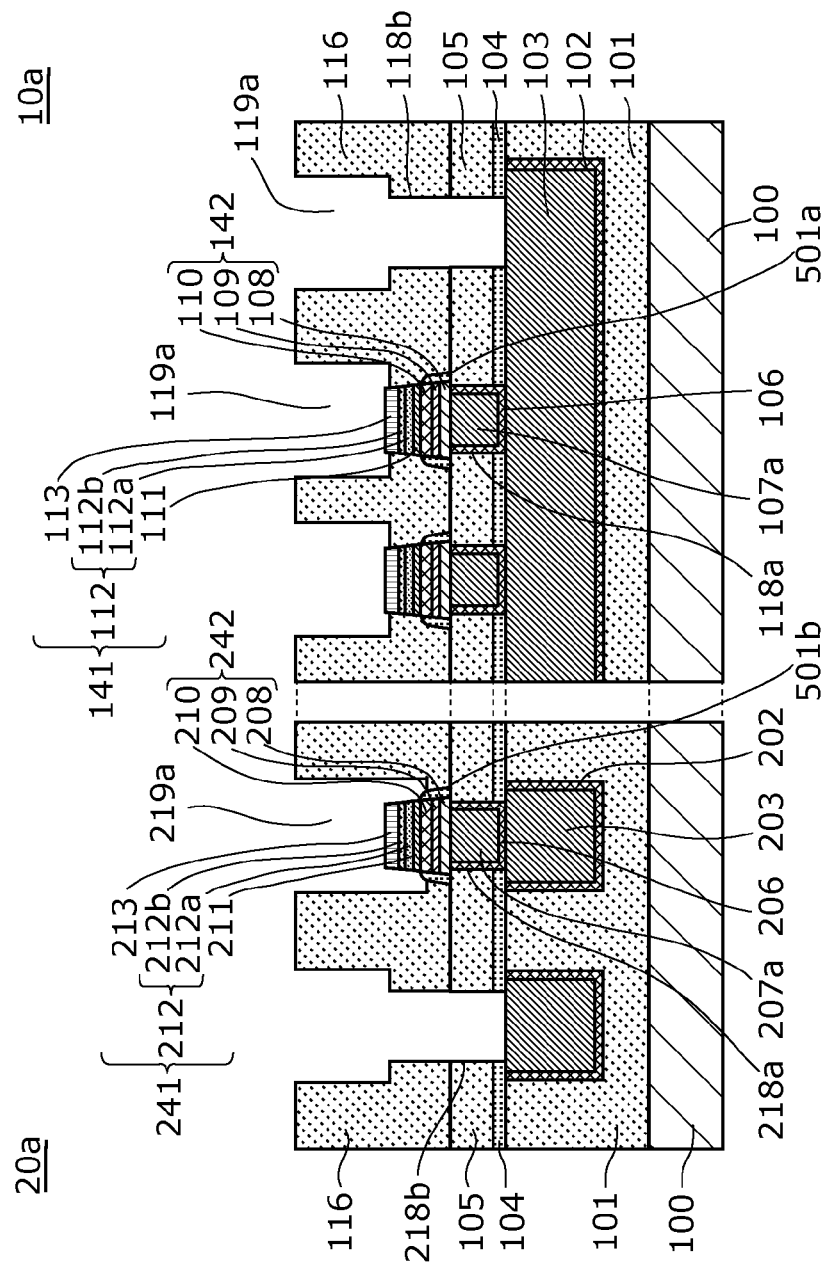
FIG. 16D is a cross-sectional view for explaining the method for manufacturing the non-volatile memory device according to Embodiment 2 of the present invention.

Next, as shown in FIGS. 16C and 16D, a third interlayer dielectric 116 is formed to cover the first variable resistance element 141, the second variable resistance element 241, the dielectric side wall 501a formed on the side surfaces of the first current steering element 142, and the dielectric side wall 501b formed on the side surfaces of the second current steering element 242. Next, wiring grooves 119a and 219a and contact holes 218a and 118b are formed in the third interlayer dielectric 116. The wiring grooves 119a and 219a are used to form (i) a second line 119 to be connected to the third upper electrode layer 113 of the first variable resistance element 141 and (ii) a fourth line 219 to be connected to a side surface of the second variable resistance element 241 included in the reference cell 21a. As a specific formation method, it is possible to use the same method similar to the one described with reference to FIGS. 5F and 5G in Embodiment 1.

At this time, the dielectric side wall 501b is formed on the side surfaces of the second current steering element 242. Accordingly, even when the third interlayer dielectric 116 is etched too deeply so that the bottom surface of the wiring groove 219a is below the lower surface of the fourth lower electrode layer 211 in a dry etching process for forming the wiring groove 219a, the dielectric side wall 501b formed in advance eliminates the possibility that the side surfaces of the second current steering element 242 are exposed. In this way, even when the wiring groove 219a is filled with a conductor later on, the embedded conductor does not adhere to the side surfaces of the second current steering element 242. In this way, for example, even when dry etching processes are significantly different, it is possible to prevent short-circuiting in the second current steering element 242. Thus, it is possible to increase the process margin.

Next, as shown in FIG. 16E, a second line 119 and a fourth line 219 are formed. As a specific formation method, it is possible to use the same method similar to the one described with reference to FIG. 5H in Embodiment 1. In this way, a part of the fourth line 219 becomes a conductive shorting layer 151 by being in contact with the side surfaces of the fourth upper electrode layer 213, the second variable resistance layer 212, and the fourth lower electrode layer 211 included in the second variable resistance element 241 of the reference cell 21*a* shown in FIG. 16D. In this way, it is possible to form the reference cell 21*a* for detecting the current steering characteristic of the second current steering element 242 even when the second variable resistance layer 212 is in a high resistance state.

Figure 16F:
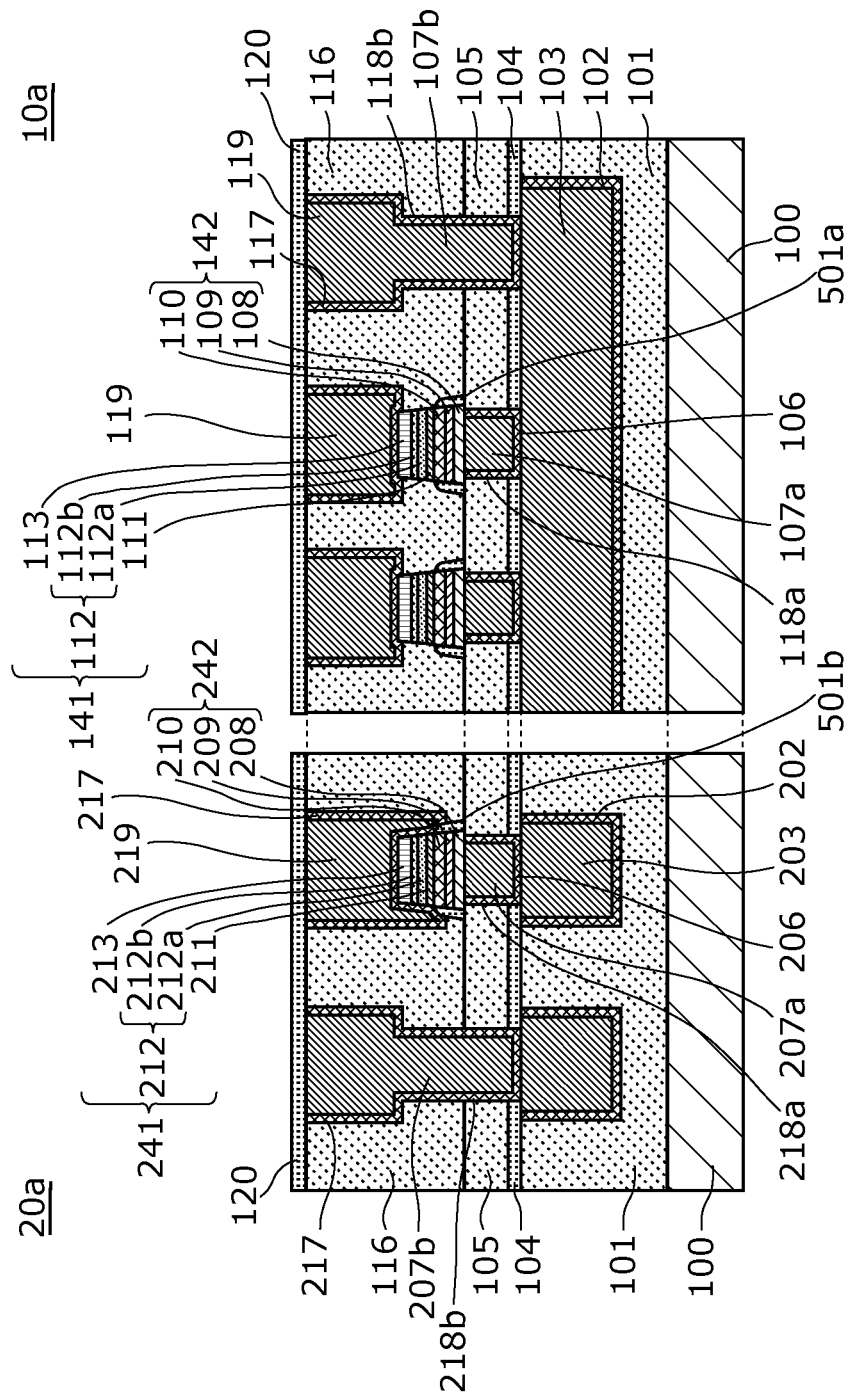
FIG. 16F is a cross-sectional view for explaining the method for manufacturing the non-volatile memory device according to Embodiment 2 of the present invention.

Next, as shown in FIG. 16F, the second liner layer 120 is formed.

As described above, the non-volatile memory device according to this embodiment provides advantageous effects similar to those in Embodiment 1.

In addition, according to the non-volatile memory device manufacturing method in this embodiment, the dielectric side wall 501*a* is formed on the side surfaces of the first current steering element 142 and the dielectric side wall 501*b* is formed on the side surfaces of the second current steering element 242, before forming the conductive shorting layer 151. The formation of the dielectric side walls increases the process margin in a succeeding process for forming the conductive shorting layer 151. Thus, it is possible to stably manufacture the second current steering element 242.

In addition, according to the non-volatile memory device manufacturing method in this embodiment, the first current steering element 142 and the second current steering element 242 are formed at the same time, and the dielectric side walls 501*a* and 501*b* are formed on the side wall parts at the same time. Thus, it is possible to form the first current steering element 142 and the second current steering element 242 having the same non-linear current steering characteristic.

In this embodiment as in Variations 1 and 2 of Embodiment 1, the conductive shorting layer 151 may be formed with a plug 307*b* disposed between the fourth line 219 and the upper electrode layer 213.

Variation 1 of Embodiment 2

Next, Variation 1 of Embodiment 2 of the present invention is described.

Figure 17:
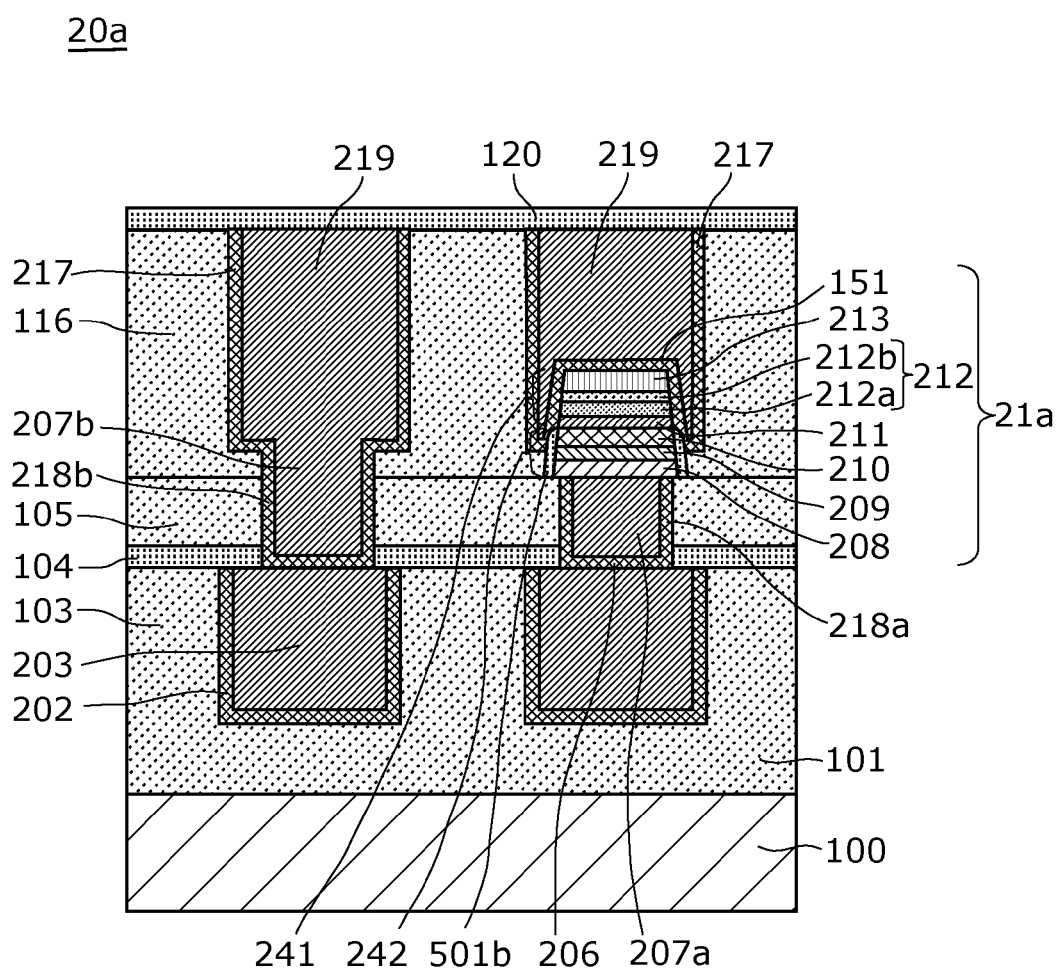
FIG. 17 is a cross-sectional view of an exemplary structure of a parameter generation circuit according to Variation 1 of Embodiment 2 of the present invention.
Figure 18:
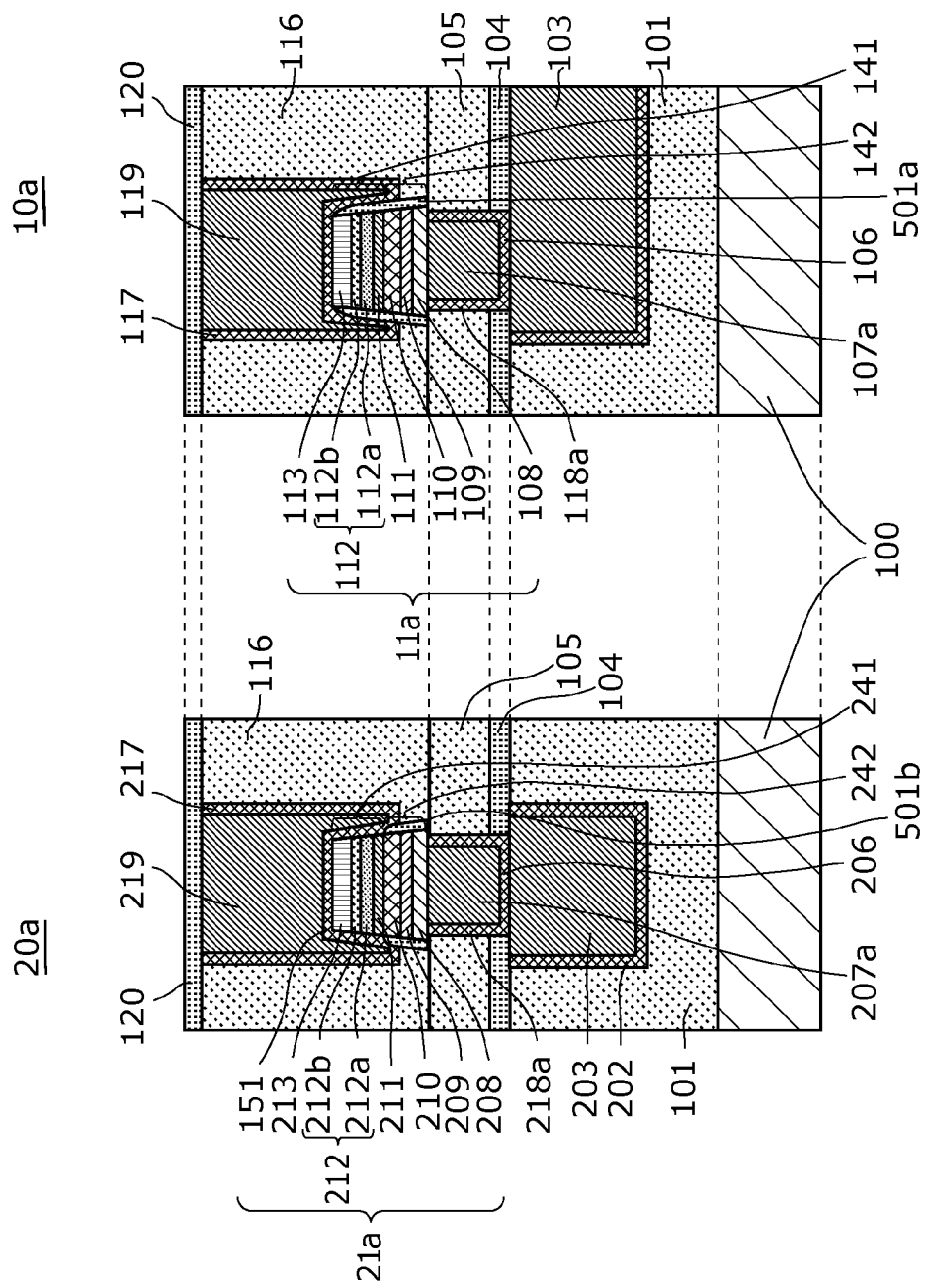
FIG. 18 is a plan view of an exemplary structure of a part of a non-volatile memory device according to Variation 1 of Embodiment 2 of the present invention.

FIG. 17 is a cross-sectional diagram showing an exemplary structure of the parameter generation circuit 20 according to this variation. FIG. 18 is a cross-sectional view of an exemplary structure of the non-volatile memory device according to this variation. The plan view of the non-volatile memory device according to this embodiment is the same as in FIG. 2. FIG. 17 is a cross-sectional view of the cross section along the alternate long and short dash line shown in the C-C in FIG. 2 when seen from the arrow direction. FIG. 18 is a cross-sectional view of the cross section along the alternate long and short dash line shown in the D-D' in FIG. 2 when seen from the arrow direction.

The non-volatile memory device in this variation is different from the non-volatile memory device in Embodiment 2 in that a first variable resistance element 141 has side surfaces covered by the dielectric side wall 501*a*.

More specifically, the reference cell 21*a* shown in FIG. 17 and FIG. 18 has the same structure as the reference cell 21*a* shown in FIG. 14 and FIG. 15. However, the memory cell 11*a* shown in FIG. 18 is configured to have the dielectric side wall 501*a* formed on side surfaces of the first variable resistance element 141 and side surfaces of the first current steering element 142. Accordingly, the memory cell 11*a* is different from the reference cell 21*a* in FIG. 14 and FIG. 15 and the reference cell 21*a* in FIG. 17 and FIG. 18 only in the point that the dielectric side wall 501*a* is formed in areas different from those in the reference cell 21*a*, and is the same as the reference cell 21*a* in the structure of the second current steering element 242, and the areas in which the dielectric side wall 501*b* are formed.

As described above, the non-volatile memory device according to this variation provides advantageous effects similar to those in Embodiment 2.

In addition, the non-volatile memory device in this variation has a first variable resistance element 141 having side surfaces covered by the dielectric side wall 501*a*. Accordingly, even when the second line 119 and the fourth line 219 are formed in the same depth, it is possible to cause short-circuiting only in the second variable resistance element 241 without causing any short-circuiting in the first variable resistance element 141. For this reason, it is possible to easily manufacture the non-volatile memory device, and to reduce the manufacturing cost.

Next, a method for manufacturing a non-volatile memory device according to this variation is described.

Each of FIG. 19A to 19H is a cross section for explaining an exemplary method for forming the memory cell array 10*a* and the parameter generation circuit 20*a* according to this variation.

The non-volatile memory device manufacturing method according to this variation is different from the non-volatile memory device manufacturing method shown in FIG. 16A to FIG. 16F in the processes starting with FIG. 16B. In other words, the non-volatile memory device manufacturing method according to this variation is different from the non-volatile memory device manufacturing method according to Embodiment 2 in the point of forming the dielectric side wall 501*a* on the side surfaces of the first variable resistance element 141 in the process for forming the dielectric side walls 501*a* and 501*b*. More specifically, the non-volatile memory device manufacturing method according to this variation is different from the non-volatile memory device manufacturing method according to Embodiment 2 in the point of forming the dielectric side wall 501*a* on the side surfaces of the first variable resistance element 141 and the first current steering element 142 included in the memory cell 11*a*, selectively removing the dielectric side wall 501*b* from the side surfaces of the second variable resistance element 241 included in the reference cell 21*a*, and forming the dielectric side wall 501*b* only on the side surfaces of the second current steering element 242.

Hereinafter, a non-volatile memory device manufacturing method according to this variation is described focusing on differences from the non-volatile memory device in Embodiment 2, and the same descriptions may be omitted. More specifically, the same descriptions of FIGS. 19A to 19H in this variation as those of FIGS. 16A to 18 in Embodiment 2 are not repeated.

Figure 19A:
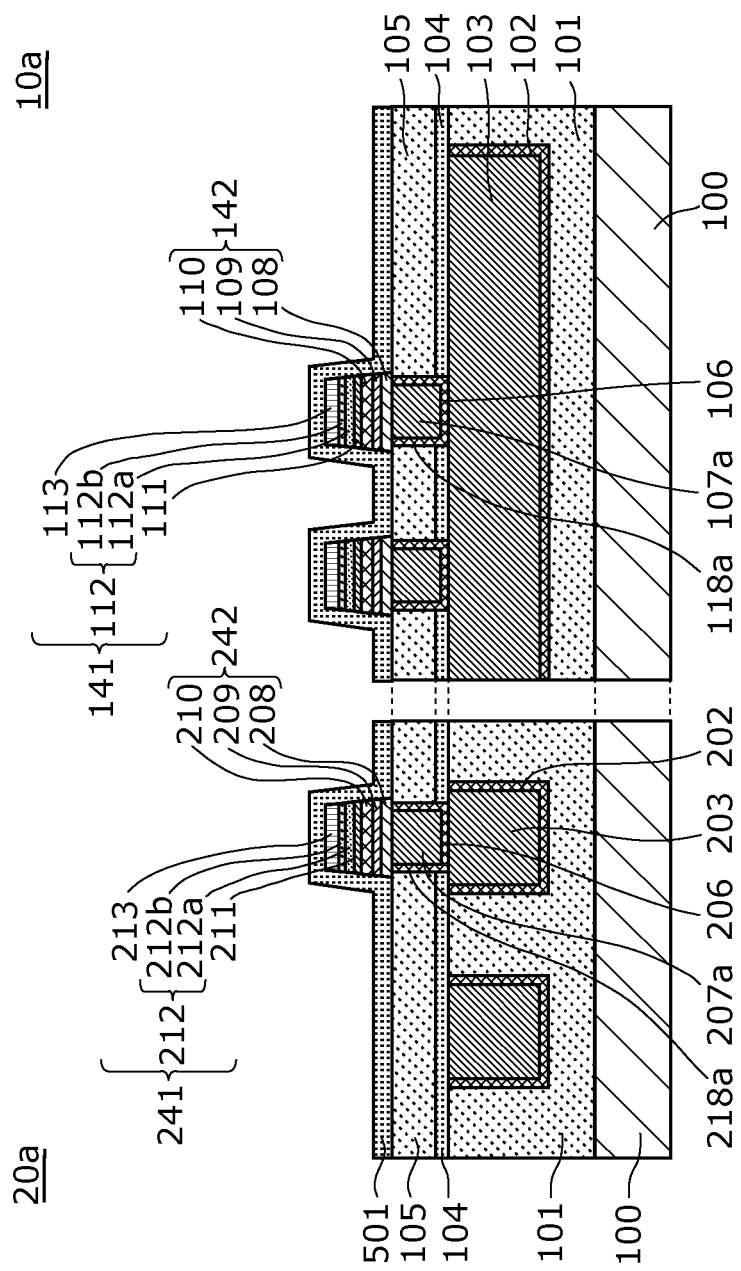
FIG. 19A is a cross-sectional view for explaining the method for manufacturing the non-volatile memory device according to Variation 1 of Embodiment 2 of the present invention.

After the processes shown in FIGS. 5A to 5E referred to in Embodiment 1, as shown in FIG. 19A, a dielectric 501 is deposited on the second interlayer dielectric 105 to cover the first variable resistance element 141, the first current steering element 142, the second variable resistance element 241, the second current steering element 242, and the second interlayer dielectric 105.

Figure 19B:
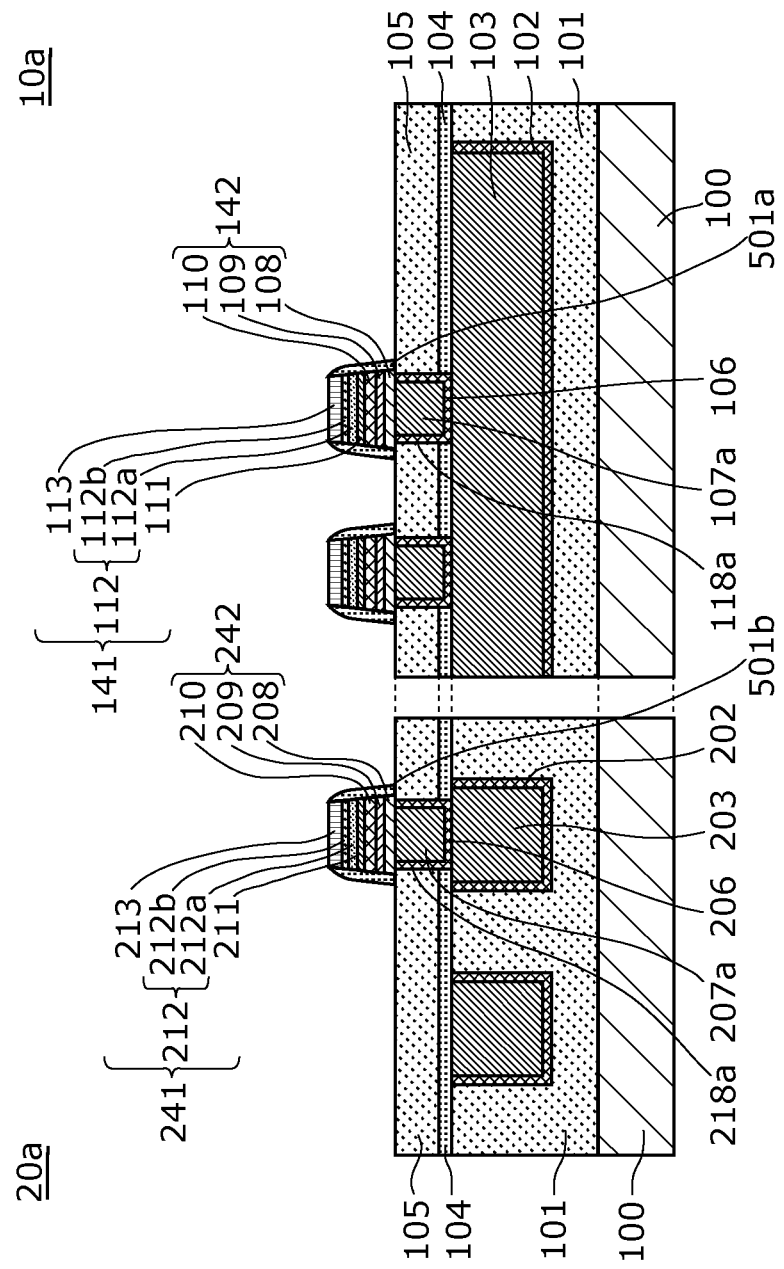
FIG. 19B is a cross-sectional view for explaining the method for manufacturing the non-volatile memory device according to Variation 1 of Embodiment 2 of the present invention.

Next, as shown in FIG. 19B, it is possible to form the dielectric side walls 501a and 501b by performing etch back (anisotropic etching) onto the dielectric 501. It is to be noted that FIG. 19B is different from FIG. 16B in Embodiment 2 in that the dielectric side wall 501a covers not only side surfaces of the first current steering element 142 but also side surfaces of the first variable resistance element 141, and that the dielectric side wall 501b covers not only side surfaces of the second current steering element 242 but also side surfaces of the second variable resistance element 241.

Figure 19C:
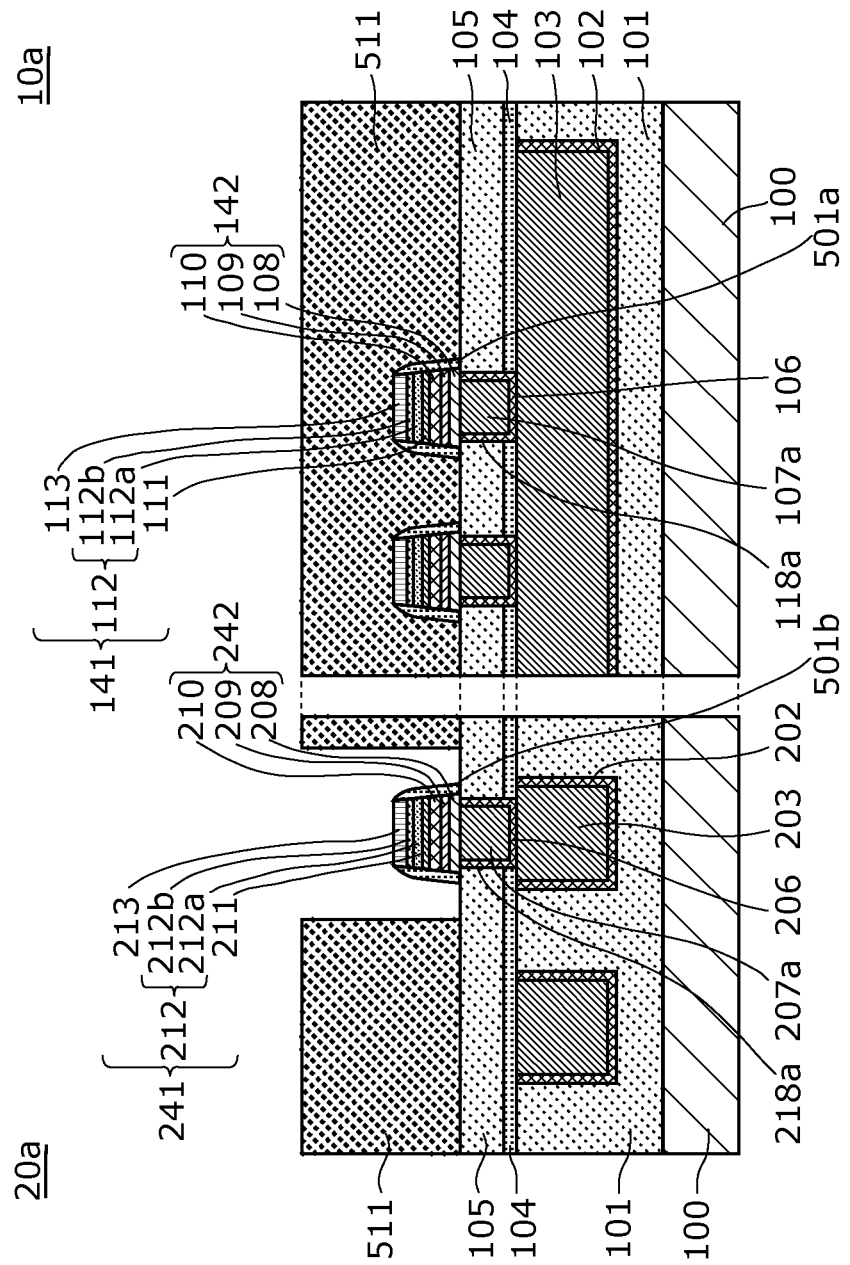
FIG. 19C is a cross-sectional view for explaining the method for manufacturing the non-volatile memory device according to Variation 1 of Embodiment 2 of the present invention.

Next, as shown in FIG. 19C, a third resist mask pattern 511 is formed to cover an area other than the area in which the reference cell 21a is formed in order to selectively remove the dielectric side wall 501b formed on the side surfaces of the second variable resistance element 241 included in the reference cell 21a.

Figure 19D:
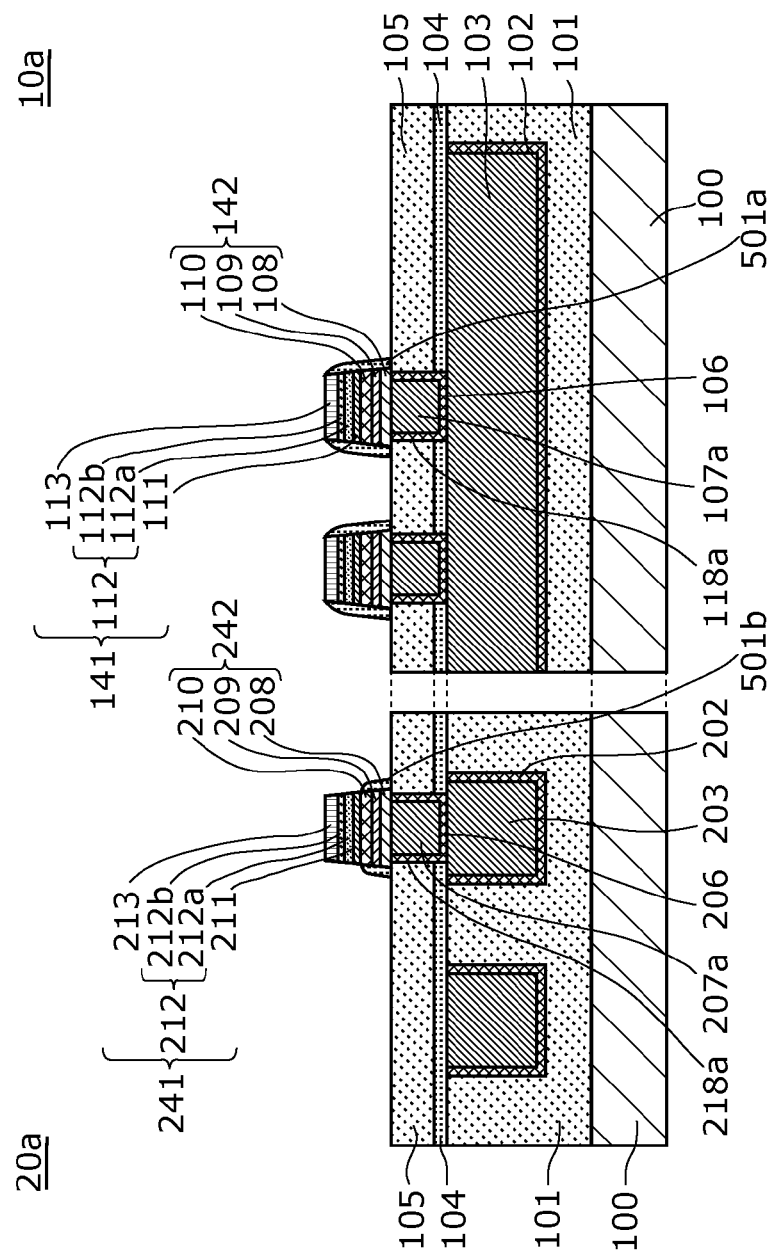
FIG. 19D is a cross-sectional view for explaining the method for manufacturing the non-volatile memory device according to Variation 1 of Embodiment 2 of the present invention.

Next, as shown in FIG. 19D, the dielectric side wall 501b formed on the side surfaces of the second variable resistance element 241 included in the reference cell 21a are removed by etching. For example, a conceivable etching method is to adjust etching time using the method (anisotropic etching) shown in FIG. 16B in Embodiment 1. In this way, it is possible to selectively etch only the dielectric side wall 501b formed on the side surfaces of the second variable resistance element 241 included in the reference cell 21a to leave the dielectric side wall 501b only on the side surfaces of the second current steering element 242. Next, the third resist mask pattern 511 is removed by performing an ashing process.

Figure 19E:
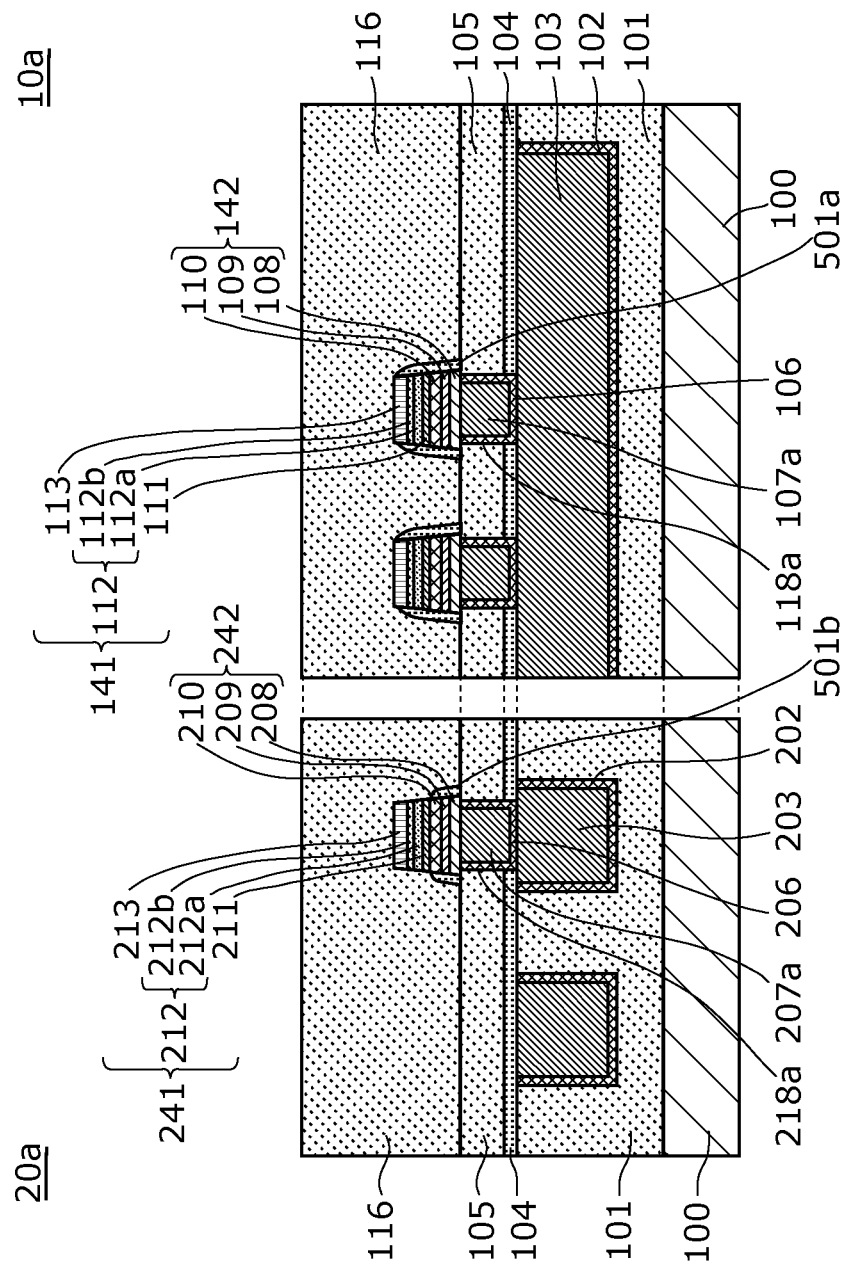
FIG. 19E is a cross-sectional view for explaining the method for manufacturing the non-volatile memory device according to Variation 1 of Embodiment 2 of the present invention.
Figure 19F:
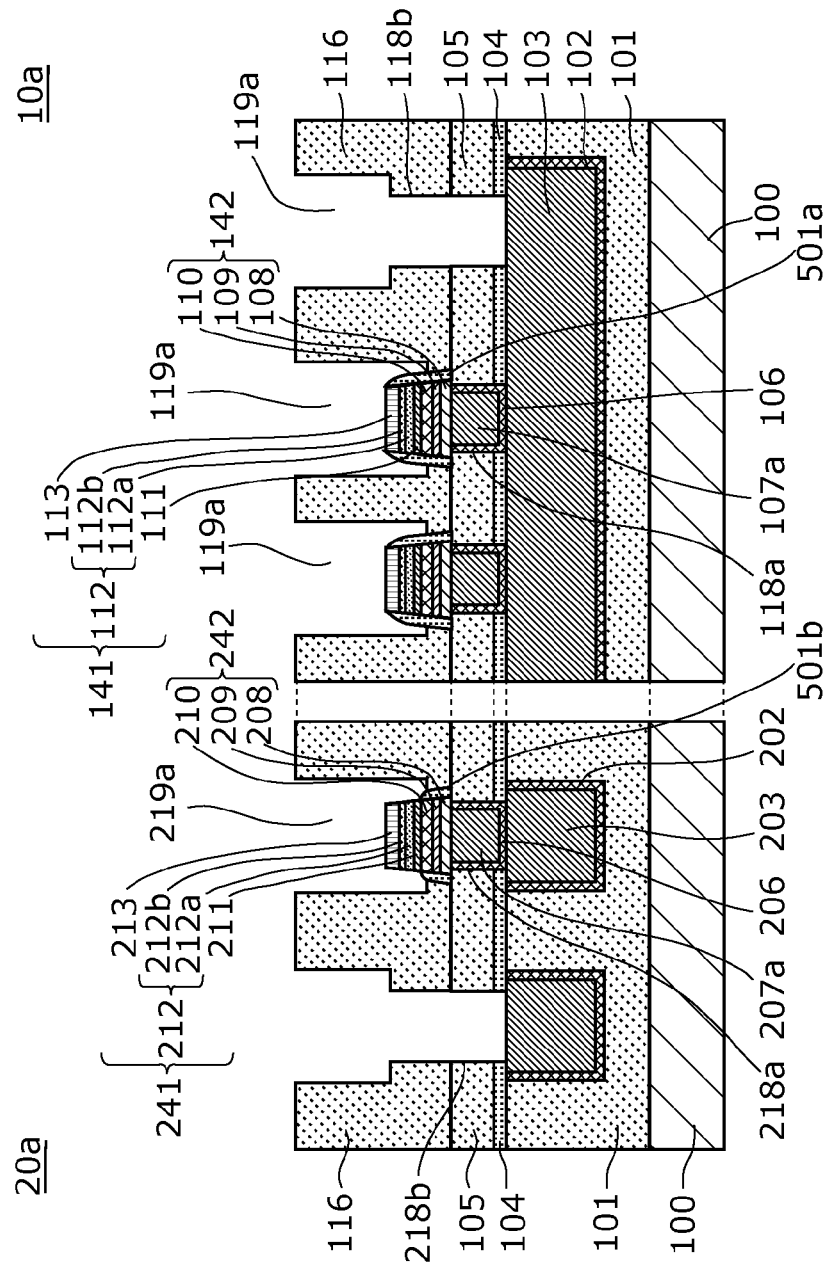
FIG. 19F is a cross-sectional view for explaining the method for manufacturing the non-volatile memory device according to Variation 1 of Embodiment 2 of the present invention.

Next, as shown in FIG. 19E and FIG. 19F, a third interlayer dielectric 116 is formed, and wiring grooves 119a and 219a and contact holes 218a and 118b are formed in the third interlayer dielectric 116.

At this time, the dielectric side wall 501a is formed on the side surfaces of the first variable resistance element 141 and the first current steering element 142 included in the memory cell 11a. Accordingly, when the wiring groove 119a is formed, even when the wiring groove 119a is formed such that the bottom surface thereof is deeper than the lower surface of the third lower electrode layer 111 in the same manner as the wiring groove 219a in which the side surfaces of the second variable resistance element 241 of the reference cell 21a are exposed, the dielectric side wall 501a eliminates the possibility of exposure of the side surfaces of the first variable resistance element 141 and the first current steering element 142 of the memory cell 11a. Therefore, it is possible to form the wiring grooves 119a and 219a at the same time.

Figure 19G:
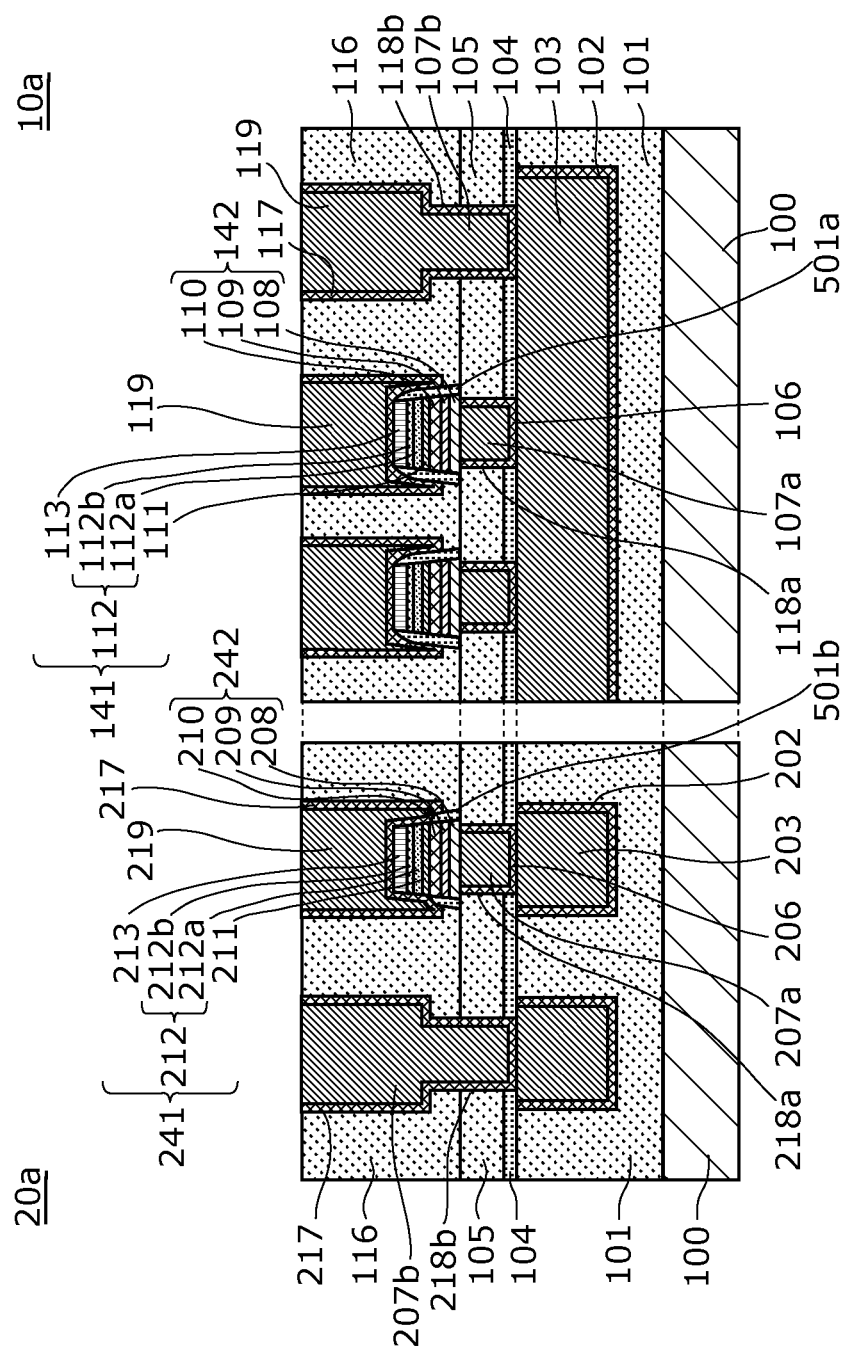
FIG. 19G is a cross-sectional view for explaining the method for manufacturing the non-volatile memory device according to Variation 1 of Embodiment 2 of the present invention.

Next, as shown in FIG. 19G, a second line 119 and a fourth line 219 are formed. In this way, a part of the fourth line 219 becomes a conductive shorting layer 151 by being in contact with the side surfaces of the fourth upper electrode layer 213, the second variable resistance layer 212, and the fourth lower electrode layer 211 included in the second variable resistance element 241 of the reference cell 21a shown in FIG. 19F. In this way, it is possible to form the reference cell 21a for detecting the current steering characteristic of the second current steering element 242 even when the second variable resistance layer 212 is in a high resistance state.

Figure 19H:
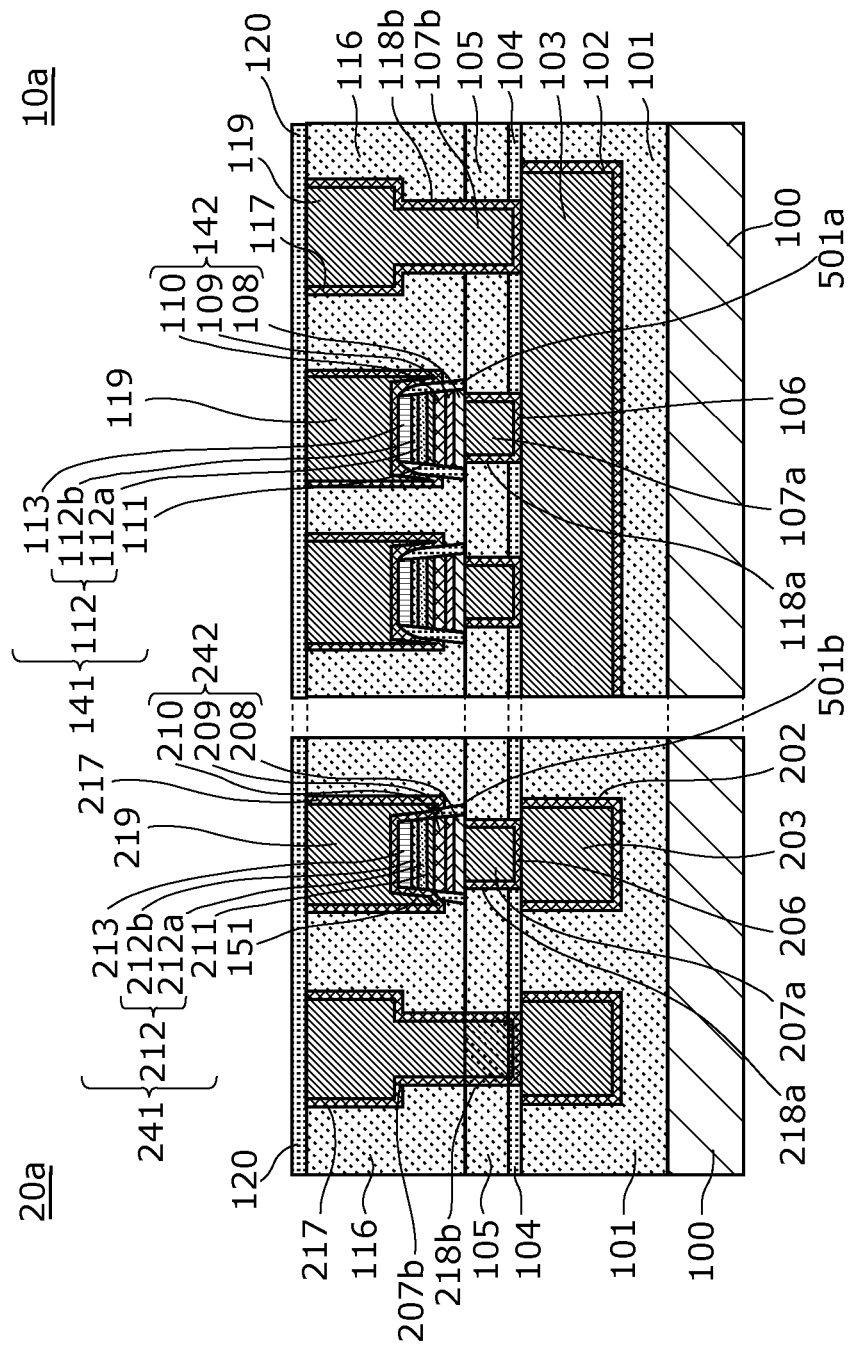
FIG. 19H is a cross-sectional view for explaining the method for manufacturing the non-volatile memory device according to Variation 1 of Embodiment 2 of the present invention.

Next, as shown in FIG. 19H, the second liner layer 120 is formed.

As described above, the non-volatile memory device according to this variation provides advantageous effects similar to those in Embodiment 2.

In addition, according to the non-volatile memory device manufacturing method in this variation, the dielectric side wall 501a is formed on the side surfaces of the first variable resistance element 141 included in the memory cell 11a, it is possible to form the wiring grooves 119a and 219a at the same time. This increases the process margin in the process for forming the conductive shorting layer 151. Therefore, it is possible to manufacture the second current steering element 242 stably, with reduction in the number of manufacturing processes and the amount of manufacturing cost.

Embodiment 3

Descriptions are given of an exemplary structure of a non-volatile memory device according to Embodiment 3 of the present invention and a method for manufacturing the same. Hereinafter, differences from Embodiment 1 are mainly described.

Figure 21:
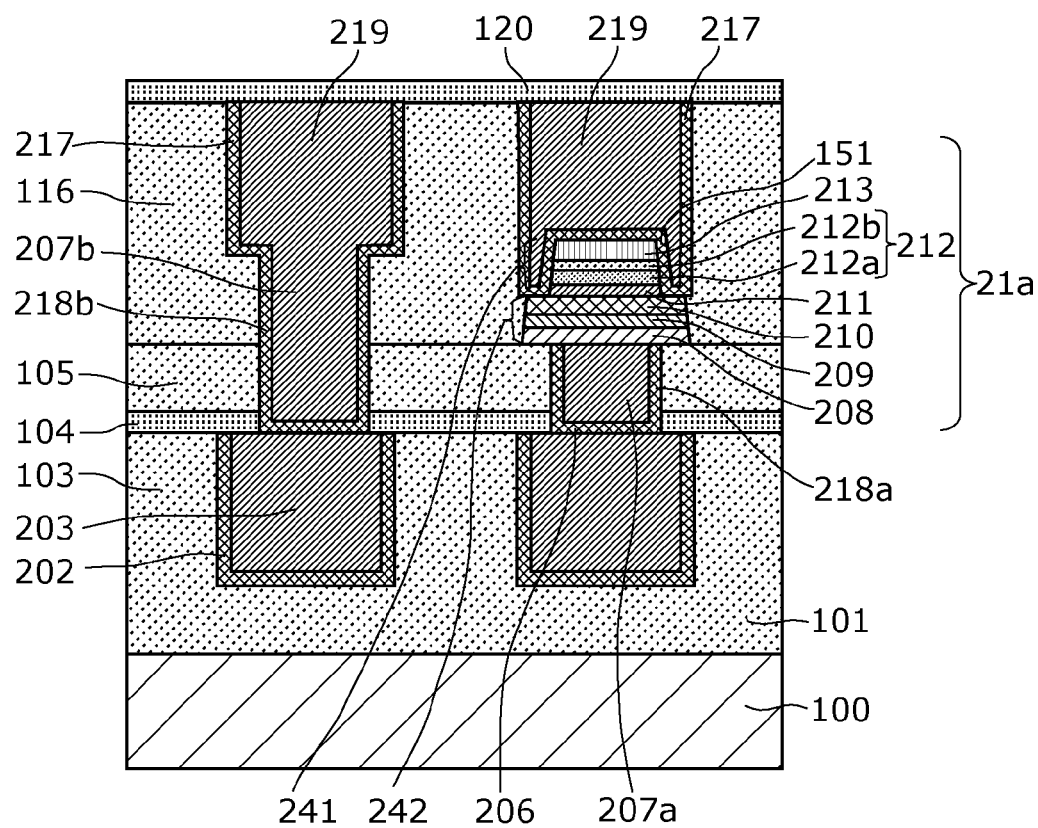
FIG. 21 is a cross-sectional view of an exemplary structure of a parameter generation circuit according to Embodiment 3 of the present invention.

FIG. 20 is a plan view showing a part of the structure of the non-volatile memory device according to this embodiment. FIG. 21 is a cross-sectional view of an exemplary structure of the parameter generation circuit 20b according to this embodiment. FIG. 22 is a cross-sectional view of an exemplary structure of the non-volatile memory device according to this embodiment. FIG. 21 is a cross-sectional view of the cross section along the alternate long and short dash line shown in the C-C' in FIG. 20 when seen from the arrow direction. FIG. 22 is a cross-sectional view of the cross section along the alternate long and short dash line shown in the D-D' in FIG. 20 when seen from the arrow direction.

The non-volatile memory device according to this embodiment is different from the non-volatile memory device according to Embodiment 1 in that the area of the second current steering layer 209 of the second current steering element 242 is larger than the area of the second variable resistance layer 212 of the second variable resistance element 241, and the area of the first current steering layer 109 of the first current steering element 142 is larger than the area of the first variable resistance layer 112 of the first variable resistance element 141 when seen from the direction perpendicular to the upper surface of the substrate 100. In other words, the non-volatile memory device according to this embodiment is different from the non-volatile memory device according to Embodiment 1 in that the second current steering element 242 is larger in area than the second variable resistance element 241, and the first current steering element 142 is larger in area than the first variable resistance element 141 when seen from the direction perpendicular to the upper surface of the substrate 100.

Here, the third barrier metal layer 117 may be replaced with the second line 119 without formation of the third barrier metal layer 117 in the wiring groove, and the third barrier metal layer 217 may be replaced with the fourth line 219 without formation of the third barrier metal layer 217 in the wiring groove. In each of FIG. 20 to FIG. 23G showing this embodiment, the third barrier metal layer 117 in the wiring groove is parts of the second line 119, and the third barrier metal layer 217 in the wiring groove is parts of the fourth line 219. In this case, the conductive shorting layer 151 is formed as the parts of the fourth line 219 (the parts positioned at the both sides including the parts in contact with the side surfaces of the second variable resistance element 241, specifically, the side surfaces of the fourth upper electrode layer 213 and the fourth electrode layer 211).

Hereinafter, an exemplary non-volatile memory device according to this embodiment is described in detail below.

A memory cell 11b and a reference cell 21b shown in FIG. 21 and FIG. 22 are configured to have a first variable resistance element 141 smaller than the first current steering element 142 and a second variable resistance element 241 smaller than the second current steering element 242, respectively, compared to the memory cell 11 and the reference cell 21 shown in FIG. 3C and FIG. 4 when seen from the direction perpendicular to the upper surface of the substrate 100. In other words, the memory cell 11*b* and a reference cell 21*b* have the same structures as the memory cell 11 and the reference cell 21 in Embodiment 1 except for the point that the first current steering element 142 and the second current steering element 242 are larger in area than the first variable resistance element 141 and the second variable resistance element 241 when seen from the direction perpendicular to the upper surface of the substrate 100.

When seen from the direction perpendicular to the upper surface of the substrate 100, the first current steering element 142 is larger in area than the first variable resistance element 141 (more specifically, the area of the first current steering element 142 is a total area of the first current steering layer 109 in contact with the first upper electrode layer 110 and the first current steering layer 109 in contact with the first lower electrode layer 108, and the area of the first variable resistance element 141 is a total area of the first variable resistance layer 112 in contact with the third upper electrode layer 113 and the first variable resistance layer 112 in contact with the third lower electrode layer 111).

When seen from the direction perpendicular to the upper surface of the substrate 100, the second current steering element 242 is larger in area than the second variable resistance element 241 (more specifically, the area of the second current steering element 242 is a total area of the second current steering layer 209 in contact with the second upper electrode layer 210 and the second current steering layer 209 in contact with the second lower electrode layer 208, and the area of the second variable resistance element 241 is a total area of the second variable resistance layer 212 in contact with the fourth upper electrode layer 213 and the second variable resistance layer 212 in contact with the fourth lower electrode layer 211).

As described above, the non-volatile memory device according to this embodiment provides advantageous effects similar to those provided by the non-volatile memory device in Embodiment 1.

Furthermore, in the non-volatile memory device in this embodiment, it is possible to increase the area of the first current steering element 142 to increase the allowable current for the first current steering element 142. This makes it possible to realize the memory cells 11*b* which operate stably.

Next, a description is given of a method for manufacturing the aforementioned non-volatile memory device, specifically, an exemplary method for forming a memory cell array 10*b* and a parameter generation circuit 20*b*.

Each of FIG. 23A to 23G is a cross section for explaining an exemplary method for forming the memory cell array 10*b* and the parameter generation circuit 20*b* according to this embodiment.

The manufacturing method according to this embodiment is different from the method for manufacturing the non-volatile memory device in FIG. 5A to FIG. 5I, at and after the process in FIG. 5E. In other words, the non-volatile memory device manufacturing method according to this embodiment is different from the non-volatile memory device manufacturing method according to Embodiment 1 in the element forming process of forming the first current steering element 142, the first variable resistance element 141, the second current steering element 242, and the second variable resistance element 241 such that the first variable resistance layer 112 of the first variable resistance element 141 is smaller in size than the first current steering layer 109 of the first current steering element 142, and the second variable resistance layer 212 of the second variable resistance element 241 is smaller in area than the second current steering layer 209 of the second current steering element 242 when seen from the direction perpendicular to the upper surface of the substrate 100. In other words, the non-volatile memory device manufacturing method according to this embodiment is different from the non-volatile memory device manufacturing method according to Embodiment 1 in the processes for forming by patterning the respective elements of: (i) a first resist mask pattern 131*a* for forming the first variable resistance element 141 and the second variable resistance element 241, and forming the first variable resistance element 141 and the second variable resistance element 241 using the first resist mask pattern 131*a*, and (ii) a second resist mask pattern 131*b* for covering the first variable resistance element 141 and the second variable resistance element 241 and larger than the first resist mask pattern 131*a*, and forming the first variable resistance element 141 and the second variable resistance element 241 using the second resist mask pattern 131*b*.

Hereinafter, an exemplary method for manufacturing the non-volatile memory device according to this embodiment is described in detail below.

Figure 23A:
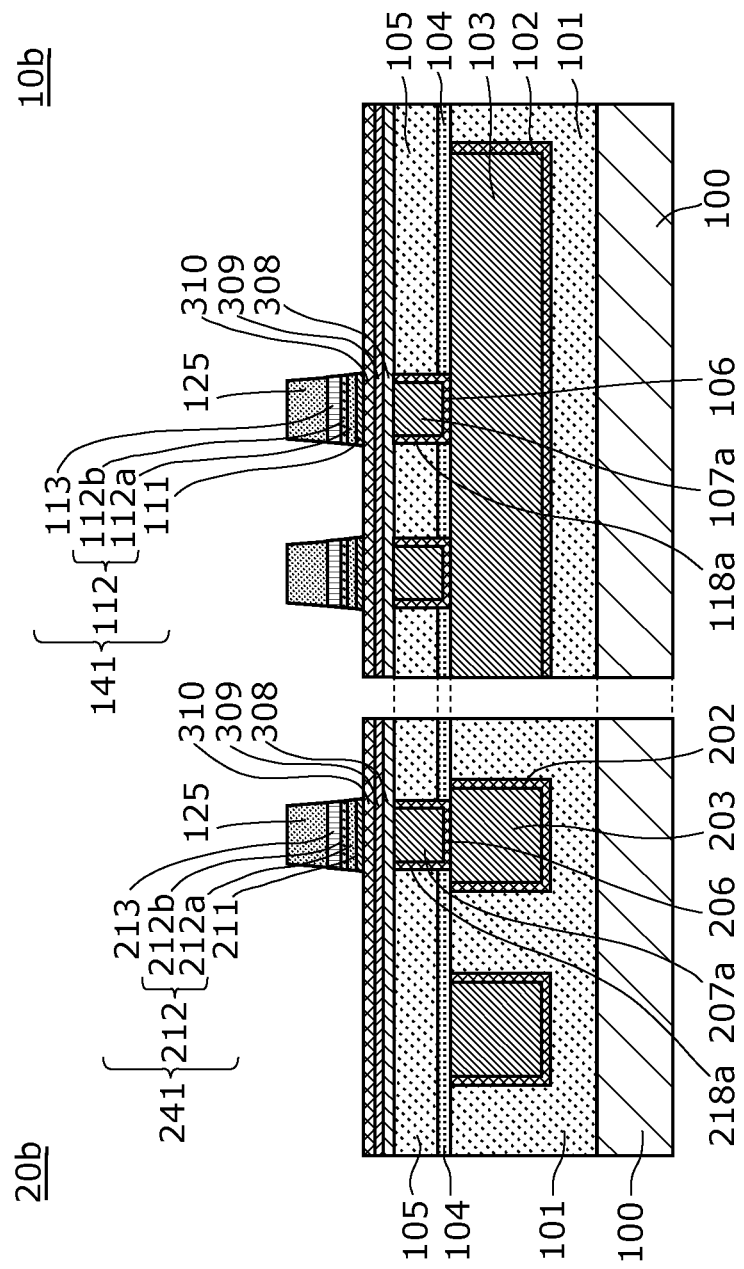
FIG. 23A is a cross-sectional view for explaining the method for manufacturing the non-volatile memory device according to Embodiment 3 of the present invention.

First, after the processes shown in FIG. 5A to FIG. 5D described in Embodiment 1, as shown in FIG. 23A, a fourth conductive layer 313, a first oxide layer 312*a*, a second oxide layer 312*b*, and a third conductive layer 311 are patterned by dry etching using a hard mask layer 125 patterned by the first resist mask pattern 131*a*. In this way, the following are formed: the third upper electrode layer 113 included in the first variable resistance element 141; the first variable resistance layer 112 and the third lower electrode layer 111; the fourth upper electrode layer 213 included in the second variable resistance element 241; and the second variable resistance layer 212 and the fourth lower electrode layer 211. In this way, the first variable resistance element 141 and the second variable resistance element 241 are formed.

Figure 23B:
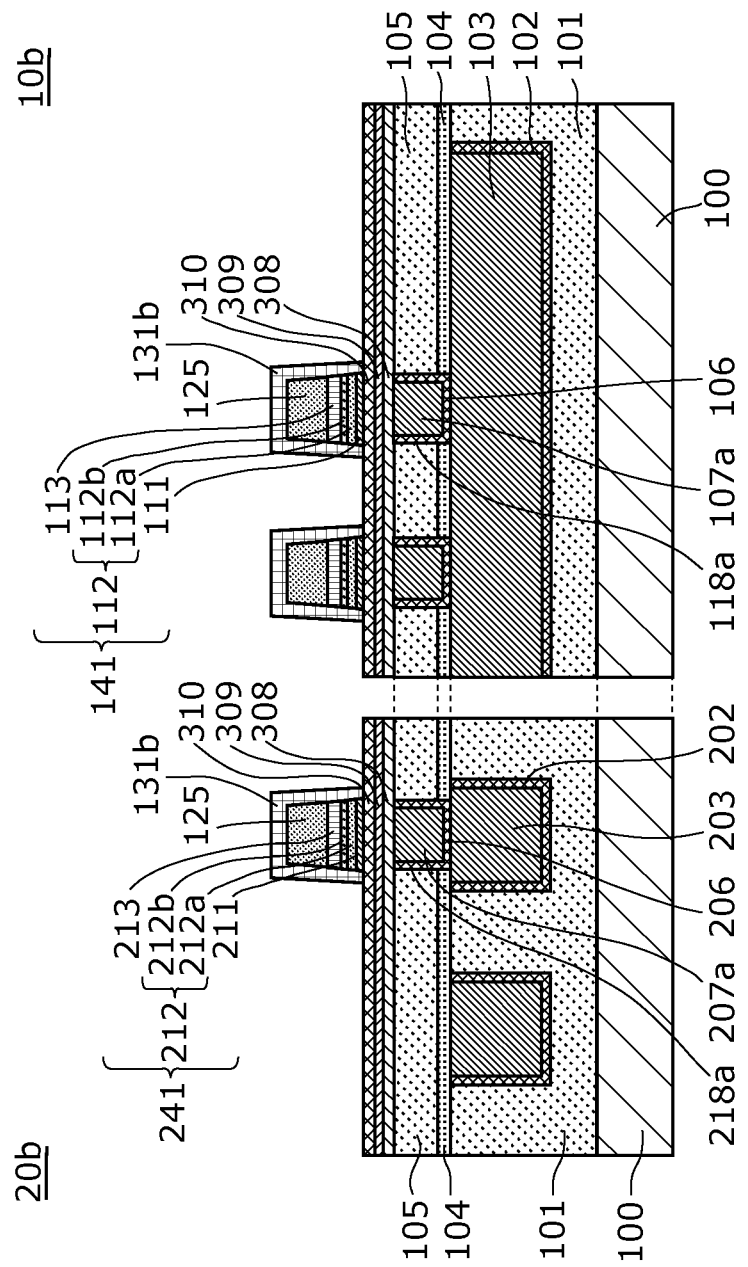
FIG. 23B is a cross-sectional view for explaining the method for manufacturing the non-volatile memory device according to Embodiment 3 of the present invention.

Next, as shown in FIG. 23B, a second resist mask pattern 131*b* larger than the first resist mask pattern 131*a* is formed using photolithography so as to cover the first variable resistance element 141 and the second variable resistance element 241 formed as shown in FIG. 23A, in other words, so as not to expose the first variable resistance element 141 and the second variable resistance element 241. The second resist mask pattern 131*b* is larger than the first resist mask pattern 131*a* and is to cover (i) the first variable resistance element 141 including the third upper electrode layer 113, the first variable resistance layer 112, and the third lower electrode layer 111 patterned using the first resist mask pattern 131*a*, (ii) the second variable resistance element 241 including the fourth upper electrode layer 213, the second variable resistance layer 212, and the fourth lower electrode layer 211, and (iii) the hard mask layer 125.

Figure 23C:
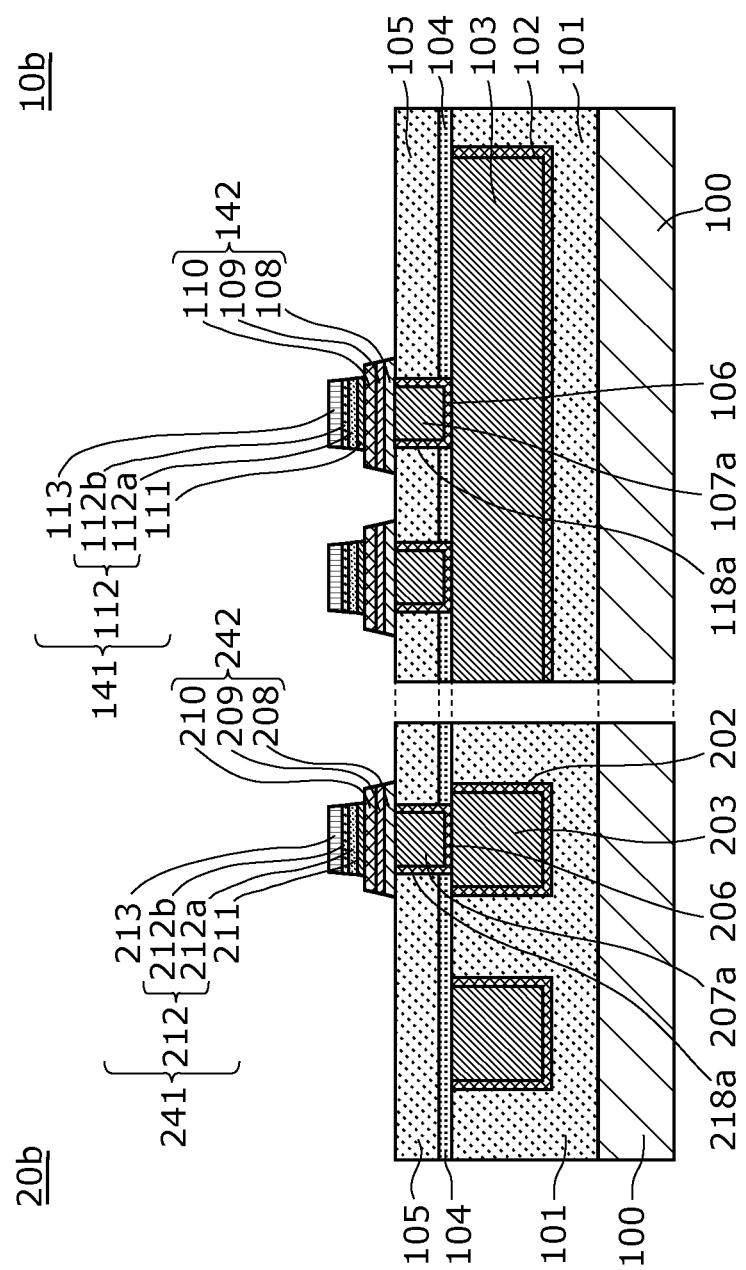
FIG. 23C is a cross-sectional view for explaining the method for manufacturing the non-volatile memory device according to Embodiment 3 of the present invention.

Next, as shown in FIG. 23C, a second conductive layer 310, a current steering layer 309, and a first conductive layer 308 are patterned by dry etching using the second resist mask pattern 131*b* formed as shown in FIG. 23B. In this way, the following are formed: the first upper electrode layer 110, the first current steering layer 109, and a first lower electrode layer 108 included in the first current steering element 142; and the second upper electrode layer 210, the second current steering layer 209, and the second lower electrode layer 208 included in the second current steering element 242. Next, the second resist mask pattern 131*b* is removed through an ashing process, and the hard mask layer 125 is removed by, for example, etching. Here, there is no need to always remove the hard mask layer 125, and it may be maintained as necessary.

Figure 23D:
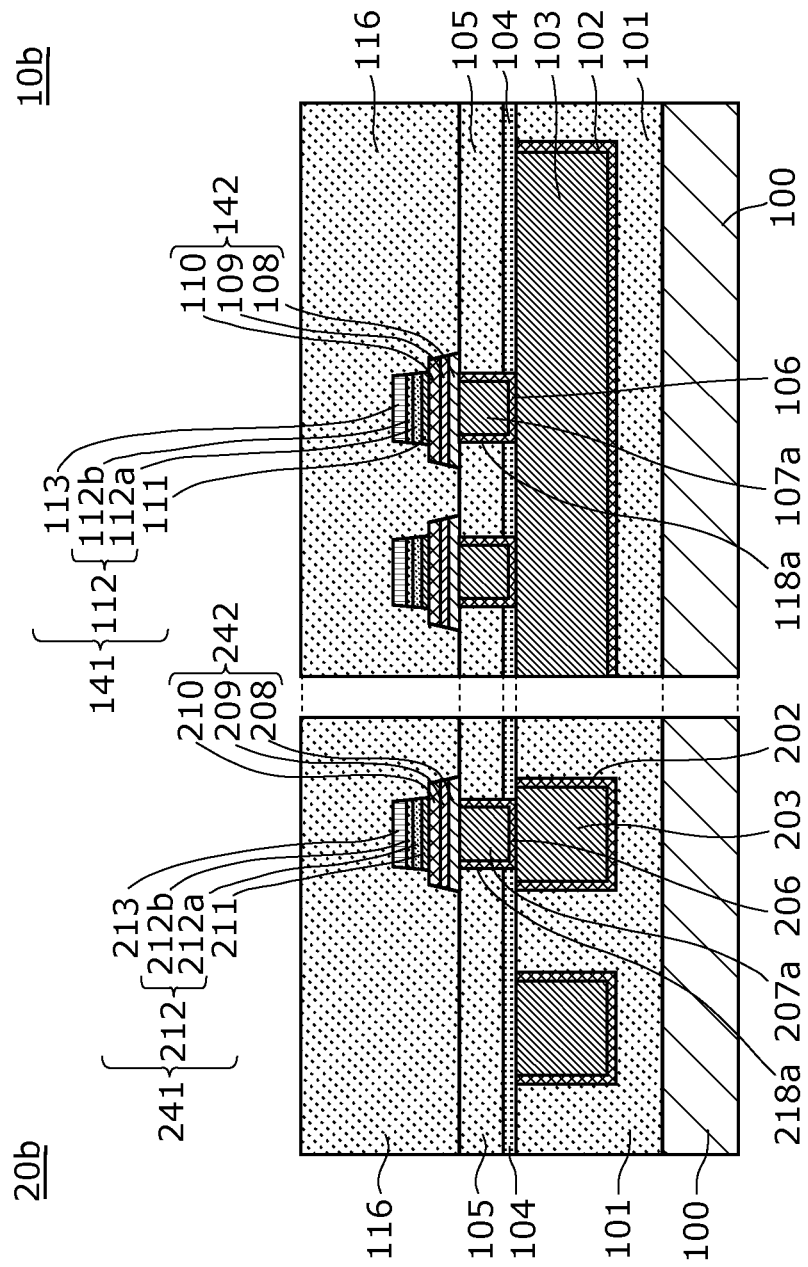
FIG. 23D is a cross-sectional view for explaining the method for manufacturing the non-volatile memory device according to Embodiment 3 of the present invention.
Figure 23E:
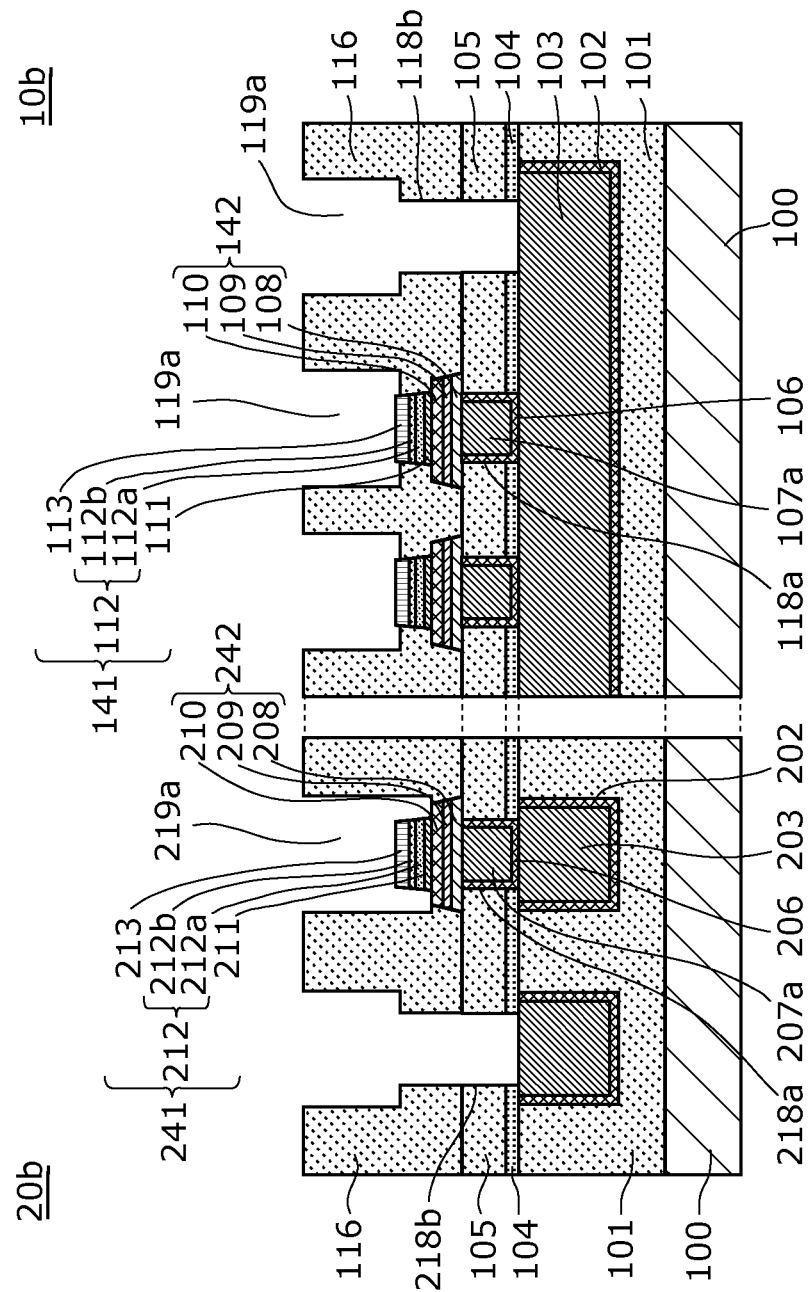
FIG. 23E is a cross-sectional view for explaining the method for manufacturing the non-volatile memory device according to Embodiment 3 of the present invention.

Next, as shown in FIGS. 23D and 23E, a third interlayer dielectric 116 is formed to cover the first variable resistance element 141, the second variable resistance element 241, the first current steering element 142, and the second current steering element 242. Next, wiring grooves 119a and 219a and contact holes 218a and 118b are formed in the third interlayer dielectric 116. The wiring grooves 119a and 219a are used to form (i) a second line 119 to be connected to the third upper electrode layer 113 of the first variable resistance element 141 and (ii) a fourth line 219 to be connected to a side surface of the second variable resistance element 241 included in the reference cell 21b. As a specific formation method, it is possible to use the same method similar to the one described with reference to FIGS. 5F and 5G in Embodiment 1.

Figure 23F:
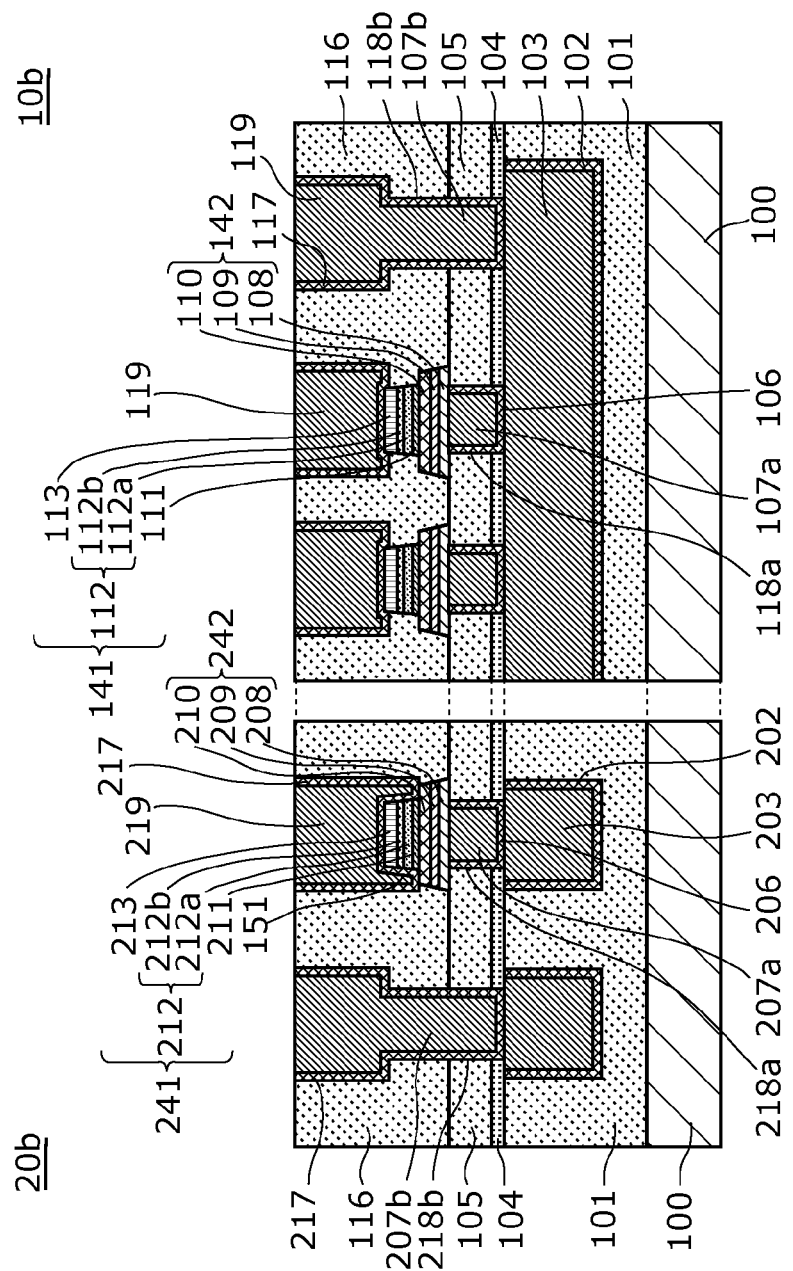
FIG. 23F is a cross-sectional view for explaining the method for manufacturing the non-volatile memory device according to Embodiment 3 of the present invention.

Next, as shown in FIG. 23F, a second line 119 and a fourth line 219 are formed. As a specific formation method, it is possible to use the same method similar to the one described with reference to FIG. 5H in Embodiment 1. In this way, a part of the fourth line 219 becomes a conductive shorting layer 151 by being in contact with the side surfaces of the fourth upper electrode layer 213, the second variable resistance layer 212, and the fourth lower electrode layer 211 included in the second variable resistance element 241 of the reference cell 21b shown in FIG. 23E. In this way, it is possible to form the reference cell 21b for detecting the current steering characteristic of the second current steering element 242 even when the second variable resistance layer 212 is in a high resistance state.

Figure 23G:
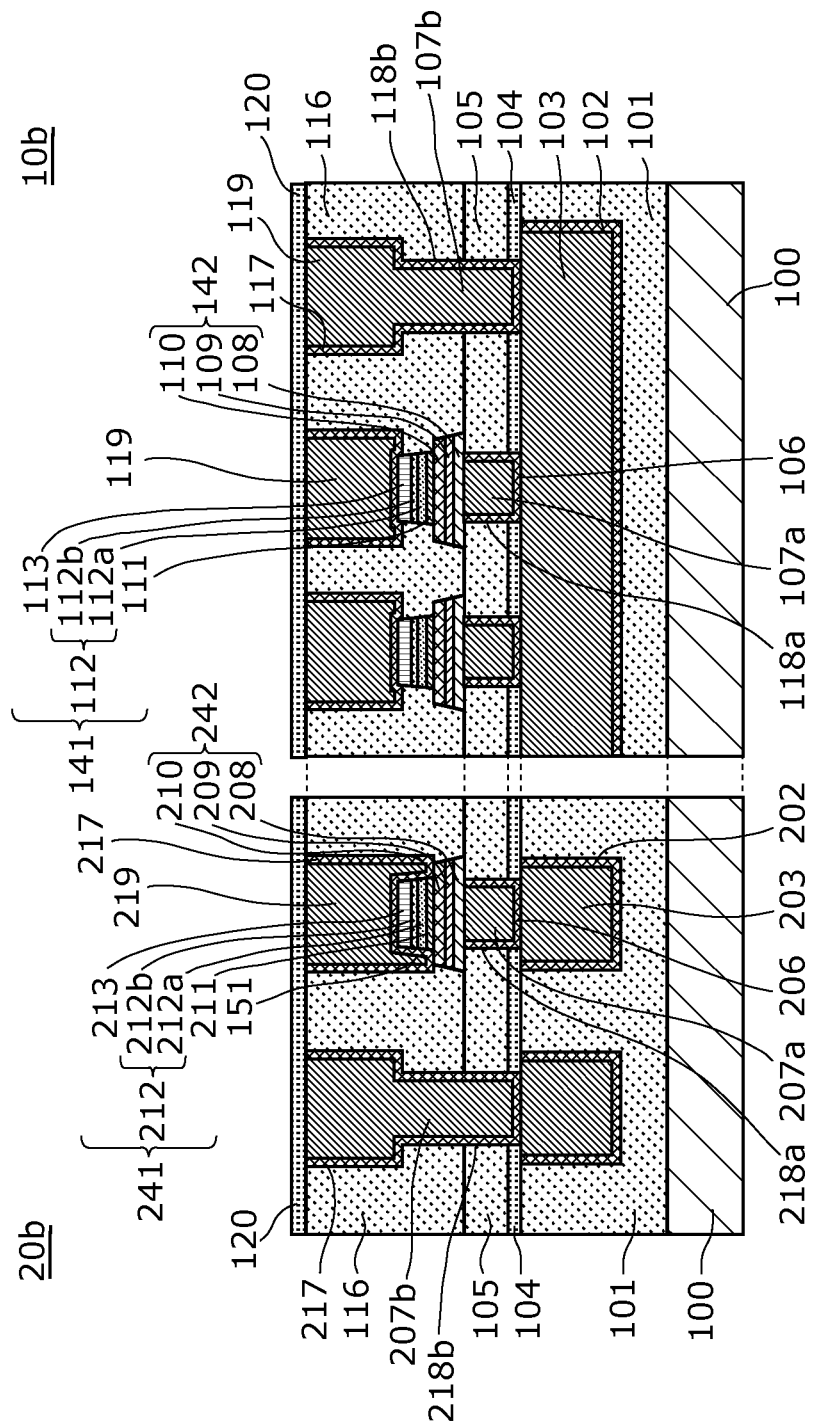
FIG. 23G is a cross-sectional view for explaining the method for manufacturing the non-volatile memory device according to Embodiment 3 of the present invention.

Next, as shown in FIG. 23G, the second liner layer 120 is formed.

As described above, the non-volatile memory device according to this embodiment provides advantageous effects similar to those in Embodiment 1.

In addition, according to the non-volatile memory device manufacturing method in this embodiment, it is possible to increase the area of the first current steering element 142 to increase the allowable current for the first current steering element 142. Thus, it is possible to realize the non-volatile memory device which operates stably.

In this embodiment as in Variations 1 and 2 of Embodiment 1, the conductive shorting layer 151 may be formed with a plug 307b disposed between the fourth line 219 and the upper electrode layer 213.

Variation 1 of Embodiment 3

Next, Variation 3 of Embodiment 1 of the present invention is described.

Figure 24:
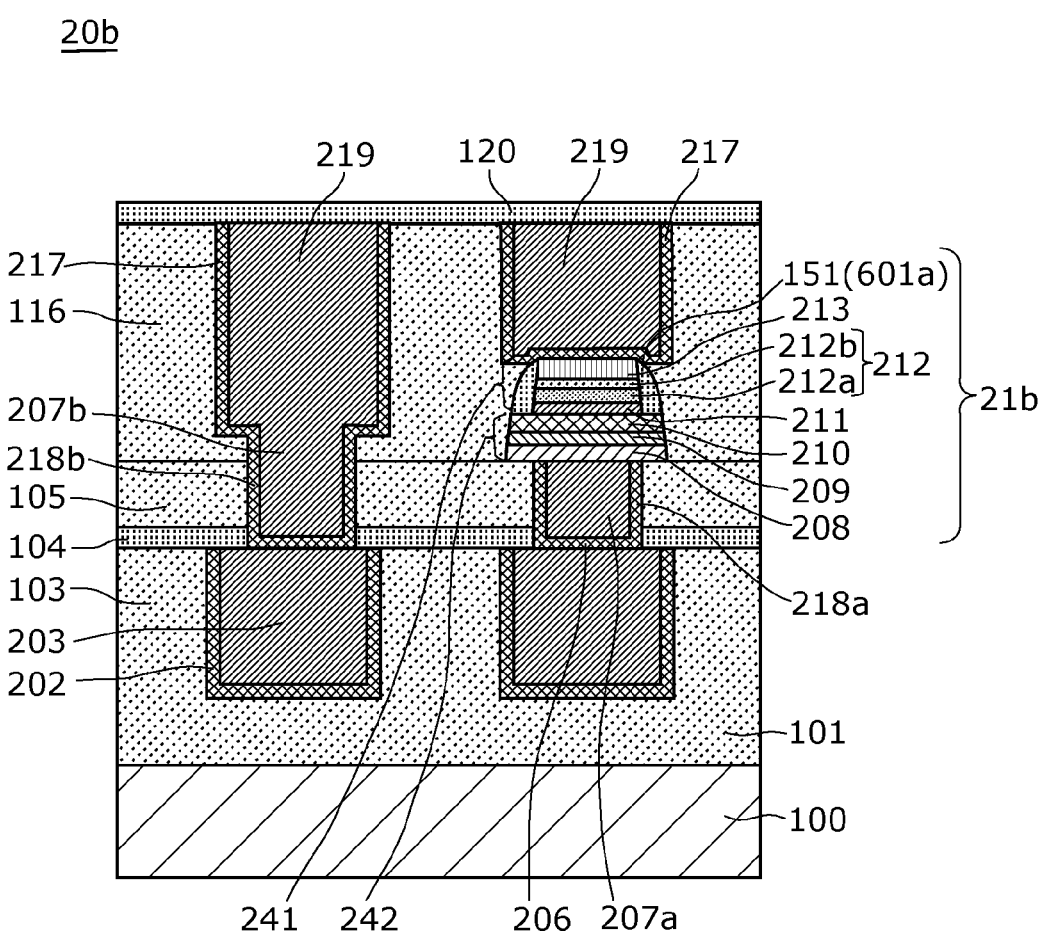
FIG. 24 is a cross-sectional view of an exemplary structure of a parameter generation circuit according to Variation 1 of Embodiment 3 of the present invention.
Figure 25:
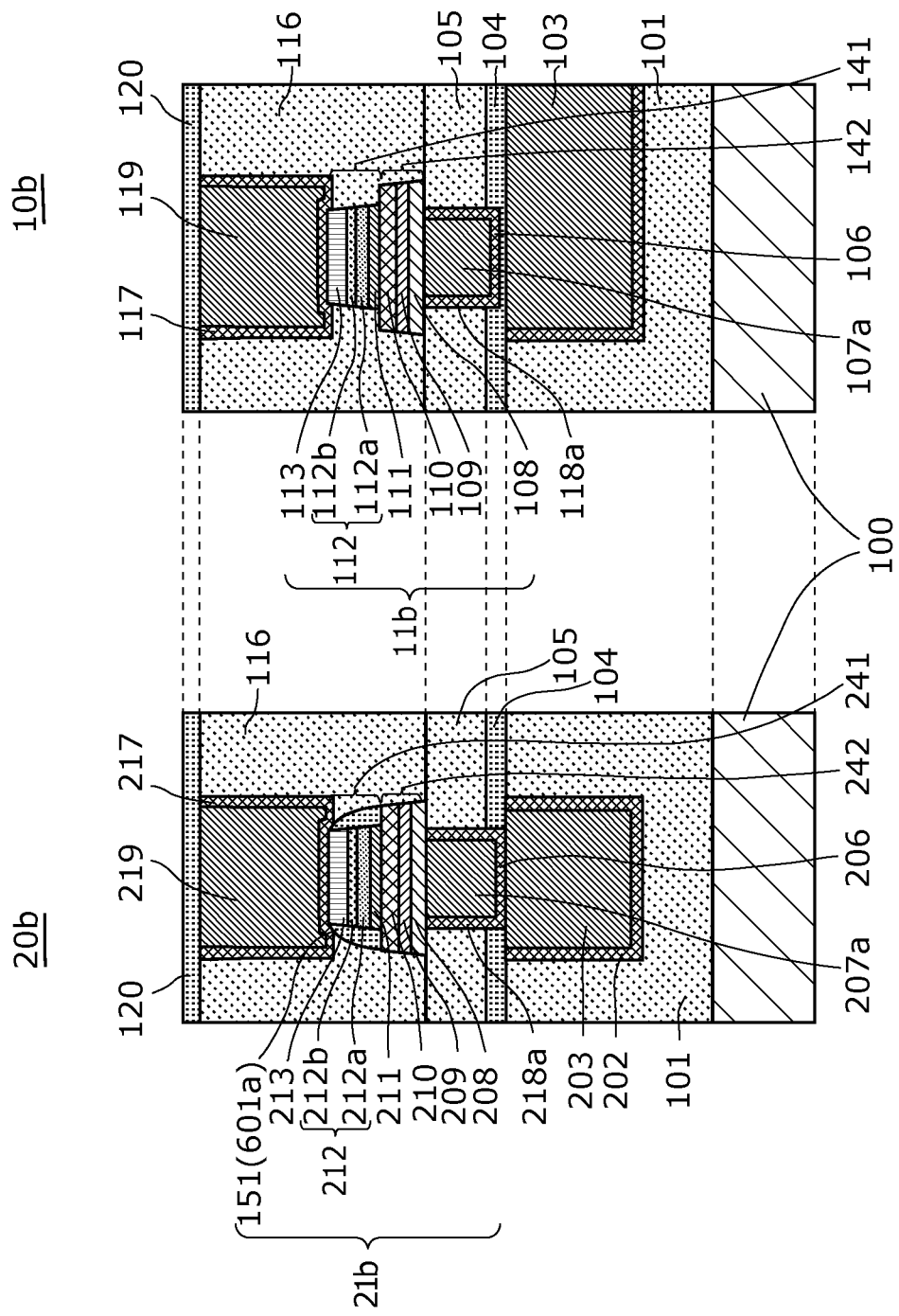
FIG. 25 is a plan view of an exemplary structure of a part of the non-volatile memory device according to Variation 1 of Embodiment 3 of the present invention.

FIG. 24 is a cross-sectional diagram showing an exemplary structure of the parameter generation circuit 20b according to this variation. FIG. 25 is a cross-sectional view of an exemplary structure of the non-volatile memory device according to this variation. The plan view of the non-volatile memory device according to this embodiment is the same as in FIG. 20. FIG. 24 is a cross-sectional view of the cross section along the alternate long and short dash line shown in the C-C' in FIG. 20 when seen from the arrow direction. FIG. 25 is a cross-sectional view of the cross section along the alternate long and short dash line shown in the D-D' in FIG. 20 when seen from the arrow direction.

The non-volatile memory device in this variation is different from the non-volatile memory device according to Embodiment 3 in that the conductive shorting layer 151 is the conductive side walls, and the second variable resistance element 241 has the side surfaces covered by the conductive side walls 601a, and the first variable resistance element 141 has the side surfaces not covered by any conductive side walls.

More specifically, the memory 11b shown in FIG. 25 has the same structure as the memory cell 11b shown in FIG. 22. However, the reference cell 21b shown in FIG. 24 and FIG. 25 is configured to have a conductive side wall 601a formed on each of the side surfaces of the second variable resistance element 241, compared to the reference cell 21b shown in FIG. 21 and FIG. 22. Accordingly, although the conductive side wall 601a is formed on each of the side wall parts of the second variable resistance element 241 included in the reference cell 21b, the second current steering element 242 including the reference cell 21b in FIG. 21 and FIG. 22 has the same structure as the second current steering element 242 including the reference cell 21b in FIG. 24 and FIG. 25.

As described above, the non-volatile memory device according to this variation provides advantageous effects similar to those in Embodiment 3.

Next, a method for manufacturing a non-volatile memory device according to this variation is described.

Each of FIG. 26A to 26I is a cross section for explaining an exemplary method for forming the memory cell array 10b and the parameter generation circuit 20b according to this variation.

The non-volatile memory device manufacturing method according to this variation is different from the non-volatile memory device manufacturing method shown in FIG. 23A to FIG. 23G, in the processes starting with FIG. 23B. In other words, the non-volatile memory device manufacturing method in this variation is different from the non-volatile memory device manufacturing method in Embodiment 3 in the process for forming the conductive shorting layer 151 in which the conductive side wall 601a is formed to be a conductive shorting layer 151 for covering the side surfaces of the fourth upper electrode layer 213, the second variable resistance layer 212, and the fourth lower electrode layer 211 which are included in the second variable resistance element 241. More specifically, the non-volatile memory device manufacturing method in this variation is different from the non-volatile memory device manufacturing method in Embodiment 3 in the point of: forming the conductive side wall 601a on each of the side surfaces of the first variable resistance element 141 and the second variable resistance element 241, and forming the first current steering element 142 and the second current steering element 242 using the conductive side wall 601a as masks; selectively removing the conductive side wall 601a from each of the side surfaces of the first variable resistance element 141 included in the reference cell 11b; and forming the conductive side wall 601a only on each of the side surfaces of the second variable resistance element 241 included in the reference cell 21b.

Hereinafter, a non-volatile memory device manufacturing method according to this variation is described focusing on differences from the non-volatile memory device in Embodiment 3, and the same descriptions may be omitted. More specifically, the same descriptions of FIGS. 26A to 26I in this variation as those of FIGS. 23B to 23G in Embodiment 3 are not repeated.

Figure 26A:
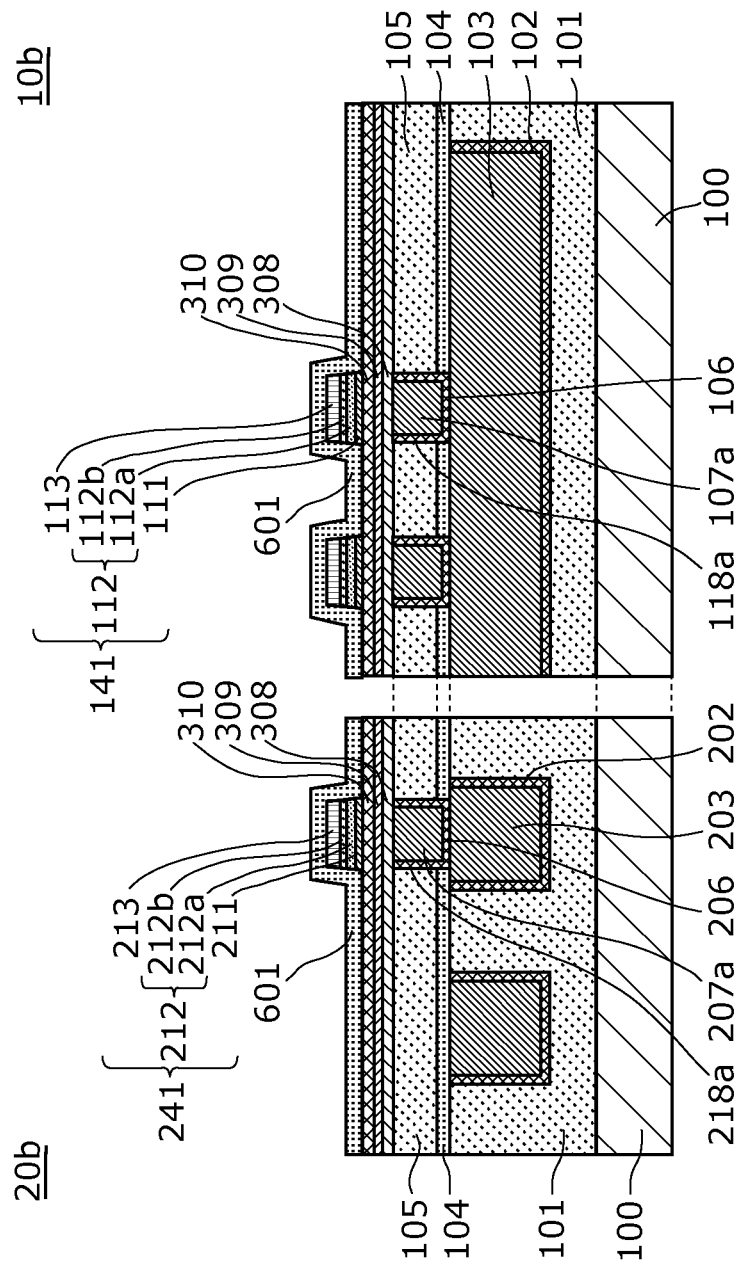
FIG. 26A is a cross-sectional view for explaining the method for manufacturing the non-volatile memory device according to Variation 1 of Embodiment 3 of the present invention.

First, after the processes shown in FIG. 5A to FIG. 5D and FIG. 23A described in Embodiment 1, as shown in FIG. 26A, the hard mask layer 125 is removed, and a conductive layer 601 (having a film thickness of 170 nm) is formed by depositing a titanium nitride to cover the first variable resistance element 141, the second variable resistance element 241, and the second conductive layer 310.

Figure 26B:
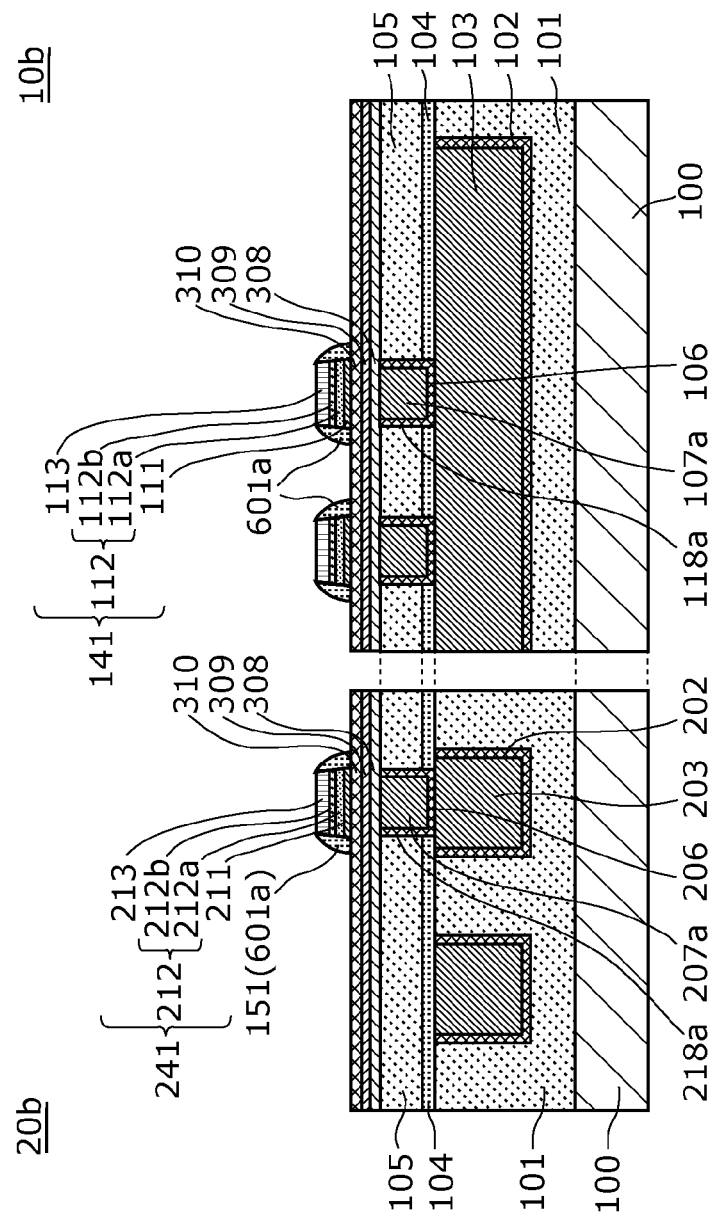
FIG. 26B is a cross-sectional view for explaining the method for manufacturing the non-volatile memory device according to Variation 1 of Embodiment 3 of the present invention.

Next, as shown in FIG. 26B, the deposited dielectric 601 is removed by performing etch back (anisotropic etching) on the dielectric 601 from the upper surfaces of the third upper electrode layer 113 and the fourth upper electrode layer 213, and the upper surface of the second conductive layer 310. By performing etch back in this way, it is possible to form the conductive side wall 601a on the side surfaces of both the first variable resistance element 141 and the second variable resistance element 241.

Here, for example, the method for etching the conductive layer 601 is the same as described with reference to FIG. 16B in Embodiment 2. In this way, it is possible to leave, only on the side wall parts, the conductive layer 601 to be the conductive side wall 601a.

Figure 26C:
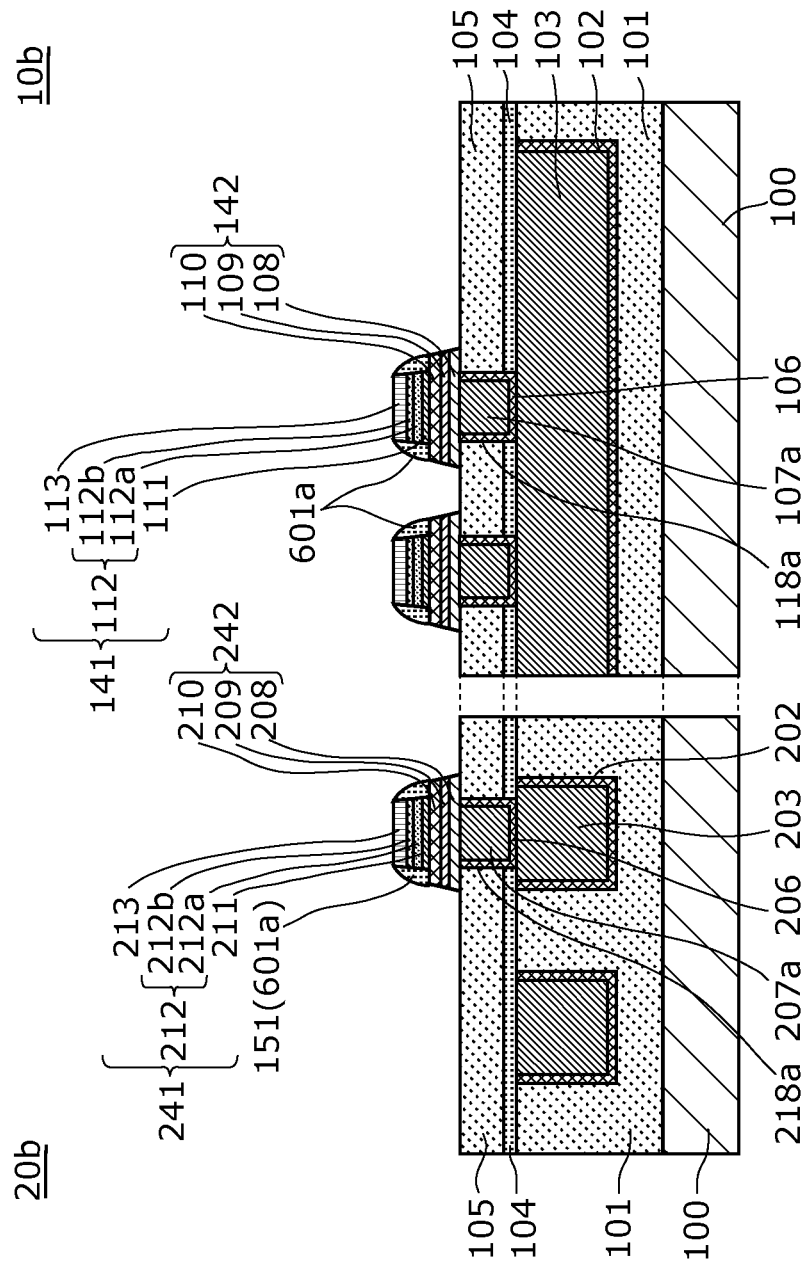
FIG. 26C is a cross-sectional view for explaining the method for manufacturing the non-volatile memory device according to Variation 1 of Embodiment 3 of the present invention.

Next, as shown in FIG. 26C, the second conductive layer 310, the current steering layer 309, and the first conductive layer 308 are patterned by dry etching using as a mask the conductive side wall 601a formed on each of the side surfaces of the first variable resistance element 141 and the second variable resistance element 241. In this way, the following are formed: the first upper electrode layer 110, the first current steering layer 109, and the first lower electrode layer 108 included in the first current steering element 142; and the second upper electrode layer 210, the second current steering layer 209, and the second lower electrode layer 208 included in the second current steering element 242. In other words, the first current steering element 142 and the second current steering element 242 are formed which are larger in area than the first variable resistance element 141 and than the second variable resistance element 241, respectively, when seen from the direction perpendicular to the upper surface of the substrate 100.

Figure 26D:
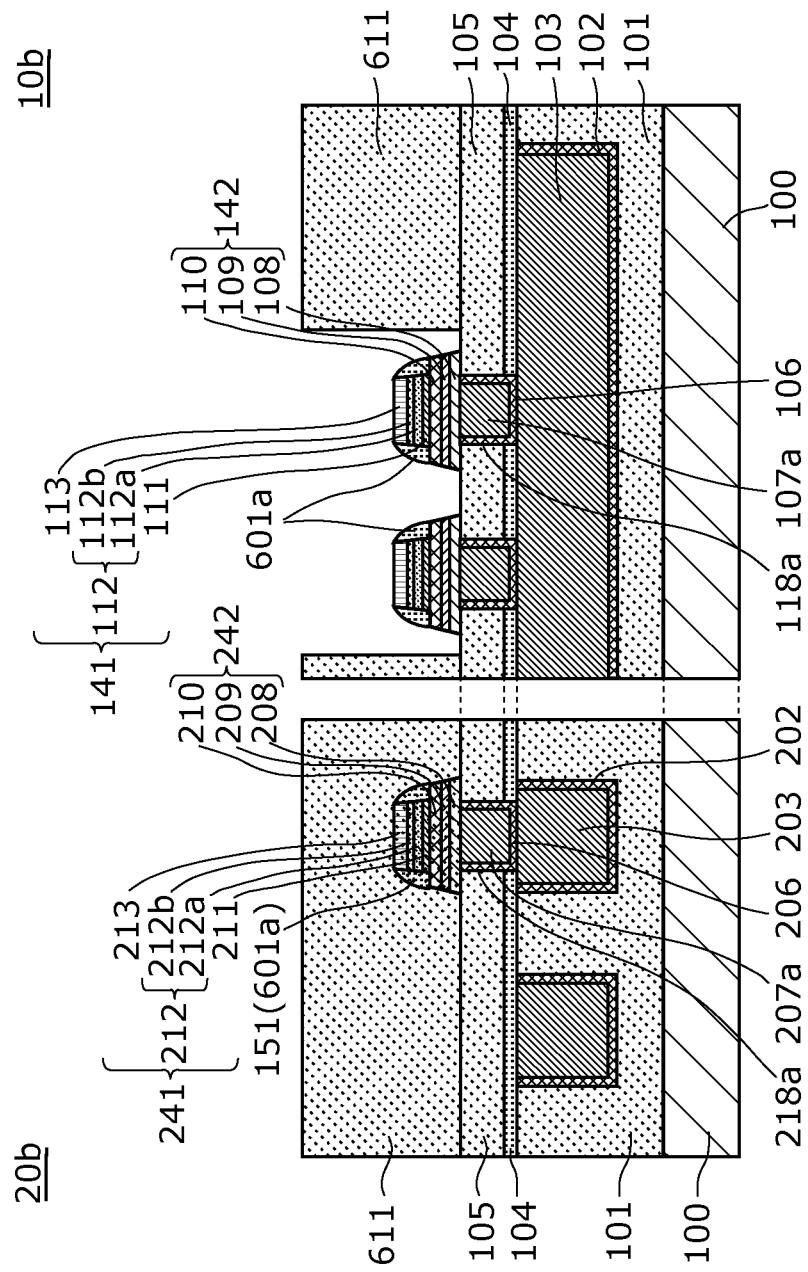
FIG. 26D is a cross-sectional view for explaining the method for manufacturing the non-volatile memory device according to Variation 1 of Embodiment 3 of the present invention.

Next, as shown in FIG. 26D, since the conductive side wall 601a is selectively removed from the side surfaces of the first variable resistance element 141 included in the memory cell 11b, the fourth resist mask pattern 611 is formed to cover the area other than the area in which the memory cell 11b is formed.

Next, as shown in FIG. 26E, the conductive side wall 601a is removed by etching from the side surfaces of the first variable resistance element 141 included in the memory cell 11b. A conceivable etching method is to adjust etching time using, for example, a method shown in FIG. 26B. In this way, it is possible to selectively etch only the conductive side wall 601a formed on the side surfaces of the first variable resistance element 141 included in the memory cell 11b, so as to leave the conductive side wall 601a only on the side surfaces of the second variable resistance element 241 included in the reference cell 21b. Next, the fourth resist mask pattern 611 is removed by performing an ashing process.

Figure 26F:
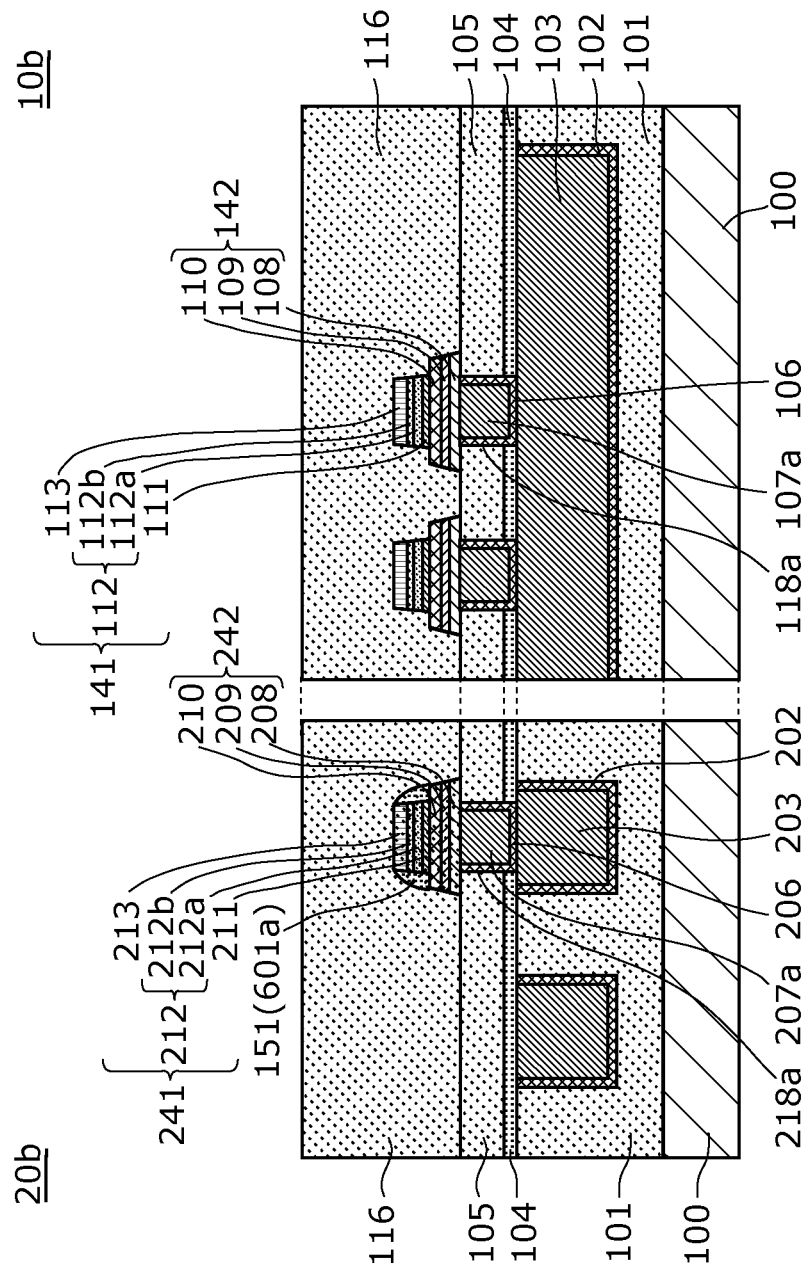
FIG. 26F is a cross-sectional view for explaining the method for manufacturing the non-volatile memory device according to Variation 1 of Embodiment 3 of the present invention.
Figure 26G:
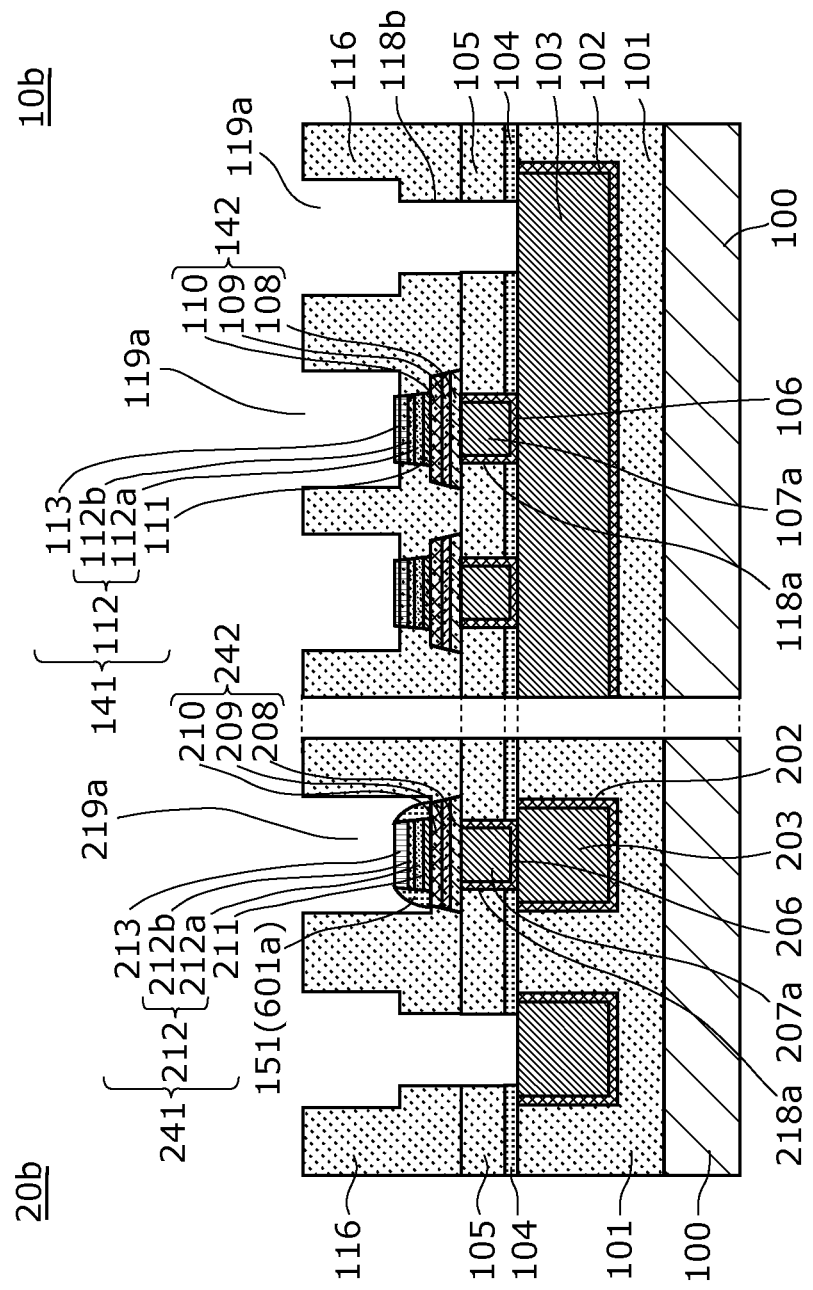
FIG. 26G is a cross-sectional view for explaining the method for manufacturing the non-volatile memory device according to Variation 1 of Embodiment 3 of the present invention.

Next, as shown in FIG. 26F and FIG. 26G, a third interlayer dielectric 116 is formed, and wiring grooves 119a and 219a and contact holes 218a and 118b are formed in the third interlayer dielectric 116.

At this time, since the conductive side wall 601a is formed on the side surfaces of the second variable resistance element 241 included in the reference cell 21b, it is only necessary to form the wiring groove 219a such that the fourth upper electrode layer 213 included in the second variable resistance element 241 is exposed therein. This is because, even in the case of forming the wiring grooves 119a and 219a for exposing the third upper electrode layer 113 included in the first variable resistance element 141 of the memory cell 11b in the same manner at shallow levels above the fourth lower electrode and the third lower electrode, a fourth line 219 and a second current steering element 242 to be formed in a later process are to be electrically connected through the conductive side wall 601a without the second variable resistance layer 212 being interposed therebetween. As a result, it is possible to form the reference cell 21b capable of detecting the current steering characteristic of the second current steering element 242 even when the second variable resistance layer 212 is in a high resistance state. Therefore, it is possible to form the wiring grooves 119a and 219a at the same time.

Figure 26H:
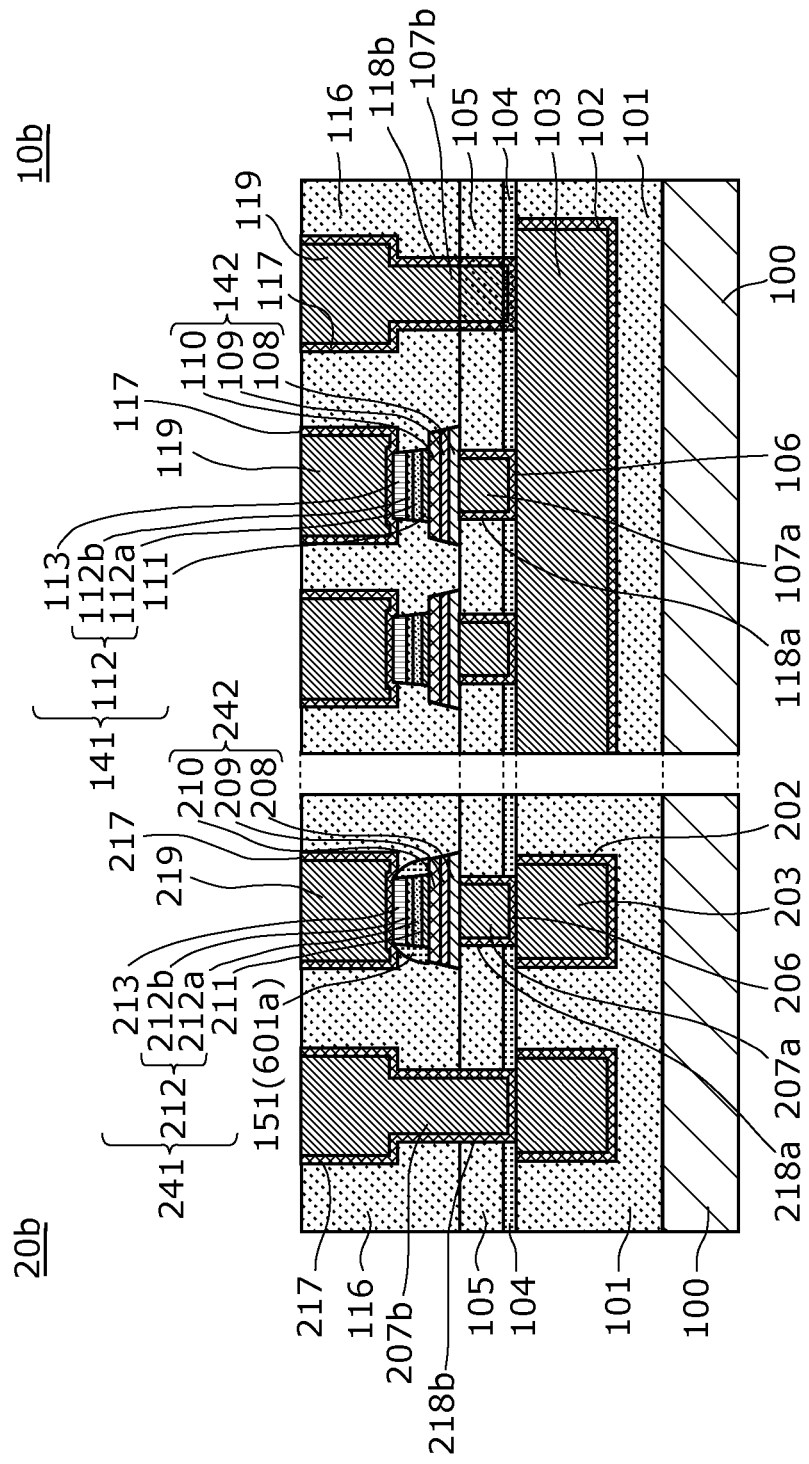
FIG. 26H is a cross-sectional view for explaining the method for manufacturing the non-volatile memory device according to Variation 1 of Embodiment 3 of the present invention.

Next, as shown in FIG. 26H, a second line 119 and a fourth line 219 are formed.

Figure 26I:
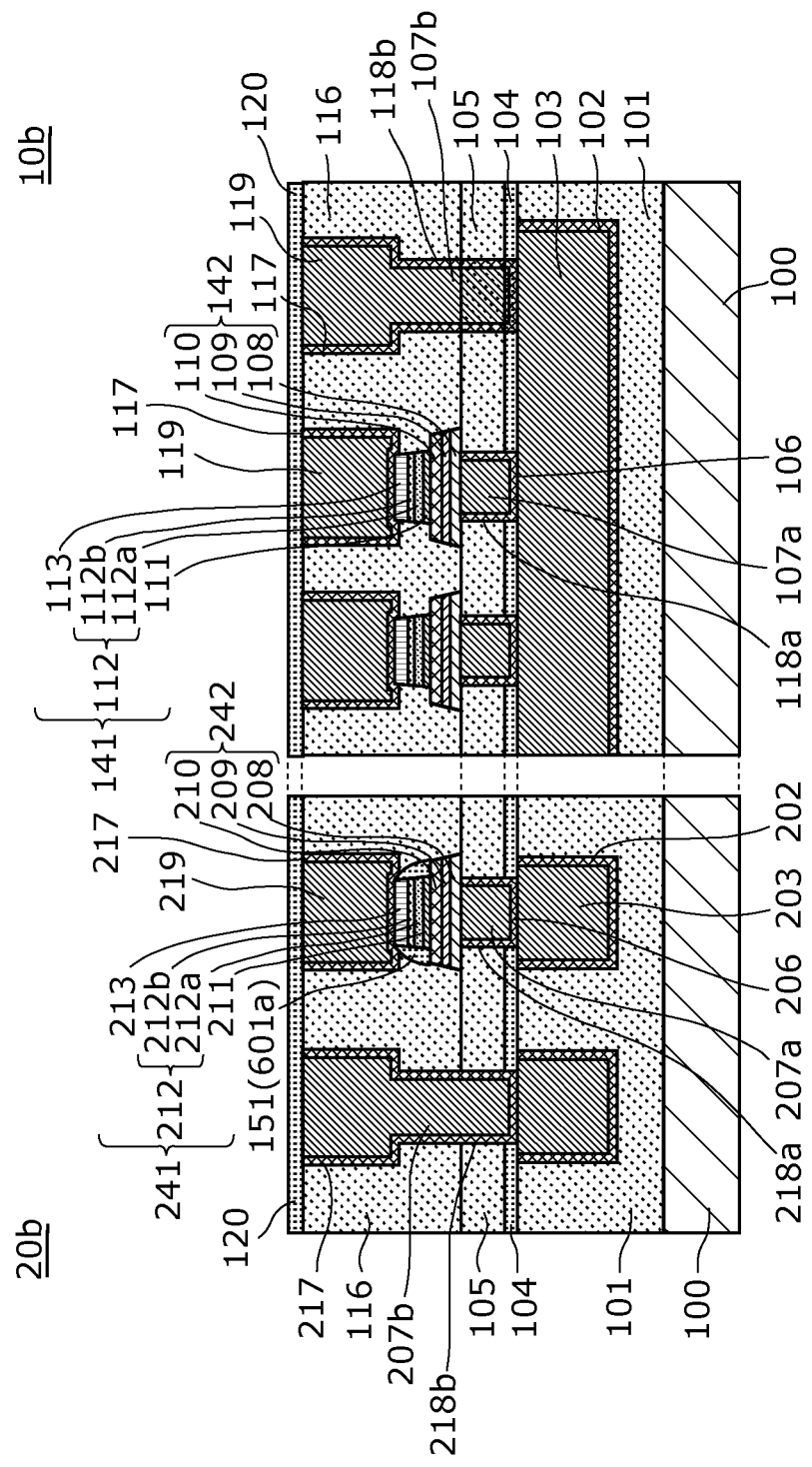
FIG. 26I is a cross-sectional view for explaining the method for manufacturing the non-volatile memory device according to Variation 1 of Embodiment 3 of the present invention.

Next, as shown in FIG. 26I, the second liner layer 120 is formed.

As described above, the non-volatile memory device according to this variation provides advantageous effects similar to those in Embodiment 3.

Embodiment 4

Descriptions are given of an exemplary structure of a non-volatile memory device according to Embodiment 4 of the present invention and a method for manufacturing the same. Hereinafter, differences from Embodiment 1 are mainly described.

Figure 27:
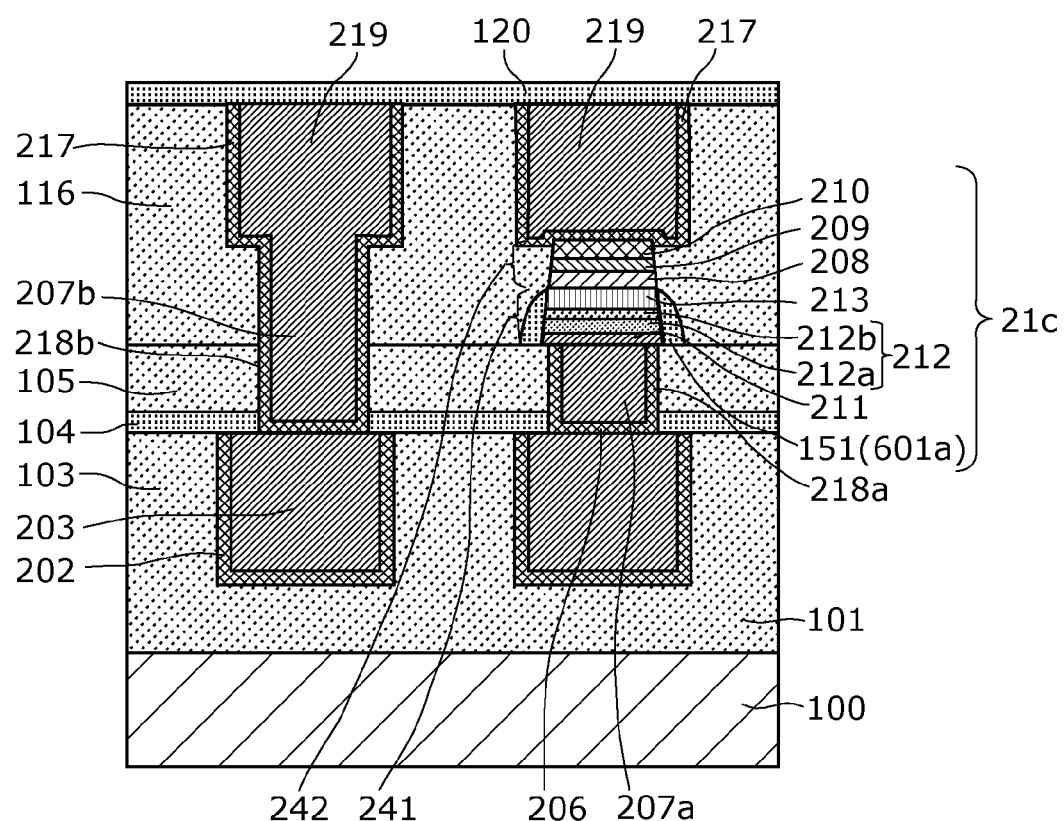
FIG. 27 is a cross-sectional view of an exemplary structure of a parameter generation circuit according to Embodiment 4 of the present invention.
Figure 28:
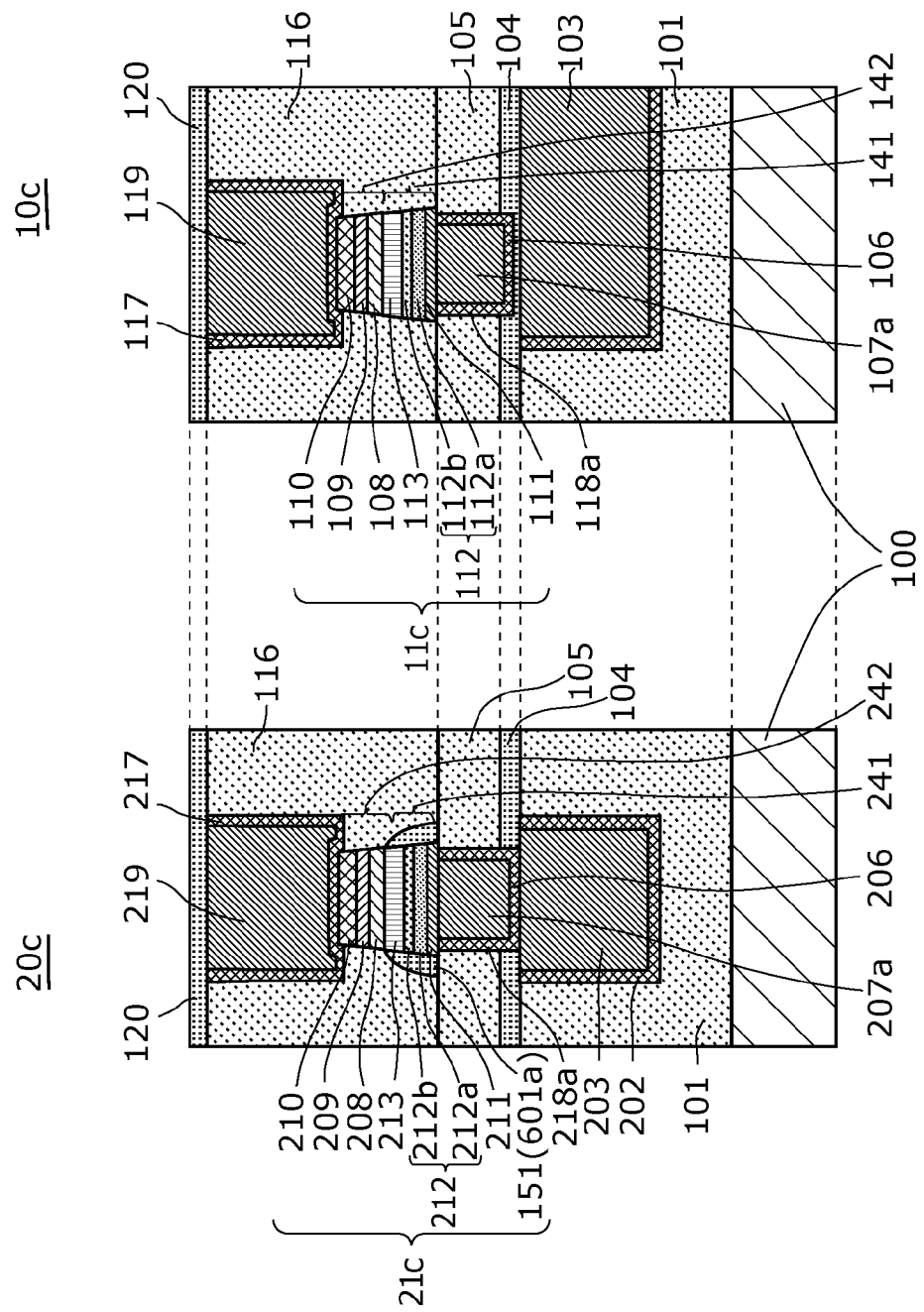
FIG. 28 is a cross-sectional view of the exemplary structure of a non-volatile memory device according to Embodiment 4 of the present invention.

FIG. 27 is a cross-sectional diagram showing an exemplary structure of the parameter generation circuit 20c according to this embodiment. FIG. 28 is a cross-sectional view of an exemplary structure of the non-volatile memory device according to this embodiment. The plan view of the non-volatile memory device according to this embodiment is the same as in FIG. 2. FIG. 27 is a cross-sectional view of the cross section along the alternate long and short dash line shown in the C-C' in FIG. 2 when seen from the arrow direction. FIG. 28 is a cross-sectional view of the cross section along the alternate long and short dash line shown in the D-D' in FIG. 28 when seen from the arrow direction.

The non-volatile memory device in this embodiment is different from the non-volatile memory device in Embodiment 1 in that: a first current steering element 142 and a first variable resistance element 141 are connected to each other in series in a memory cell 11c, and the first current steering element 142 is formed above the first variable resistance element 141; and a second current steering element 242 and a second variable resistance element 241 are connected to each other in series in a reference cell 21c, and the second current steering element 242 is formed above the variable resistance element 241. In other words, the memory cell array 10c is different from the memory cell array 10 in Embodiment 1 in that: the first variable resistance element 141 is formed to include a third lower electrode layer 111 connected electrically and physically to a plug 107a, a first variable resistance layer 112 formed above the third lower electrode layer 111, and a third upper electrode layer 113 formed above the first variable resistance layer 112 which are formed above the second interlayer dielectric 105; and the first current steering element 142 is formed to include a first lower electrode layer 108, a first current steering layer 109, and a first upper electrode layer 110 which are formed above the third upper electrode 113. In other words, the parameter generation circuit 20c is different from the parameter generation circuit 20 in Embodiment 1 in that: the second variable resistance element 241 is formed to include a fourth lower electrode layer 211 connected electrically and physically to a plug 207a, a second variable resistance layer 212 formed above the fourth lower electrode layer 211, and a fourth upper electrode layer 213 formed above the second variable resistance layer 212 which are formed above the second interlayer dielectric 105; and the second current steering element 242 is formed to include a second lower electrode layer 208, a second current steering layer 209, and a second upper electrode layer 210 which are formed above the fourth upper electrode 213.

The non-volatile memory device in this embodiment is different from the non-volatile memory device according to Embodiment 1 in that the conductive shorting layer 151 is the conductive side wall, and the second variable resistance element 241 has the side surfaces each covered by the conductive side wall 601a, and the first variable resistance element 141 has the side surfaces not covered by the conductive side wall.

Here, the third barrier metal layer 117 may be replaced with the second line 119 without formation of the third barrier metal layer 117 in the wiring groove, and the third barrier metal layer 217 may be replaced with the fourth line 219 without formation of the third barrier metal layer 217 in the wiring groove. In each of FIG. 27 to FIG. 29L showing this embodiment, the third barrier metal layer 117 in the wiring groove is a part of the second lines 119, and the third barrier metal layer 217 in the wiring groove is a part of the fourth lines 219.

Hereinafter, an exemplary non-volatile memory device according to this embodiment is described in detail below.

The memory cell 11c and the reference cell 21c shown in FIG. 27 and FIG. 28 respectively have structures each including a conductive side wall 601b obtained by forming the first current steering element 142 above the first variable resistance element 141 and forming the second current steering element 242 above the second variable resistance element 241, compared to a corresponding one of the memory cell 11 and the reference cell 21 shown in FIG. 3C and FIG. 4. In other words, the memory cell 11c and the reference cell 21c are the same in structures as the memory cell 11 and the reference cell 21 in Embodiment 1 except that: the first variable resistance element 141 and the first current steering element 142 are turned upside down, and the second variable resistance element 241 and the second current steering element 242 are turned upside down, and that the conductive side wall 601a is formed as the conductive shorting layer 151.

As described above, the non-volatile memory device according to this embodiment provides advantageous effects similar to those provided by the non-volatile memory device in Embodiment 1.

Furthermore, in the non-volatile memory device in this embodiment, the first current steering element 142 and the second current steering element 242 are formed above the first variable resistance element 141 and the second variable resistance element 241. Accordingly, it is possible to form the first current steering element 142 and the second current steering element 242 with reduced process thermal budgets. Thus, it is possible to realize the memory cell 11c and the reference cell 21c which an operate stably.

Next, a description is given of a method for manufacturing the aforementioned non-volatile memory device, specifically, an exemplary method for forming a memory cell array 10c and a parameter generation circuit 20c.

Each of FIG. 29A to 29L is a cross section for explaining an exemplary method for forming the memory cell array 10c and the parameter generation circuit 20c according to this embodiment.

The manufacturing method according to this embodiment is different from the method for manufacturing the non-volatile memory device in FIG. 5A to FIG. 5I, at and after the process in FIG. 5B. In other words, the non-volatile memory device manufacturing method according to this embodiment is different from the non-volatile memory device manufacturing device according to Embodiment 1 in the element forming processes for: forming a third conductive layer 311 above the substrate 100; forming a variable resistance layer 312 above the third conductive layer 311; forming a fourth conductive layer 313 above the variable resistance layer 312; forming a first conductive layer 308 above the fourth conductive layer 313; forming a current steering layer 309 above the first conductive layer 308; forming a second conductive layer 310 above the current steering layer 309; forming a first upper electrode layer 110 and a second upper electrode layer 210 by patterning the second conductive layer 310; forming a first current steering layer 109 and a second current steering layer 209 by patterning the current steering layer 309; forming a first lower electrode layer 108 and a second lower electrode layer 208 by patterning the first conductive layer 308; forming a third upper electrode layer 113 and a fourth upper electrode layer 213 by patterning the fourth conductive layer 313; forming a first variable resistance layer 112 and a second variable resistance layer 212 by patterning the variable resistance layer 312; and forming a third lower electrode layer 111 and a fourth lower electrode layer 211 by patterning the third conductive layer 311, wherein the process for forming the conductive shorting layer 151 includes forming the conductive side wall 601a to cover the side surfaces of the fourth upper electrode layer 213, the second variable resistance layer 212, and the fourth lower electrode layer 211 of the second variable resistance element 241 so as to use the conductive side wall 601a as the conductive shorting layer 151. More specifically, the non-volatile memory device manufacturing method according to this embodiment is different from the non-volatile memory device manufacturing device according to Embodiment 1 in the processes for: forming a first current steering element 142 included in a memory cell 11c and a second current steering element 242 included in a reference cell 21c at the same time; forming a first variable resistance element 141 below and in contact with the first current steering element 142 included in the memory cell 11c a the second variable resistance element 241 below and in contact with the second current steering element 242 included in the reference cell 21c, after the formation of the first current steering element 142 and the second current steering element 242; and forming the second line 119 electrically connected to the memory cell 11c and the fourth line 219 electrically connected to the reference cell 21c, wherein among the processes for forming the elements by patterning, the patterning for forming the first current steering element 142 for forming the memory cell 11c and the patterning for forming the first variable resistance element 141 are performed using the same hard mask layer 125, and the patterning for forming the second current steering element 242 for forming the reference cell 21c and the patterning for forming the second variable resistance element 241 are performed using the same hard mask layer 125, and the conductive side wall 601a is formed as the conductive shorting layer 151 on the side surfaces of the second variable resistance element 241 included in the reference cell 21c.

Hereinafter, an exemplary method for manufacturing the non-volatile memory device according to this embodiment is described in detail below.

Figure 29A:
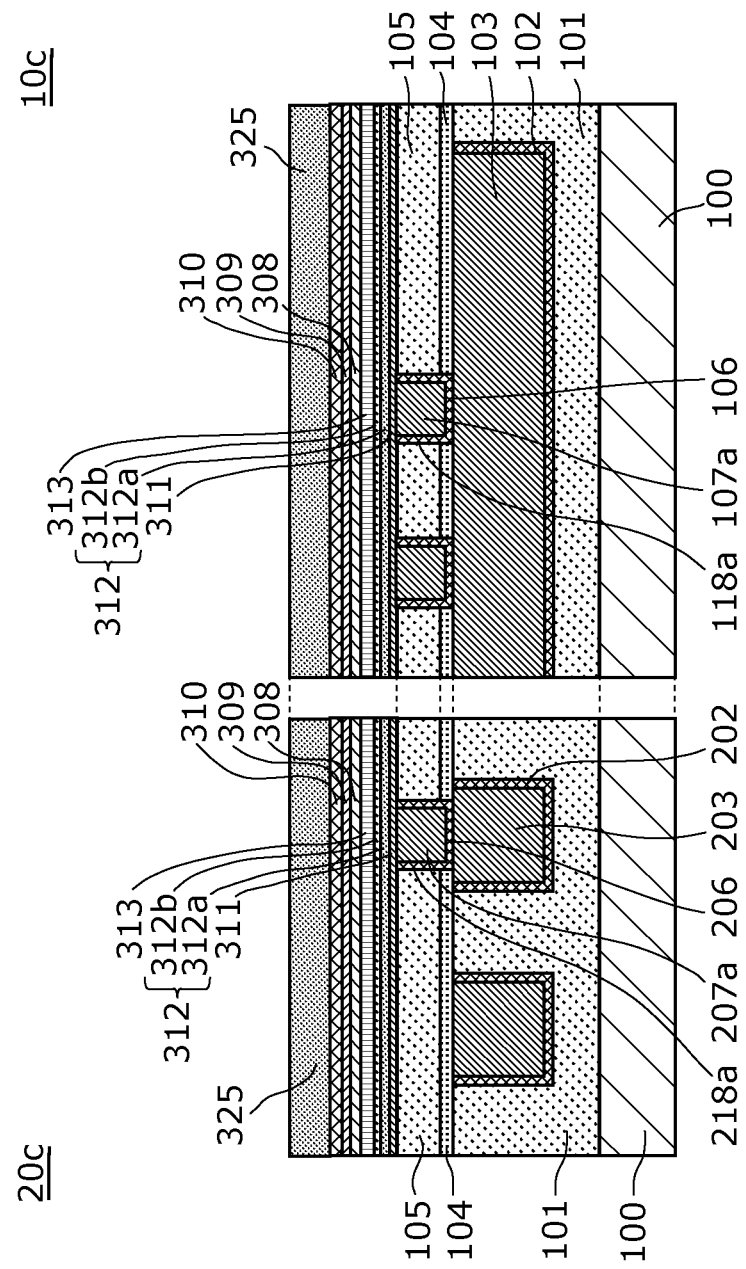
FIG. 29A is a cross-sectional view for explaining the method for manufacturing the non-volatile memory device according to Embodiment 4 of the present invention.

Next, as shown in FIG. 29A, the following are sequentially deposited above the second interlayer dielectric 105 including the plugs 107a and 207a using a sputtering method or the like: a third conductive layer 311 (having a thickness of 30 nm) including a tantalum nitride; a first oxide layer 312a, a second oxide layer 312b, and a fourth conductive layer 313 (having a thickness of 80 nm) including iridium. Next, the following are sequentially deposited above the fourth conductive layer 313 using a sputtering method or the like: a first conductive layer 308 (having a thickness of 20 nm) including a tantalum nitride; a current steering layer 309 (having a thickness of 20 nm) including a nitrogen-deficient silicon nitride; and a second conductive electrode layer 310 (having a thickness of 30 nm) including a tantalum nitride. Next, as a hard mask for use in dry etching, the following is deposited using a sputtering method or the like: a hard mask layer 325 (having a thickness of 100 nm) which is a conductive layer and includes one of a titanium nitride and a titanium-aluminium nitride (for example, a titanium-aluminium nitride.

Figure 29B:
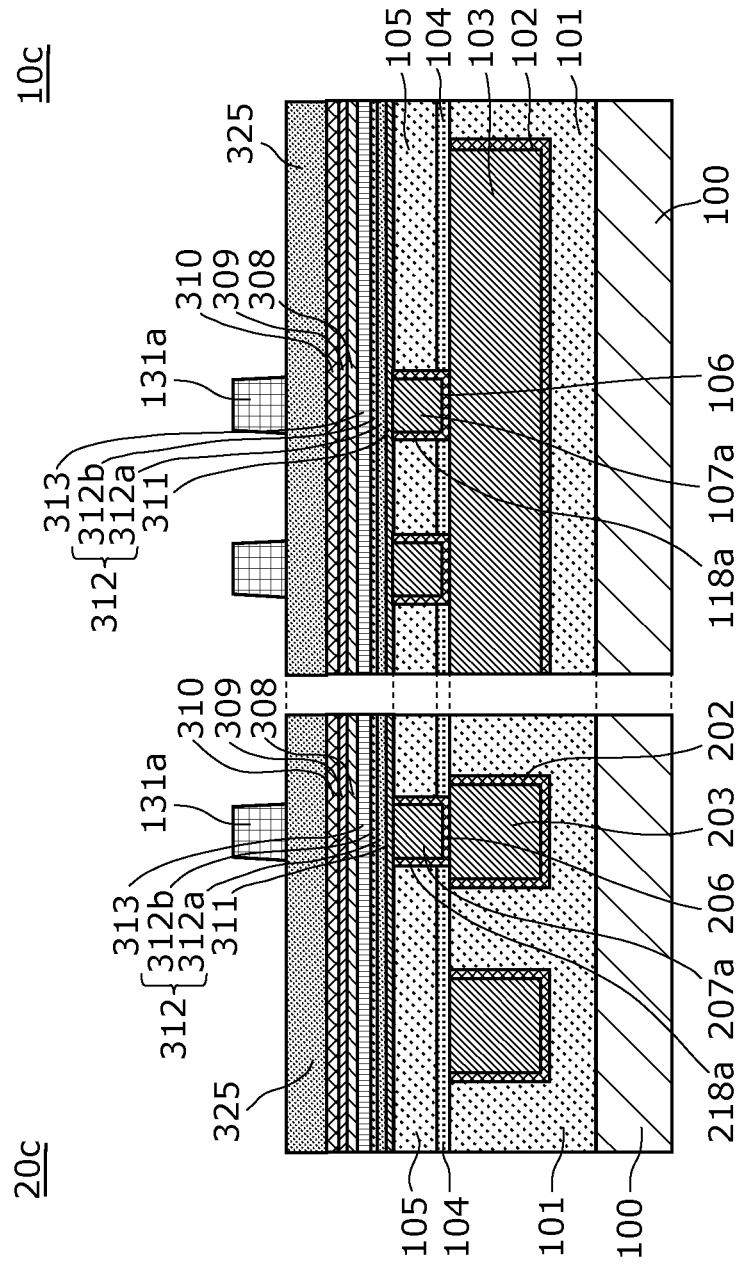
FIG. 29B is a cross-sectional view for explaining the method for manufacturing the non-volatile memory device according to Embodiment 4 of the present invention.

Next, as shown in FIG. 29B, a first resist mask pattern 131a for forming the first current steering element 142 and the second current steering element 242 are formed above a hard mask 325 using photolithography.

Figure 29C:
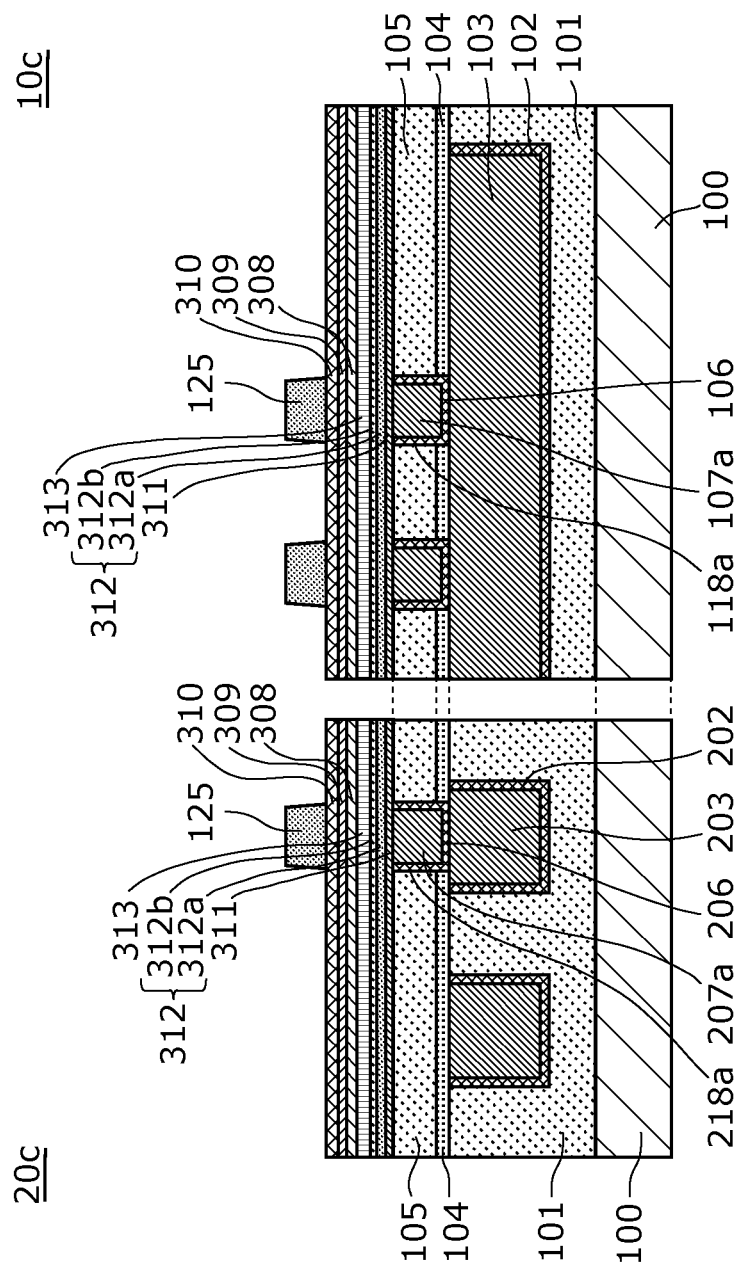
FIG. 29C is a cross-sectional view for explaining the method for manufacturing the non-volatile memory device according to Embodiment 4 of the present invention.

Next, as shown in FIG. 29C, the hard mask layer 325 is patterned using the first resist mask pattern 131a to form a hard mask layer 125. Next, the first resist mask pattern 131a is removed by performing an ashing process.

Figure 29D:
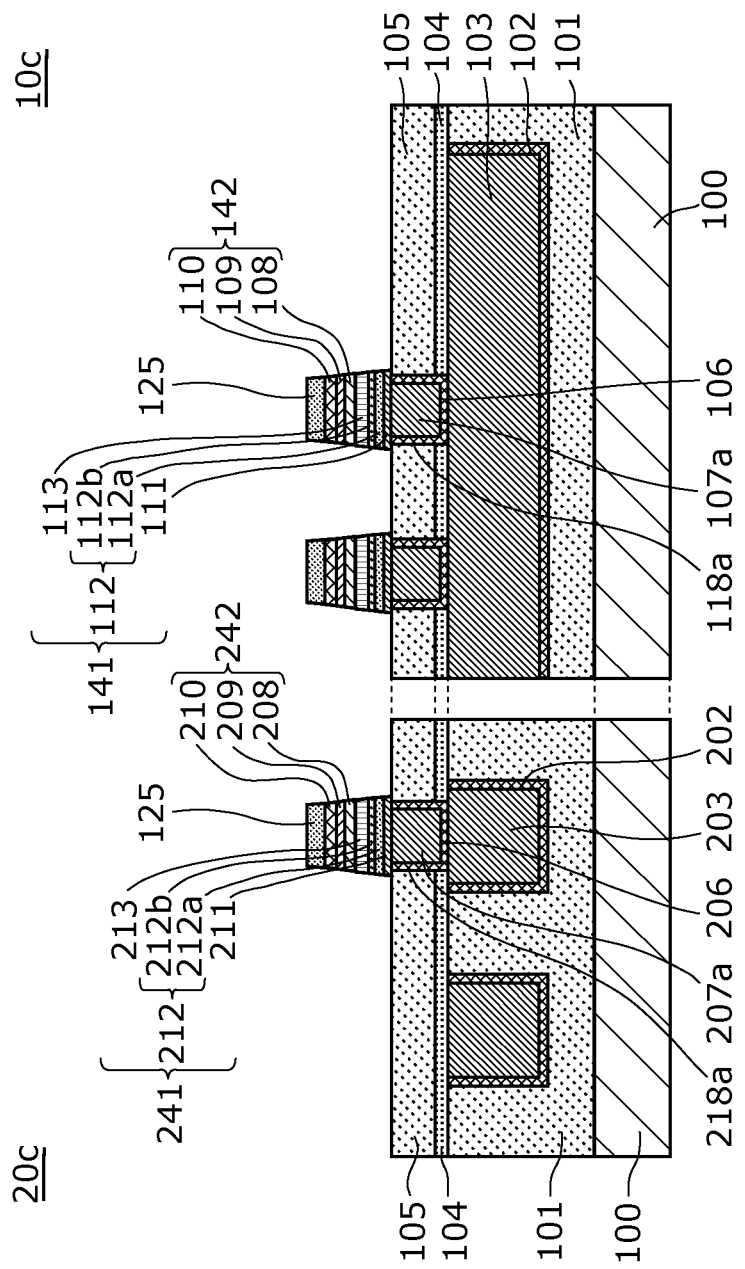
FIG. 29D is a cross-sectional view for explaining the method for manufacturing the non-volatile memory device according to Embodiment 4 of the present invention.

Next, as shown in FIG. 29D, (i) the first upper electrode layer 110, the first current steering layer 109, and the first lower electrode layer 108 of the first current steering element 142 and (ii) the second upper electrode layer 210, the second current steering layer 209, and the second lower electrode layer 208 of the second current steering element 242 are formed at the same time by patterning the second conductive layer 310, the current steering layer 309, and the first conductive layer 308 using the hard mask layer 125. Next, (i) the third upper electrode layer 113, the first variable resistance layer 112, and the third lower electrode layer 111 of the first variable resistance element 141 and (ii) the fourth upper electrode layer 213, the second variable resistance layer 212, and the fourth lower electrode layer 211 of the second variable resistance element 241 are formed at the same time by pattering the fourth conductive layer 313, the first oxide layer 312a, the second oxide layer 312b, and the third conductive layer 311 using the hard mask layer 125.

Figure 29E:
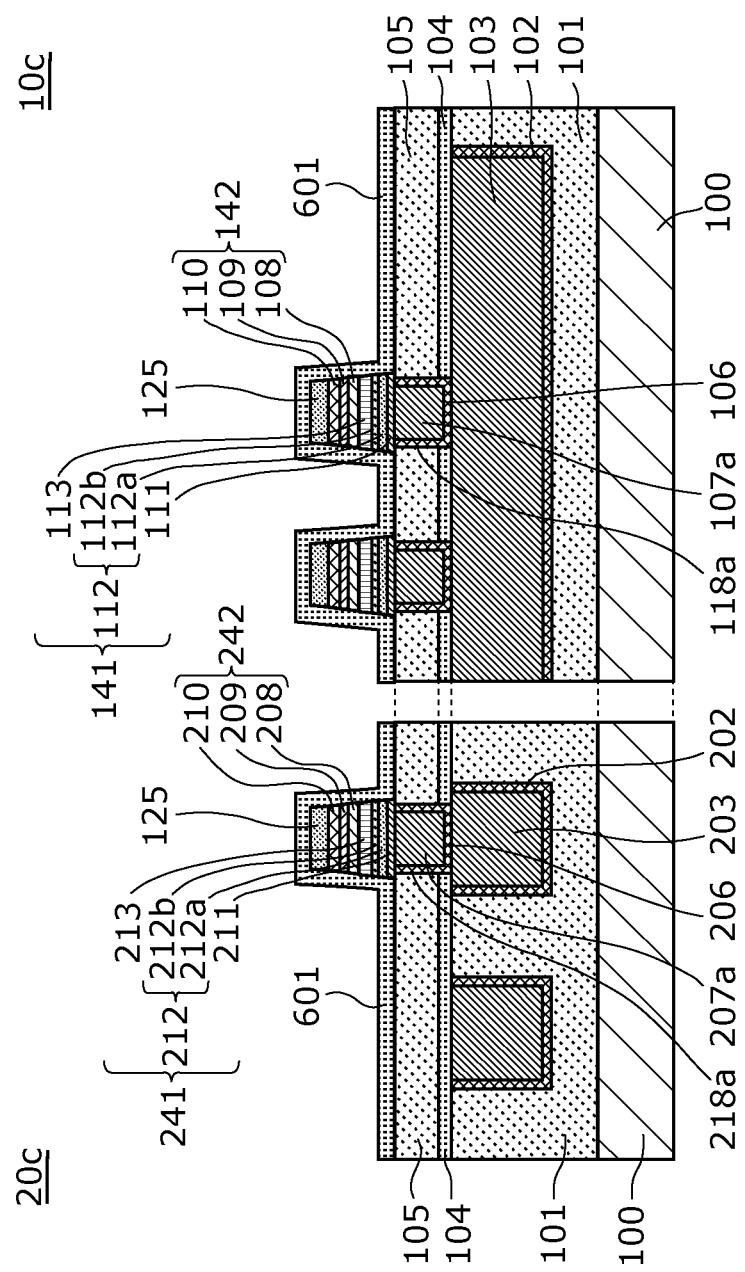
FIG. 29E is a cross-sectional view for explaining the method for manufacturing the non-volatile memory device according to Embodiment 4 of the present invention.
Figure 29F:
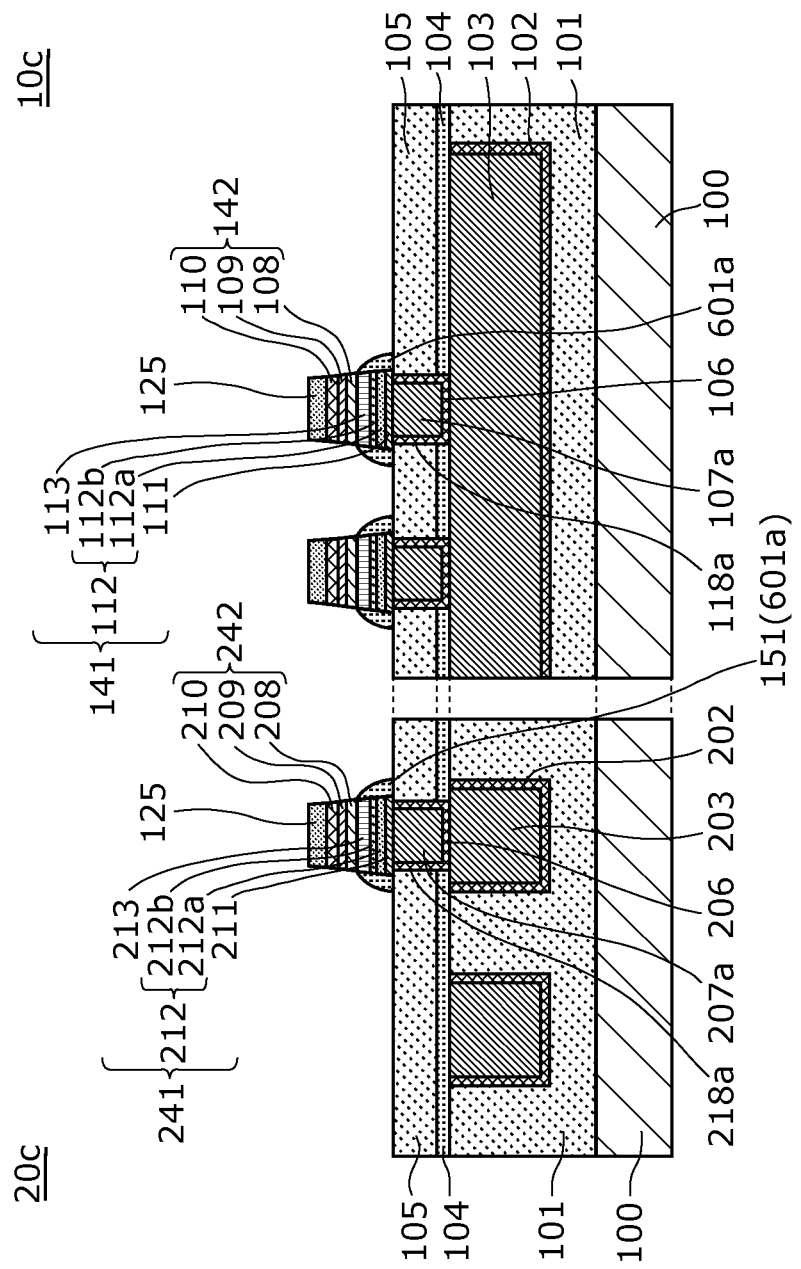
FIG. 29F is a cross-sectional view for explaining the method for manufacturing the non-volatile memory device according to Embodiment 4 of the present invention.

Next, as shown in FIG. 29E and FIG. 29F, it is possible to leave the conductive side wall 601a only on both the side surfaces of the first variable resistance element 141 and the second variable resistance element 241 by performing etch back (anisotropic etching) on the conductive layer 601 after the deposition of the conductive layer 601. As a specific formation method, the method described in Embodiment 3 can be used.

Figure 29G:
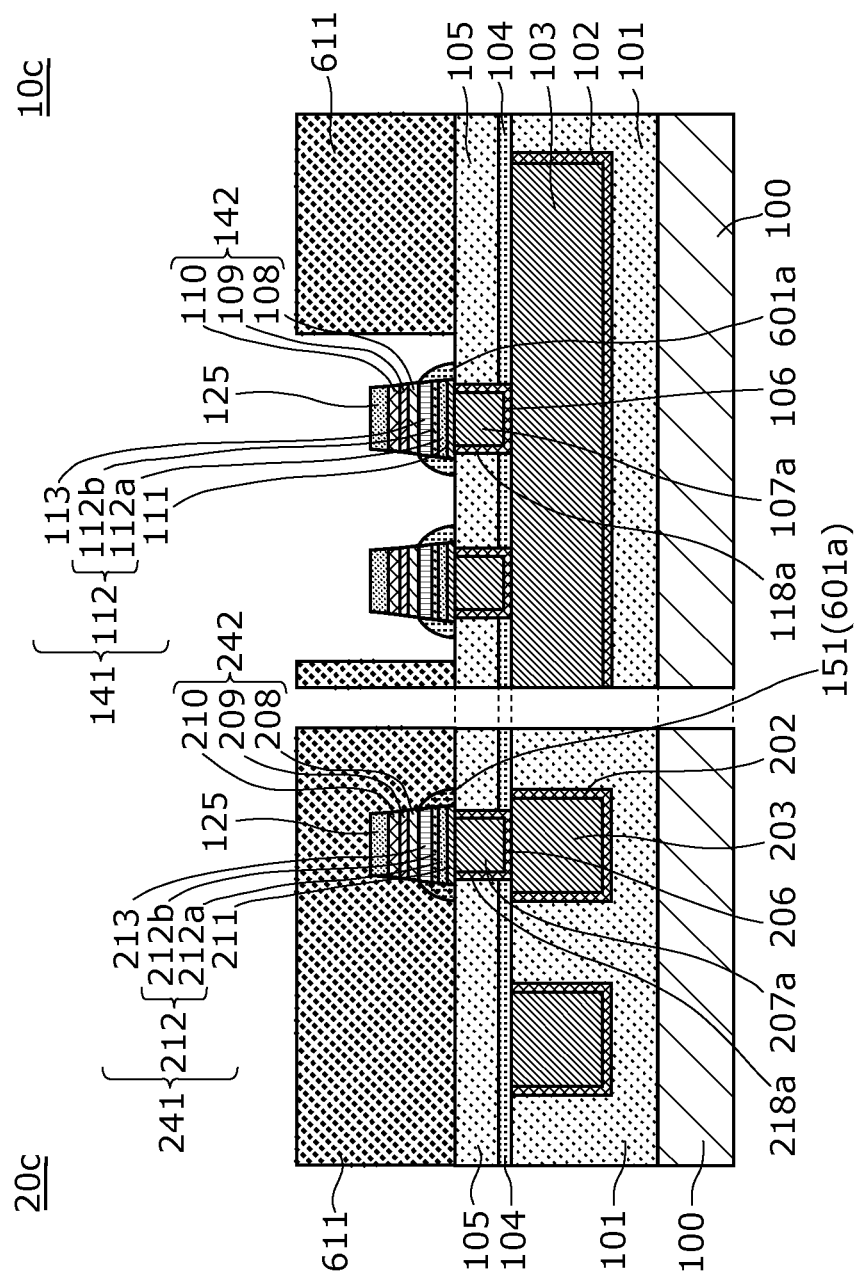
FIG. 29G is a cross-sectional view for explaining the method for manufacturing the non-volatile memory device according to Embodiment 4 of the present invention.

Next, as shown in FIG. 29G, since the conductive side wall 601a is selectively removed from the side surfaces of the first variable resistance element 141 included in the memory cell 11c, the fourth resist mask pattern 611 is formed to cover the area other than the area in which the memory cell 11c is formed.

Figure 29H:
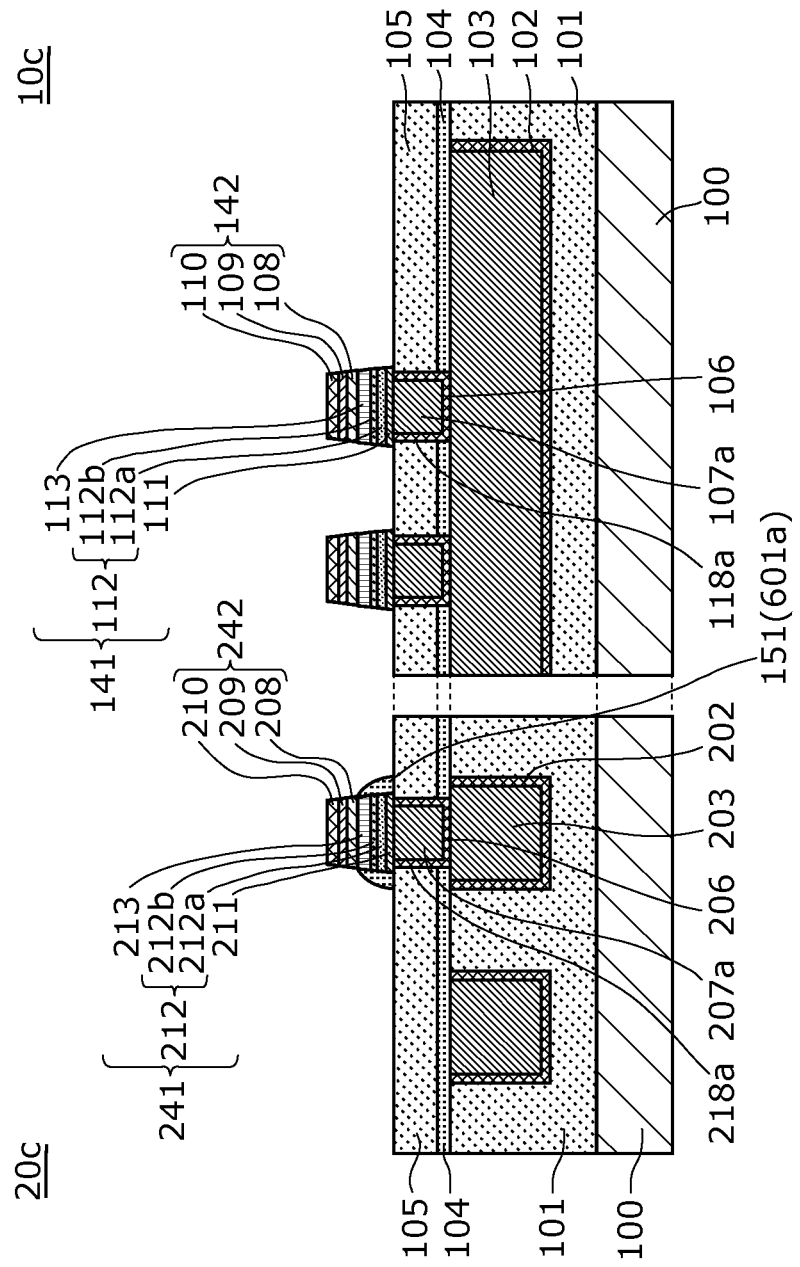
FIG. 29H is a cross-sectional view for explaining the method for manufacturing the non-volatile memory device according to Embodiment 4 of the present invention.

Next, as shown in FIG. 29H, the conductive side wall 601a is removed by etching from the side surfaces of the first variable resistance element 141 included in the memory cell 11c. A conceivable etching method is, for example, to selectively etch only the conductive side wall 601a formed on the side surfaces of the first variable resistance element 141 included in the memory cell 11c using the same method as in the process of FIG. 29F. In this way, it is possible to form the conductive side wall 601a only on the side surfaces of the second variable resistance element 241 included in the reference cell 21c. Next, the fourth resist mask pattern 611 is removed by performing an ashing process. Next, the hard mask layer 125 is removed by etching or the like. Here, the hard mask layer 125 does not always need to be removed, and may be maintained as necessary.

Figure 29I:
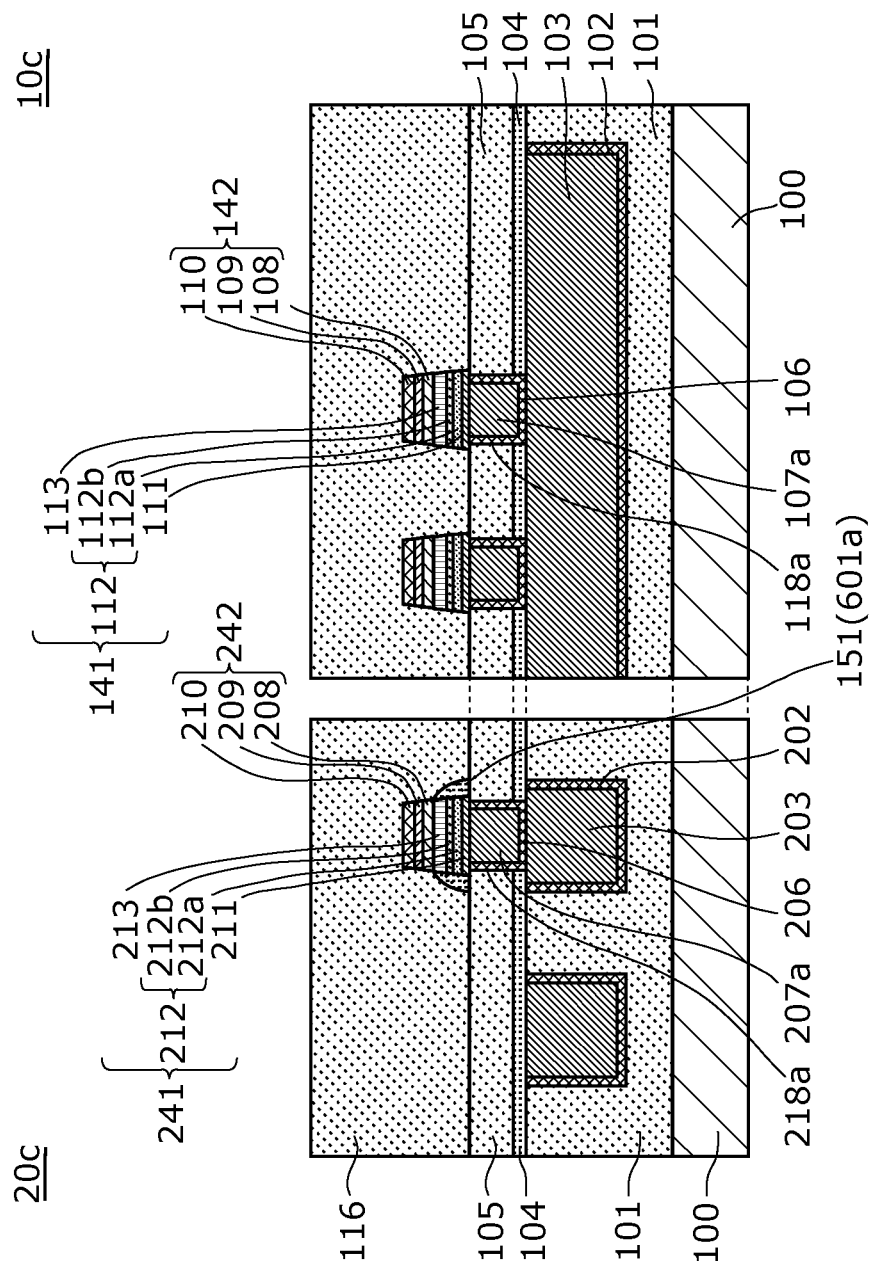
FIG. 29I is a cross-sectional view for explaining the method for manufacturing the non-volatile memory device according to Embodiment 4 of the present invention.
Figure 29J:
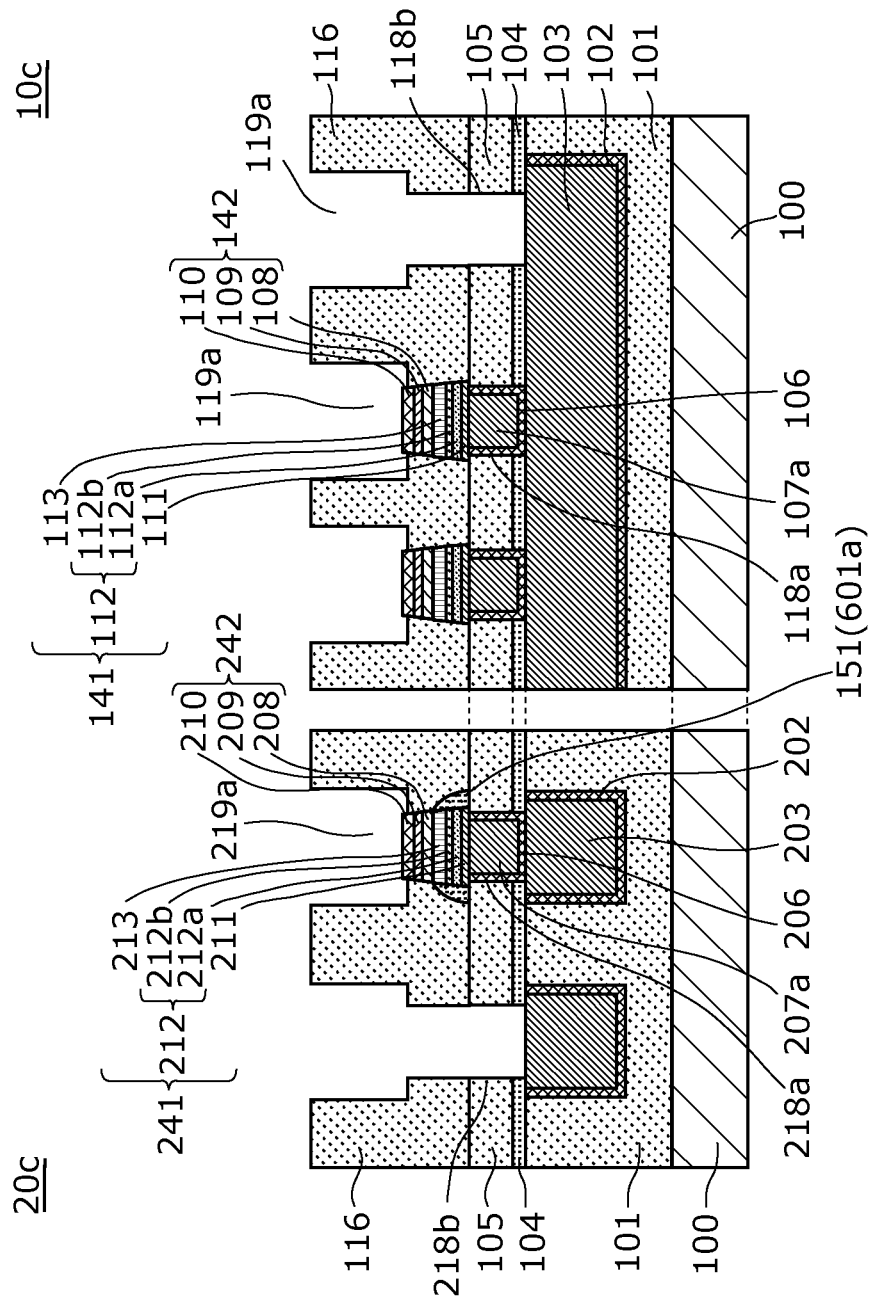
FIG. 29J is a cross-sectional view for explaining the method for manufacturing the non-volatile memory device according to Embodiment 4 of the present invention.

Next, as shown in FIG. 29I and FIG. 29J, a third interlayer dielectric 116 is formed to cover the first current steering element 142, the first variable resistance element 141, the second current steering element 242, and the conductive side wall 601a formed on the side surfaces of the second variable resistance element 241. Next, in the third interlayer dielectric 116, the following is formed: wiring grooves 119a and 219a for forming a second line 119 to be connected to the first upper electrode layer 110 of the first current steering element 142 and a fourth line 219 to be connected to the second upper electrode layer 210 of the second current steering element 242, and contact holes 218a and 118b. As a specific formation method, it is possible to use the same method similar to the one described with reference to FIGS. 5F and 5G in Embodiment 1.

Figure 29K:
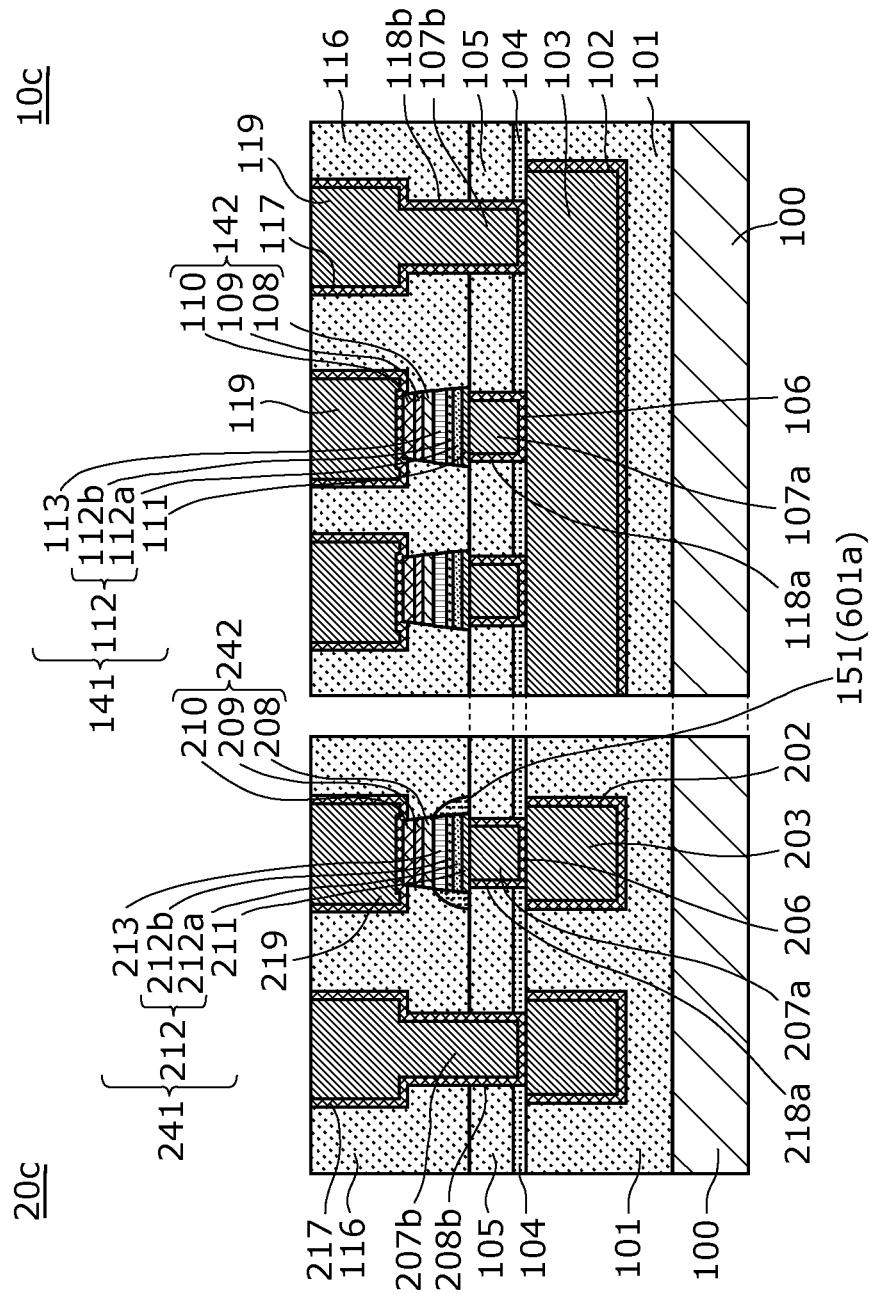
FIG. 29K is a cross-sectional view for explaining the method for manufacturing the non-volatile memory device according to Embodiment 4 of the present invention.

Next, as shown in FIG. 29K, a second line 119 and a fourth line 219 are formed. As a specific formation method, it is possible to use the same method similar to the one described with reference to FIG. 5H in Embodiment 1.

Figure 29L:
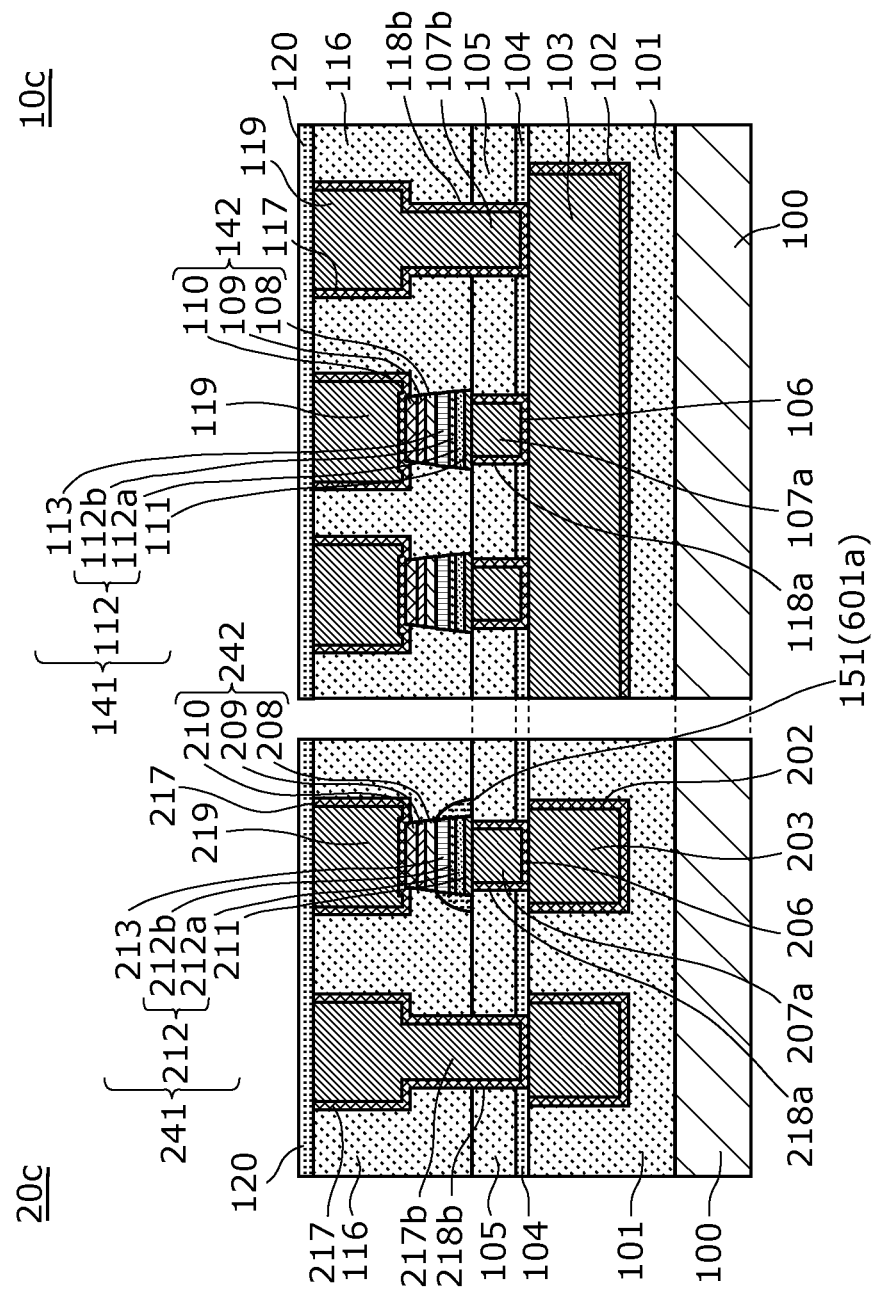
FIG. 29L is a cross-sectional view for explaining the method for manufacturing the non-volatile memory device according to Embodiment 4 of the present invention.

Next, as shown in FIG. 29L, the second liner layer 120 is formed.

As described above, the non-volatile memory device according to this embodiment provides advantageous effects similar to those in Embodiment 1.

In addition, according to the non-volatile memory device manufacturing method in this embodiment, a first current steering element 142 and a second current steering element 242 are formed above the first variable resistance element 141 and the second variable resistance element 241. Accordingly, it is possible to form the first current steering element 142 and the second current steering element 242 with reduced process thermal budgets, resulting in increase in the flexibility in selecting materials for the lower electrodes, the current steering layers, and the upper electrodes of the current steering elements.

The non-volatile memory devices and methods for manufacturing the same according to the present invention have been described above based on the embodiments. However, the present invention is not limited to these embodiments. The present invention encompasses various kinds of modifications to the embodiments conceivable by a person skilled in the art without deviating from the scope of the present invention. In addition, some of the structural elements in different ones of the embodiments may be arbitrarily combined within the scope of the present invention.

Figure 31:
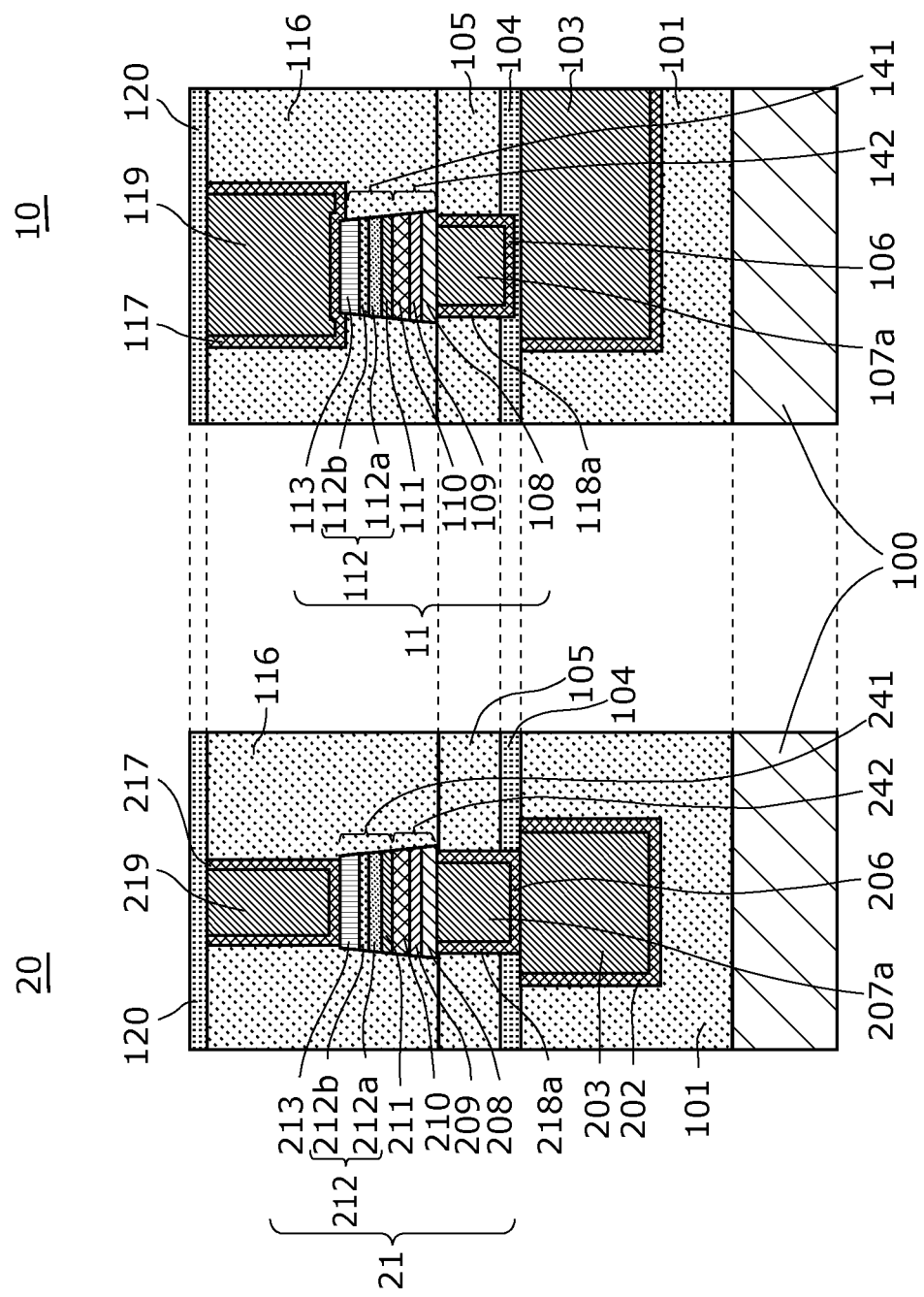
FIG. 31 is a plan view of an exemplary structure of a part of the non-volatile memory device according to the variation of any of Embodiments 1 to 4 of the present invention.
Figure 32:
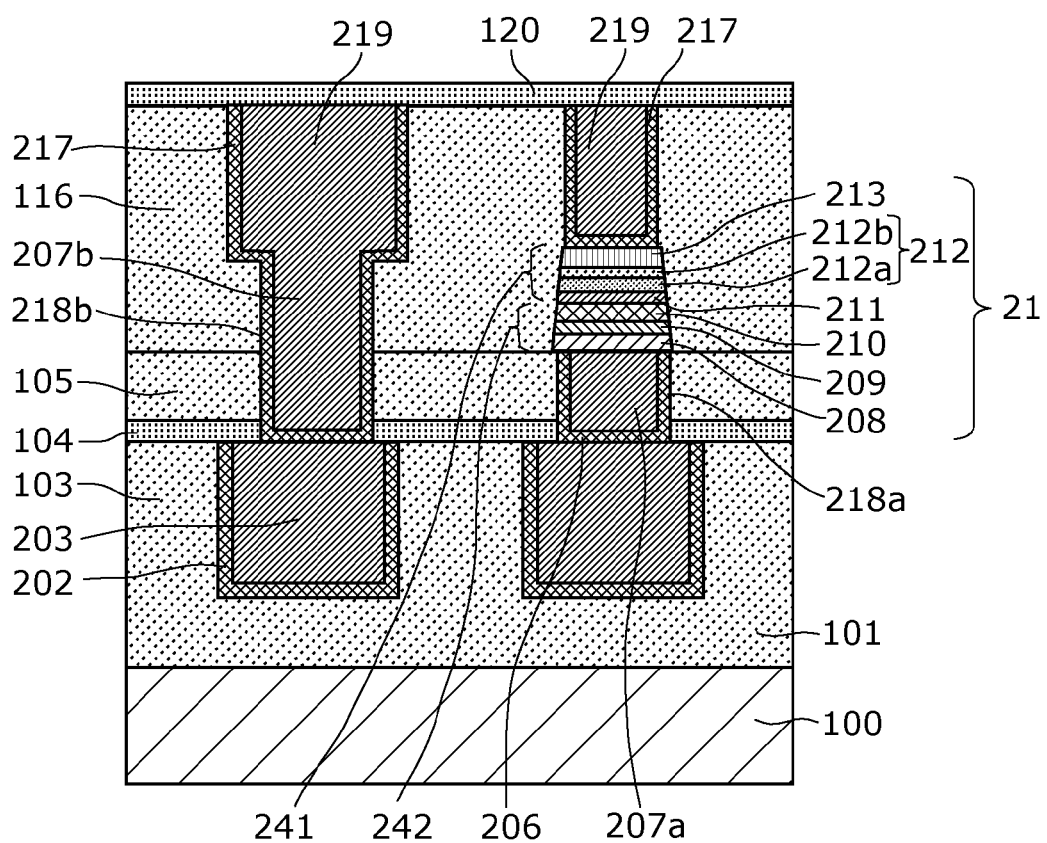
FIG. 32 is a cross-sectional view of an exemplary structure of a parameter generation circuit according to the variation of any of Embodiments 1 to 4 of the present invention.
Figure 33:
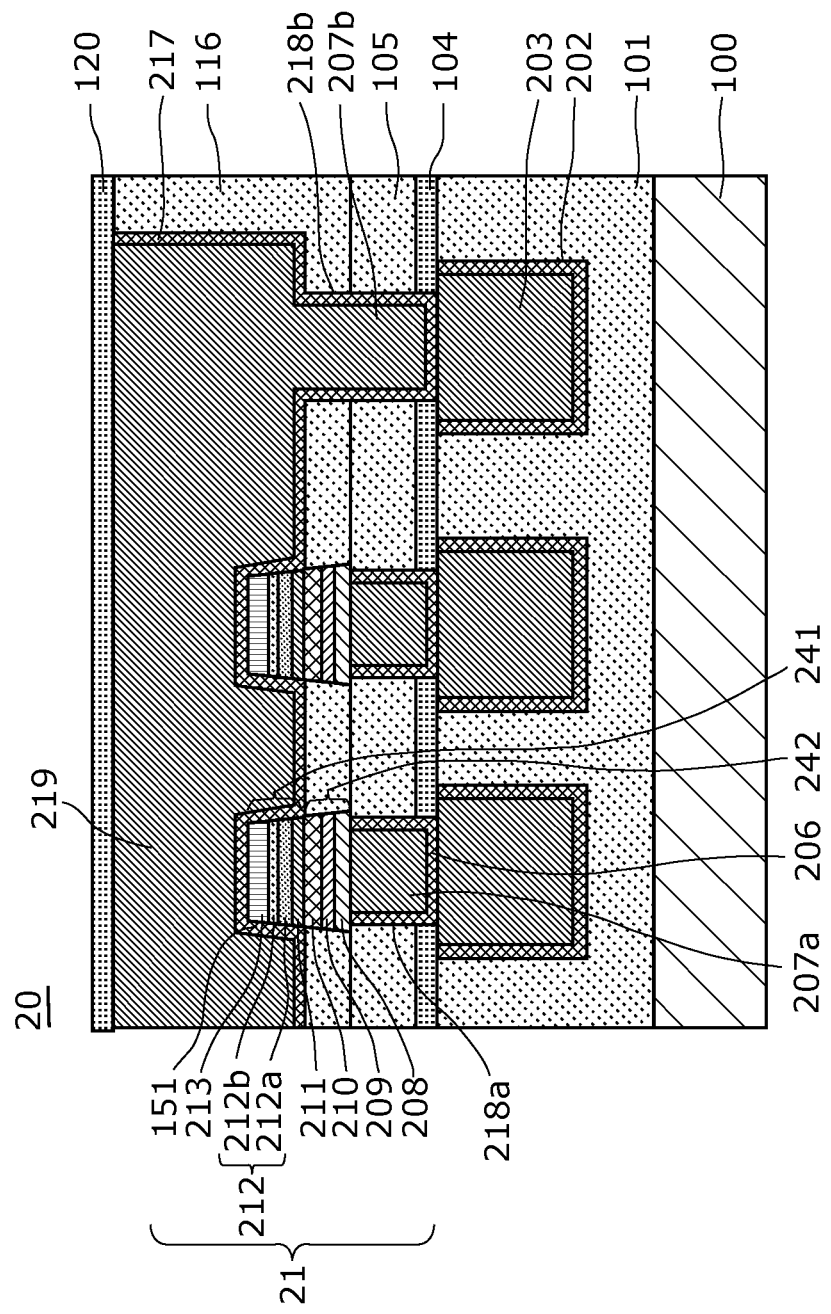
FIG. 33 is a cross-sectional view of an exemplary structure of a parameter generation circuit according to the variation of any of Embodiments 1 to 4 of the present invention.

For example, in each of the embodiments, the variable resistance element and the current steering element have x-direction and y-direction maximum widths smaller than a line width, but the variable resistance element and the current steering element may have x-direction and y-direction maximum widths larger than or equal to the line width. Each of FIG. 30 to FIG. 33 shows a structural example in the case where the line width of the fourth line 219 is smaller than the x-direction width of the second variable resistance element 241. FIG. 30 is a plan view showing an exemplary structure of a part of the non-volatile memory device. FIG. 31 is a cross section showing an exemplary structure of the non-volatile memory device. Each of FIG. 32 and FIG. 33 is a cross section showing an exemplary structure of the parameter generation circuit 20. FIG. 31 is a cross-sectional view of the cross section along the alternate long and short dash line shown in the D-D' in FIG. 30 when seen from the arrow direction. FIG. 32 is a cross-sectional view of the cross section along the alternate long and short dash line shown in the C-C' in FIG. 30 when seen from the arrow direction. FIG. 33 is a cross-sectional view of the cross section along the alternate long and short dash line shown in the E-E' in FIG. 30 when seen from the arrow direction.

In this way, as shown in FIG. 30 to FIG. 32, the conductive shorting layer 151 is formed on the side surfaces of the second variable resistance element 241 except for the surface in the line-width direction (x-direction) of the fourth line 219. However, even in such a case, as shown in FIG. 33, the fourth line 219 and the third barrier metal layer 217 can be formed such that their lower parts are in contact with the side surfaces of the second variable resistance element 241 in a longitudinal direction (y-direction) of the fourth line 219. In other words, in the longitudinal direction (y-direction) of the fourth line 219, it is possible to form the conductive shorting layer 151 on the side surfaces of the second variable resistance element 241. In the example shown in FIG. 33, the bottom surfaces of the fourth line 219 and the third barrier metal layer 217 are positioned deeper than the upper surfaces of the second variable resistance element 241 and the fourth lower electrode layer 211 not only around the reference cell 21 but also between the plurality of reference cells 21 connected with the same fourth line 219 and the third barrier metal layer 217. Accordingly, the conductive shorting layer 151 which is substituted by the plurality of reference cells 21 is formed through the fourth line 219 and the third barrier metal layer 217.

In addition, although the conductive shorting layer 151 is in contact with the fourth lower electrode layer 211 in the embodiment, it is only necessary for the conductive shorting layer 151 to be in contact with at least one of the fourth lower electrode layer 211 and the second upper electrode layer 210.

In addition, the third lower electrode layer 111 of the first variable resistance element 141 and the first upper electrode layer 110 of the first current steering element 142 may be in a single common layer (intermediate electrode layer) in the embodiment. Likewise, the fourth lower electrode layer 211 of the second variable resistance element 241 and the second upper electrode layer 210 of the second current steering element 242 may be in a single common layer (intermediate electrode layer) in the embodiment. In this case, the second conductive layer 310 and the third conductive layer 311 are formed in the same process, and the second conductive layer 310 and the third conductive layer 311 are patterned in the same process.

INDUSTRIAL APPLICABILITY

The present invention is applicable to non-volatile memory devices and methods for manufacturing the same, and particularly to various kinds of electronic devices such as digital home appliances, memory cards, mobile phones, and personal computers.

REFERENCE SIGNS LIST 10, 10a, 10b, 10c Memory cell array
11, 11a, 11b, 11c Memory cell
20, 20a, 20b, 20c Parameter generation circuit
21, 21a, 21b, 21c Reference cell
100 Substrate
101 First interlayer dielectric
102, 202 First barrier metal layer
103 First line
104 First liner layer
105 Second interlayer dielectric
106, 206 Second barrier metal layer
107a, 107b, 207a, 207b, 307a, 307b Plug
108 First lower electrode layer
109 First current steering layer
110 First upper electrode layer
111 Third lower electrode layer
112 First variable resistance layer
112a, 212a First oxide layer
112b, 212b Second oxide layer
113 Third upper electrode layer
116 Third interlayer dielectric
117, 217 Third barrier metal layer
118a, 118b, 218a, 218b, 318a, 318b Contact hole
119 Second line
119a, 219a Wiring groove
120 Second liner layer
125, 325 Hard mask layer
131a First resist mask pattern
131b Second resist mask pattern
141 First variable resistance element
142 First current steering element
151 Conductive shorting layer
203 Third line
208 Second lower electrode layer
209 Second current steering layer
210 Second upper electrode layer
211 Fourth lower electrode layer
212 Second variable resistance layer
213 Fourth upper electrode layer
219 Fourth line
241 Second variable resistance element
242 Second current steering element
308 First conductive layer
309 Current steering layer
310 Second conductive layer
311 Third conductive layer
312 Variable resistance layer
312a First oxide layer
312b Second oxide layer
313 Fourth conductive layer
501 Dielectric
501a, 501b Dielectric side wall
511 Third resist mask pattern
601 Conductive layer
601a Conductive side wall
611 Fourth resist mask pattern

The invention claimed is:

1. A non-volatile memory device comprising:
a substrate;
a memory cell array including:
a plurality of first lines arranged in parallel to each other above the substrate;
a plurality of second lines arranged in parallel to each other crossing the plurality of first lines three-dimensionally; and
a plurality of memory cells each including a first variable resistance element and a first current steering element and placed at a corresponding one of cross-points of the first lines and the second lines; and
a parameter generation circuit including:
a third line placed above the substrate;
a fourth line placed above the third line; and
a current steering characteristic reference cell placed between and connected to the third line and the fourth line and including a second variable resistance element and a second current steering element having a same current density-voltage characteristic as a current density-voltage characteristic of the first current steering element,
wherein the second variable resistance element includes:
a lower electrode layer;
a variable resistance layer formed above the lower electrode layer; and
an upper electrode layer formed above the variable resistance layer, and in the current steering characteristic reference cell,
the second variable resistance element has a side surface with a conductive shorting layer for short-circuiting the upper electrode layer and the lower electrode layer.

2. The non-volatile memory device according to claim 1, wherein the second current steering element is an element for determining a non-linear current steering characteristic of the first current steering element.

3. The non-volatile memory device according to claim 1, comprising:
a control circuit;
a write circuit which applies, to one or more predetermined memory cells among the plurality of memory cells, a voltage for writing information to the one or more predetermined memory cells; and
a read circuit which applies, to one or more predetermined memory cells among the plurality of memory cells, a voltage for reading the information from the one or more predetermined memory cells,
wherein the parameter generation circuit obtains a parameter indicating a non-linear current steering characteristic of the second current steering element, and outputs a parameter signal corresponding to the parameter to the control circuit,
the control circuit generates a control signal for controlling the write circuit and the read circuit based on the parameter signal, and outputs the control signal to at least one of the write circuit and the read circuit, and
the at least one of the write circuit and the read circuit determines the voltage to be applied to the one or more predetermined memory cells based on the control signal.

4. The non-volatile memory device according to claim 1, wherein the first current steering element includes:
a lower electrode layer;
a current steering layer formed above the lower electrode layer of the first current steering element; and
an upper electrode layer formed above the current steering layer of the first current steering element,
the second current steering element includes:
a lower electrode layer;
a current steering layer formed above the lower electrode layer of the second current steering element; and
an upper electrode layer formed above the current steering layer of the second current steering element,
the lower electrode layer of the first current steering element and the lower electrode layer of the second current steering element have a same composition,
the current steering layer of the first current steering element and the current steering layer of the second current steering element have a same composition and a same film thickness, and
the upper electrode layer of the first current steering element and the upper electrode layer of the second current steering element have a same composition.

5. The non-volatile memory device according to claim 4, wherein the current steering layer of the first current steering layer and the current steering layer of the second current steering layer are formed in a single process.

6. The non-volatile memory device according to claim 1, wherein the first variable resistance element includes:
a lower electrode layer;
a variable resistance layer formed above the lower electrode layer of the first variable resistance element; and
an upper electrode layer formed above the variable resistance layer of the first variable resistance element,
the lower electrode layer of the first variable resistance element and the lower electrode layer of the second variable resistance element have a same composition,
the variable resistance layer of the first variable resistance element and the variable resistance layer of the second variable resistance element have a same composition and a same film thickness, and
the upper electrode layer of the first variable resistance element and the upper electrode layer of the second variable resistance element have a same composition.

7. The non-volatile memory device according to claim 6, wherein the variable resistance layer of the first variable resistance element and the variable resistance layer of the second variable resistance element are formed in a single process.

8. The non-volatile memory device according to claim 1, wherein in each of the memory cells:
the first current steering element and the first variable resistance element are connected in series; and
the first variable resistance element is placed above the first current steering element, and
in the current steering characteristic reference cell:
the second variable resistance element and the second current steering element are connected in series; and
the second variable resistance element is placed above the second current steering element.

9. The non-volatile memory device according to claim 8, wherein the second current steering element includes:
a lower electrode layer;
a current steering layer formed above the lower electrode layer of the second current steering element; and
an upper electrode layer formed above the current steering layer of the second current steering element, and
the conductive shorting layer is in contact with at least one of the lower electrode layer of the second variable resistance element and the upper electrode layer of the second current steering element.

10. The non-volatile memory device according to claim 9, wherein the conductive shorting layer is a part of the fourth line.

11. The non-volatile memory device according to claim 10, wherein the fourth line has a bottom surface positioned deeper than an upper surface of the lower electrode layer of the second variable resistance element.

12. The non-volatile memory device according to claim 9, wherein the parameter generation circuit includes a plurality of the current steering characteristic reference cells,
each of the current steering characteristic reference cells includes the conductive shorting layer, and
the conductive shorting layer is a part of a contact plug of the current steering characteristic reference cell positioned between the fourth line and the upper electrode layer of the second variable resistance element.

13. The non-volatile memory device according to claim 12, wherein centers of the contact plug of the current steering characteristic reference cell and the variable resistance layer of the second variable resistance element are different when seen from a direction perpendicular to an upper surface of the substrate.

14. The non-volatile memory device according to claim 9, wherein the first variable resistance element includes:
a lower electrode layer;
a variable resistance layer formed above the lower electrode layer of the first variable resistance element; and
an upper electrode layer formed above the variable resistance layer of the first variable resistance element, the lower electrode layer of the first variable resistance element and the upper electrode layer of the first variable resistance element are electrically connected via the variable resistance layer, and the first variable resistance element has a side surface covered by a dielectric side wall.

15. The non-volatile memory device according to claim 9, wherein each of the first current steering element and the second current steering element has a side surface covered by a dielectric side wall.

16. The non-volatile memory device according to claim 15, wherein the first variable resistance element has a side surface covered by a dielectric side wall.

17. The non-volatile memory device according to claim 9, wherein the conductive shorting layer is a conductive side wall.

18. The non-volatile memory device according to claim 1, wherein in each of the memory cells:

the first current steering element and the first variable resistance element are connected in series; and the first current steering element is placed above the first variable resistance element, and in the current steering characteristic reference cell:

the second current steering element and the second variable resistance element are connected in series; and the second current steering element is placed above the second variable resistance element.

19. The non-volatile memory device according to claim 18, wherein the conductive shorting layer is a conductive side wall.

* * * * *